United States Patent
Raumann et al.

(10) Patent No.: US 11,893,424 B2
(45) Date of Patent: *Feb. 6, 2024

(54) TRAINING A NEURAL NETWORK USING A NON-HOMOGENOUS SET OF RECONFIGURABLE PROCESSORS

(71) Applicant: SambaNova Systems, Inc., Palo Alto, CA (US)

(72) Inventors: Martin Russell Raumann, San Leandro, CA (US); Qi Zheng, Fremont, CA (US); Bandish B. Shah, San Francisco, CA (US); Ravinder Kumar, Fremont, CA (US); Kin Hing Leung, Cupertino, CA (US); Sumti Jairath, Santa Clara, CA (US); Gregory Frederick Grohoski, Bee Cave, TX (US)

(73) Assignee: SambaNova Systems, Inc., Palo Alto, CA (US)

( * ) Notice: Subject to any disclaimer, the term of this patent is extended or adjusted under 35 U.S.C. 154(b) by 173 days.

This patent is subject to a terminal disclaimer.

(21) Appl. No.: 17/582,925

(22) Filed: Jan. 24, 2022

(65) Prior Publication Data

US 2022/0197714 A1     Jun. 23, 2022

Related U.S. Application Data

(63) Continuation of application No. 17/379,924, filed on Jul. 19, 2021, now Pat. No. 11,237,880, which is a
(Continued)

(51) Int. Cl.
*G06F 9/50* (2006.01)
*G06F 9/455* (2018.01)
*G06N 3/02* (2006.01)

(52) U.S. Cl.
CPC ........ *G06F 9/5077* (2013.01); *G06F 9/45558* (2013.01); *G06F 9/5027* (2013.01); *G06N 3/02* (2013.01); *G06F 2009/4557* (2013.01)

(58) Field of Classification Search
None
See application file for complete search history.

(56) References Cited

U.S. PATENT DOCUMENTS 6,470,485 B1   10/2002   Cote et al.
6,539,438 B1    3/2003   Ledzius et al.
(Continued)

FOREIGN PATENT DOCUMENTS

EP    1372084 A2    12/2003
JP    2020112901 A   7/2020
WO    2010142987 A1 12/2010

OTHER PUBLICATIONS

Accelerated Computing with a Reconfigurable Dataflow Architecture, SambaNova Systems Whitepaper, 10 pages.
(Continued)

*Primary Examiner* — Hiren P Patel
(74) *Attorney, Agent, or Firm* — Flagship Patents; Sikander M. Khan; Bruce A. Young

(57) ABSTRACT

A system for training parameters of a neural network includes a processing node with a processor reconfigurable at a first level of configuration granularity and a controller reconfigurable at a finer level of configuration granularity. The processor is configured to execute a first dataflow segment of the neural network with training data to generate a predicted output value using a set of neural network parameters, calculate a first intermediate result for a parameter based on the predicted output value, a target output value, and a parameter gradient, and provide the first intermediate result to the controller. The controller is configured to receive a second intermediate result over a network, and
(Continued)

execute a second dataflow segment, dependent upon the first intermediate result and the second intermediate result, to generate a third intermediate result indicative of an update of the parameter.

11 Claims, 53 Drawing Sheets

Related U.S. Application Data continuation-in-part of application No. 17/127,929, filed on Dec. 18, 2020, now Pat. No. 11,182,221.

(56) References Cited

U.S. PATENT DOCUMENTS

| | | | |
|---|---|---|---|
| 6,667,983 | B1 | 12/2003 | Lo et al. |
| 9,009,723 | B2 | 4/2015 | Degenaro et al. |
| 9,501,325 | B2 | 11/2016 | Pell et al. |
| 10,621,138 | B2 | 4/2020 | Hu et al. |
| 10,831,507 | B2 | 11/2020 | Shah et al. |
| 11,068,780 | B2* | 7/2021 | Mellempudi ......... G06N 3/045 |
| 11,080,227 | B2 | 8/2021 | Koeplinger et al. |
| 11,237,880 | B1* | 2/2022 | Raumann ............. G06F 9/5077 |
| 11,328,207 | B2* | 5/2022 | Lauterbach .......... G06F 9/5027 |
| 11,328,208 | B2* | 5/2022 | Lie ......................... G06N 3/084 |
| 11,392,740 | B2* | 7/2022 | Raumann ........... G06F 15/7871 |
| 2002/0156998 | A1 | 10/2002 | Casselman |
| 2003/0108119 | A1 | 6/2003 | Mohebbi et al. |
| 2006/0015712 | A1 | 1/2006 | Ang et al. |
| 2007/0186126 | A1 | 8/2007 | Smith et al. |
| 2007/0220522 | A1 | 9/2007 | Coene et al. |
| 2008/0013448 | A1 | 1/2008 | Horie et al. |
| 2009/0172351 | A1 | 7/2009 | Vorbach et al. |
| 2009/0300209 | A1 | 12/2009 | Elzur |
| 2014/0137123 | A1 | 5/2014 | Hartmann et al. |
| 2014/0258438 | A1 | 9/2014 | Ayoub |
| 2015/0058614 | A1 | 2/2015 | Degenaro et al. |
| 2015/0100971 | A1 | 4/2015 | Dube et al. |
| 2015/0106823 | A1 | 4/2015 | Canoy et al. |
| 2016/0308719 | A1 | 10/2016 | Putnam et al. |
| 2016/0314025 | A1 | 10/2016 | McGarry et al. |
| 2017/0220499 | A1 | 8/2017 | Gray |
| 2017/0315815 | A1 | 11/2017 | Smith et al. |
| 2017/0317679 | A1 | 11/2017 | Suh et al. |
| 2018/0285295 | A1 | 10/2018 | Abel et al. |
| 2018/0307950 | A1 | 10/2018 | Nealis et al. |
| 2018/0308200 | A1 | 10/2018 | Surti et al. |
| 2018/0314941 | A1 | 11/2018 | Lie et al. |
| 2018/0315158 | A1 | 11/2018 | Nurvitadhi et al. |
| 2019/0089616 | A1 | 3/2019 | Chabbi et al. |
| 2019/0138890 | A1 | 5/2019 | Liang et al. |
| 2019/0171604 | A1 | 6/2019 | Brewer |
| 2019/0171612 | A1 | 6/2019 | Shahar et al. |
| 2019/0180176 | A1 | 6/2019 | Yudanov et al. |
| 2019/0258921 | A1 | 8/2019 | Lie et al. |
| 2019/0286973 | A1 | 9/2019 | Kovvuri et al. |
| 2019/0384642 | A1 | 12/2019 | Bolkhovitin et al. |
| 2020/0090313 | A1 | 3/2020 | Bugdary et al. |
| 2020/0151573 | A1 | 5/2020 | Das et al. |
| 2020/0174840 | A1 | 6/2020 | Zhao et al. |
| 2020/0226444 | A1 | 7/2020 | Sharma et al. |
| 2020/0264876 | A1 | 8/2020 | Lo et al. |
| 2020/0301898 | A1 | 9/2020 | Samynathan et al. |
| 2020/0326992 | A1 | 10/2020 | Jin et al. |
| 2020/0341930 | A1 | 10/2020 | Cannata et al. |
| 2021/0011770 | A1 | 1/2021 | Prabhakar et al. |
| 2021/0089343 | A1 | 3/2021 | Hyoudou |
| 2021/0097366 | A1 | 4/2021 | Wagner et al. |
| 2021/0097379 | A1 | 4/2021 | Yang et al. |
| 2021/0103820 | A1 | 4/2021 | Ghosh |
| 2021/0125058 | A1 | 4/2021 | Chowdhury et al. |
| 2021/0192357 | A1 | 6/2021 | Sinha et al. |
| 2021/0192358 | A1 | 6/2021 | Song et al. |
| 2021/0200610 | A1 | 7/2021 | Chu et al. |
| 2021/0241093 | A1 | 8/2021 | Byrne et al. |
| 2021/0374503 | A1* | 12/2021 | Kim ....................... G06N 3/063 |
| 2022/0198117 | A1* | 6/2022 | Raumann ................ G06F 13/28 |

OTHER PUBLICATIONS

Dettmers, How to Parallelize Deep Learning on GPUs Part 1 of 2: Data Parallelism, dated Oct. 9, 2014, 19 pages. Retrieved on Sep. 3, 2021. Retrieved from [URL: https://timdettmers.com/2014/10/09/deep-learning-data-parallelism/].

Dettmers, How to Parallelize Deep Learning on GPUs Part 2 of 2: Model Parallelism, dated Nov. 9, 2014, 19 pages. Retrieved on Sep. 3, 2021. Retrieved from [URL: https://timdettmers.com/2014/11/09/model-parallelism-deep-learning/ ].

Donges, Gradient Descent: An Introduction to Machine Learning's Most Popular Algorithms, dated Jun. 16, 2019, 10 pages. Retrieved on Mar. 24, 2021, retrieved from [URL: https://builtin.com/data-science/gradient-descent ].

Ekanayake, Model Parallelism in Deep Learning is NOT What you think, dated Nov. 10, 2018, 4 pages. Retrieved on Sep. 3, 2021. Retrieved from [URL: https://medium.com/@esaliya/model-parallelism-in-deep-learning-is-not-what-you-think-94d2f81e82ed ].

Ericles, Sousa, et. al. "A Reconfigurable Memory Architecture for System Integration of Coarse-Grained Reconfigurable Arrays", 2017 International Conference on ReConFigurable Computing and FPGAs, Dec. 4-6, 2017, 8 pages.

Goodfellow et. al., Deep Learning Book Chapter 6 Deep Feedforward Networks, 2016, 60 pages.

Insujang, GPU Architecture Overview, Better Tomorrow with Computer Science, published Apr. 27, 2017, retrieved on Jun. 17, 2021, retrieved from the Internet [URL: https://insujang.github.io/2017-04-17/gpu-architecture-overview/].

Jackson et. al., PCI Express Technology Comprehensive Guide to Generation 1.x, 2.x and 3.0, dated Jun. 2020, 1057 pages.

Jin et. al., How to scale distributed deep learning, dated Nov. 14, 2016, 16 pages.

Kachris et al.; "A Survey on Reconfigurable Accelerators for Cloud Computing", IEEE 2016, Aug. 29, 2016, pp. 1-11.

Knodel, Oliver, et. al., "RC3E: Reconfigurable Accelerators in Data Centers and their Provision by Adapted Service Models", IEEE 9th International Converence on Cloud Computing, 2016, pp. 1-8.

Koeplinger, et. al., "Spatial A Language and Compiler for Application Accelerators", Jun. 18-22, 2018, 16 pages.

Lecture 11: Distributed Training and Communication Protocols, CSE599W: Spring 2018, UW Paul G. Allen School of Computer Science and Engineering, 41 pages.

Li, Ang, et. al., "Evaluating Modern GPU Interconnect: PCIe, NVLink, NV-SLI, NVSwitch and GPUDirect", Mar. 11, 2019, 15 pages.

Liu et. al., Offloading distributed Applications onto SmartNICs using iPipe, ACM 2019, pp. 1-16.

M. Emani et al., "Accelerating Scientific Applications With SambaNova Reconfigurable Dataflow Architecture," in Computing in Science & Engineering, vol. 23, No. 2, pp. 114-119, Mar. 1-Apr. 2021, doi: 10.1109/MCSE.2021.3057203.

Mao, Data Parallelism vs Model Parallelism in Distributed Deep Learning Training, dated Mar. 23, 2019, 4 pages, retrieved on Mar. 30, 2021, Retrieved from the internet [URL: https://leimao.github.io].

Marshall, Dave, "Remote Procedure Calls (RPC)", Jan. 5, 1999, 15 pages, Retreived from URL <https ://users.cs.cf.ac .uk/Dave. Marshall/C/node33 .html#S ECTION 003300000000000000000>.

Mazur, A step by step backpropagation example, dated Mar. 17, 2015, 26 pages. Retrieved on Sep. 3, 2021. Retrieved from [URL: https://mattmazur.com/2015/03/17/a-step-by-step-backpropagation-example/ ].

NVIDIA, "NVIDIA DGX-1 System Architecture", WP-08437-001_v02, 2017, 33 pages.

NVIDIA, "NVIDIA DGX-1 With Tesla V100 System Architecture", WP-08437-002_v01, 2017, 43 pages.

NVIDIA, "NVIDIA Tesla P100", WP-08019-001 v01.1, 2016, 45 pages.

(56) References Cited

OTHER PUBLICATIONS

NVIDIA, "NVIDIA Turing GPU Architecture", WP-09183-001_v01, 2018, 86 pages.

Podobas et al, A Survey on Coarse-Grained Reconfigurable Architectures From a Performance Perspective, IEEEAccess, vol. 2020.3012084, Jul. 27, 2020, 25 pages.

Prabhakar, et al., "Plasticine: A Reconfigurable Architecture For Parallel Patterns", pp. 389-402, IEEE, Jun. 24, 2017.

Ruder, An overview of gradient descent optimization algorithms, NUI Galway Aylien Lyd, dated Jun. 15, 2017, 14 pages.

Strom, Scalable Distributed DNN Training Using Commodity GPU Cloud Computing, Amazon.com, 5 pages.

Tanaka et. al., Distributed Deep Learning with GPU-FPGA heterogenous computing, IEEE 2021, 9 pages.

U.S. Appl. No. 17/127,818—Notice of Allowance, dated Jul. 21, 2021, 10 pages.

U.S. Appl. No. 17/127,818—Office Action dated Apr. 1, 2021, 15 pages.

U.S. Appl. No. 17/127,929—Office Action dated Apr. 1, 2021, 26 pages.

U.S. Appl. No. 17/127,929 Notice of Allowance, dated Jul. 21, 2021, 14 pages.

U.S. Appl. No. 17/214,768 Notice of Allowance, dated Aug. 11, 2021, 26 pages.

U.S. Appl. No. 17/214,768 Supplemental Notice of Allowance, dated Aug. 25, 2021, 10 pages.

What is the difference between model parallelism and data parallelism, Quora, 14 pages. Retrieved on Sep. 3, 2021. Retrieved from [URL: https://www.quora.com/What-is-the-difference-between-model-parallelism-and-data-parallelism ].

Woolloy, NCCL: Accelerated Multi-GPU Collective Communications, NVIDIA, 56 pages.

Xiandong Qi, Introduction to Distributed Deep Learning, dated May 13, 2017, 13 pages.

Zhang et al., Dive into Deep Learning, Release 0.16.2, dated Mar. 20, 2021, 1027 pages.

Bae et al., "Auto-tuning CNNs for coarse-grained reconfigurable array-based accelerators", IEEE 2018 (Bae_2018.pdf; pp. 1-10) (Year: 2018).

Li et al, "CATERPILLAR: coarse grain reconfigurable architecture for accelerating the training of deep neural networks"; IEEE 2017 (Li_2017.pdf; pp. 1-10) (Year: 2017).

Ma et al; "DeepGauge: Multi-Granularity Testing Criteria for Deep Learning Systems"; ACM 2018 (Ma_2018.pdf; pp. 1-12) (Year: 2018).

U.S. Appl. No. 17/379,924 Notice of Allowance, dated Sep. 16, 2021, 51 pages.

U.S. Appl. No. 17/379,921 Notice of Allowance, dated Nov. 26, 2021, 34 pages.

Busa et. al., A Run-Time World-Level Reconfigurable Coarse-Grain Functional Unit for a VLIW Processor, ACM, dated 2002, 6 pages.

Jafri et. al., NeuroCGRA: A Cgra with support for Neural Networks, IEEE, dated 2014, 6 pages.

Rubattu et al., Dataflow-Functional High-Level Synthesis for Coarse-Grained Reconfigurable Accelerators, IEEE Embedded Systems Letters, vol. 11, No. 3, dated Sep. 2019, 4 pages.

U.S. Appl. No. 17/127,818—Response to Office Action dated Apr. 1, 2021, filed Jul. 1, 2021, 15 pages.

U.S. Appl. No. 17/127,929—Response to Office Action dated Apr. 1, 2021, Jul. 1, 2021, 10 pages.

U.S. Appl. No. 17/379,921 Notice of Allowance dated Mar. 21, 2022, 25 pages.

PCT/US2021/063733—International Search Report and Written Opinion, dated Apr. 4, 2022, 17 pages.

PCT/US2021/063728—International Search Report and Written Opinion, dated Apr. 4, 2022, 15 pages.

Galanis et al., Partitioning Methodology for Heterogeneous Reconfigurable Functional Units, The Journal of Supercomputing, vol. 38, No. 1, dated Oct. 1, 2006, 18 pages.

Galanis et al., A design flow for speeding-up dsp applications in heterogeneous reconfigurable systems, Microelectronics Journal, vol. 37, dated 2006, pp. 554-564, 11 pages.

Galanis et al., Accelerating Applications by Mapping Critical Kernels on Coarse-Grain Reconfigurable Hardware in Hybrid Systems, Field-Programmable Custom Computing Machines, 2005, 13th Annual IEEE Symposium on Napa, CA Apr. 2005, 2 pages.

PCT/US2022/020638—International Search Report and Written Opinion, dated Jun. 21, 2022, 17 pages.

PCT/US2022/016871—International Search Report and Written Opinion, dated Jun. 1, 2022, 14 pages.

Vucha et al., Dynamic Task Distribution Model for On-Chip Reconfigurable High Speed Computing System, Hindawi, dated Jun. 30, 2015, 13 pages.

Souissi et al., Optimization of Run-time Mapping on Heterogeneous CPU/FPGA Architecture, 9th International Conference of Modeling, Optimization and Simulation—MOSIM'12, Jun. 6-8, 2012, Bordeaux, France, 9 pages.

Fazlali et al., Efficient task scheduling for runtime reconfigurable systems, Journal of Systems Architecture, vol. 56, dated Jul. 26, 2010, pp. 623-632, 10 pages.

\* cited by examiner

| | | |
|---|---|---|
| A0 | First of Z1 chunks for each of W Switch Units<br>First of Z2 chunks for each of X PCU Units<br>First of Z3 chunks for each of Y PMU Units<br>First of Z4 chunks for each of Z AGCU Units<br>First of Z5 chunks for each of F FPGA Units | Block (0) |
| A1 | Second of Z1 chunks for each of W Switch Units<br>Second of Z2 chunks for each of X PCU Units<br>Second of Z3 chunks for each of Y PMU Units<br>Second of Z4 chunks for each of Z AGCU Units<br>Second of Z5 chunks for each of F FPGA Units | Block (1) |
| A2 | Third of Z2 chunks for each of X PCU Units<br>Third of Z3 chunks for each of Y PMU Units<br>Third of Z4 chunks for each of Z AGCU Units<br>Third of Z5 chunks for each of F FPGA Units | Block (2) |
| A3 | Fourth of Z3 chunks for each of Y PMU Units<br>Fourth of Z4 chunks for each of Z AGCU Units<br>Fourth of Z5 chunks for each of F FPGA Units | Block (3) |
| A4 | Fifth of Z3 chunks for each of Y PMU Units<br>Fifth of Z4 chunks for each of Z AGCU Units<br>Fifth of Z5 chunks for each of F FPGA Units | Block (4) |
| A5 | Sixth of Z4 chunks for each of Z AGCU Units<br>Sixth of Z5 chunks for each of F FPGA Units | Block (5) |
| A6 | Seventh of Z5 chunks for each of F FPGA Units | Block (6) |

| Time Step | GPU0 | Host | GPUi |
|---|---|---|---|
| 1 | FWD0 | | FWD0 |
| 2 | FWD1 | | FWD1 |
| 3 | FWD2 | | FWD2 |
| 4 | BWD2 | | BWD2 |
| 5 | BWD1 | SYNC2 | BWD1 |
| 6 | BWD0 | SYNC1 | BWD0 |
| 7 | | SYNC0 | |
| 8 | AR2 | | AR2 |
| 9 | AR1 | | AR1 |
| 10 | AR0 | | AR0 |
| 11 | OPT2 | | OPT2 |
| 12 | OPT1 | | OPT1 |
| 13 | OPT0 | | OPT0 |

FIG. 39

| Time Step | RP0 | FPGA | RPi |
|---|---|---|---|
| 1 | FWD0 | | FWD0 |
| 2 | FWD1 | | FWD1 |
| 3 | FWD2 | | FWD2 |
| 4 | BWD2 | | BWD2 |
| 5 | BWD1 | SYNC2-AR2 | BWD1 |
| 6 | BWD0 | SYNC1-AR1 | BWD0 |
| 7 | | SYNC0-AR0 | |
| 8 | OPT2 | | OPT2 |
| 9 | OPT1 | | OPT1 |
| 10 | OPT0 | | OPT0 |

FIG. 40

| Time Step | RP0 | FPGA | RPi |
|---|---|---|---|
| 1 | FWD0 | | FWD0 |
| 2 | FWD1 | | FWD1 |
| 3 | FWD2 | | FWD2 |
| 4 | BWD2 | | BWD2 |
| 5 | BWD1 | SYNC2-AR2-OPT2 | BWD1 |
| 6 | BWD0 | SYNC1-AR1-OPT1 | BWD0 |
| 7 | | SYNC0-AR0-OPT0 | |

TRAINING A NEURAL NETWORK USING A NON-HOMOGENOUS SET OF RECONFIGURABLE PROCESSORS

PRIORITY APPLICATION

This application is a continuation of U.S. patent application Ser. No. 17/379,924, filed on Jul. 19, 2021, entitled "DATAFLOW ALL-REDUCE FOR RECONFIGURABLE PROCESSOR SYSTEMS," which is a continuation-in-part of U.S. patent application Ser. No. 17/127,929, filed on Dec. 18, 2020, entitled "Inter-Node Buffer-Based Streaming for Reconfigurable Processor-As-A-Service (RPaaS),". Both of the aforementioned non-provisional application are incorporated by reference for all purposes.

INCORPORATIONS

The following are incorporated by reference for all purposes as if fully set forth herein:

U.S. Non-provisional patent application Ser. No. 17/379,921, filed on Jul. 19, 2021, entitled "DATAFLOW FUNCTION OFFLOAD TO RECONFIGURABLE PROCESSORS,";

U.S. Non-provisional patent application Ser. No. 17/127,929, filed Dec. 18, 2020, entitled "INTER-NODE BUFFER-BASED STREAMING FOR RECONFIGURABLE PROCESSOR-AS-A-SERVICE (RPaaS),";

U.S. Non-provisional patent application Ser. No. 17/127,818, filed Dec. 18, 2020, entitled "INTRA-NODE BUFFER-BASED STREAMING FOR RECONFIGURABLE PROCESSOR-AS-A-SERVICE (RPaaS),";

Prabhakar et al., "Plasticine: A Reconfigurable Architecture for Parallel Patterns," ISCA '17, Jun. 24-28, 2017, Toronto, ON, Canada;

Koeplinger et al., "Spatial: A Language And Compiler For Application Accelerators," Proceedings Of The 39th ACM SIGPLAN Conference On Programming Language Design And Implementation (PLDI), Proceedings of the 43rd International Symposium on Computer Architecture, 2018;

U.S. Non-provisional patent application Ser. No. 16/239,252, filed Jan. 3, 2019, entitled "VIRTUALIZATION OF A RECONFIGURABLE DATA PROCESSOR,";

U.S. Non-provisional patent application Ser. No. 16/197,826, filed Nov. 21, 2018, entitled, "CONFIGURATION LOAD OF A RECONFIGURABLE DATA PROCESSOR,";

U.S. Non-provisional patent application Ser. No. 16/198,086, filed Nov. 21, 2018, entitled, "CONFIGURATION UNLOAD OF A RECONFIGURABLE DATA PROCESSOR,";

U.S. Non-provisional patent application Ser. No. 16/260,548, filed Jan. 29, 2019, entitled, "MATRIX NORMAL/TRANSPOSE READ AND A RECONFIGURABLE DATA PROCESSOR INCLUDING SAME,";

U.S. Non-provisional patent application Ser. No. 16/536,192, filed Aug. 8, 2019, entitled, "COMPILER FLOW LOGIC FOR RECONFIGURABLE ARCHITECTURES,";

U.S. Non-provisional patent application Ser. No. 16/407,675, filed May 9, 2019, entitled, "CONTROL FLOW BARRIER AND RECONFIGURABLE DATA PROCESSOR,";

U.S. Non-provisional patent application Ser. No. 16/504,627, filed Jul. 8, 2019, entitled, "QUIESCE RECONFIGURABLE DATA PROCESSOR,";

U.S. Non-provisional patent application Ser. No. 16/572,516, filed Sep. 16, 2019, entitled, "EFFICIENT EXECUTION OF OPERATION UNIT GRAPHS ON RECONFIGURABLE ARCHITECTURES BASED ON USER SPECIFICATION,";

U.S. Non-provisional patent application Ser. No. 16/744,077, filed Jan. 15, 2020, entitled, "COMPUTATIONALLY EFFICIENT SOFTMAX LOSS GRADIENT BACKPROPAGATION,";

U.S. Non-provisional patent application Ser. No. 16/590,058, filed Oct. 1, 2019, entitled, "COMPUTATION UNITS FOR FUNCTIONS BASED ON LOOKUP TABLES,";

U.S. Non-provisional patent application Ser. No. 16/695,138, filed Nov. 25, 2019, entitled, "COMPUTATION UNITS FOR BATCH NORMALIZATION,";

U.S. Non-provisional patent application Ser. No. 16/688,069, filed Nov. 19, 2019, entitled, "LOOK-UP TABLE WITH INPUT OFFSETTING,";

U.S. Non-provisional patent application Ser. No. 16/718,094, filed Dec. 17, 2019, entitled, "COMPUTATION UNITS FOR ELEMENT APPROXIMATION,";

U.S. Non-provisional patent application Ser. No. 16/560,057, filed Sep. 4, 2019, entitled, "SIGMOID FUNCTION IN HARDWARE AND A RECONFIGURABLE DATA PROCESSOR INCLUDING SAME,";

U.S. Non-provisional patent application Ser. No. 16/572,527, filed Sep. 16, 2019, entitled, "PERFORMANCE ESTIMATION-BASED RESOURCE ALLOCATION FOR RECONFIGURABLE ARCHITECTURES,";

U.S. Non-provisional patent application Ser. No. 15/930,381, filed May 12, 2020, entitled, "COMPUTATIONALLY EFFICIENT GENERAL MATRIX-MATRIX MULTIPLICATION (GeMM),";

U.S. Non-provisional patent application Ser. No. 16/890,841, filed Jun. 2, 2020, entitled, "ANTI-CONGESTION FLOW CONTROL FOR RECONFIGURABLE PROCESSORS,";

U.S. Non-provisional patent application Ser. No. 16/922,975, filed Jul. 7, 2020, entitled, "RUNTIME VIRTUALIZATION OF RECONFIGURABLE DATAFLOW RESOURCES,";

U.S. Non-provisional patent application Ser. No. 16/996,66, filed Aug. 18, 2020, entitled, "RUNTIME PATCHING OF CONFIGURATION FILES,";

U.S. Non-provisional patent application Ser. No. 17/023,015, filed Sep. 16, 2020, "COMPILE TIME LOGIC FOR DETECTING STREAMING COMPATIBLE AND BROADCAST COMPATIBLE DATA ACCESS PATTERNS"; and U.S. Non-provisional patent application Ser. No. 17/031,679, filed Sep. 24, 2020, "SYSTEMS AND METHODS FOR MEMORY LAYOUT DETERMINATION AND CONFLICT RESOLUTION".

FIELD OF THE TECHNOLOGY DISCLOSED

The technology disclosed relates to throughput improvements in machine learning applications that use processors like Central Processing Units (CPUs), Graphics Processing Units (GPUs), Field Programmable Gate Arrays (FPGAs), Coarse-Grained Reconfigurable Architectures (CGRAs), Application-Specific Integrated Circuits (ASICs), Application Specific Instruction-set Processors (ASIPs), and Digital Signal Processors (DSPs). In particular, the technology disclosed relates to execution of a dataflow-based processing graph partially on one or more CGRAs and partially on one or more intelligent programmable network interface components.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Conventional stored-program computer architectures are based on an instruction-based control flow paradigm, in which a primitive set of operations are performed sequentially on data stored in some storage device in response to software instructions being sequentially provided to a central processor. A program counter controls when each instruction is to execute. Dataflow architectures, by contrast, are based on the idea of disconnected computational actors organized into stages that can be pipelined. Data is moved down a pipeline from one processing stage to the next, rather than data being stored in a memory and processing instructions being brought to a central processor to perform each subsequent step.

Whereas control-flow instructions are centrally controlled, dataflow stages execute primarily in response to the availability of all the required operands. In dataflow architectures, each processing element has some way of knowing when all the operands are available before it can execute (or complete the execution of) the function of that stage. Many kinds of algorithms can be implemented with dataflow processing, such as certain aspects of natural-language processing, recommendation engines, database analytics, scientific applications, SQL data processing and deep learning. The present application focuses on deep learning algorithms as an example, but the concepts discussed herein apply just as well to other types of problems.

Deep learning is a subset of machine learning algorithms that are inspired by the structure and function of the human brain. Most deep learning algorithms involve artificial neural network architectures, in which multiple layers of neurons each receive input from neurons in a prior layer or layers, and in turn influence the neurons in the subsequent layer or layers. Training these neural network models can be computationally extremely demanding. In recent years significant advances have been made by offloading many common computations to specialized GPU co-processor hardware, but even so, network training still can take an impractically long time on a single machine. Fortunately the computations involved in network training often include lengthy sequences that are highly repetitive, and that do not depend on the internal results from other instances of the sequence. Such computations often can be parallelized by running different instances of the sequence on different machines. The algorithms still require partial results to be shared periodically among the instances, so periodic sync-ups are still required as the algorithm proceeds.

Mechanisms for parallelizing neural network training can be divided roughly into two groups: model parallelism and data parallelism. With model parallelism, the network model is divided up and parts of it are allocated to different machines. In some versions the model is divided longitudinally, such that upstream portions of the model are executed by one machine, which passes its results to another machine that executes downstream portions of the model. In the meantime, the upstream machine can begin processing the next batch of training data through the upstream portions of the model. In other versions of model parallelism, the model may include branches which are later merged downstream. In such versions the different branches could be processed on different machines.

With data parallelism, different instances of the same network model are programmed into different machines. The different instances typically each process different batches of the training data, and the partial results are combined. Parallelization mechanisms also can be mixed and matched, using a combination of model parallelism and data parallelism.

Most parallel implementations, however, still require centralized control, at least for managing the sharing of partial results among the various machines. GPUs are now available which can share updates with GPUs in the same or different machines by way of specialized high bandwidth communication links directly interconnecting the GPUs, often separate from the channel that connects the GPU to its local CPU. But the sharing process is still orchestrated centrally during runtime. For example, in GPU implementations, when each processing node has completed its work prior to a synchronization step, it so notifies the host via a control communication of some kind. The host typically awaits receipt of such notifications from all the required processing nodes. Then the host sends instructions back to all the processing nodes to go ahead and exchange their partial results data with each other. In some implementations a further control signal round-trip occurs in case the aggregation of the partial results data from all the processing nodes is itself to be distributed among the processing nodes. For example, centralized control might be required to orchestrate the distribution of partial gradients among the workers, the combining of the partial gradients by one or more workers, and/or the distribution of the final gradients back to all the workers. The control overhead arising from such centralized control can stifle scaling of the system beyond just a few nodes. Very few architectures with centralized synchronization scale adequately beyond single digit numbers of processing nodes.

CPUs and GPUs operate on a stream of instructions, where instructions perform stateful operations. Instruction processors of this type are programmed using instructions, encoded into bits. A task is specified as an ordered list of processor instructions in software. These units have hardware architectures with mechanisms to track "program state". Program state would include, among other things, a form of a global "program counter" register, to track the next instruction to be fetched from memory. In addition, the hardware of such instruction processors would also have a pipeline to decode and execute these instructions that have been fetched (an instruction pipeline). In other words, these architectures contain a pipeline through which a stream of instructions flows during execution, where each instruction performs operations and updates the hardware state.

A GPU can consist of an array of distributed computational units in cores, which generally rely on a shared pool of memory. The distributed computational units are stored-program processors which are programmable by writing instructions that are fetched, decoded, and executed like a normal processor. Synchronization and communication are achieved by executing sequences of instructions that operate on the shared memory.

Reconfigurable processors, including Field Programmable Gate Arrays (FPGAs), can be configured to implement a variety of functions more efficiently or faster than might be achieved using a general-purpose processor executing a computer program. So-called Coarse-Grained Reconfigurable Architectures (CGRAs) are being developed in which the configurable units in the array are more complex than used in typical, more fine-grained FPGAs, and may enable faster or more efficient execution of various classes of functions. For example, CGRAs have been proposed that can enable implementation of energy-efficient accelerators for machine learning and artificial intelligence workloads. See, Prabhakar, et al., "Plasticine: A Reconfigurable Architecture for Parallel Patterns," ISCA '17, Jun. 24-28, 2017, Toronto, ON, Canada. Various aspects of some such CGRAs are described in the above-incorporated patent applications.

A CGRA as described in the above patent applications includes an array of reconfigurable units, sometimes referred to herein as Coarse Grained Reconfigurable Units (CGRUs). The units can comprise somewhat specialized computational and memory units. These units are connected by a fabric to enable inter-unit communication and synchronization. The components may be reconfigured in several ways, but often rely on direct hardware reconfiguration by altering their behavior under control of configuration bits loaded from a bit file into registers prior to runtime. No instructions are fetched, decoded, or executed during runtime; instead, state machines are configured by the bit file contents to implement sequences of operations.

Units of such CGRAs operate on streams of data and control messages (as opposed to instructions) that flow through a sea of configurable units, where the configurable units are programmed using configuration data, such as a bit file. Embodiments based on configurable units have architectures that look and operate differently than stored program instruction-based processors, as they have to manage execution in different ways. Arrays of configurable units as in CGRAs and FPGAs have a different programming contract: configuration bits. These architectures do not have the hardware to fetch and process instructions, they do not have a global "program counter" register in the sense of instruction processors, and they do not have a pipeline that is built to fetch, decode, and execute an instruction stream. Instead, configurable execution units and stateful elements are physically distributed on chip, and connected together using a programmable interconnect. A program is not a stream of instructions; instead, configuration bits program the configurable execution units to construct a custom control and data path for an application. Instead of a stream of instructions, the configurable units are programmed to operate on streams of data and control messages, to produce other data and control messages. This makes such architectures inherently distributed, without a single global program state.

CGRAs are optimized for performing certain kinds of complex computations that are common in specific types of applications such as deep learning. This can limit their effectiveness when performing more general or simpler kinds of computations. Also, since CGRAs are optimized for processing flowing data, the orchestration of inter-node communications and data syncing can be a sub-optimal use of their power. It is desirable, therefore, to find a way to perform such functions without impacting the ability of the CGRA units to continue performing functions more in line with the capabilities of their powerful hardware components. It is particularly desirable to avoid or minimize any requirement for a separate host to perform such orchestration of inter-node communications and data syncing, in order to avoid the control overhead that tends to stifle scaling.

More particularly, as mentioned above, parallelizing deep learning applications, especially those based on Stochastic Gradient Decent (SGD), requires periodic sharing of intermediate results among the various nodes operating in parallel. For data parallelization, such intermediate results can include both partially aggregated gradients being shared with those of other worker nodes in order to enable calculation of the fully aggregated gradients, and fully aggregated gradients or updated neural network parameters being returned to the worker nodes. In conventional GPU-based data parallel implementations, partially aggregated gradients can be passed among the GPUs over a direct, high bandwidth link, but the GPUs themselves are then occupied in calculating the full aggregations and the updated parameters. For large neural networks with too many layers to fit within a single GPU, it is possible to pipeline the calculations so that each GPU calculates the partial aggregations for one segment of the parameters, and these intermediate results are shared among the GPUs on the direct interconnect while each GPU works on calculating the partial aggregations for the next segment of parameters. However, even though each GPU may receive the partial aggregations from other GPUs early enough, it cannot begin work on its full aggregation work yet because it is still working on calculating the partial aggregations for the next segment of parameters.

It would be desirable to improve scaling of data parallelization in neural network training applications, so that larger and more powerful neural networks can be trained effectively.

SUMMARY

Roughly described, the invention involves a system for data parallel training of a neural network on multiple reconfigurable units configured by a host with dataflow pipelines to perform different steps in the training. CGRA units are configured to evaluate first and second sequential sections of neural network layers based on a respective subset of training data, and to back-propagate the error through the sections to calculate parameter gradients for the respective subset. Gradient synchronization and reduction are performed by one or more units having finer grain reconfigurability, such as an FPGA. The FPGA performs synchronization and reduction of the gradients for the second section while the CGRA units perform back-propagation through the first sequential section. Intermediate results are transmitted using a P2P message passing protocol layer. Execution of dataflow segments in the different units is triggered by receipt of data, rather than by a command from any host system.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings, in which:

FIG. 37 illustrates one example organization of a configuration file.

FIG. 39 illustrates the temporal progress resulting from a conventional implementation of data parallelism.

FIGS. 40 and 41 illustrate the temporal progress resulting from improved implementations using an FPGA on the SmartNIC.

DETAILED DESCRIPTION

The following discussion is presented to enable any person skilled in the art to make and use the technology disclosed and is provided in the context of a particular application and its requirements. Various modifications to the disclosed implementations will be readily apparent to those skilled in the art, and the general principles defined herein may be applied to other implementations and applications without departing from the spirit and scope of the technology disclosed. Thus, the technology disclosed is not intended to be limited to the implementations shown but is to be accorded the widest scope consistent with the principles and features disclosed herein.

Data Center

Figure 1:
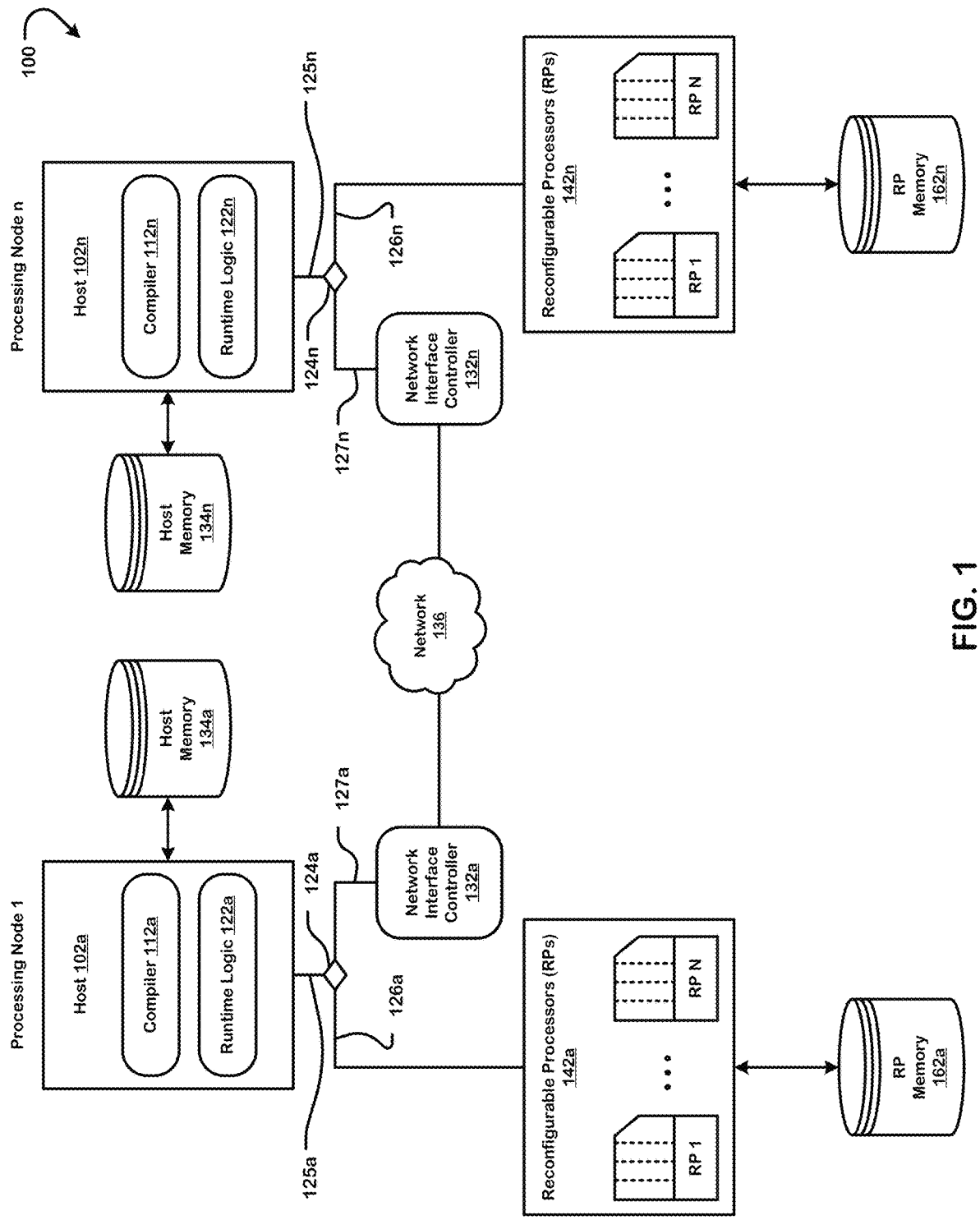
FIG. 1 shows an architectural level schematic of a data center in accordance with an implementation.

Systems and processes for providing Reconfigurable Processor-as-a-Service (RPaaS) are described. The systems and processes will be described with reference to FIG. 1 showing an architectural level schematic of a data center 100 in accordance with an implementation. Because FIG. 1 is an architectural diagram, certain details of the data center 100 are intentionally omitted to improve the clarity of the description. It may be noted that data center 100 can include the same, more, or fewer elements configured in the same or different manner in other implementations. The discussion of FIG. 1 will be organized as follows. First, the elements of the figure will be described, followed by their interconnections. Then, the use of the elements in the system will be described in greater detail.

FIG. 1 shows first and second processing nodes in the data center 100. In FIG. 1, the first processing node is identified as "processing node 1," and the second processing node is identified as "processing node n." The first and second processing nodes are configured to collaboratively execute configuration files for applications in a distributed fashion. One skilled in the art will appreciate that the data center 100 can have any number of processing nodes operatively coupled for data communications through a network 136 (also called herein "network fabric 136"). Examples of the network 136 include a Storage Area Network (SAN) and a Local Area Network (LAN). The SAN can be implemented with a variety of data communications fabrics, devices, and protocols. For example, the fabrics for the SAN can include Fibre Channel, Ethernet, InfiniBand, Serial Attached Small Computer System Interface ('SAS'), or the like. Data communication protocols for use with the SAN can include Advanced Technology Attachment ('ATA'), Fibre Channel Protocol, Small Computer System Interface ('SCSI'), Internet Small Computer System Interface ('iSCSI'), Hyper-SCSI, Non-Volatile Memory Express ('NVMe') over Fabrics, or the like.

The LAN can also be implemented with a variety of fabrics, devices, and protocols. For example, the fabrics for the LAN can include Ethernet (802.3), wireless (802.11), or the like. Data communication protocols for use in the LAN can include Transmission Control Protocol ('TCP'), User Datagram Protocol ('UDP'), Internet Protocol (IP), Hypertext Transfer Protocol ('HTTP'), Wireless Access Protocol ('WAP'), Handheld Device Transport Protocol ('HDTP'), Session Initiation Protocol ('SIP'), Real-time Transport Protocol ('RTP'), or the like.

The network 136 also connects other network components in the data center 100. Examples of other network components include buses, switches, routers, load balancers, hypervisors, and Application Programming Interfaces (APIs). Along the network 136, the switches, for example, can receive packets via a plurality of input ports and can transmit packets via a plurality of output ports. The processing nodes in the data center 100 can communicate with each other through the network 136 using a variety of networking paths established by the switches. Another example of the network 136 is a Wide Area Network (WAN).

A processing node (or node) is an addressable application running on a hardware device or virtual device that attaches to a network, and is capable of sending, receiving, or forwarding information over a communications channel to or from other processing nodes. Examples of electronic devices which can be deployed as hardware processing nodes include all varieties of computers, workstations, laptop computers, handheld computers, and smartphones. Processing nodes can be implemented in a cloud-based server system. More than one virtual device configured as a processing node can be implemented using a single physical device.

The data center 100 comprises a pool of reconfigurable dataflow resources. The pool of reconfigurable dataflow resources can have a variety of compute scales and hierarchies. The pool of reconfigurable dataflow resources can be a single processing node operatively coupled to a plurality of reconfigurable processors, which in turn is supported by different bus and memory resources. The processing node can have a host processor (e.g., a CPU) that exchanges data with the reconfigurable processors, for example, over a local bus like Peripheral Component Interconnect Express (PCIe) interface or another interconnect fabric. The host processor can have a runtime processor (or a runtime logic) that manages resource allocation, memory mapping, and execution of configuration files for applications requesting execution from the host processor. PCIe is described in formal PCI Express specifications available from PCI-SIG Administration, Beaverton, OR, all of which are incorporated herein by reference to the extent they are available at the filing date of this patent application. As used herein, the terms "PCIe bus" and "PCIe fabric" refer to a bus or fabric that satisfies the requirements of Revision 1.0 of the PCI Express specification or any subsequent revision thereof. PCIe is described also for example in Jackson and Budruk, PCI Express Technology 3.0, available from MindShare, Inc., Cedar Park, TX, also incorporated by reference herein. The terms "PCIe bus" and "PCIe fabric" are used interchangeably herein.

The pool of reconfigurable dataflow resources can be a rack (or cluster) of processing nodes connected through the network 136. Each processing node in the rack can run a respective plurality of reconfigurable processors and include a respective host processor configured with a respective runtime processor. The runtime processors, distributed across the processing nodes, communicate with each other to provide unified access to reconfigurable processors attached not only to their own processing node but also to reconfigurable processors attached to every other processing node in the data center 100.

The pool of reconfigurable dataflow resources can be a pod that comprises a plurality of racks connected through the network 136. The pool of reconfigurable dataflow resources can be a superpod that comprises a plurality of pods connected through the network 136. The pool of reconfigurable dataflow resources can be a zone that comprises a plurality of superpods connected through the network 136. The pool of reconfigurable dataflow resources can be the data center 100 that comprises a plurality of zones connected through the network 136.

The pool of reconfigurable dataflow resources can include bus (or transfer) resources. Examples of the bus resources include PCIe channels, Direct Memory Access (DMA) channels, and Double Data Rate (DDR) channels. The pool of reconfigurable dataflow resources can include memory (or storage) resources. Examples of the memory resources include main memory (e.g., off-chip/external Dynamic Random Access Memory (DRAM), NAND flash), local secondary storage (e.g., local disks (e.g., HDD, SSD)), and remote secondary storage (e.g., distributed file systems, web servers). Other examples of the memory resources include latches, registers, flops, bypass networks, and caches (e.g., ones explicitly addressed by RAMs/DRAMs/SRAMs). The pool of reconfigurable dataflow resources is dynamically scalable to meet the performance requirements of applications requesting execution. The applications access the pool of reconfigurable dataflow resources over one or more networks (e.g., the Internet).

The discussion now returns to the first and second processing nodes of the data center 100. The first processing node comprises a first host processor 102a. Examples of the first host processor 102a include x86 and x64 processors. The first host processor 102a interfaces with a host memory 134a (e.g., RAM). The first host processor 102a has a compiler 112a to compile applications and a runtime logic 122a to execute the compiled applications on a plurality of reconfigurable processors 142a. The runtime logic 122a is configured to provide on-demand access to the pool of reconfigurable dataflow resources, which can be rapidly provisioned and released with minimal management effort or service provider interaction.

Examples of the reconfigurable processors 142a include Field Programmable Gate Arrays (FPGAs), Coarse-Grained Reconfigurable Architectures (CGRAs), Application-Specific Integrated Circuits (ASICs), and Application Specific Instruction-set Processor (ASIP). The reconfigurable processors 142a interface with a reconfigurable processor memory 162a (e.g., DRAM). Each of the reconfigurable processors 142a includes an array of configurable units (e.g., compute units and memory units) in a programmable interconnect fabric. The array of configurable units in a reconfigurable processor is partitionable into a plurality of sub-arrays (or tiles) of configurable units. Additional details about one implementation of the architecture of the reconfigurable processors are discussed later in this application. In other implementations, the processing nodes in the data center 100 include processors instead of/in addition to the reconfigurable processors 142a. Examples of such processors include Graphics Processing Units (GPUs) and Digital Signal Processors (DSPs).

A Network Interface Controller 132a (e.g., NIC, SmartNIC) connects the first host processor 102a and the reconfigurable processors 142a to the network 136. A bus switch 124a uses local buses 125a, 126a, and 127a to operatively couple the first host processor 102a, the reconfigurable processors 142a, and the Network Interface Controller 132a. Examples of the local buses 125a, 126a, and 127a include Peripheral Component Interconnect Express (PCIe), Cache Coherent Interconnect for Accelerators (CCIX), Compute Express Link (CXL), and Open Coherent Accelerator Processor Interface (OpenCAPI).

The second processing node comprises a second host processor 102n. Examples of the second host processor 102n include x86 and x64 processors. The second host processor 102n interfaces with a host memory 134n (e.g., RAM). The second host processor 102n has a compiler 112n to compile applications and a runtime logic 122n to execute the compiled applications on a plurality of reconfigurable processors 142n. The runtime logic 122n is configured to provide on-demand access to the pool of reconfigurable dataflow resources, which can be rapidly provisioned and released with minimal management effort or service provider interaction.

Examples of the reconfigurable processors 142n include Field Programmable Gate Arrays (FPGAs), Coarse-Grained Reconfigurable Architectures (CGRAs), Application-Specific Integrated Circuits (ASICs), and Application Specific Instruction-set Processor (ASIP). The reconfigurable processors 142n interface with a reconfigurable processor memory 162n (e.g., DRAM). Each of the reconfigurable processors 142n includes an array of configurable units (e.g., compute units and memory units) in a programmable interconnect fabric. The array of configurable units in a reconfigurable processor is partitionable into a plurality of sub-arrays (or tiles) of configurable units. Additional details about one implementation of the architecture of the reconfigurable processors are discussed later in this application. In other implementations, the processing nodes in the data center 100 include processors instead of/in addition to the reconfigurable processors 142n. Examples of such processors include Graphics Processing Units (GPUs) and Digital Signal Processors (DSPs).

A Network Interface Controller 132n (e.g., NIC, SmartNIC) connects the second host processor 102n and the reconfigurable processors 142n to the network 136. A bus switch 124n uses local buses 125n, 126n, and 127n to operatively couple the second host processor 102n, the reconfigurable processors 142n, and the Network Interface Controller 132n. Examples of the local buses 125n, 126n, and 127n include Peripheral Component Interconnect Express (PCIe), Cache Coherent Interconnect for Accelerators (CCIX), Compute Express Link (CXL), and Open Coherent Accelerator Processor Interface (OpenCAPI).

Having described the elements and interconnections of FIG. 1, the discussion now turns to the buffers used by the technology disclosed for latency optimization in intra-node and inter-node processing.

Buffers

Figure 2A:
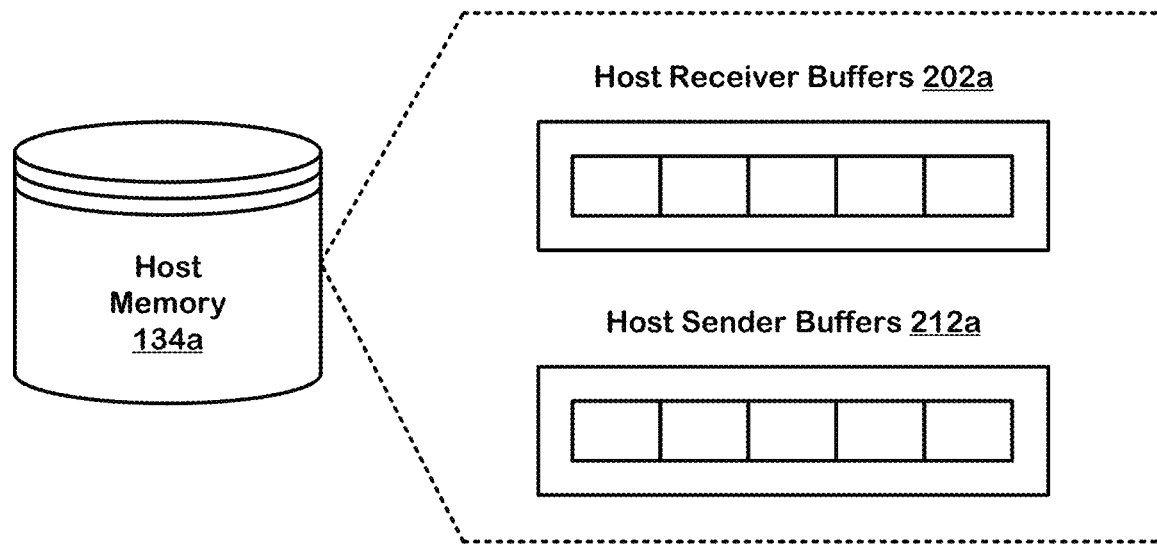
FIG. 2A shows host sender buffers and host receiver buffers located in a host memory of a first host processor of a first processing node in the data center of FIG. 1.

FIG. 2A shows host sender buffers 212a and host receiver buffers 202a located in the host memory 134a. The host sender buffers 212a are reconfigurable processors-to-host processor buffers that are configured to receive data from the reconfigurable processors 142a and provide the data to the first host processor 102a. The host receiver buffers 202a are host processor-to-reconfigurable processors buffers that are configured to receive data from the first host processor 102a and provide the data to the reconfigurable processors 142a. Examples of the data include scalar data (e.g., control bits) and vector data (e.g., vectors, tensors, arguments, commands) The host memory 134a, and therefore the host sender buffers 212a and the host receiver buffers 202a, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The host sender buffers 212a and the host receiver buffers 202a can be First-In, First-Out (FIFO) buffers, First-In, Last-Out (FILO) buffers, Last-In, First-Out (LIFO) buffers, Last-In, Last-Out (LILO) buffers, or circular buffers. The host sender buffers 212a and the host receiver buffers 202a can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 2B:
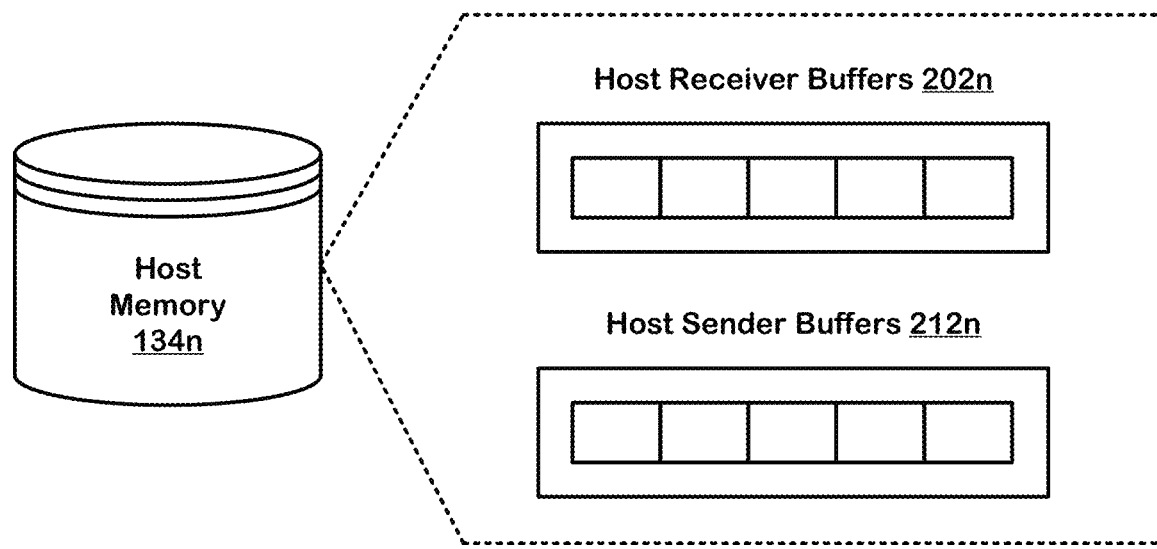
FIG. 2B shows host sender buffers and host receiver buffers located in a host memory of a second host processor of a second processing node in the data center of FIG. 1.

FIG. 2B shows host sender buffers 212n and host receiver buffers 202n located in the host memory 134n. The host sender buffers 212n are reconfigurable processors-to-host processor buffers that are configured to receive data from the reconfigurable processors 142n and provide the data to the second host processor 102n. The host receiver buffers 202n are host processor-to-reconfigurable processors buffers that are configured to receive data from the second host processor 102n and provide the data to the reconfigurable processors 142n. Examples of the data include scalar data (e.g., control bits) and vector data (e.g., vectors, tensors, arguments, commands) The host memory 134n, and therefore the host sender buffers 212n and the host receiver buffers 202n, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The host sender buffers 212n and the host receiver buffers 202n can be First-In, First-Out (FIFO) buffers, First-In, Last-Out (FILO) buffers, Last-In, First-Out (LIFO) buffers, Last-In, Last-Out (LILO) buffers, or circular buffers. The host sender buffers 212n and the host receiver buffers 202n can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 3A:
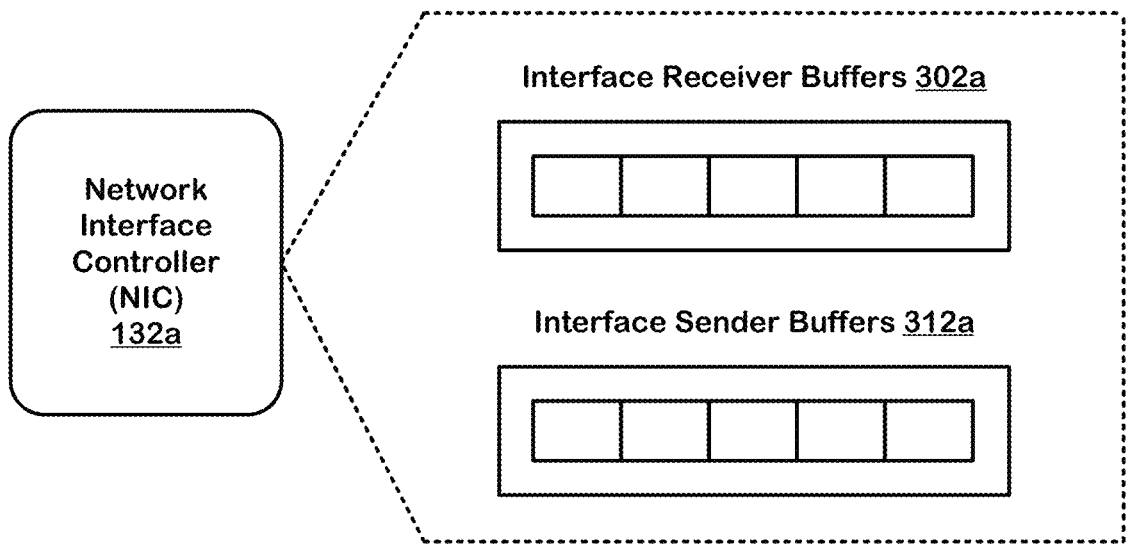
FIG. 3A shows interface sender buffers and interface receiver buffers located at a first Network Interface Controller operatively coupled to the first processing node.

FIG. 3A shows interface sender buffers 312a and interface receiver buffers 302a located at the Network Interface Controller 132a. The interface sender buffers 312a are reconfigurable processors-to-host processor buffers that are configured to receive data from the reconfigurable processors 142a and provide the data to the first host processor 102a. The interface receiver buffers 302a are host processor-to-reconfigurable processors buffers that are configured to receive data from the first host processor 102a and provide the data to the reconfigurable processors 142a. Examples of the data include scalar data (e.g., control bits) and vector data (e.g., vectors, tensors, arguments, commands) The Network Interface Controller 132a, and therefore the interface sender buffers 312a and the interface receiver buffers 302a, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The interface sender buffers 312a and the interface receiver buffers 302a can be First-In, First-Out (FIFO) buffers, First-In, Last-Out (FILO) buffers, Last-In, First-Out (LIFO) buffers, Last-In, Last-Out (LILO) buffers, or circular buffers. The interface sender buffers 312a and the interface receiver buffers 302a can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 3B:
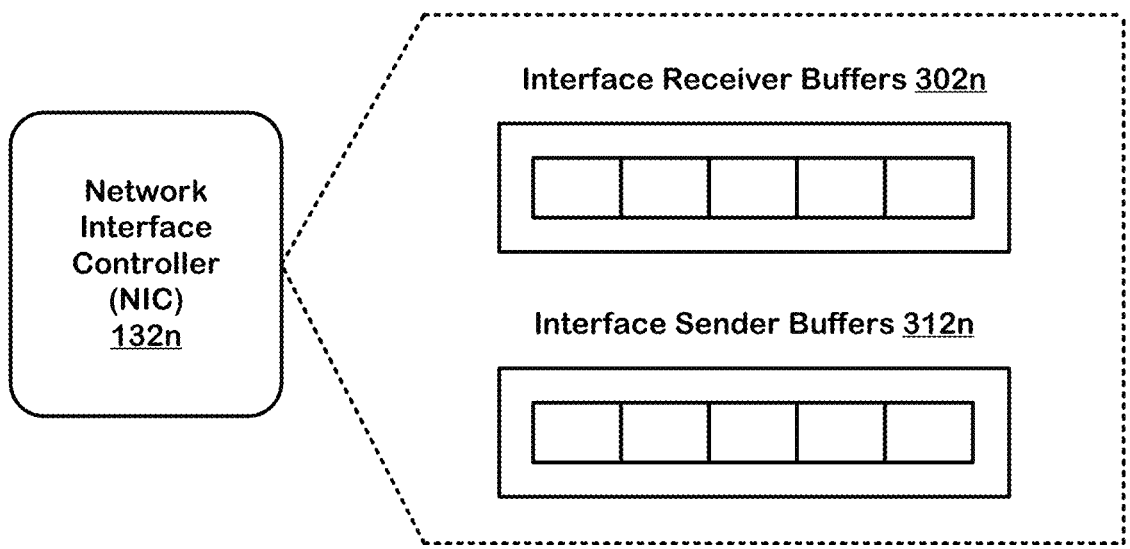
FIG. 3B shows interface sender buffers and interface receiver buffers located at a second Network Interface Controller operatively coupled to the second processing node.

FIG. 3B shows interface sender buffers 312n and interface receiver buffers 302n located at the Network Interface Controller 132n. The interface sender buffers 312n are reconfigurable processors-to-host processor buffers that are configured to receive data from the reconfigurable processors 142n and provide the data to the second host processor 102n. The interface receiver buffers 302n are host processor-to-reconfigurable processors buffers that are configured to receive data from the second host processor 102n and provide the data to the reconfigurable processors 142n.

Examples of the data include scalar data (e.g., control bits) and vector data (e.g., vectors, tensors, arguments, commands) The Network Interface Controller 132n, and therefore the interface sender buffers 312n and the interface receiver buffers 302n, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The interface sender buffers 312n and the interface receiver buffers 302n can be First-In, First-Out (FIFO) buffers, First-In, Last-Out (FILO) buffers, Last-In, First-Out (LIFO) buffers, Last-In, Last-Out (LILO) buffers, or circular buffers. The interface sender buffers 312n and the interface receiver buffers 302n can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 4A:
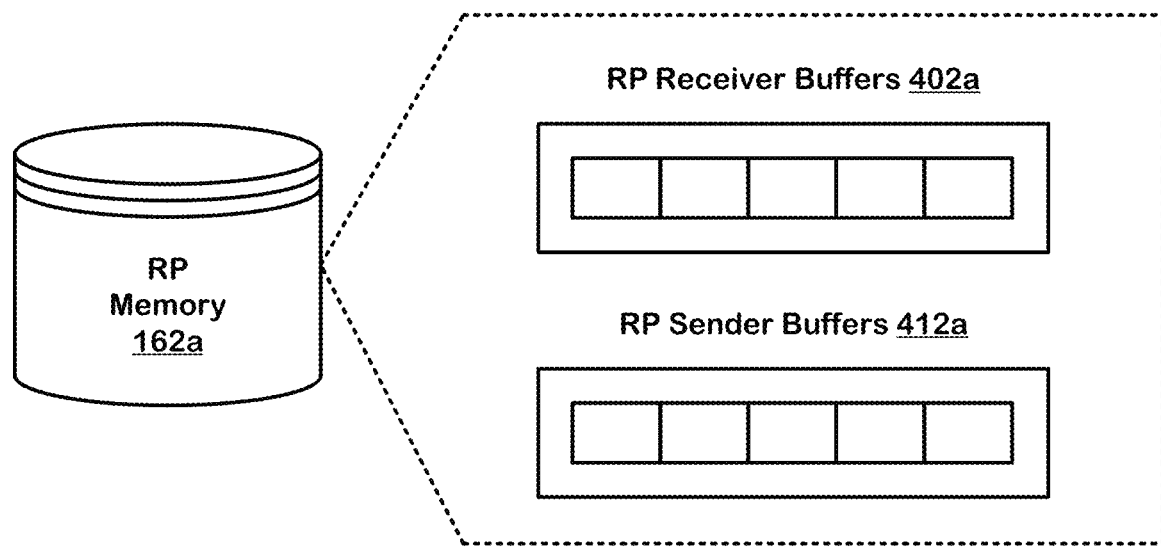
FIG. 4A shows reconfigurable processor (RP) sender buffers and reconfigurable processor receiver buffers located in a processor memory of a first reconfigurable processor operatively coupled to the first processing node.

FIG. 4A shows reconfigurable processor (RP) sender buffers 412a and reconfigurable processor (RP) receiver buffers 402a located in the reconfigurable processor memory 162a of the reconfigurable processors 142a. The reconfigurable processor sender buffers 412a are reconfigurable processors-to-host processor buffers that are configured to receive data from the reconfigurable processors 142a and provide the data to the first host processor 102a. The reconfigurable processor receiver buffers 402a are host processor-to-reconfigurable processors buffers that are configured to receive data from the first host processor 102a and provide the data to the reconfigurable processors 142a. Examples of the data include scalar data (e.g., control bits) and vector data (e.g., vectors, tensors, arguments, commands) The reconfigurable processor memory 162a, and therefore the reconfigurable processor sender buffers 412a and the reconfigurable processor receiver buffers 402a, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The reconfigurable processor sender buffers 412a and the reconfigurable processor receiver buffers 402a can be First-In, First-Out (FIFO) buffers, First-In, Last-Out (FILO) buffers, Last-In, First-Out (LIFO) buffers, Last-In, Last-Out (LILO) buffers, or circular buffers. The reconfigurable processor sender buffers 412a and the reconfigurable processor receiver buffers 402a can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

Figure 4B:
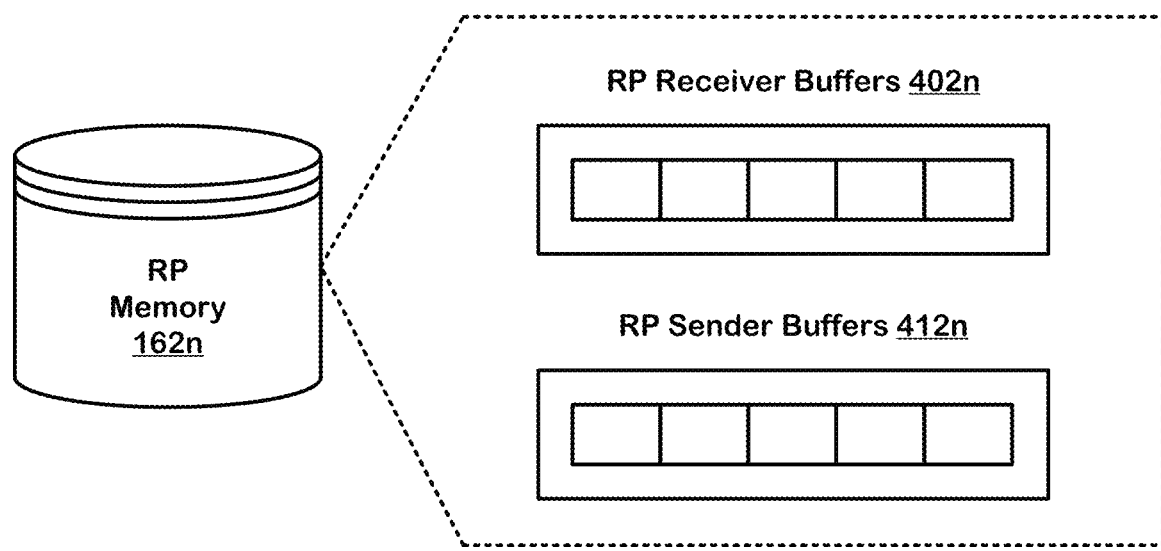
FIG. 4B shows reconfigurable processor sender buffers and reconfigurable processor receiver buffers located in a processor memory of a second reconfigurable processor operatively coupled to the second processing node.

FIG. 4B shows reconfigurable processor (RP) sender buffers 412n and reconfigurable processor (RP) receiver buffers 402n located in the reconfigurable processor memory 162n of the reconfigurable processors 142n. The reconfigurable processor sender buffers 412n are reconfigurable processors-to-host processor buffers that are configured to receive data from the reconfigurable processors 142n and provide the data to the second host processor 102n. The reconfigurable processor receiver buffers 402n are host processor-to-reconfigurable processors buffers that are configured to receive data from the second host processor 102n and provide the data to the reconfigurable processors 142n. Examples of the data include scalar data (e.g., control bits) and vector data (e.g., vectors, tensors, arguments, commands). The reconfigurable processor memory 162n, and therefore the reconfigurable processor sender buffers 412n and the reconfigurable processor receiver buffers 402n, are accessible to each of the host processors (e.g., first and second host processors 102a, 102n), each of the reconfigurable processors (e.g., reconfigurable processors 142a, 142n), and each of the Network Interface Controllers (e.g., Network Interface Controllers 132a, 132n) in the data center 100. The reconfigurable processor sender buffers 412n and the reconfigurable processor receiver buffers 402n can be First-In, First-Out (FIFO) buffers, First-In, Last-Out (FILO) buffers, Last-In, First-Out (LIFO) buffers, Last-In, Last-Out (LILO) buffers, or circular buffers. The reconfigurable processor sender buffers 412n and the reconfigurable processor receiver buffers 402n can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

The buffers can be defined by a virtual address space that maps to a physical range of memory addresses (which may be contiguous or discontiguous) in the memory. The virtual buffers are read from and written to at locations in the memory indicated using a read pointer and write pointer, respectively. The pointers are held in a memory (which may be the same as or separate to the memory holding the virtual buffer).

Having described the buffers, the discussion now turns to the debugging logic and the testing logic disclosed by the technology disclosed.

Debugging Logic and Testing Logic

Figure 5A:
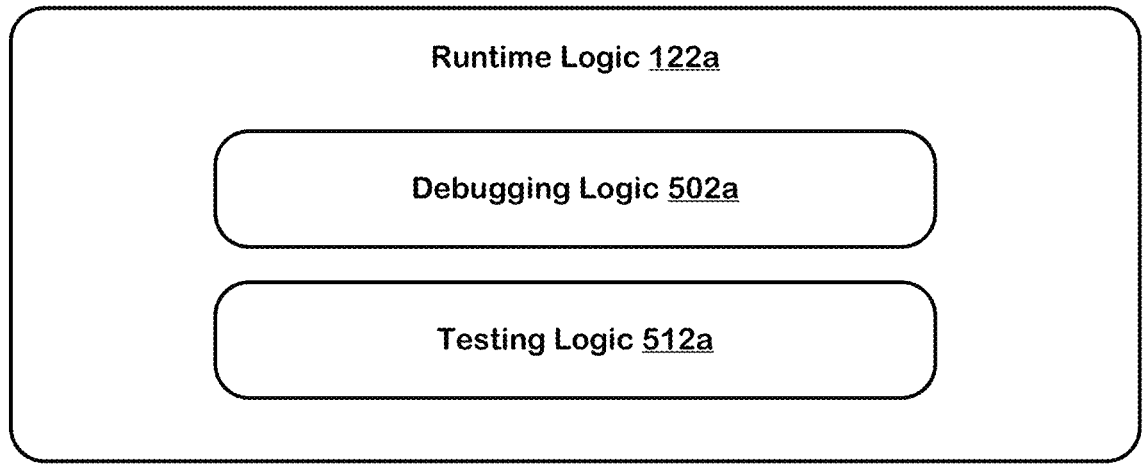
FIG. 5A is a heuristics diagram of a runtime logic running at the first host processor.

FIG. 5A is a heuristics diagram of the runtime logic 122a. The runtime logic 122a comprises debugging logic 502a and testing logic 512a. The runtime logic 122a is configured to load and execute one or more configuration files for applications on one or more of the reconfigurable processors 142a. The reconfigurable processors 142a are configured to process the configuration files and generate outputs, and to send the outputs to the first host processor 102a using at least one of the reconfigurable processors-to-host processor buffers (e.g., host sender buffers 212a, host sender buffers 212n, interface sender buffers 312a, interface sender buffers 312n, reconfigurable processor sender buffers 412a, reconfigurable processor sender buffers 412n).

The debugging logic 502a, running on the first host processor 102a, is configured to detect errors (e.g., in the execution of the configuration files). In one implementation, the debugging logic 502a is further configured to report the errors to a debugging console on the first host processor 102a based on comparison of the outputs to expected outputs. In another implementation, the debugging logic 502a is further configured to report the errors to a debug output file on the first host processor 102a based on the comparison of the outputs to the expected outputs.

In some implementations, debugging logic running on a particular host processor or reconfigurable processor in the data center 100 can report errors to any other host processor or reconfigurable processor in the data center 100. For example, the debugging logic 502a, running on the first host processor 102a, can report errors to a debugging console on the second host processor 102n based on comparison of outputs to expected outputs. In another example, the debugging logic 502a can report errors to a debug output file on the second host processor 102n based on comparison of the outputs to the expected outputs.

The runtime logic 122a is further configured to execute, on the reconfigurable processors 142a, one or more test configuration files for test applications. The reconfigurable processors 142*a* are further configured to process the test configuration files and generate test outputs, and to send the test outputs to the first host processor 102*a* using at least one of the reconfigurable processors-to-host processor buffers (e.g., host sender buffers 212*a*, host sender buffers 212*n*, interface sender buffers 312*a*, interface sender buffers 312*n*, reconfigurable processor sender buffers 412*a*, reconfigurable processor sender buffers 412*n*). The testing logic 512*a*, running on the first host processor 102*a*, is configured to determine test statistics based on the test outputs, and to report the test statistics to a test output file on the first host processor 102*a*.

In some implementations, testing logic running on a particular host processor or reconfigurable processor in the data center 100 can report test statistics to a test output file on any other host processor or reconfigurable processor in the data center 100. For example, the testing logic 512*a*, running on the first host processor 102*a*, can report test statistics to a test output file on the second host processor 102*n*.

Figure 5B:
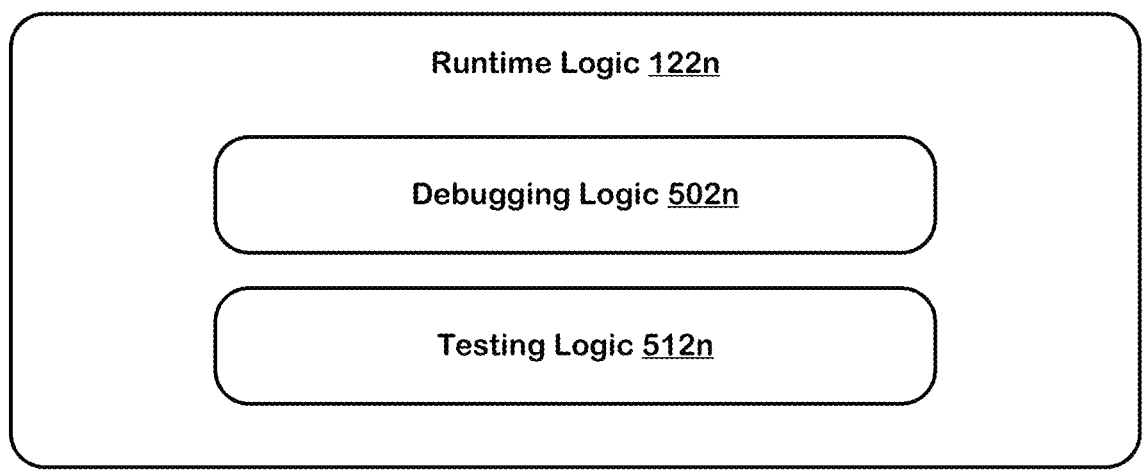
FIG. 5B is a heuristics diagram of a runtime logic running at the second host processor.

FIG. 5B is a heuristics diagram of the runtime logic 122*n*. The runtime logic 122*n* comprises debugging logic 502*n* and testing logic 512*n*. The runtime logic 122*n* is configured to load and execute one or more configuration files for applications on one or more of the reconfigurable processors 142*n*. The reconfigurable processors 142*n* are configured to process the configuration files and generate outputs, and to send the outputs to the second host processor 102*n* using at least one of the reconfigurable processors-to-host processor buffers (e.g., host sender buffers 212*a*, host sender buffers 212*n*, interface sender buffers 312*a*, interface sender buffers 312*n*, reconfigurable processor sender buffers 412*a*, reconfigurable processor sender buffers 412*n*).

The debugging logic 502*n*, miming on the second host processor 102*n*, is configured to detect errors (e.g., in execution of the configuration files). In one implementation, the debugging logic 502*n* is further configured to report errors to a debugging console on the second host processor 102*n* based on comparison of the outputs to expected outputs. In another implementation, the debugging logic 502*n* is further configured to report the errors to a debug output file on the second host processor 102*n* based on the comparison of the outputs to the expected outputs.

In some implementations, debugging logic running on a particular host processor or reconfigurable processor in the data center 100 can report errors to any other host processor or reconfigurable processor in the data center 100. For example, the debugging logic 502*n*, miming on the second host processor 102*n*, can report errors to a debugging console on the first host processor 102*a* based on comparison of outputs to expected outputs. In another example, the debugging logic 502*n* can report errors to a debug output file on the first host processor 102*a* based on comparison of outputs to expected outputs.

In some implementations, testing logic miming on a particular host processor or reconfigurable processor in the data center 100 can report test statistics to a test output file on any other host processor or reconfigurable processor in the data center 100. For example, the testing logic 512*n*, running on the second host processor 102*n*, can report test statistics to a test output file on the first host processor 102*a*.

Figure 6:
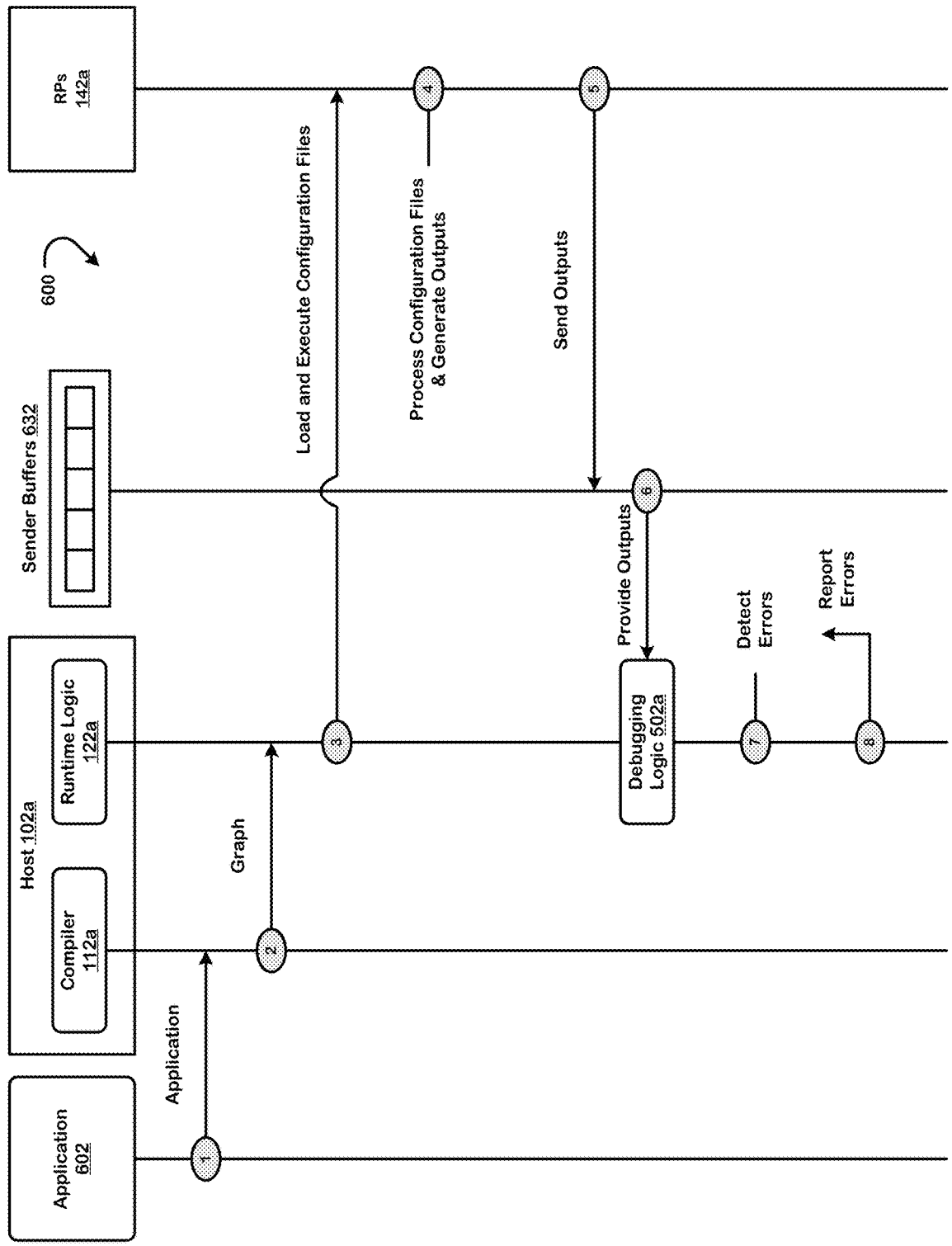
FIG. 6 is a message sequence chart illustrating one implementation of a debugging logic running at the first host processor and detecting errors in execution of configuration files on one or more of the reconfigurable processors operatively coupled to the first processing node.

FIG. 6 is a message sequence chart 600 illustrating one implementation of the debugging logic 502*a* detecting errors in execution of configuration files on one or more of the reconfigurable processors (RP) 142*a*. At operation one, the compiler 112*a* compiles an application 602 to generate a graph that includes one or more configuration files for the application 602. At operation two, the compiler 112*a* sends the graph to the runtime logic 122*a* for execution. At operation three, the runtime logic 122*a* loads the configuration files on one or more of the reconfigurable processors 142*a*. Once the configuration files have been loaded, the runtime logic 122*a* triggers execution of the bit file by sending an 'execution' (or start) command to the reconfigurable processors by writing to a particular CSR (control and status register) that exists for this purpose. At operation four, the reconfigurable processors 142*a* process the configuration files and generate outputs (e.g., vectors, tensors). At operation five, the reconfigurable processors 142*a* send the outputs to sender buffers 632 (or reconfigurable processors-to-host processor buffers). Examples of the sender buffers 632 include host sender buffers 212*a*, host sender buffers 212*n*, interface sender buffers 312*a*, interface sender buffers 312*n*, reconfigurable processor sender buffers 412*a*, and reconfigurable processor sender buffers 412*n*. At operation six, the sender buffers 632 provide the outputs to the debugging logic 502*a*. At operation seven, the debugging logic 502*a* detects errors in the execution of the configuration files based on comparison of the outputs to expected outputs. At operation eight, the debugging logic 502*a* reports the errors to a debugging console or a debug output file on the first host processor 102*a*. Other implementations may perform the operations in different orders and/or with different, fewer, or additional operations than the ones illustrated in FIG. 6. Multiple operations can be combined in some implementations.

One skilled in the art will appreciate that, in FIG. 6, operations three and six comprise streaming network packets between reconfigurable processors (e.g., RPs 142*a*) and a host processor (e.g., host 102*a*) on a same processing node 1 over local buses (e.g., PCIe buses) using a protocol like Transmission Control Protocol (TCP).

Figure 7:
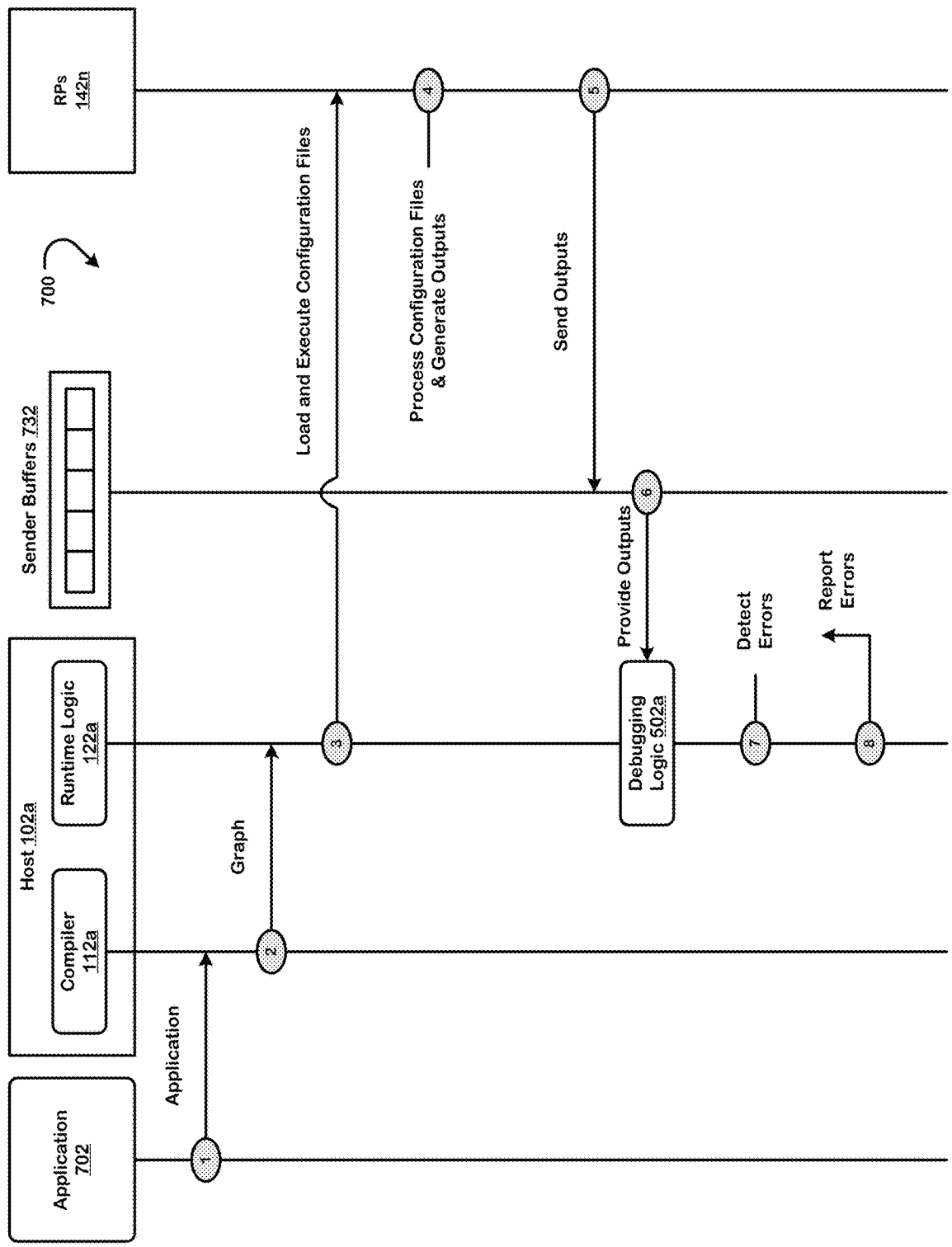
FIG. 7 is a message sequence chart illustrating one implementation of the debugging logic of FIG. 6 detecting errors in the execution of configuration files on one or more of the reconfigurable processors operatively coupled to the second processing node.

FIG. 7 is a message sequence chart 700 illustrating one implementation of the debugging logic 502*a* detecting errors in execution of configuration files on one or more of the reconfigurable processors (RP) 142*n*. At operation one, the compiler 112*a* compiles an application 702 to generate a graph that includes one or more configuration files for the application 702. At operation two, the compiler 112*a* sends the graph to the runtime logic 122*a* for execution. At operation three, the runtime logic 122*a* loads the configuration files on one or more of the reconfigurable processors 142*n*. Once the configuration files have been loaded, the runtime logic 122*a* triggers execution of the bit file by sending an 'execution' (or start) command to the reconfigurable processors by writing to a particular CSR that exists for this purpose. At operation four, the reconfigurable processors 142*n* process the configuration files and generate outputs (e.g., vectors, tensors). At operation five, the reconfigurable processors 142*n* send the outputs to sender buffers 732 (or reconfigurable processors-to-host processor buffers). Examples of the sender buffers 732 include host sender buffers 212*a*, host sender buffers 212*n*, interface sender buffers 312*a*, interface sender buffers 312*n*, reconfigurable processor sender buffers 412*a*, and reconfigurable processor sender buffers 412*n*. At operation six, the sender buffers 732 provide the outputs to the debugging logic 502*a*. At operation seven, the debugging logic 502*a* detects errors in the execution of the configuration files based on comparison of the outputs to expected outputs. At operation eight, the debugging logic 502*a* reports the errors to a debugging console or a debug output file on the first host processor 102*a*. Other implementations may perform the operations in different orders and/or with different, fewer, or additional operations than the ones illustrated in FIG. 7. Multiple operations can be combined in some implementations.

One skilled in the art will appreciate that, in FIG. 7, operations three and six comprise streaming network packets between one or more reconfigurable processors (e.g., RPs 142n) on the second processing node and a host processor (e.g., host 102a) on the first processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Figure 8:
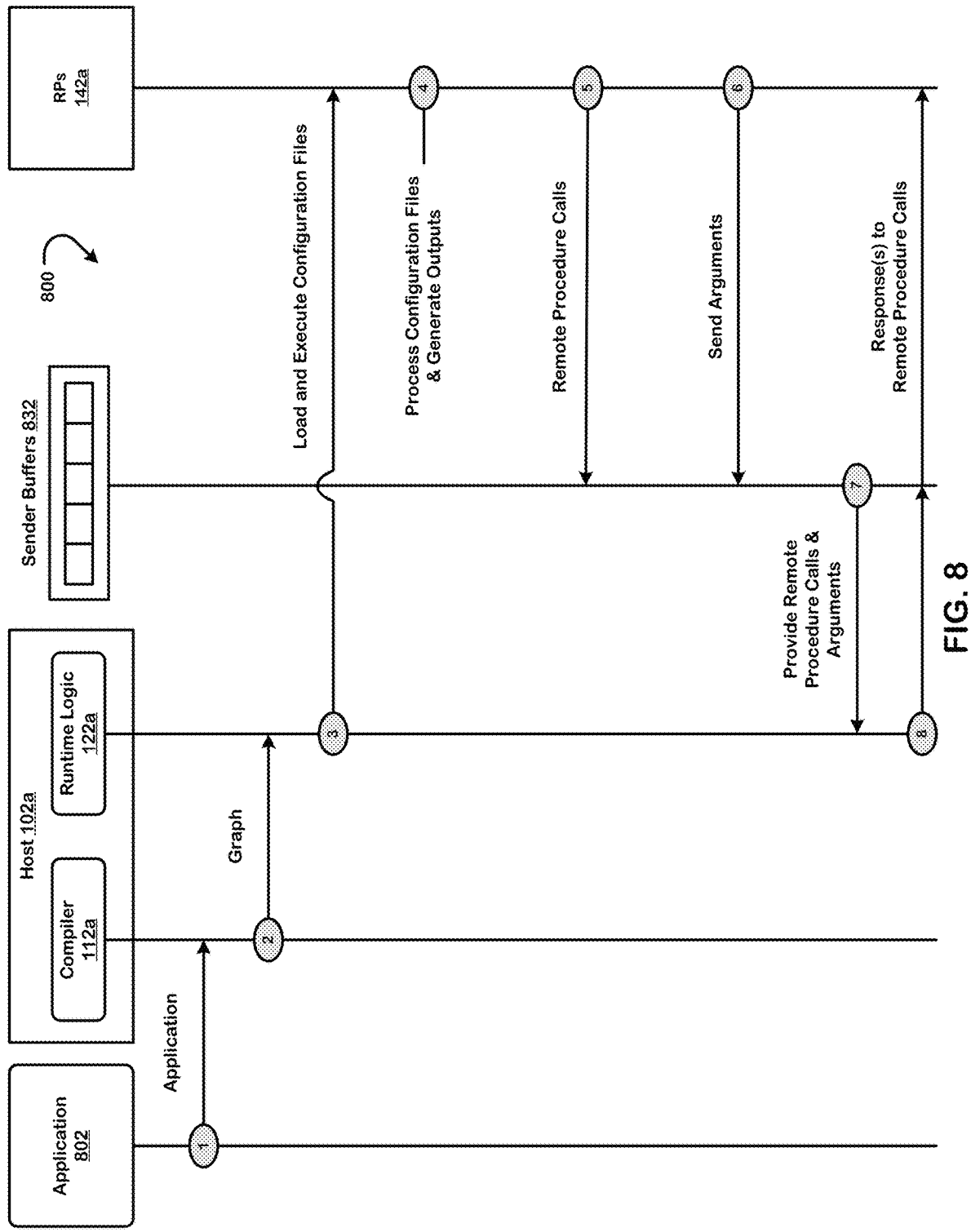
FIG. 8 is a message sequence chart illustrating one implementation of one or more of the reconfigurable processors operatively coupled to the first processing node issuing remote procedure calls to the first host processor.

FIG. 8 is a message sequence chart 800 illustrating one implementation of one or more of the reconfigurable processors (RP) 142a issuing remote procedure calls to the first host processor 102a. At operation one, the compiler 112a compiles an application 802 to generate a graph that includes one or more configuration files for the application 802. At operation two, the compiler 112a sends the graph to the runtime logic 122a for execution. At operation three, the runtime logic 122a loads the configuration files on one or more of the reconfigurable processors 142a. Once the configuration files have been loaded, the runtime logic 122a triggers execution of the bit file by sending an 'execution' (or start) command to the reconfigurable processors by writing to a particular CSR that exists for this purpose. At operation four, the reconfigurable processors 142a process the configuration files and generate outputs (e.g., vectors, tensors). At operation five, the reconfigurable processors 142a issue one or more remote procedure calls to the first host processor 102a using sender buffers 832 (or reconfigurable processors-to-host processor buffers). Examples of the sender buffers 832 include host sender buffers 212a, host sender buffers 212n, interface sender buffers 312a, interface sender buffers 312n, reconfigurable processor sender buffers 412a, and reconfigurable processor sender buffers 412n. In one implementation, the reconfigurable processors 142a notify the first host processor 102a of error reporting using the remote procedure calls. At operation six, the reconfigurable processors 142a use at least one of the sender buffers 832 to send one or more argument values to the first host processor 102a for execution of the remote procedure calls. At operation seven, the sender buffers 832 provide the remote procedure calls and the argument values to the runtime logic 122a. At operation 8, one or more responses to the remote procedure calls are sent to the reconfigurable processors 142n via the buffers (e.g., sender buffers of the first host processor 102a and receiver buffers of the reconfigurable processors 142a). Other implementations may perform the operations in different orders and/or with different, fewer, or additional operations than the ones illustrated in FIG. 8. Multiple operations can be combined in some implementations.

One skilled in the art will appreciate that, in FIG. 8, operations three and seven comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 9:
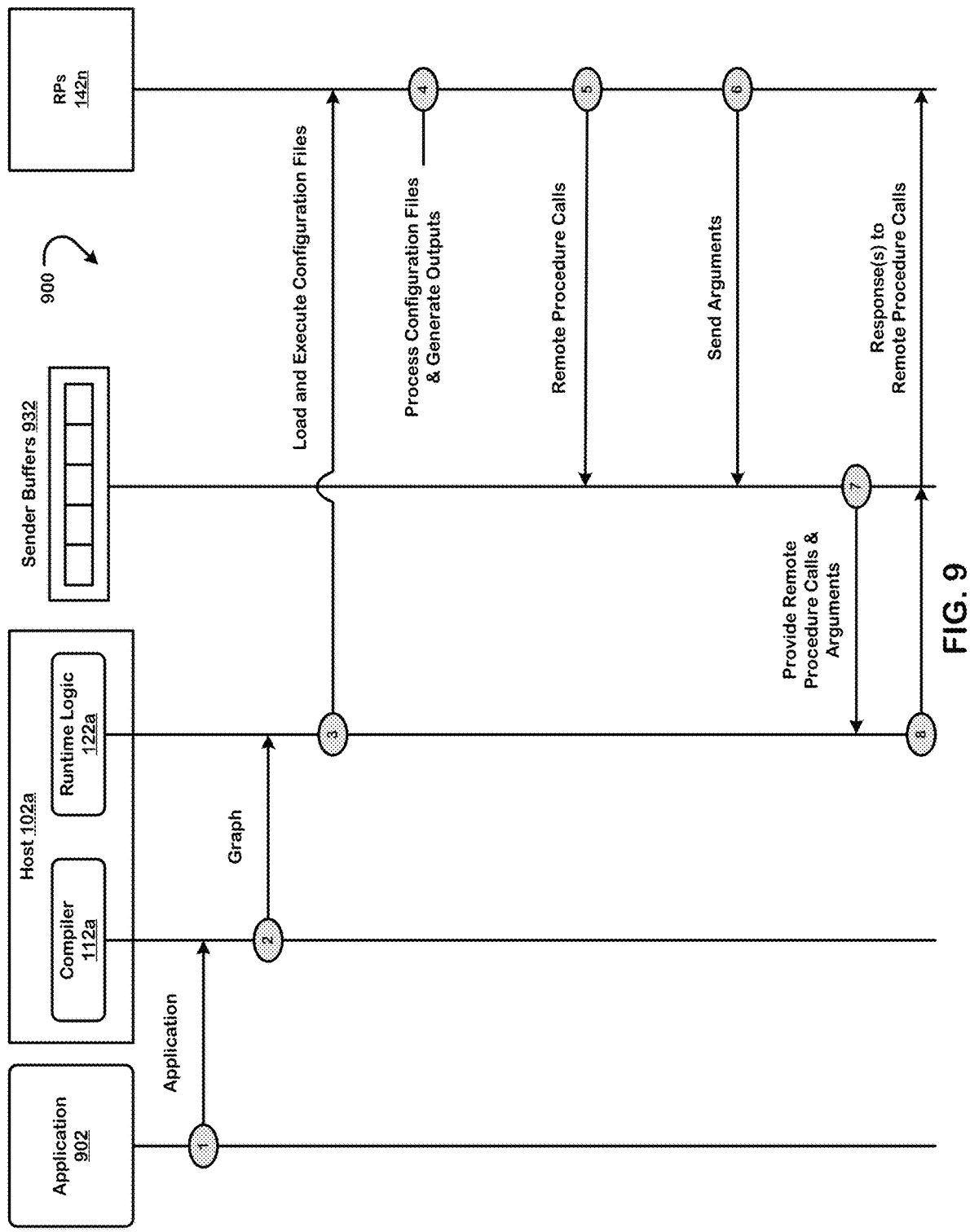
FIG. 9 is a message sequence chart illustrating one implementation of one or more of the reconfigurable processors operatively coupled to the second processing node issuing remote procedure calls to the first host processor.

FIG. 9 is a message sequence chart 900 illustrating one implementation of one or more of the reconfigurable processors (RP) 142n issuing remote procedure calls to the first host processor 102a. At operation one, the compiler 112a compiles an application 902 to generate a graph that includes one or more configuration files for the application 902. At operation two, the compiler 112a sends the graph to the runtime logic 122a for execution. At operation three, the runtime logic 122a loads the configuration files on one or more of the reconfigurable processors 142n. Once the configuration files have been loaded, the runtime logic 122a triggers execution of the bit file by sending an 'execution' (or start) command to the reconfigurable processors by writing to a particular CSR that exists for this purpose. At operation four, the reconfigurable processors 142n process the configuration files and generate outputs (e.g., vectors, tensors). At operation five, the reconfigurable processors 142n issue one or more remote procedure calls to the first host processor 102a using sender buffers 932 (or reconfigurable processors-to-host processor buffers). Examples of the sender buffers 932 include host sender buffers 212a, host sender buffers 212n, interface sender buffers 312a, interface sender buffers 312n, reconfigurable processor sender buffers 412a, and reconfigurable processor sender buffers 412n. In one implementation, the reconfigurable processors 142n notify the first host processor 102a of error reporting using the remote procedure calls. At operation six, the reconfigurable processors 142n use at least one of the sender buffers 932 to send one or more argument values to the first host processor 102a for execution of the remote procedure calls. At operation seven, the sender buffers 932 provide the remote procedure calls and the argument values to the runtime logic 122a. At operation 8, one or more responses to the remote procedure calls are sent to the reconfigurable processors 142n via the buffers (e.g., sender buffers of the first host processor 102a and receiver buffers of the reconfigurable processors 142n). Other implementations may perform the operations in different orders and/or with different, fewer, or additional operations than the ones illustrated in FIG. 9. Multiple operations can be combined in some implementations.

One skilled in the art will appreciate that, in FIG. 9, operations three and seven comprise streaming network packets between one or more reconfigurable processors (e.g., RPs 142n) on the second processing node and a host processor (e.g., host 102a) on the first processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Figure 10:
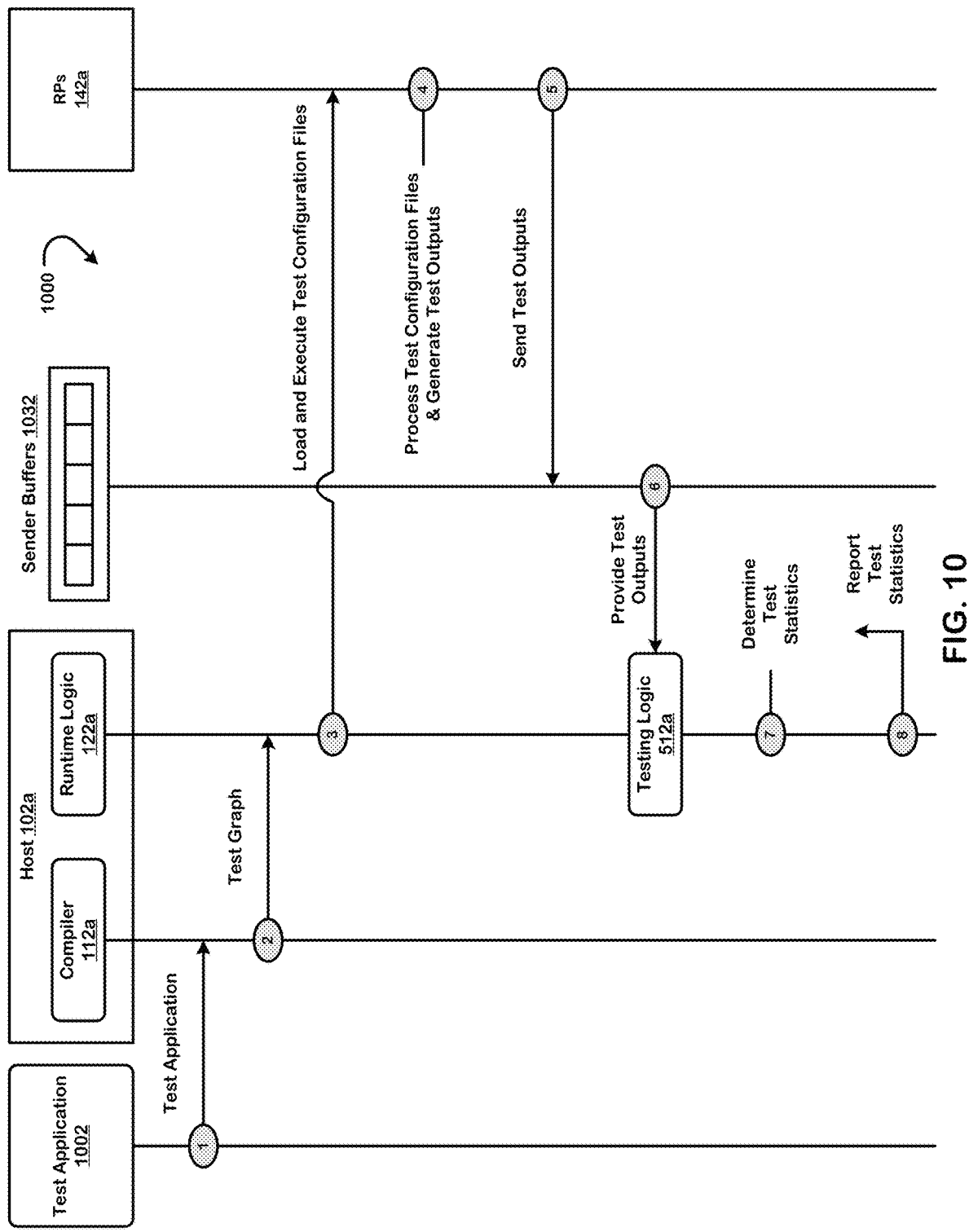
FIG. 10 is a message sequence chart illustrating one implementation of a testing logic running at the first host processor and determining and reporting test statistics for execution of test configuration files on one or more of the reconfigurable processors operatively coupled to the first processing node.

FIG. 10 is a message sequence chart 1000 illustrating one implementation of the testing logic 512a reporting test statistics for execution of test configuration files on one or more of the reconfigurable processors (RP) 142a. At operation one, the compiler 112a compiles a test application 1002 to generate a test graph that includes one or more test configuration files for the test application 1002. At operation two, the compiler 112a sends the test graph to the runtime logic 122a for execution. At operation three, the runtime logic 122a loads the test configuration files on one or more of the reconfigurable processors 142a. Once the configuration files have been loaded, the runtime logic 122a triggers execution of the bit file by sending an 'execution' (or start) command to the reconfigurable processors by writing to a particular CSR that exists for this purpose. At operation four, the reconfigurable processors 142a process the test configuration files and generate test outputs (e.g., vectors, tensors). At operation five, the reconfigurable processors 142a send the test outputs to sender buffers 1032 (or reconfigurable processors-to-host processor buffers). Examples of the sender buffers 1032 include host sender buffers 212a, host sender buffers 212n, interface sender buffers 312a, interface sender buffers 312n, reconfigurable processor sender buffers 412a, and reconfigurable processor sender buffers 412n. At operation six, the sender buffers 1032 provide the test outputs to the testing logic 512a. At operation seven, the testing logic 512a determines test statistics based on the test outputs. At operation eight, the testing logic 512a reports the test statistics to a test output file on the first host processor 102a. Other implementations may perform the operations in different orders and/or with different, fewer, or additional operations than the ones illustrated in FIG. 10. Multiple operations can be combined in some implementations.

One skilled in the art will appreciate that, in FIG. 10, operations three and six comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 11:
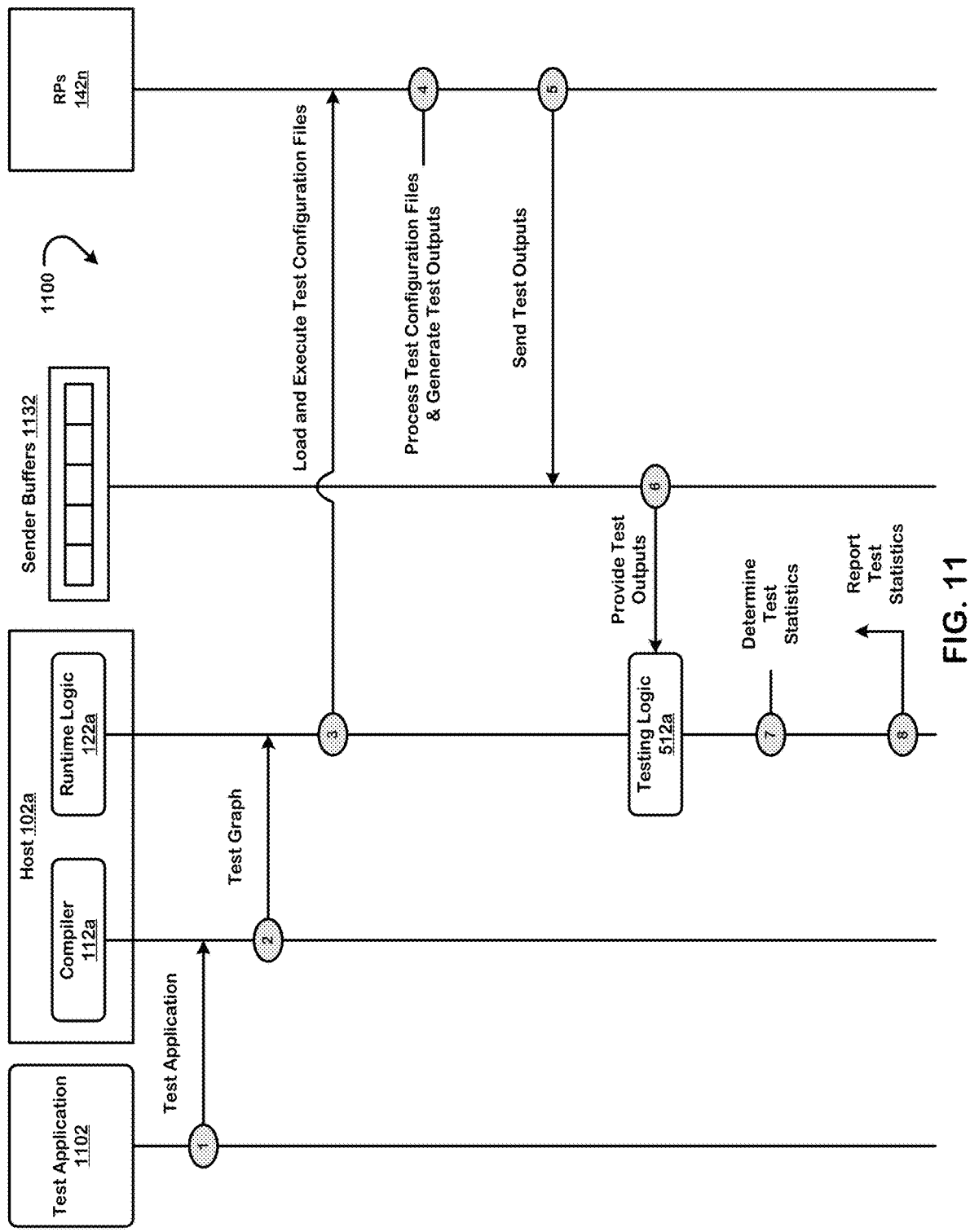
FIG. 11 is a message sequence chart illustrating one implementation of the testing logic of FIG. 10 determining and reporting test statistics for execution of test configuration files on one or more of the reconfigurable processors operatively coupled to the second processing node.

FIG. 11 is a message sequence chart 1100 illustrating one implementation of the testing logic 512a reporting test statistics for execution of test configuration files on one or more of the reconfigurable processors (RP) 142n. At operation one, the compiler 112a compiles a test application 1102 to generate a test graph that includes one or more test configuration files for the test application 1102. At operation two, the compiler 112a sends the test graph to the runtime logic 122a for execution. At operation three, the runtime logic 122a loads the test configuration files on one or more of the reconfigurable processors 142n Once the configuration files have been loaded, the runtime logic 122a triggers execution of the bit file by sending an 'execution' (or start) command to the reconfigurable processors by writing to a particular CSR that exists for this purpose. At operation four, the reconfigurable processors 142n process the test configuration files and generate test outputs (e.g., vectors, tensors). At operation five, the reconfigurable processors 142n send the test outputs to sender buffers 1132 (or reconfigurable processors-to-host processor buffers). Examples of the sender buffers 1132 include host sender buffers 212a, host sender buffers 212n, interface sender buffers 312a, interface sender buffers 312n, reconfigurable processor sender buffers 412a, and reconfigurable processor sender buffers 412n. At operation six, the sender buffers 1132 provide the test outputs to the testing logic 512a. At operation seven, the testing logic 512a determines test statistics based on the test outputs. At operation eight, the testing logic 512a reports the test statistics to a test output file on the first host processor 102a. Other implementations may perform the operations in different orders and/or with different, fewer, or additional operations than the ones illustrated in FIG. 11. Multiple operations can be combined in some implementations.

One skilled in the art will appreciate that, in FIG. 11, operations three and six comprise streaming network packets between one or more reconfigurable processors (e.g., RPs 142n) on the second processing node and a host processor (e.g., host 102a) on the first processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Having described the debugging logic and the testing logic, the discussion now turns to the reconfigurable processor-to-host processor workload sharing disclosed by the technology disclosed.

Reconfigurable Processor-to-Host Processor Workload Sharing

Figure 12:
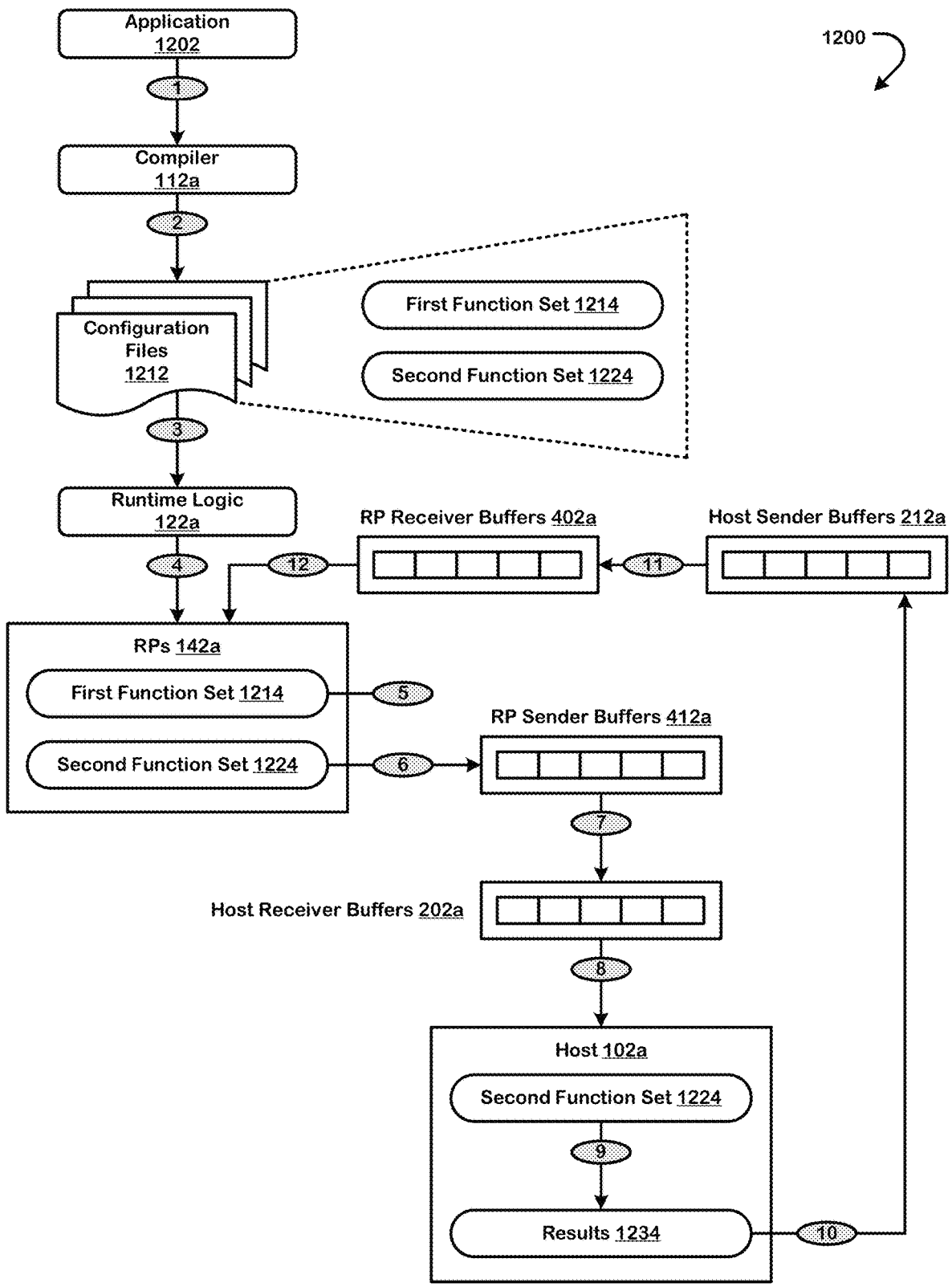
FIG. 12 is a message sequence chart illustrating one implementation of executing a first set of functions in configuration files on one or more of the reconfigurable processors operatively coupled to the first processing node and executing a second set of functions in the configuration files on the first host processor.

FIG. 12 is a message sequence chart 1200 illustrating one implementation of executing a first set of functions in configuration files and/or data therefor (e.g., weights, coefficients, vectors, tensors (image data, audio data, natural language processing (NLP data)), control data (e.g., control tokens)) on one or more of the reconfigurable processors (RP) 142a and executing a second set of functions and/or data therefor (e.g., weights, coefficients, vectors, tensors (image data, audio data, natural language processing (NLP data)), control data (e.g., control tokens)) in the configuration files on the first host processor 102a. At operation one, the compiler 112a receives an application 1202 for compilation. At operation two, the compiler 112a compiles the application 1202 to generate one or more configuration files 1212. The configuration files 1212 include a plurality of functions. The plurality of functions includes a first set of functions 1214 and a second set of functions 1224. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1212 to the runtime logic 122a for execution. At operation four, the runtime logic 122a loads the first set of functions 1214 and/or the data therefor (e.g., weights, coefficients, vectors, tensors (image data, audio data, natural language processing (NLP data)), control data (e.g., control tokens)) and the second set of functions 1224 and/or the data therefor (e.g., weights, coefficients, vectors, tensors (image data, audio data, natural language processing (NLP data)), control data (e.g., control tokens)) on one or more of the reconfigurable processors 142a. At operation five, the reconfigurable processors 142a process the first set of functions 1214 and/or the data therefor (e.g., weights, coefficients, vectors, tensors (image data, audio data, natural language processing (NLP data)), control data (e.g., control tokens)) and generate a first set of outputs (e.g., vectors, tensors). The reconfigurable processors 142a transmit functions in the second set of functions 1224 and/or the data therefor (e.g., weights, coefficients, vectors, tensors (image data, audio data, natural language processing (NLP data)), control data (e.g., control tokens)) to the first host processor 102a using one or more reconfigurable processors-to-host processor buffers. This is referred to herein as "reconfigurable processor-to-host processor workload sharing." In one implementation, data on which the functions in the second set of functions 1224 are executed is transmitted to the first host processor 102a using the reconfigurable processors-to-host processor buffers. In some implementations, respective ones of the reconfigurable processors-to-host processor buffers are used to transmit respective functions in the second set of functions 1224 and/or data therefor (e.g., weights, coefficients, vectors, tensors (image data, audio data, natural language processing (NLP data)), control data (e.g., control tokens)) to the first host processor 102a. One example workload sharing flow includes using one or more of the reconfigurable processor sender buffers 412a and one or more of the host receiver buffers 202a. At operation six, the reconfigurable processors 142a transmit the functions in the second set of functions 1224 and/or the data therefor (e.g., weights, coefficients, vectors, tensors (image data, audio data, natural language processing (NLP data)), control data (e.g., control tokens)) to the reconfigurable processor sender buffers 412a. At operation seven, the reconfigurable processor sender buffers 412a transmit the functions in the second set of functions 1224 and/or the data therefor (e.g., weights, coefficients, vectors, tensors (image data, audio data, natural language processing (NLP data)), control data (e.g., control tokens)) to the host receiver buffers 202a. At operation eight, the host receiver buffers 202a transmit the functions in the second set of functions 1224 and/or the data therefor (e.g., weights, coefficients, vectors, tensors (image data, audio data, natural language processing (NLP data)), control data (e.g., control tokens)) to the first host processor 102a. At operation nine, the first host processor 102a executes the functions in the second set of functions 1224 and/or the data therefor (e.g., weights, coefficients, vectors, tensors (image data, audio data, natural language processing (NLP data)), control data (e.g., control tokens)) to generate a second set of outputs (or results 1234) (e.g., vectors, tensors). The first host processor 102a transmits the results 1234 to one or more of the reconfigurable processors 142a using one or more host processor-to-reconfigurable processors buffers. In some implementations, respective ones of the host processor-to-reconfigurable processors buffers are used to transmit respective results of executing respective functions in the second set of functions 1224 and/or data therefor (e.g., weights, coefficients, vectors, tensors (image data, audio data, natural language processing (NLP data)), control data (e.g., control tokens)) to the reconfigurable processors 142a. One workload sharing flow includes using one or more of the host sender buffers 212a and one or more of the reconfigurable processor receiver buffers 402a. At operation ten, the first host processor 102a transmits the results 1234 to the host sender buffers 212a. At operation eleven, the host sender buffers 212a transmit the results 1234 to the reconfigurable processor receiver buffers 402a. At operation twelve, the reconfigurable processor receiver buffers 402a transmit the results 1234 to the reconfigurable processors 142a. In some implementations, one or more functions in the first set of functions 1214 waits for results of execution of one or more functions in the second set of functions 1224 and/or the data therefor (e.g., weights, coefficients, vectors, tensors (image data, audio data, natural language processing (NLP data)), control data (e.g., control tokens)) on the first host processor 102a to combine the results with results of execution of one or more functions in the first set of functions 1214 and/or the data therefor (e.g., weights, coefficients, vectors, tensors (image data, audio data, natural language processing (NLP data)), control data (e.g., control tokens)) on the reconfigurable processors 142a. In other implementations, the first set of functions 1214 and the second set of functions 1224 operate separately and in parallel. In one implementation, one or more functions in the second set of functions 1224 daisy chain the results to one or more functions in the first set of functions 1214, and vice-versa. In another implementation, one or more functions in the second set of functions 1224 execute for a certain number of iterations before returning the results to the reconfigurable processors 142a. Other implementations may perform the operations in different orders and/or with different, fewer, or additional operations than the ones illustrated in FIG. 12. Multiple operations can be combined in some implementations.

One skilled in the art will appreciate that, in FIG. 12, operations six, seven, eight, ten, eleven, and twelve comprise streaming network packets between reconfigurable processors (e.g., RPs 142a) and a host processor (e.g., host 102a) on a same processing node 1 over local buses (e.g., PCIe buses) using a protocol like Transmission Control Protocol (TCP).

Figure 13:
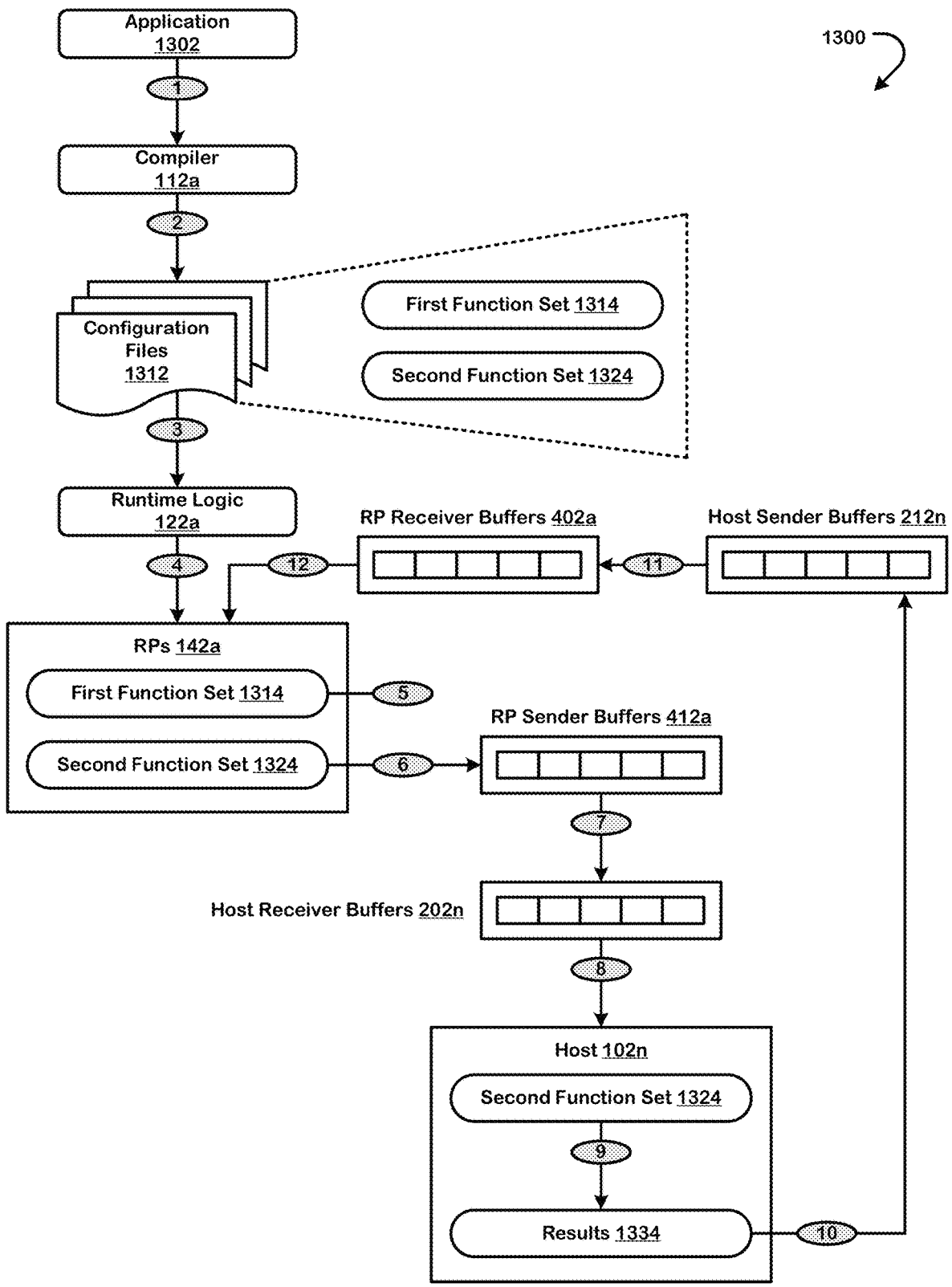
FIG. 13 is a message sequence chart illustrating one implementation of executing a first set of functions in configuration files on one or more of the reconfigurable processors operatively coupled to the first processing node and executing a second set of functions in the configuration files on the second host processor.

FIG. 13 is a message sequence chart 1300 illustrating one implementation of executing a first set of functions in configuration files and/or data therefor (e.g., weights, coefficients, vectors, tensors (image data, audio data, natural language processing (NLP data)), control data (e.g., control tokens)) on one or more of the reconfigurable processors (RP) 142a and executing a second set of functions and/or data therefor (e.g., weights, coefficients, vectors, tensors (image data, audio data, natural language processing (NLP data)), control data (e.g., control tokens)) in the configuration files on the second host processor 102n. At operation one, the compiler 112a receives an application 1302 for compilation. At operation two, the compiler 112a compiles the application 1302 to generate one or more configuration files 1312. The configuration files 1312 include a plurality of functions. The plurality of functions includes a first set of functions 1314 and a second set of functions 1324. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1312 to the runtime logic 122a for execution. At operation four, the runtime logic 122a loads the first set of functions 1314 and/or the data therefor (e.g., weights, coefficients, vectors, tensors (image data, audio data, natural language processing (NLP data)), control data (e.g., control tokens)) and the second set of functions 1324 and/or the data therefor (e.g., weights, coefficients, vectors, tensors (image data, audio data, natural language processing (NLP data)), control data (e.g., control tokens)) on one or more of the reconfigurable processors 142a. At operation five, the reconfigurable processors 142a process the first set of functions 1314 and/or the data therefor (e.g., weights, coefficients, vectors, tensors (image data, audio data, natural language processing (NLP data)), control data (e.g., control tokens)) and generate a first set of outputs (e.g., vectors, tensors). The reconfigurable processors 142a transmit functions in the second set of functions 1324 and/or data therefor (e.g., weights, coefficients, vectors, tensors (image data, audio data, natural language processing (NLP data)), control data (e.g., control tokens)) to the second host processor 102n using one or more reconfigurable processors-to-host processor buffers. This is referred to herein as "reconfigurable processor-to-host processor workload sharing." In one implementation, data on which the functions in the second set of functions 1324 are executed is transmitted to the second host processor 102n using the reconfigurable processors-to-host processor buffers. In some implementations, respective ones of the reconfigurable processors-to-host processor buffers are used to transmit respective functions in the second set of functions 1324 and/or data therefor (e.g., weights, coefficients, vectors, tensors (image data, audio data, natural language processing (NLP data)), control data (e.g., control tokens)) to the second host processor 102n. One example workload sharing flow includes using one or more of the reconfigurable processor sender buffers 412a and one or more of the host receiver buffers 202n. At operation six, the reconfigurable processors 142a transmit the functions in the second set of functions 1324 and/or the data therefor (e.g., weights, coefficients, vectors, tensors (image data, audio data, natural language processing (NLP data)), control data (e.g., control tokens)) to the reconfigurable processor sender buffers 412a. At operation seven, the reconfigurable processor sender buffers 412a transmit the functions in the second set of functions 1324 and/or the data therefor (e.g., weights, coefficients, vectors, tensors (image data, audio data, natural language processing (NLP data)), control data (e.g., control tokens)) to the host receiver buffers 202n. At operation eight, the host receiver buffers 202n transmit the functions in the second set of functions 1324 and/or the data therefor (e.g., weights, coefficients, vectors, tensors (image data, audio data, natural language processing (NLP data)), control data (e.g., control tokens)) to the second host processor 102n. At operation nine, the second host processor 102n executes the functions in the second set of functions 1324 and/or the data therefor (e.g., weights, coefficients, vectors, tensors (image data, audio data, natural language processing (NLP data)), control data (e.g., control tokens)) to generate a second set of outputs (or results 1334) (e.g., vectors, tensors). The second host processor 102n transmits the results 1334 to one or more of the reconfigurable processors 142a using one or more host processor-to-reconfigurable processors buffers. In some implementations, respective ones of the host processor-to-reconfigurable processors buffers are used to transmit respective results of executing respective functions in the second set of functions 1324 and/or data therefor (e.g., weights, coefficients, vectors, tensors (image data, audio data, natural language processing (NLP data)), control data (e.g., control tokens)) to the reconfigurable processors 142a. One workload sharing flow includes using one or more of the host sender buffers 212n and one or more of the reconfigurable processor receiver buffers 402a. At operation ten, the second host processor 102n transmits the results 1334 to the host sender buffers 212n. At operation eleven, the host sender buffers 212n transmit the results 1334 to the reconfigurable processor receiver buffers 402a. At operation twelve, the reconfigurable processor receiver buffers 402a transmit the results 1334 to the reconfigurable processors 142a. In some implementations, one or more functions in the first set of functions 1314 wait for results of execution of one or more functions in the second set of functions 1324 on the second host processor 102n to combine the results with results of execution of one or more functions in the first set of functions 1314 and/or the data therefor (e.g., weights, coefficients, vectors, tensors (image data, audio data, natural language processing (NLP data)), control data (e.g., control tokens)) on the reconfigurable processors 142a. In other implementations, the first set of functions 1314 and the second set of functions 1324 operate separately and in parallel. In one implementation, one or more functions in the second set of functions 1324 daisy chain the results to one or more functions in the first set of functions 1314, and vice-versa. In another implementation, one or more functions in the second set of functions 1324 executes for a certain number of iterations before returning the results to the reconfigurable processors 142a. Other implementations may perform the operations in different orders and/or with different, fewer, or additional operations than the ones illustrated in FIG. 13. Multiple operations can be combined in some implementations.

One skilled in the art will appreciate that, in FIG. 13, operations six, seven, eight, ten, eleven, and twelve comprise streaming network packets between one or more reconfigurable processors (e.g., RPs 142a) on the first processing node and a host processor (e.g., host 102n) on the second processing node over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Having described the reconfigurable processor-to-host processor workload sharing, the discussion now turns to the reconfigurable processor-to-reconfigurable processor workload sharing disclosed by the technology disclosed.

Reconfigurable Processor-to-Reconfigurable Processor Workload Sharing

Figure 14A:
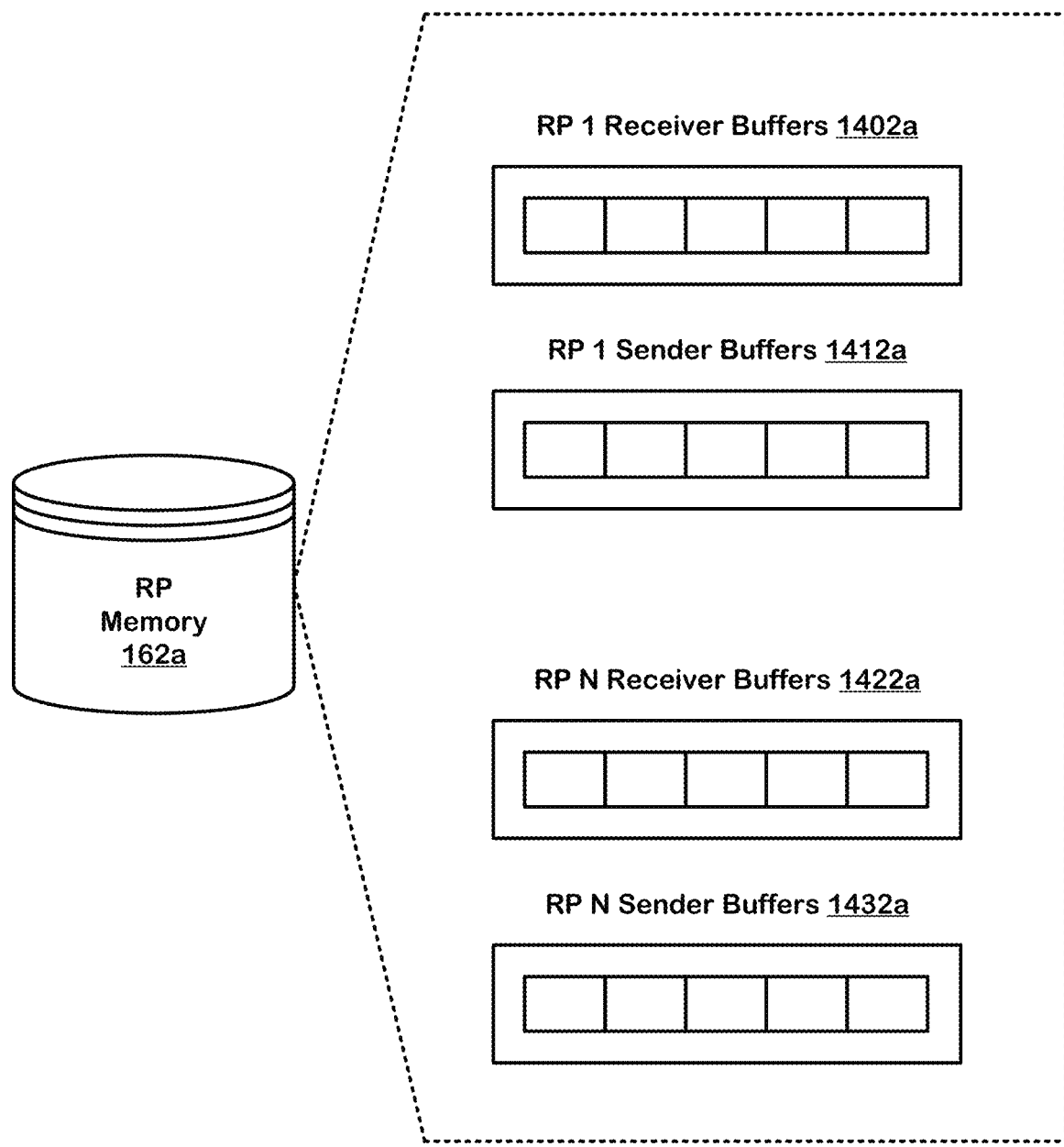
FIG. 14A shows sender and receiver buffers used by individual reconfigurable processors in the reconfigurable processors operatively coupled to the first processing node for data streaming.

FIG. 14A shows sender and receiver buffers used by individual reconfigurable processors in the reconfigurable processors 142a. Reconfigurable processor 1 (RP 1) receiver buffers 1402a and reconfigurable processor 1 (RP 1) sender buffers 1412a are used by a first reconfigurable processor in the reconfigurable processors 142a to receive data from and send data to another host processor or reconfigurable processor in the data center 100. Reconfigurable processor n (RP n) receiver buffers 1422a and reconfigurable processor n (RP n) sender buffers 1432a are used by a second reconfigurable processor in the reconfigurable processors 142a to receive data from and send data to another host processor or reconfigurable processor in the data center 100. The reconfigurable processor 1 receiver buffers 1402a, the reconfigurable processor 1 sender buffers 1412a, the reconfigurable processor n receiver buffers 1422a, and the reconfigurable processor n sender buffers 1432a are located in the reconfigurable processor memory 162a.

Figure 14B:
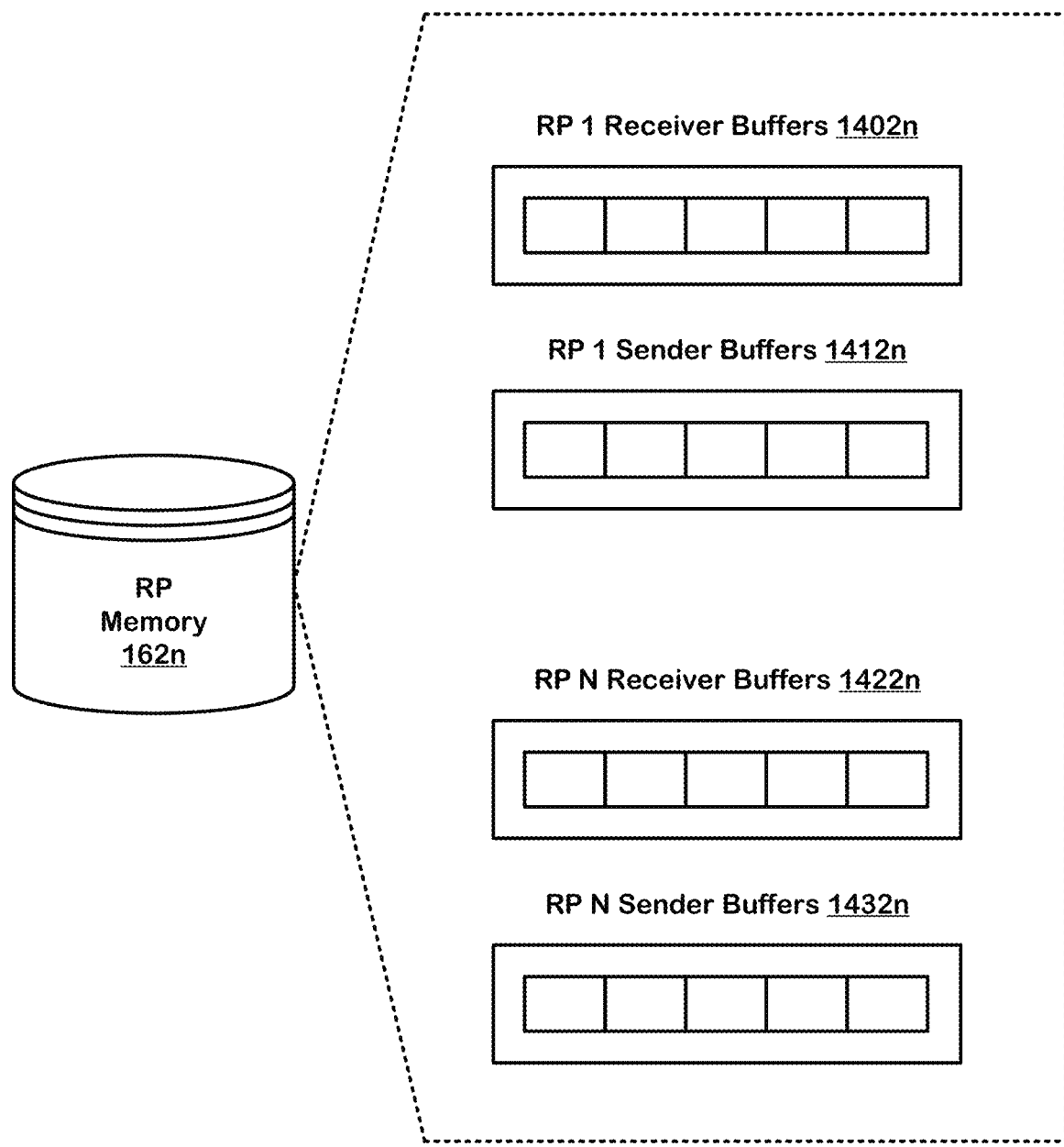
FIG. 14B shows sender and receiver buffers used by individual reconfigurable processors in the reconfigurable processors operatively coupled to the second processing node for data streaming.

FIG. 14B shows sender and receiver buffers used by individual reconfigurable processors in the reconfigurable processors 142n. Reconfigurable processor 1 (RP 1) receiver buffers 1402n and reconfigurable processor 1 (RP 1) sender buffers 1412n are used by a first reconfigurable processor in the reconfigurable processors 142n to receive data from and send data to another host processor or reconfigurable processor in the data center 100. Reconfigurable processor n (RP n) receiver buffers 1422n and reconfigurable processor n (RP n) sender buffers 1432n are used by a second reconfigurable processor in the reconfigurable processors 142n to receive data from and send data to another host processor or reconfigurable processor in the data center 100. The reconfigurable processor 1 receiver buffers 1402n, the reconfigurable processor 1 sender buffers 1412n, the reconfigurable processor n receiver buffers 1422n, and the reconfigurable processor n sender buffers 1432n are located in the reconfigurable processor memory 162n.

Intra-Node Processing

Figure 15:
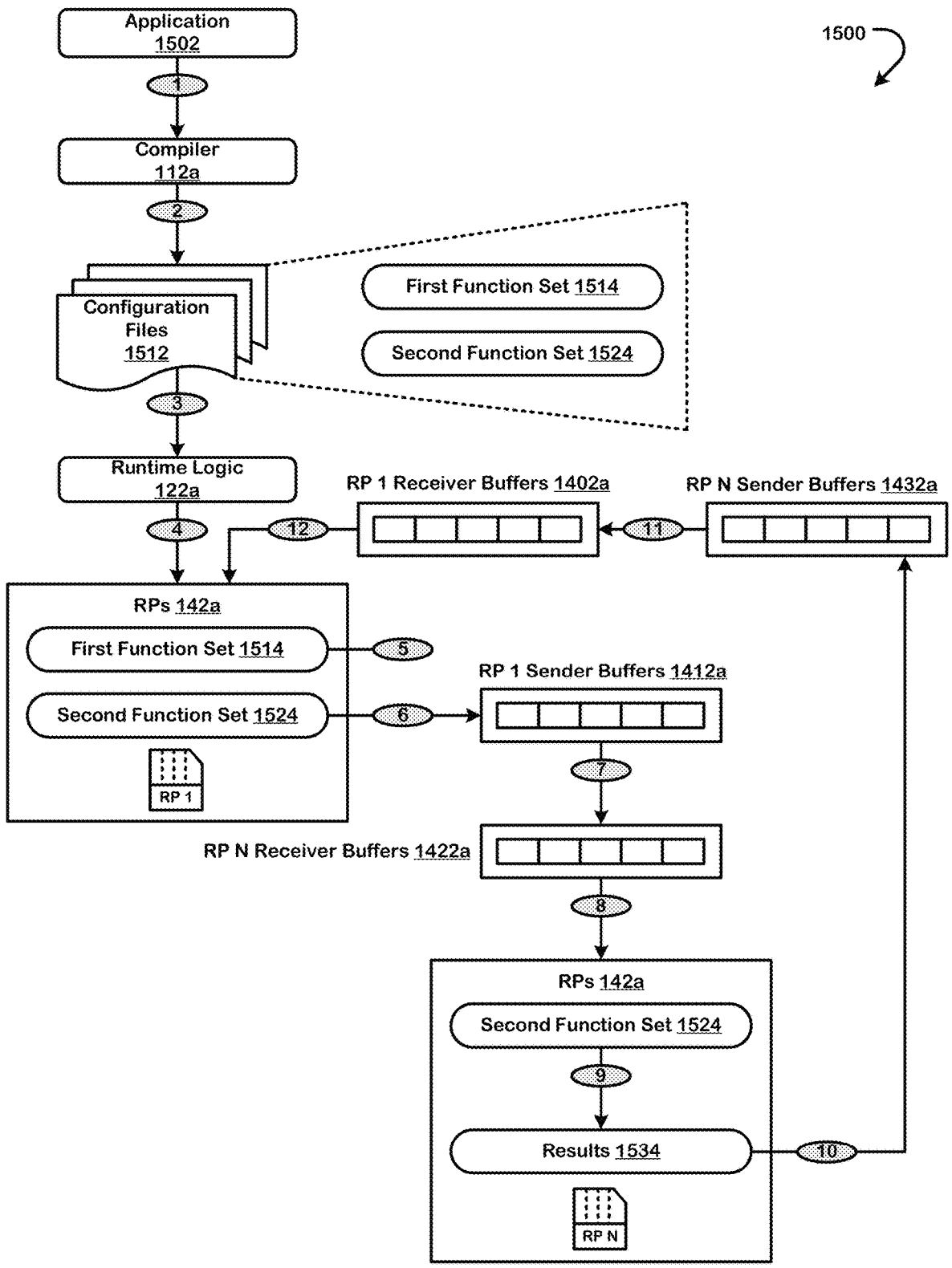
FIG. 15 is a message sequence chart illustrating one implementation of executing a first set of functions in configuration files on a first reconfigurable processor operatively coupled to the first processing node and executing a second set of functions in the configuration files on a second reconfigurable processor operatively coupled to the first processing node.

FIG. 15 is a message sequence chart 1500 illustrating one implementation of executing a first set of functions in configuration files and/or data therefor (e.g., weights, coefficients, vectors, tensors (image data, audio data, natural language processing (NLP data)), control data (e.g., control tokens)) on a first reconfigurable processor in the reconfigurable processors 142a and executing a second set of functions in the configuration files and/or data therefor (e.g., weights, coefficients, vectors, tensors (image data, audio data, natural language processing (NLP data)), control data (e.g., control tokens)) on a second reconfigurable processor in the reconfigurable processors 142a. In FIG. 15, the first reconfigurable processor is identified as "RP 1" and the second reconfigurable processor is identified as "RP N." Note that the first reconfigurable processor and the second reconfigurable processor are operatively coupled to a same processing node, i.e., the first processing node. This is referred to herein as "intra-node processing." At operation one, the compiler 112a receives an application 1502 for compilation. At operation two, the compiler 112a compiles the application 1502 to generate one or more configuration files 1512. The configuration files 1512 include a plurality of functions. The plurality of functions includes a first set of functions 1514 and a second set of functions 1524. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1512 to the runtime logic 122a for execution. At operation four, the runtime logic 122a loads the first set of functions 1514 and/or the data therefor (e.g., weights, coefficients, vectors, tensors (image data, audio data, natural language processing (NLP data)), control data (e.g., control tokens)) and the second set of functions 1524 and/or the data therefor (e.g., weights, coefficients, vectors, tensors (image data, audio data, natural language processing (NLP data)), control data (e.g., control tokens)) on the first reconfigurable processor. At operation five, the first reconfigurable processor processes the first set of functions 1514 and/or the data therefor (e.g., weights, coefficients, vectors, tensors (image data, audio data, natural language processing (NLP data)), control data (e.g., control tokens)) and generates a first set of outputs (e.g., vectors, tensors). The first reconfigurable processor transmits functions in the second set of functions 1524 and/or data therefor (e.g., weights, coefficients, vectors, tensors (image data, audio data, natural language processing (NLP data)), control data (e.g., control tokens)) to the second reconfigurable processor using one or more reconfigurable processors-to-reconfigurable processors buffers. This is referred to herein as "reconfigurable processor-to-reconfigurable processor workload sharing." In one implementation, data on which the functions in the second set of functions 1524 and/or the data therefor (e.g., weights, coefficients, vectors, tensors (image data, audio data, natural language processing (NLP data)), control data (e.g., control tokens)) are executed is transmitted to the second reconfigurable processor using the reconfigurable processors-to-reconfigurable processors buffers. In some implementations, respective ones of the reconfigurable processors-to-reconfigurable processors buffers are used to transmit respective functions in the second set of functions 1524 and/or data therefor (e.g., weights, coefficients, vectors, tensors (image data, audio data, natural language processing (NLP data)), control data (e.g., control tokens)) to the second reconfigurable processor. One example workload sharing flow includes using one or more of the reconfigurable processor 1 (RP 1) sender buffers 1412a and one or more of the reconfigurable processor N (RP N) receiver buffers 1422a. At operation six, the first reconfigurable processor transmits the functions in the second set of functions 1524 and/or the data therefor (e.g., weights, coefficients, vectors, tensors (image data, audio data, natural language processing (NLP data)), control data (e.g., control tokens)) to the reconfigurable processor 1 sender buffers 1412a. At operation seven, the reconfigurable processor 1 sender buffers 1412a transmit the functions in the second set of functions 1524 and/or the data therefor (e.g., weights, coefficients, vectors, tensors (image data, audio data, natural language processing (NLP data)), control data (e.g., control tokens)) to the reconfigurable processor N receiver buffers 1422a. At operation eight, the reconfigurable processor N receiver buffers 1422a transmit the functions in the second set of functions 1524 and/or the data therefor (e.g., weights, coefficients, vectors, tensors (image data, audio data, natural language processing (NLP data)), control data (e.g., control tokens)) to the second reconfigurable processor. At operation nine, the second reconfigurable processor executes the functions in the second set of functions 1524 and/or the data therefor (e.g., weights, coefficients, vectors, tensors (image data, audio data, natural language processing (NLP data)), control data (e.g., control tokens)) to generate a second set of outputs (or results 1534) (e.g., vectors, tensors). The second reconfigurable processor transmits the results 1534 to the first reconfigurable processor using one or more of the reconfigurable processors-to-reconfigurable processors buffers. In some implementations, respective ones of the reconfigurable processors-to-reconfigurable processors buffers are used to transmit respective results of executing respective functions in the second set of functions 1524 and/or data therefor (e.g., weights, coefficients, vectors, tensors (image data, audio data, natural language processing (NLP data)), control data (e.g., control tokens)) to the first reconfigurable processor. One workload sharing flow includes using one or more of the reconfigurable processor N (RP N) sender buffers 1432a and one or more of the reconfigurable processor 1 (RP 1) receiver buffers 1402a. At operation ten, the second reconfigurable processor transmits the results 1534 to the reconfigurable processor N sender buffers 1432a. At operation eleven, the reconfigurable processor N sender buffers 1432a transmit the results 1534 to the reconfigurable processor 1 receiver buffers 1402a. At operation twelve, the reconfigurable processor 1 receiver buffers 1402a transmit the results 1534 to the first reconfigurable processor. In some implementations, one or more functions in the first set of functions 1514 waits for results of execution of one or more functions in the second set of functions 1524 on the second reconfigurable processor to combine the results with results of execution of one or more functions in the first set of functions 1514 and/or the data therefor (e.g., weights, coefficients, vectors, tensors (image data, audio data, natural language processing (NLP data)), control data (e.g., control tokens)) on the first reconfigurable processor. In other implementations, the first set of functions 1514 and the second set of functions 1524 operate separately and in parallel. In one implementation, one or more functions in the second set of functions 1524 daisy chain the results to one or more functions in the first set of functions 1514, and vice-versa. In another implementation, one or more functions in the second set of functions 1524 executes for a certain number of iterations before returning the results to the first reconfigurable processor. Other implementations may perform the operations in different orders and/or with different, fewer, or additional operations than the ones illustrated in FIG. 15. Multiple operations can be combined in some implementations.

One skilled in the art will appreciate that, in FIG. 15, operations six, seven, eight, ten, eleven, and twelve comprise streaming network packets between reconfigurable processors on a same processing node 1 over local buses (e.g., PCIe buses) using a protocol like Transmission Control Protocol (TCP).

Inter-Node Processing

Figure 16:
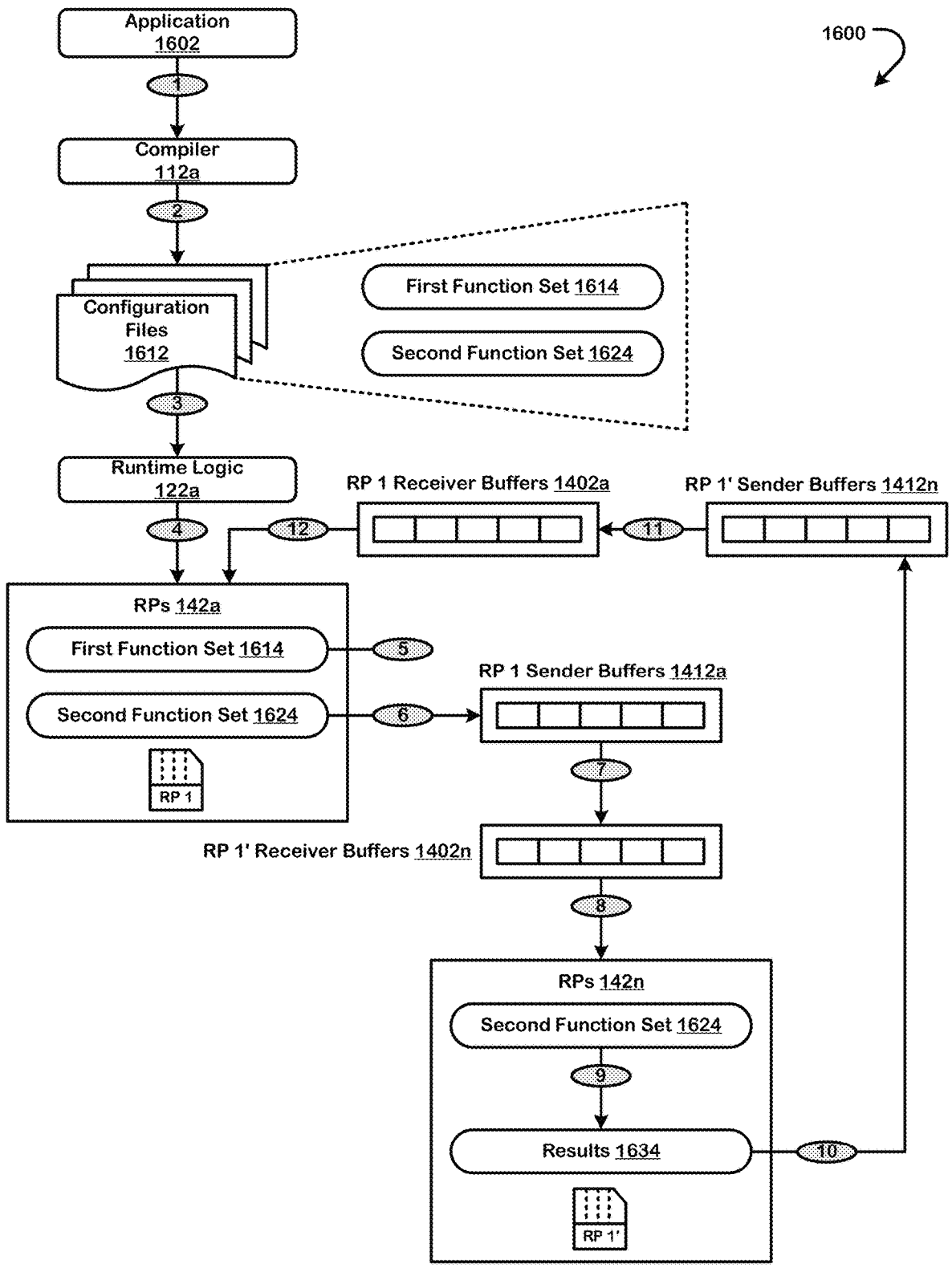
FIG. 16 is a message sequence chart illustrating one implementation of executing a first set of functions in configuration files on a first reconfigurable processor operatively coupled to the first processing node and executing a second set of functions in the configuration files on a first reconfigurable processor operatively coupled to the second processing node.

FIG. 16 is a message sequence chart 1600 illustrating one implementation of executing a first set of functions in configuration files and/or data therefor (e.g., weights, coefficients, vectors, tensors (image data, audio data, natural language processing (NLP data)), control data (e.g., control tokens)) on a first reconfigurable processor in the reconfigurable processors 142a and executing a second set of functions in the configuration files and/or data therefor (e.g., weights, coefficients, vectors, tensors (image data, audio data, natural language processing (NLP data)), control data (e.g., control tokens)) on a first reconfigurable processor in the reconfigurable processors 142n. In FIG. 16, the first reconfigurable processor in the reconfigurable processors 142a is identified as "RP 1" and the first reconfigurable processor in the reconfigurable processors 142n is identified as "RP 1'." Note that the first reconfigurable processor in the reconfigurable processors 142a and the first reconfigurable processor in the reconfigurable processors 142n are operatively coupled to different processing nodes, i.e., the first processing node and the second processing node. This is referred to herein as "inter-node processing." At operation one, the compiler 112a receives an application 1602 for compilation. At operation two, the compiler 112a compiles the application 1602 to generate one or more configuration files 1612. The configuration files 1612 include a plurality of functions. The plurality of functions includes a first set of functions 1614 and a second set of functions 1624. Examples of functions in the plurality of functions include non-linearities like Rectified Linear Unit (ReLU) and its variants (e.g., leaky ReLU), hyperbolic tangent, sigmoid, and softmax, element-wise addition, matrix multiplication (e.g., General Matrix Multiply (GeMM)), layer normalization (e.g., batch normalization), loss functions like cross-entropy, and tensor shape modifiers like transpose. At operation three, the compiler 112a sends the configuration files 1612 to the runtime logic 122a for execution. At operation four, the runtime logic 122a loads the first set of functions 1614 and/or the data therefor (e.g., weights, coefficients, vectors, tensors (image data, audio data, natural language processing (NLP data)), control data (e.g., control tokens)) and the second set of functions 1624 and/or the data therefor (e.g., weights, coefficients, vectors, tensors (image data, audio data, natural language processing (NLP data)), control data (e.g., control tokens)) on the first reconfigurable processor in the reconfigurable processors 142a. At operation five, the first reconfigurable processor in the reconfigurable processors 142a processes the first set of functions 1614 and/or the data therefor (e.g., weights, coefficients, vectors, tensors (image data, audio data, natural language processing (NLP data)), control data (e.g., control tokens)) and generates a first set of outputs (e.g., vectors, tensors). The first reconfigurable processor in the reconfigurable processors 142a transmits functions in the second set of functions 1624 and/or data therefor (e.g., weights, coefficients, vectors, tensors (image data, audio data, natural language processing (NLP data)), control data (e.g., control tokens)) to the first reconfigurable processor in the reconfigurable processors 142n using one or more reconfigurable processors-to-reconfigurable processors buffers. This is referred to herein as "reconfigurable processor-to-reconfigurable processor workload sharing." In one implementation, data on which the functions in the second set of functions 1624 and/or the data therefor (e.g., weights, coefficients, vectors, tensors (image data, audio data, natural language processing (NLP data)), control data (e.g., control tokens)) are executed is transmitted to the first reconfigurable processor in the reconfigurable processors 142n using the reconfigurable processors-to-reconfigurable processors buffers. In some implementations, respective ones of the reconfigurable processors-to-reconfigurable processors buffers are used to transmit respective functions in the second set of functions 1624 and/or data therefor (e.g., weights, coefficients, vectors, tensors (image data, audio data, natural language processing (NLP data)), control data (e.g., control tokens)) to the first reconfigurable processor in the reconfigurable processors 142n. One example workload sharing flow includes using one or more of the reconfigurable processor 1 (RP 1) sender buffers 1412a and one or more of the reconfigurable processor 1' (RP 1') receiver buffers 1402n. At operation six, the first reconfigurable processor in the reconfigurable processors 142a transmits the functions in the second set of functions 1624 and/or the data therefor (e.g., weights, coefficients, vectors, tensors (image data, audio data, natural language processing (NLP data)), control data (e.g., control tokens)) to the reconfigurable processor 1 sender buffers 1412a. At operation seven, the reconfigurable processor 1 sender buffers 1412a transmit the functions in the second set of functions 1624 and/or the data therefor (e.g., weights, coefficients, vectors, tensors (image data, audio data, natural language processing (NLP data)), control data (e.g., control tokens)) to the reconfigurable processor 1' receiver buffers 1402n. At operation eight, the reconfigurable processor 1' receiver buffers 1402n transmit the functions in the second set of functions 1624 and/or the data therefor (e.g., weights, coefficients, vectors, tensors (image data, audio data, natural language processing (NLP data)), control data (e.g., control tokens)) to the first reconfigurable processor in the reconfigurable processors 142n. At operation nine, the first reconfigurable processor in the reconfigurable processors 142n executes the functions in the second set of functions 1624 and/or the data therefor (e.g., weights, coefficients, vectors, tensors (image data, audio data, natural language processing (NLP data)), control data (e.g., control tokens)) to generate a second set of outputs (or results 1634) (e.g., vectors, tensors). The first reconfigurable processor in the reconfigurable processors 142n transmits the results 1634 to the first reconfigurable processor in the reconfigurable processors 142a using one or more of the reconfigurable processors-to-reconfigurable processors buffers. In some implementations, respective ones of the reconfigurable processors-to-reconfigurable processors buffers are used to transmit respective results of executing respective functions in the second set of functions 1624 and/or data therefor (e.g., weights, coefficients, vectors, tensors (image data, audio data, natural language processing (NLP data)), control data (e.g., control tokens)) to the first reconfigurable processor in the reconfigurable processors 142a. One workload sharing flow includes using one or more of the reconfigurable processor 1' (RP 1') sender buffers 1412n and one or more of the reconfigurable processor 1 (RP 1) receiver buffers 1402a. At operation ten, the first reconfigurable processor in the reconfigurable processors 142n transmits the results 1634 to the reconfigurable processor 1' sender buffers 1412n. At operation eleven, the reconfigurable processor 1' sender buffers 1412n transmit the results 1634 to the reconfigurable processor 1 receiver buffers 1402a. At operation twelve, the reconfigurable processor 1 receiver buffers 1402a transmit the results 1634 to the first reconfigurable processor in the reconfigurable processors 142a. In some implementations, one or more functions in the first set of functions 1614 waits for results of execution of one or more functions in the second set of functions 1624 on the first reconfigurable processor in the reconfigurable processors 142n to combine the results with results of execution of one or more functions in the first set of functions 1614 and/or the data therefor (e.g., weights, coefficients, vectors, tensors (image data, audio data, natural language processing (NLP data)), control data (e.g., control tokens)) on the first reconfigurable processor in the reconfigurable processors 142a. In other implementations, the first set of functions 1614 and the second set of functions 1624 operate separately and in parallel. In one implementation, one or more functions in the second set of functions 1624 daisy chain the results to one or more functions in the first set of functions 1614, and vice-versa. In another implementation, one or more functions in the second set of functions 1624 executes for a certain number of iterations before returning the results to the first reconfigurable processor in the reconfigurable processors 142a. Other implementations may perform the operations in different orders and/or with different, fewer, or additional operations than the ones illustrated in FIG. 16. Multiple operations can be combined in some implementations.

One skilled in the art will appreciate that, in FIG. 16, operations six, seven, eight, ten, eleven, and twelve comprise streaming network packets between reconfigurable processors on different processing nodes 1 and n over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC).

Having described the reconfigurable processor-to-reconfigurable processor workload sharing, the discussion now turns to the asynchronous tensor streaming disclosed by the technology disclosed.

Asynchronous Tensor Streaming

Figure 17A:
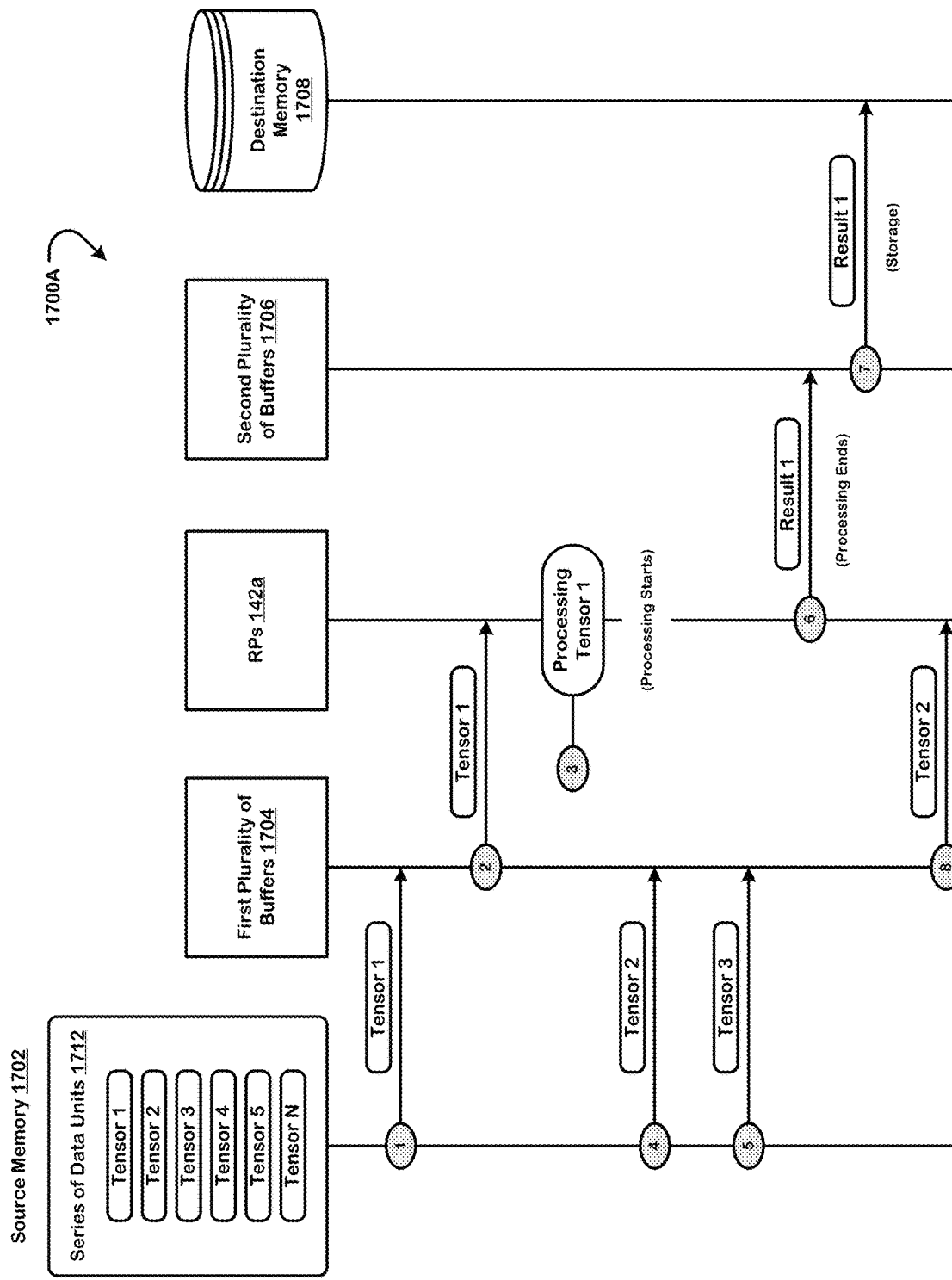
FIG. 17A is a message sequence chart illustrating one implementation of asynchronous tensor streaming in which a next tensor is buffered while a reconfigurable processor is processing a current tensor.

FIG. 17A is a message sequence chart 1700A illustrating one implementation of asynchronous tensor streaming in which a next tensor is buffered while a reconfigurable processor is processing a current tensor. A reconfigurable processor in the data center 100 (e.g., one or more of the reconfigurable processors 142a) is configured to execute one or more configuration files using a series of data units 1712. In one implementation, the series of data units 1712 includes a sequence of tensors 1 to N. A first plurality of buffers 1704 is configured to receive data units in the series of data units 1712 from a source memory 1702 (e.g., host memory 134a, host memory 134n), and to stream the data units to the reconfigurable processor for processing. Examples of buffers in the first plurality of buffers 1704 include First-In, First-Out (FIFO) buffers, First-In, Last-Out (FILO) buffers, Last-In, First-Out (LIFO) buffers, Last-In, Last-Out (LILO) buffers, and circular buffers. The buffers in the first plurality of buffers 1704 can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors. A second plurality of buffers 1706 is configured to stream results of processing the data units from the reconfigurable processor, and to send the results to a destination memory 1708 (e.g., reconfigurable processor memory 162a, reconfigurable processor memory 162n) for storage. Examples of buffers in the second plurality of buffers 1706 include First-In, First-Out (FIFO) buffers, First-In, Last-Out (FILO) buffers, Last-In, First-Out (LIFO) buffers, Last-In, Last-Out (LILO) buffers, and circular buffers. The buffers in the second plurality of buffers 1706 can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

A runtime logic (e.g., runtime logic 122a, runtime logic 122n) is configured to cause the buffers in the first plurality of buffers 1704 to receive a next data unit in the series of data units 1712 from the source memory 1702 while the reconfigurable processor processes a current data unit in the series of data units 1712. The runtime logic is further configured to stream the next data unit to the reconfigurable processor for processing after the buffers in the second plurality of buffers 1706 stream results of processing the current data unit from the reconfigurable processor.

Turning to the example illustrated in FIG. 17A. Consider that tensor 1 is the current data unit and tensors 2 and 3 are next data units. At timestep one, the buffers in the first plurality of buffers 1704 receive tensor 1 from the source memory 1702. At timestep two, the buffers in the first plurality of buffers 1704 stream tensor 1 to the reconfigurable processor. At timestep three, the reconfigurable processor starts processing tensor 1. While the reconfigurable processor is processing tensor 1, the buffers in the first plurality of buffers 1704 receive tensors 2 and 3 from the source memory 1702 at timesteps four and five, respectively. At timestep six, the reconfigurable processor streams results of processing tensor 1 (result 1) to the buffers in the second plurality of buffers 1706. At timestep seven, the buffers in the second plurality of buffers 1706 stream the results of processing tensor 1 to the destination memory 1708 for storage. At timestep eight, the buffers in the first plurality of buffers 1704 stream tensor 2 to the reconfigurable processor. In other implementations, streaming of tensor 2 from the buffers in the first plurality of buffers 1704 to the reconfigurable processor precedes the streaming of the results of processing tensor 1 from the buffers in the second plurality of buffers 1706 to the destination memory 1708. Other implementations may perform the steps in different orders and/or with different, fewer, or additional steps than the ones illustrated in FIG. 17A. In some implementations, processing of tensors in one or more previous timesteps/iterations (e.g., tensors 2 and 3) by the reconfigurable processors 142a overlaps with the processing of a tensor in a current timestep/iteration (e.g., tensor 1) by the reconfigurable processors 142a. This is referred to herein as "meta-pipelining". Multiple steps can be combined in some implementations.

Figure 17B:
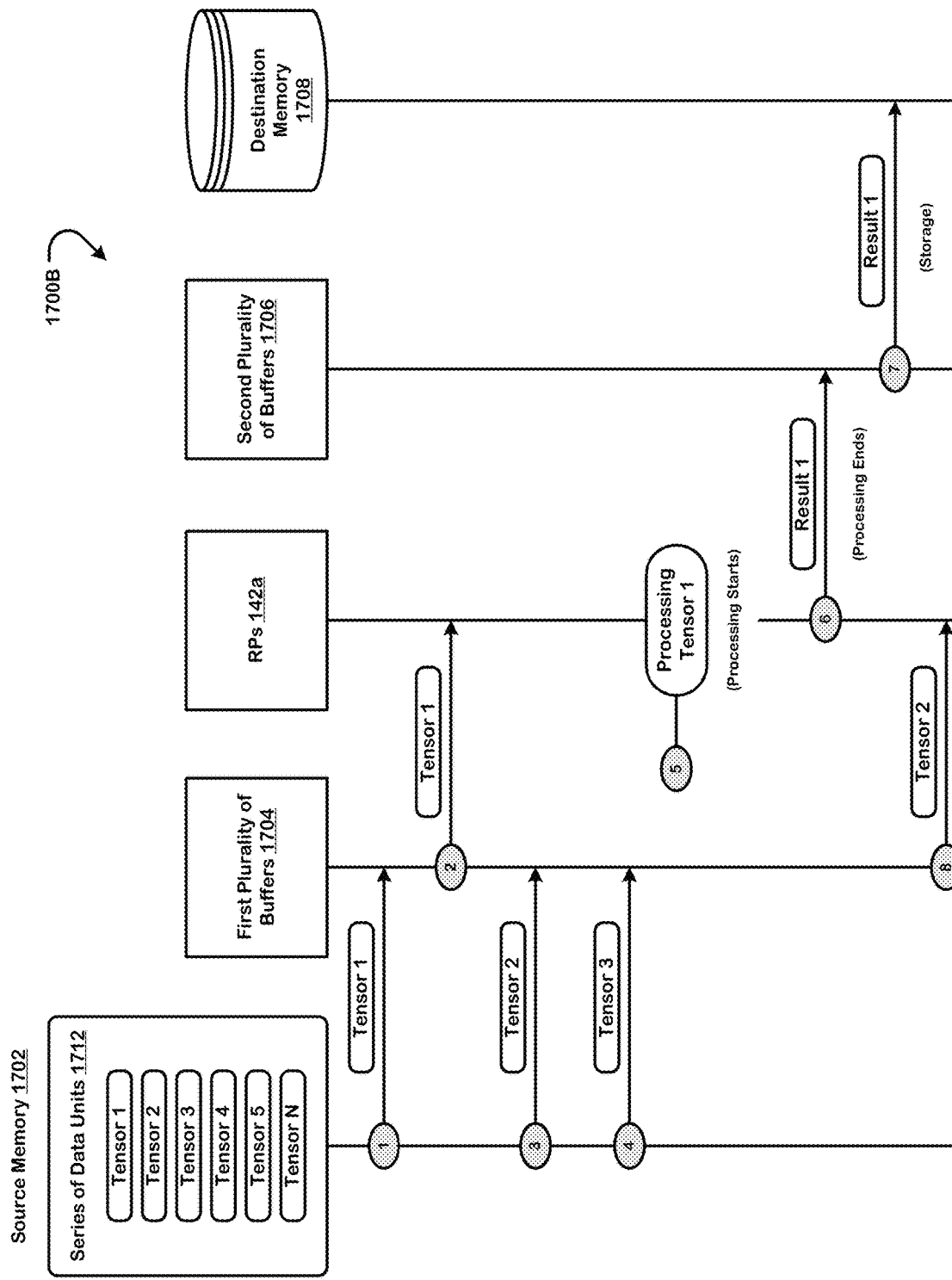
FIG. 17B is a message sequence chart illustrating one implementation of asynchronous tensor streaming in which a next tensor is buffered before a reconfigurable processor processes a current tensor.

FIG. 17B is a message sequence chart 1700B illustrating one implementation of asynchronous tensor streaming in which a next tensor is buffered before a reconfigurable processor processes a current tensor. The runtime logic is further configured to cause the buffers in the first plurality of buffers 1704 to receive the next data unit from the source memory 1702 before the reconfigurable processor starts processing the current data unit.

Turning to the example illustrated in FIG. 17B. At timestep one, the buffers in the first plurality of buffers 1704 receive tensor 1 from the source memory 1702. At timestep two, the buffers in the first plurality of buffers 1704 stream tensor 1 to the reconfigurable processor. Before the reconfigurable processor starts processing tensor 1, the buffers in the first plurality of buffers 1704 receive tensors 2 and 3 from the source memory 1702 at timesteps three and four, respectively. At timestep five, the reconfigurable processor starts processing tensor 1. At timestep six, the reconfigurable processor streams results of processing tensor 1 (result 1) to the buffers in the second plurality of buffers 1706. At timestep seven, the buffers in the second plurality of buffers 1706 stream the results of processing tensor 1 to the destination memory 1708 for storage. At timestep eight, the buffers in the first plurality of buffers 1704 stream tensor 2 to the reconfigurable processor. In other implementations, streaming of tensor 2 from the buffers in the first plurality of buffers 1704 to the reconfigurable processor precedes the streaming of the results of processing tensor 1 from the buffers in the second plurality of buffers 1706 to the destination memory 1708. Other implementations may perform the steps in different orders and/or with different, fewer, or additional steps than the ones illustrated in FIG. 17B. Multiple steps can be combined in some implementations.

Figure 17C:
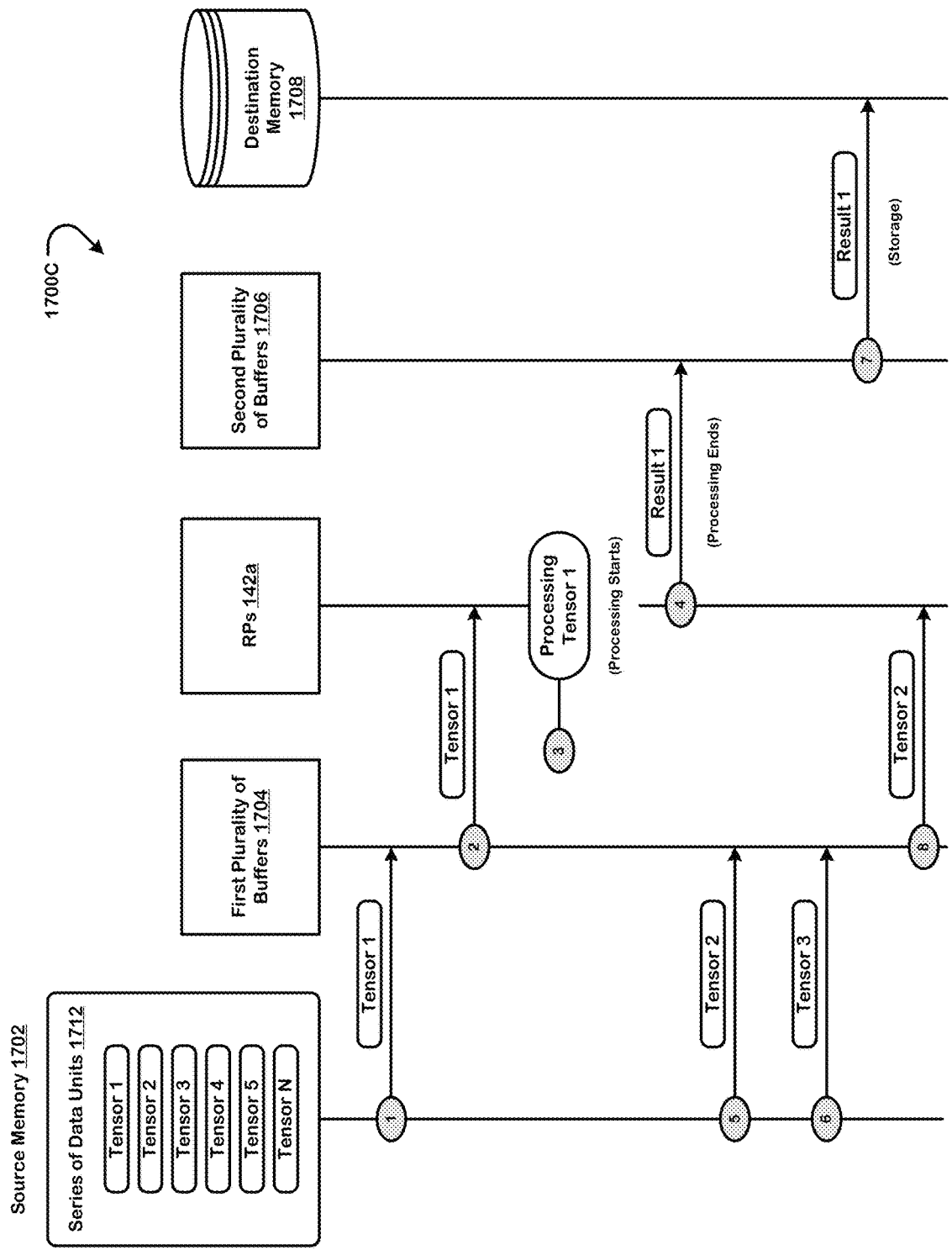
FIG. 17C is a message sequence chart illustrating one implementation of asynchronous tensor streaming in which a next tensor is buffered after a reconfigurable processor has processed a current tensor.

FIG. 17C is a message sequence chart 1700C illustrating one implementation of asynchronous tensor streaming in which a next tensor is buffered after a reconfigurable processor has processed a current tensor. The runtime logic is further configured to cause the buffers in the first plurality of buffers 1704 to receive the next data unit from the source memory 1702 after the buffers in the second plurality of buffers 1706 stream the results of processing the current data unit from the reconfigurable processor.

Turning to the example illustrated in FIG. 17C. At timestep one, the buffers in the first plurality of buffers 1704 receive tensor 1 from the source memory 1702. At timestep two, the buffers in the first plurality of buffers 1704 stream tensor 1 to the reconfigurable processor. At timestep three, the reconfigurable processor starts processing tensor 1. At timestep four, the reconfigurable processor streams results of processing tensor 1 (result 1) to the buffers in the second plurality of buffers 1706. After the buffers in the second plurality of buffers 1706 stream the results of processing tensor 1 from the reconfigurable processor, the buffers in the first plurality of buffers 1704 receive tensors 2 and 3 from the source memory 1702 at timesteps five and six, respectively. At timestep seven, the buffers in the second plurality of buffers 1706 stream the results of processing tensor 1 to the destination memory 1708 for storage. At timestep eight, the buffers in the first plurality of buffers 1704 stream tensor 2 to the reconfigurable processor. In other implementations, streaming of tensor 2 from the buffers in the first plurality of buffers 1704 to the reconfigurable processor precedes the streaming of the results of processing tensor 1 from the buffers in the second plurality of buffers 1706 to the destination memory 1708. Other implementations may perform the steps in different orders and/or with different, fewer, or additional steps than the ones illustrated in FIG. 17C. Multiple steps can be combined in some implementations.

Having described the asynchronous tensor streaming, the discussion now turns to how the technology disclosed executes configuration files on reconfigurable processors that are on different processing nodes in the data center 100. This is referred to herein as "inter-node execution of configuration files."

Inter-Node Execution of Configuration Files

Figure 18:
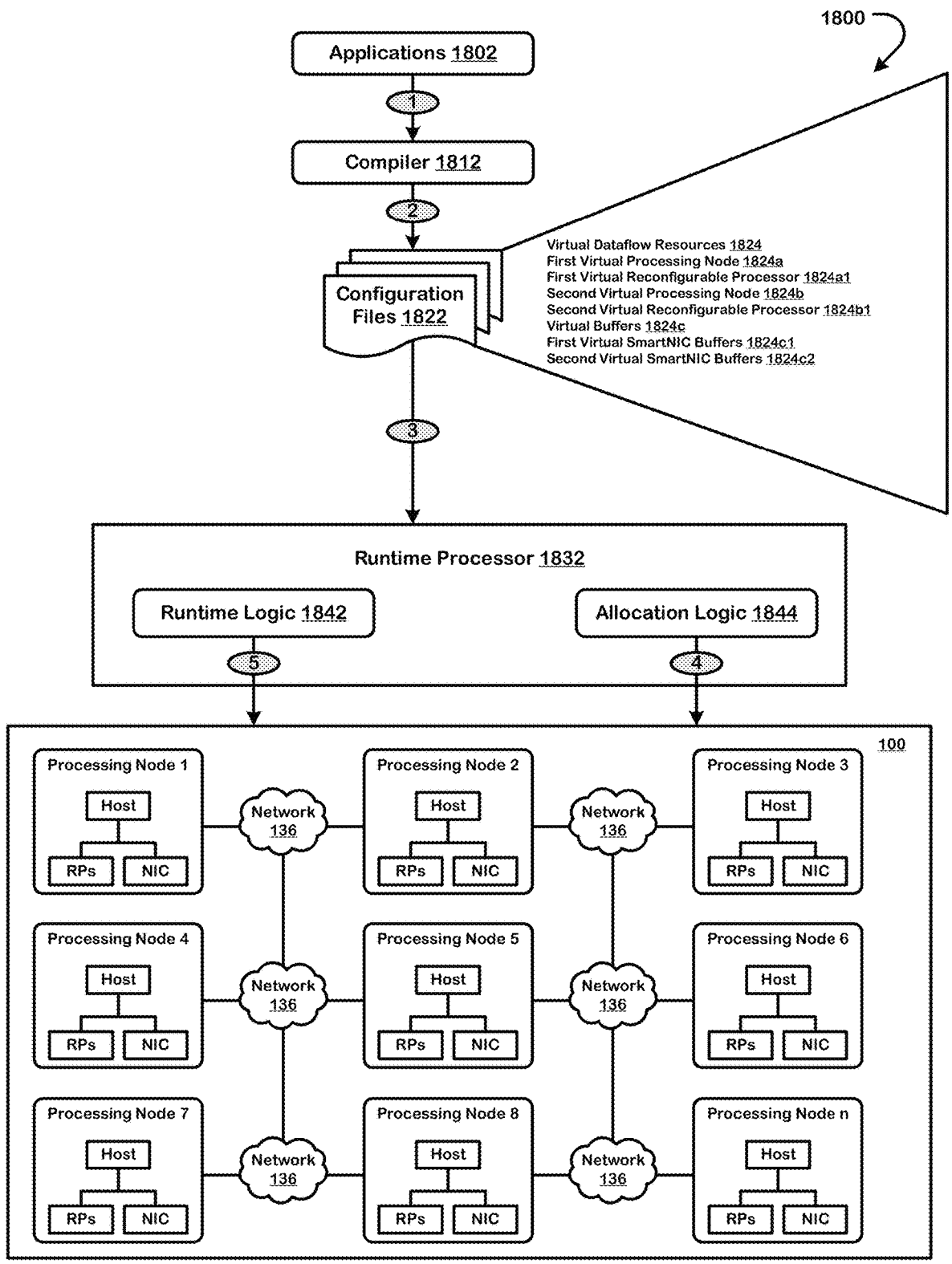
FIG. 18 is a message sequence chart illustrating one implementation of executing configuration files on reconfigurable processors that are on different processing nodes in the data center.

FIG. 18 is a message sequence chart 1800 illustrating one implementation of executing configuration files on reconfigurable processors that are on different processing nodes in the data center 100. This is referred to herein as "inter-node execution of configuration files." The data center 100 comprises a pool of reconfigurable dataflow resources. The pool of reconfigurable dataflow resources includes a plurality of processing nodes (e.g., processing nodes 1 to n). Respective processing nodes in the plurality of processing nodes are operatively coupled to respective pluralities of reconfigurable processors (RPs) and respective pluralities of buffers. The respective processing nodes are also operatively coupled to respective host processors. The respective processing nodes are also operatively coupled to respective pluralities of Network Interface Controllers (NICs) or Smart Network Interface Controllers (SmartNICs).

In one implementation, buffers in the respective pluralities of buffers are located in respective memories of the respective pluralities of reconfigurable processors. Examples of the respective memories of the respective pluralities of reconfigurable processors include off-chip and/or on-chip memories like DRAM, NAND flash, SRAM, latches, flops, bypass networks, and registers. In another implementation, the buffers are located in respective memories of NICs or SmartNICs in the respective pluralities of NICs or SmartNICs. In yet another implementation, the buffers are located in respective memories of host processors (e.g., RAM/ROM, caches) in the respective host processors. In other implementations, the buffers can be located in or attached to any network component of the data center 100 such as PCIe buses, Double Data Rate (DDR) channels, Dual In-Line Memory Modules (DIMMs), routers, and switches. The buffers can be First-In, First-Out (FIFO) buffers, First-In, Last-Out (FILO) buffers, Last-In, First-Out (LIFO) buffers, Last-In, Last-Out (LILO) buffers, or circular buffers. The buffers can be of size 8 bytes, 16 bytes, 32 bytes, 64 bytes, 128 bytes, 256 bytes, and so on, or any convenient size appropriate for the transfer of data between the host processor, the network interface controllers, and the reconfigurable processors.

A compiler 1812 compiles applications 1802 (operation one) and generates configuration files 1822 (operation two). The configuration files 1822 specify configurations of virtual dataflow resources 1824 required to execute the configuration files 1822. In one implementation, the virtual dataflow resources 1824 include a first virtual reconfigurable processor 1824a1 in a first virtual processing node 1824a, a second virtual reconfigurable processor 1824b1 in a second virtual processing node 1824b, and virtual buffers 1824c that stream data between the first virtual reconfigurable processor 1824a1 and the second virtual reconfigurable processor 1824b1. The virtual buffers 1824c comprise first virtual SmartNIC buffers 1824c1 and second virtual SmartNIC buffers 1824c2.

A runtime processor 1832 is operatively coupled to the pool of reconfigurable dataflow resources and configured to receive the configuration files 1822 (operation three). The runtime processor 1832 comprises a runtime logic 1842 and an allocation logic 1844. The allocation logic 1844 is configured to allocate reconfigurable dataflow resources in the pool of reconfigurable dataflow resources to the virtual dataflow resources 1824 (operation four). The allocated reconfigurable dataflow resources include a first processing node in the respective processing nodes allocated to the first virtual processing node 1824a, a second processing node in the respective processing nodes allocated to the second virtual processing node 1824b, a first reconfigurable processor, operatively coupled to the first processing node, allocated to the first virtual reconfigurable processor 1824a1, a second reconfigurable processor operatively coupled to the second processing node allocated to the second virtual reconfigurable processor 1824b1, and a first plurality of buffers, operatively coupled to the first processing node, and a second plurality of buffers, operatively coupled to the second processing node, allocated to the virtual buffers 1824c. The runtime logic 1842 is configured to execute the configuration files 1822 using the allocated reconfigurable dataflow resources (operation five). The runtime logic 1842 also writes starting weights to the RPs in an embodiment.

The discussion now turns to how buffers can be allocated for inter-node streaming of configuration data (e.g., bit stream) by mapping physical memory addresses of the buffers to memories of different network components in the data center 100 (e.g., host memories, reconfigurable processor memories, NIC memories, SmartNIC memories, PCIe bus memories, DDR channel memories, DIMM memories, etc.).

Buffer Allocation

The buffers are programmable and can be allocated by specifying physical memory addresses. The physical memory addresses of the buffers specify memory locations of the buffers. The physical memory addresses of the buffers can be designated by the host processors and/or by the reconfigurable processors. The configurations of the virtual buffers 1824c specify virtual memory segments of the buffers allocated for execution of the applications 1802 (e.g., the first and second plurality of buffers), including virtual address spaces (e.g., starting or base addresses) of the virtual memory segments and sizes of the virtual address spaces (e.g., sizes of the memory blocks in bytes). The runtime processor 1832 maps the virtual address spaces of the virtual memory segments to physical address spaces of physical memory segments in memory where the allocated buffers are located. The memory can be host processor memory, reconfigurable processor memory (off-chip or on-chip), NIC memory, SmartNIC memory, PCIe memory, DMA memory, DIMM memory, or any other network component memory in the data center 100.

Figure 19:
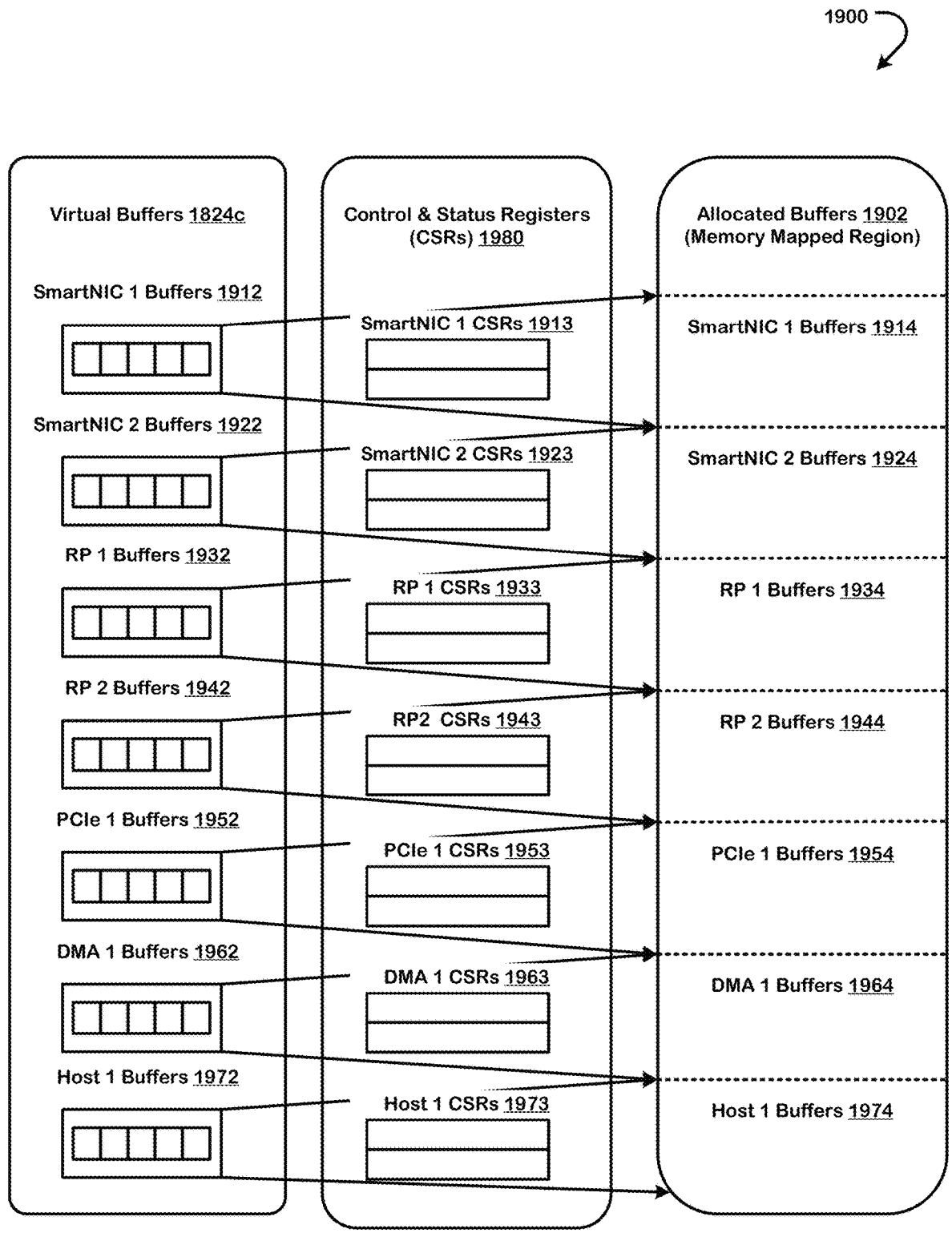
FIG. 19 shows one implementation of memory mapping and allocating virtual buffers to physical buffers located in memories of different network components in the data center.

FIG. 19 shows one implementation of memory mapping 1900 the virtual buffers 1824c to allocated buffers 1902/ physical buffers 1902 located in respective physical memories of example reconfigurable dataflow resources such as SmartNIC one (SmartNIC 1) memory, SmartNIC two (SmartNIC 2) memory, reconfigurable processor one (RP 1) memory, reconfigurable processor two (RP 2) memory, PCIe 1 memory, DMA 1 memory, and host processor 1 memory. FIG. 19 shows that Control and Status Registers (CSRs) 1980 of the example reconfigurable dataflow resources are used for memory mapping the virtual buffers 1824c in a virtual memory space to physical memory space. CSRs 1913, 1923, 1933, 1943, 1953, 1963, and 1973 in the allocated physical element (e.g., SmartNIC, RP, DMA engine of PCIe device, etc.) are used to map the application virtual buffer addresses to the appropriate physical addresses by having the runtime logic program them. (e.g., SmartNIC 1 buffers 1912, SmartNIC 2 buffers 1922, RP 1 buffers 1932, RP 2 buffers 1942, PCIe 1 buffers 1952, DMA 1 buffers 1962, host 1 buffers 1972) to the allocated buffers 1902 in a contiguous physical memory space (e.g., SmartNIC 1 buffers 1914 (first range of physical memory addresses), SmartNIC 2 buffers 1924 (second range of physical memory addresses), RP 1 buffers 1934 (third range of physical memory addresses), RP 2 buffers 1944 (fourth range of physical memory addresses), PCIe 1 buffers 1954 (fifth range of physical memory addresses), DMA 1 buffers 1964 (sixth range of physical memory addresses), host 1 buffers 1974 (seventh range of physical memory addresses)).

The discussion now turns to how buffer allocation is done independently for multiple applications being executed simultaneously or in parallel on a given set of reconfigurable dataflow resources (e.g., reconfigurable processors, NICs, SmartNICs, PCIe buses, DMA channels), and how allocated buffers are kept isolated on an application-by-application basis.

Application-Wise Buffer Allocation and Isolation

In one implementation, the runtime processor 1832 configures control and status registers of the reconfigurable dataflow resources with configuration data (e.g., bit stream) identifying the mapping between the virtual address spaces and the physical address spaces for the configuration files 1822 to access the physical memory segments during execution of the applications 1802. In some implementations, a first set of the physical memory segments mapped to buffers allocated to a first one of the applications 1802 are different from a second set of the physical memory segments mapped to buffers allocated to a second one of the applications 1802. Also, access of the buffers allocated to the first one of the applications 1802 is confined to the first set of the physical memory segments, and access of the buffers allocated to the second one of the applications 1802 is confined to the second set of the physical memory segments.

In some implementations, the reconfigurable processors have respective pluralities of buffers for respective applications such that a first plurality of buffers can be used to stream configuration data (e.g., bit stream) to execute configuration files for a first application, a second plurality of buffers can be used to stream configuration data (e.g., bit stream) to execute configuration files for a second application, a third plurality of buffers can be used to stream configuration data (e.g., bit stream) to execute configuration files for a third application, and so on. The configuration files for the first, second, and third applications can be executed in parallel or sequence using the first, second, and third plurality of buffers, respectively. In one implementation, the configuration files for the first, second, and third applications can be executed, in parallel or in sequence, on a single reconfigurable processor using the first, second, and third plurality of buffers, respectively. In another implementation, the configuration files for the first, second, and third applications can be executed, in parallel or in sequence, across reconfigurable processors on a same processing node using the first, second, and third plurality of buffers, respectively, such that, in some implementations, each of the first, second, and third plurality of buffers includes a set of sender (TX) buffers and receiver (RX) buffers for each reconfigurable processor or NIC or SmartNIC on the same processing node used to execute the configuration files. In yet another implementation, the configuration files for the first, second, and third applications can be executed, in parallel or in sequence, across reconfigurable processors on different processing nodes using the first, second, and third plurality of buffers, respectively, such that, in some implementations, each of the first, second, and third plurality of buffers includes a set of sender (TX) buffers and receiver (RX) buffers for each reconfigurable processor or NIC or SmartNIC on the different processing nodes used to execute the configuration files.

In one implementation, the runtime processor 1832 runs on each host processor in the data center 100 and provides unified access to the pool of reconfigurable dataflow resources in the data center 100. Additional details about how the allocation logic 1844 spans the userspace and kernel space of a host processor on which a runtime processor or runtime logic runs can be found in U.S. Nonprovisional patent application Ser. No. 16/922,975, filed Jul. 7, 2020, entitled, "RUNTIME VIRTUALIZATION OF RECONFIGURABLE DATAFLOW RESOURCES,", which is incorporated herein by reference (specific reference is made to the runtime library 312, the kernel module 322, the resource manager 471, the device driver 474, and other allocation logic and components in the application incorporated by reference).

The discussion now turns to how various aspects of the technology disclosed described in this application can be executed without the use of hosts or host processors. Such implementations are referred to herein as "host-less implementations."

Hypervisor and Host-Less Implementations

In another implementation, the runtime processor 1832 runs on each reconfigurable processor in the data center 100 and provides unified access to the pool of reconfigurable dataflow resources in the data center 100. In yet another implementation, the runtime processor 1832 runs as a hypervisor only on a subset of the host processors in the data center 100 (e.g., only on one host processor). In yet another implementation, the runtime processor 1832 runs as a hypervisor only on a subset of the reconfigurable processors in the data center 100 (e.g., only on one reconfigurable processor).

Figure 20:
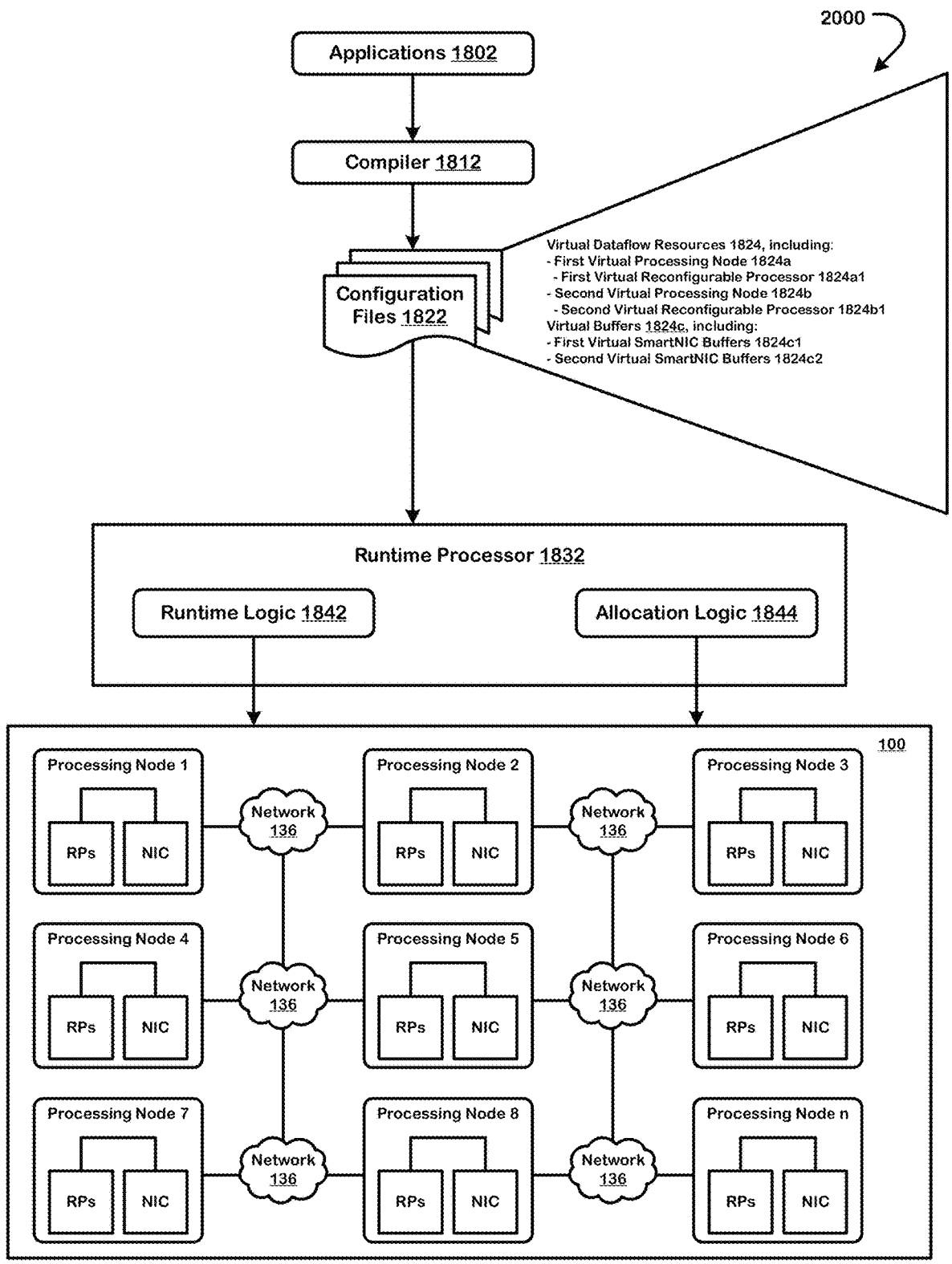
FIG. 20 shows an architectural level schematic of one implementation of the data center in which the processing nodes of the data center do not include host processors.

FIG. 20 shows an architectural level schematic 2000 of one implementation of the data center 100 in which the processing nodes of the data center 100 do not include host processors. The implementation shown in the architectural level schematic 2000 is configured to execute other implementations discussed in this application (e.g., intra-node processing, inter-node execution of configuration files), except that the other implementations are executed without using the host processors. In many host-less implementations, functionalities that are otherwise performed by host processors are instead performed by the reconfigurable processors in the data center 100. Some examples of functionalities performed by the reconfigurable processors in host-less implementations include hosting the compiler 1812, compiling the applications 1802, generating the configuration files 1822, generating configurations of the virtual dataflow resources 1824, hosting the runtime processor 1832, memory mapping, resource allocation (e.g., designating and allocating physical memory addresses of the buffers and other reconfigurable dataflow resources), execution of the configuration files 1822, parsing incoming network packets and running anomaly detection in ultra-low and deterministic latency, etc.). In other host-less implementations, the functionalities that are otherwise performed by the host processors are obviated by other network components in the data center 100, for example, by the SmartNICs that comprise microcontrollers to locally trigger host-like commands without requiring an external host.

In the hypervisor and the host-less implementations, the runtime processor 1832 can be considered a distributed runtime processor, a distributed runtime logic, a distributed resource manager, and/or a distributed resource allocator that provides unified access to the pool of reconfigurable dataflow resources in the data center 100.

The discussion now turns to how, for efficient execution of the configuration files, the technology disclosed uses buffers to stream, over a network fabric, configuration data (e.g., bit stream) between reconfigurable processors that are on different processing nodes in the data center 100. This is referred to herein as "buffer-based inter-node streaming of configuration data (e.g., bit stream) over network fabric."

Figure 21:
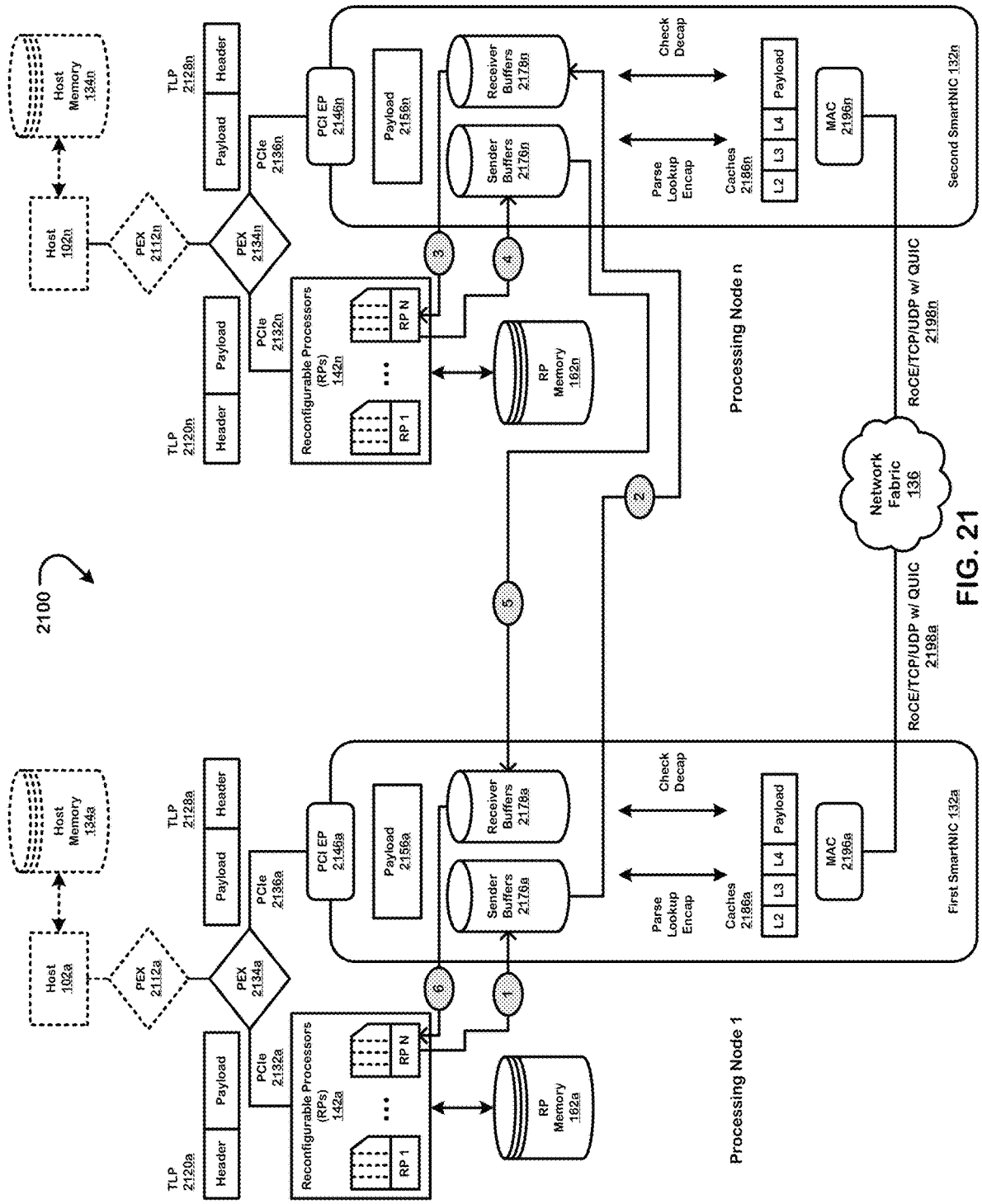
FIG. 21 is a message sequence chart illustrating one implementation of buffer-based inter-node streaming of configuration data over the network fabric.

Buffer-Based Inter-Node Streaming of Configuration Data (e.g., Bit Stream) Over Network Fabric FIG. 21 is a message sequence chart 2100 illustrating one implementation of buffer-based inter-node streaming of configuration data (e.g., bit stream) over the network fabric 136. In the implementation illustrated in FIG. 21, buffers used for the inter-node streaming, i.e., sender buffers 2176*a*, receiver buffers 2178*a*, sender buffers 2176*n*, and receiver buffers 2178*n*, are located in respective memories of the SmartNIC devices 132*a* and 132*n*. However, these buffers can be located in any network component of the data center 100 (e.g., memories of host processors, memories of reconfigurable processors, memories of NIC devices, memories on PCIe buses, memories on DDR channels, memories of DIMMs, etc.).

In the implementation illustrated in FIG. 21, the local buses 125*a*, 126*a*, 127*a*, 125*n*, 126*n*, and 127*n* and bus switches 124*a* and 124*n* that operatively couple reconfigurable processors on a same processing node to a host processor of the same processing node and to a NIC device or a SmartNIC device attached to the same processing node are PCIe buses 2132*a*, 2136*a*, 2132*n*, and 2136*n* and PCIe switches (PEX) 2112*a*, 2134*a*, 2112*n*, and 2134*n*, respectively. In other implementations, the PCIe protocol can be replaced by or supplemented with other bus protocols such as Cache Coherent Interconnect for Accelerators (CCIX), Compute Express Link (CXL), and Open Coherent Accelerator Processor Interface (OpenCAPI).

Even though the message sequence chart 2100 begins at operation one, some preceding operations are omitted for the sake of clarity. Turning to the example illustrated in FIG. 18, some examples of the omitted operations include the applications 1802 requesting execution, the compiler 1812 compiling the applications 1802 and generating the configuration files 1822, the runtime processor 1832 allocating physical resources, i.e., reconfigurable dataflow resources, for execution of the configuration files 1822, and the runtime processor 1832 loading the configuration files 1812 on the allocated reconfigurable dataflow resources. These omitted operations can be executed on any host processor or any reconfigurable processor in the data center 100.

Continuing with the example illustrated in FIG. 18, consider that the virtual dataflow resources 1824 and the virtual buffers 1824*c* are allocated reconfigurable dataflow resources of the processing node 1 and the processing node n in the data center 100. The first virtual processing node 1824*a* is allocated the processing node 1 (hereinafter "a first processing node"). The first virtual reconfigurable processor 1824*a*1 is allocated reconfigurable processor N (RP N) on the processing node 1 (hereinafter "a first reconfigurable processor"). The second virtual processing node 1824*b* is allocated the processing node n (hereinafter "a second processing node"). The second virtual reconfigurable processor 1824*b*1 is allocated reconfigurable processor N (RP N) on the processing node n (hereinafter "a second reconfigurable processor"). The first virtual SmartNIC buffers 1824*c*1 are allocated the sender buffers 2176*a* and the receiver buffers 2178*a* (hereinafter "a first plurality of buffers"). The second virtual SmartNIC buffers 1824*c*2 are allocated the sender buffers 2176*n* and the receiver buffers 2178*n* (hereinafter "a second plurality of buffers").

The first plurality of buffers includes a first set of sender buffers 2176*a* configured to receive data from the first reconfigurable processor and provide the data to a second set of receiver buffers 2178*n* in the second plurality of buffers. The second set of receiver buffers 2178*n* are configured to provide the data to the second reconfigurable processor. The second plurality of buffers includes a second set of sender buffers 2176*n* configured to receive data from the second reconfigurable processor and provide the data to a first set of receiver buffers 2178*a* in the first plurality of buffers. The first set of receiver buffers 2178*a* are configured to provide the data to the first reconfigurable processor.

The runtime processor 1832 is configured to configure the first SmartNIC 132*a* with a routing table that specifies the first reconfigurable processor as a local reconfigurable processor, and the second reconfigurable processor as a destination reconfigurable processor. The runtime processor 1832 is configured to configure the second SmartNIC 132*n* with a routing table that specifies the second reconfigurable processor as a local reconfigurable processor, and the first reconfigurable processor as a destination reconfigurable processor.

In particular, FIG. 21 shows one implementation of how the runtime processor 1832 executes the configuration files 1822 on the first processing node (processing node 1) and the second processing node (processing node n). In one implementation, the execution includes streaming data (e.g., configuration data (e.g., bit stream) and application data (weights, coefficients, vectors, tensors, control data (e.g., control tokens), etc.) for the configuration files 1822 that define the applications 1802 between the first reconfigurable processor and the second reconfigurable processor using one or more buffers in the first plurality of buffers and one or more buffers in the second plurality of buffers, thereby the streaming bypassing the first host processor 102*a* and the second host processor 102*n* (as indicated by the dotted lines in FIG. 21). Accordingly, in some implementations, the message sequence chart 2100 can be executed without using host processors (e.g., as the host-less implementations discussed with respect to FIG. 20). This saves latency and improves throughput, and also does not require any processing time needed on the first and second host processors 102*a* and 102*n* (e.g., for processing by their respective operating systems).

In some implementations, the execution includes streaming input data for the applications 1802 from the first reconfigurable processor to the second reconfigurable processor. In some implementations, one or more of the sender buffers in the first set of sender buffers 2176*a* are configured to receive the input data from the first reconfigurable processor (operation one) and provide the input data to one or more receiver buffers in the second set of receiver buffers 2178*n* (operation two).

The first reconfigurable processor is configured to push the input data to the first SmartNIC 132*a* (e.g., via the PCIe Endpoint Port (EP) 2146*a*) (operation one). In some implementations, operation one is accomplished by an address generator of the first reconfigurable processor (e.g., Address Generation and Coalescing Units) (AGCU)) writing the input data to physical memory addresses mapped to the sender buffers in the first set of sender buffers 2176*a* (e.g., via a hardware write (HWRITE) command). In one implementation, the first SmartNIC 132*a* is configured to write the input data, after encapsulation, into the sender buffers in the first set of sender buffers 2176*a*. In one implementation, the first SmartNIC 132*a* is configured to update tail pointers of the sender buffers in the first set of sender buffers 2176*a* in response to the writing of the input data. In one implementation, the first SmartNIC 132*a* is configured to process the input data as payload 2156*a*, apply encapsulation, store it in caches 2186*a*, and stream it to the second SmartNIC 132*n* over the network fabric 136 (e.g., via the MAC port 2196*a*).

One skilled in the art will appreciate that operations one and six comprise streaming network packets between the first reconfigurable processor and the first SmartNIC 132*a* over the local buses PCIe 2132*a* and 2136*a* using a protocol like Transaction Layer Packet (TLP) (e.g., 2120*a*, 2128*a*). One skilled in the art will also appreciate that operation two comprises streaming network packets from the first SmartNIC 132*a* to the second SmartNIC 132*n* over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198*a*, 2198*n*).

The receiver buffers in the second set of receiver buffers 2178*n* are configured to provide the input data to the second reconfigurable processor (operation three). In some implementations, operation three is accomplished by an address generator of the second reconfigurable processor (e.g., Address Generation and Coalescing Units) (AGCU)) reading the input data from physical memory addresses mapped to the receiver buffers in the second set of receiver buffers 2178*n* (e.g., via a hardware read (HWREAD) command). In one implementation, the first SmartNIC 132*a* is configured to send the input data to the second SmartNIC 132*n* in response to the updated tail pointers. In one implementation, the second SmartNIC 132*n* is configured to write the input data, after decapsulation, into the receiver buffers in the second set of receiver buffers 2178*n*. In one implementation, the second SmartNIC 132*n* is configured to update tail pointers of the receiver buffers in the second set of receiver buffers 2178*n* in response to the writing of the input data. The second reconfigurable processor is configured to pull the input data from the second SmartNIC 132*n* (e.g., via the PCIe Endpoint Port (EP) 2146*n*) by reading the input data from the receiver buffers in the second set of receiver buffers 2178*n* in response to the updated tail pointers.

In some implementations, the execution includes streaming output data for the applications 1802 from the second reconfigurable processor to the first reconfigurable processor. The output data is generated as a result of processing the input data (e.g., processing of the input data by the second reconfigurable processor). In some implementations, one or more of the sender buffers in the second set of sender buffers 2176*n* are configured to receive the output data from the second reconfigurable processor (operation four) and provide the output data to one or more receiver buffers in the first set of receiver buffers 2178*a* (operation five).

The second reconfigurable processor is configured to push the output data to the second SmartNIC 132*n* (e.g., via the PCIe Endpoint Port (EP) 2146*n*) (operation four). In some implementations, operation four is accomplished by an address generator of the second reconfigurable processor (e.g., Address Generation and Coalescing Units) (AGCU)) writing the output data to physical memory addresses mapped to the sender buffers in the second set of sender buffers 2176*n* (e.g., via a hardware write (HWRITE) command) In one implementation, the second SmartNIC 132*n* is configured to write the output data, after encapsulation, into the sender buffers in the second set of sender buffers 2176*n*. In one implementation, the second SmartNIC 132*n* is configured to update tail pointers of the sender buffers in the second set of sender buffers 2176*n* in response to the writing of the output data. In one implementation, the second SmartNIC 132*n* is configured to process the output data as payload 2156*n*, apply encapsulation, store it in caches 2186*n*, and stream it to the first SmartNIC 132*a* over the network fabric 136 (e.g., via the MAC port 2196*n*).

One skilled in the art will appreciate that operations three and four comprise streaming network packets between the second reconfigurable processor to the second SmartNIC 132*n* over the local buses PCIe 2132*n* and 2136*n* using a protocol like Transaction Layer Packet (TLP) (e.g., 2120*n*, 2128*n*). One skilled in the art will also appreciate that operation five comprises streaming network packets from the second SmartNIC 132*n* to the first SmartNIC 132*a* over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198*a*, 2198*n*).

The receiver buffers in the first set of receiver buffers 2178*a* are configured to provide the output data to the first reconfigurable processor (operation six). In some implementations, operation six is accomplished by an address generator of the first reconfigurable processor (e.g., Address Generation and Coalescing Units) (AGCU)) reading the output data from physical memory addresses mapped to the receiver buffers in the first set of receiver buffers 2178*a* (e.g., via a hardware read (HWREAD) command). In one implementation, the second SmartNIC 132*n* is configured to send the output data to the first SmartNIC 132*a* in response to the updated tail pointers. In one implementation, the first SmartNIC 132*a* is configured to write the output data, after decapsulation, into the receiver buffers in the first set of receiver buffers 2178*a*. In one implementation, the first SmartNIC 132*a* is configured to update tail pointers of the receiver buffers in the first set of receiver buffers 2178*a* in response to the writing of the output data. The first reconfigurable processor is configured to pull the output data from the first SmartNIC 132*a* (e.g., via the PCIe Endpoint Port (EP) 2146*a*) by reading the output data from the receiver buffers in the first set of receiver buffers 2178*a* in response to the updated tail pointers.

In some implementations, the first reconfigurable processor notifies the second reconfigurable processor of remote invocations using one or more remote procedure calls. In one implementation, the first reconfigurable processor uses the sender buffers in the first set of sender buffers 2176*a* and the receiver buffers in the second set of receiver buffers 2178*n* to send, over the network fabric 136, one or more argument values to the second reconfigurable processor for execution of the remote procedure calls (similar to operation 2 in FIG. 21).

In some implementations, the second reconfigurable processor notifies the first reconfigurable processor of remote invocations using one or more remote procedure calls. In one implementation, the second reconfigurable processor uses the sender buffers in the second set of sender buffers 2176*n* and the receiver buffers in the first set of receiver buffers 2178*a* to send, over the network fabric 136, one or more argument values to the first reconfigurable processor for execution of the remote procedure calls (similar to operation 5 in FIG. 21).

Figure 22:
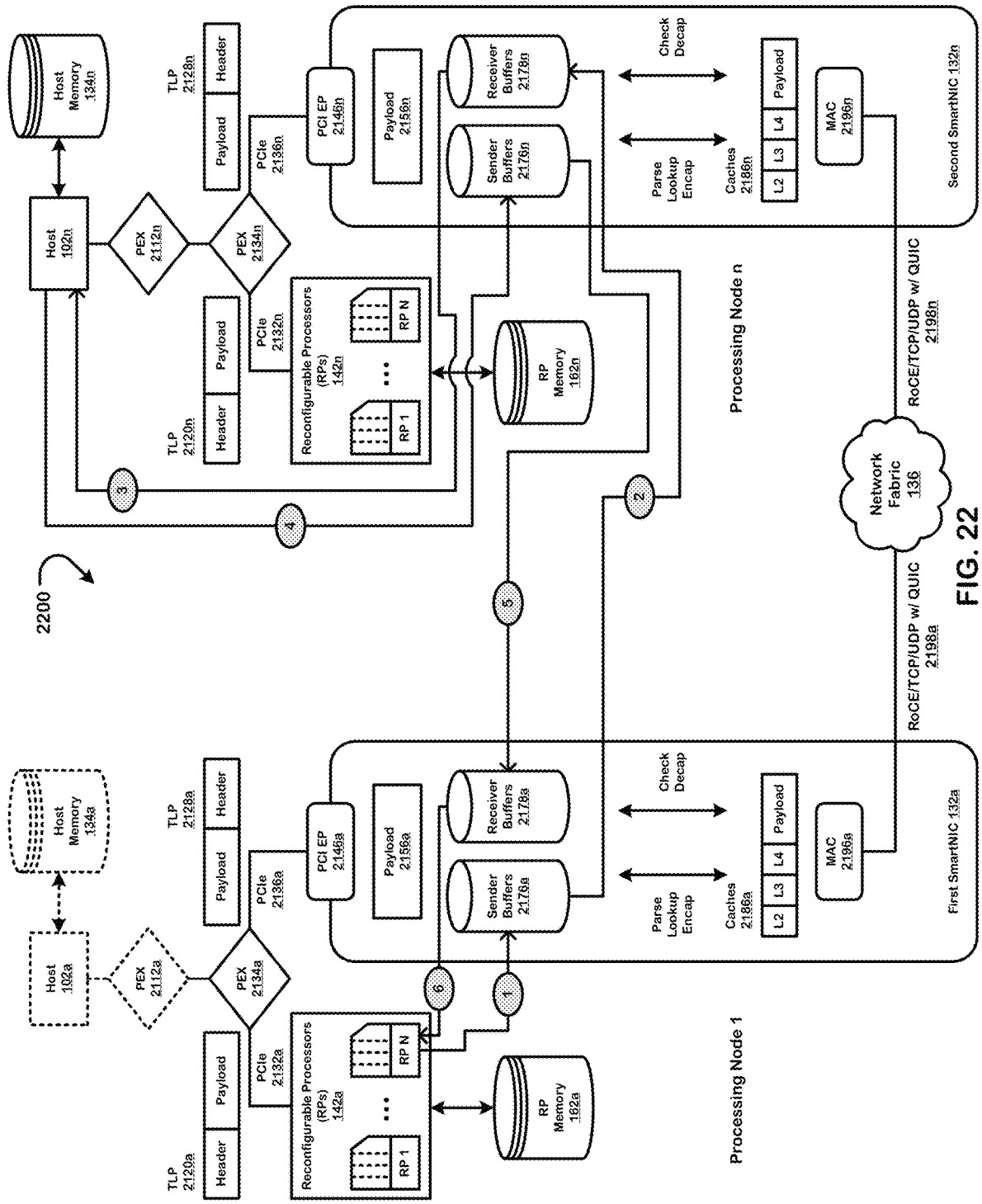
FIG. 22 is a message sequence chart illustrating another implementation of buffer-based inter-node streaming of configuration data over the network fabric.

FIG. 22 is a message sequence chart 2200 illustrating another implementation of buffer-based inter-node streaming of configuration data (e.g., bit stream) over the network fabric 136. In particular, FIG. 22 shows another implementation of how the runtime processor 1832 executes the configuration files 1822 on the first processing node (processing node 1) and the second processing node (processing node n). In one implementation, the execution includes streaming data (e.g., configuration data (e.g., bit stream) and application data (weights, coefficients, vectors, tensors, control data (e.g., control tokens), etc.) for the configuration files 1822 that define the applications 1802 between the first reconfigurable processor and the second host processor 102*n* using one or more buffers in the first plurality of buffers and one or more buffers in the second plurality of buffers, thereby the streaming bypassing the first host processor 102*a* (as indicated by the dotted lines in FIG. 22). This saves latency and improves throughput, and also does not require any processing time needed on the first host processor 102*a* (e.g., for processing by its operating system).

In some implementations, the execution includes streaming input data for the applications 1802 from the first reconfigurable processor to the second host processor 102*n*. In some implementations, one or more of the sender buffers in the first set of sender buffers 2176*a* are configured to receive the input data from the first reconfigurable processor (operation one) and provide the input data to one or more receiver buffers in the second set of receiver buffers 2178*n* (operation two).

The first reconfigurable processor is configured to push the input data to the first SmartNIC 132*a* (e.g., via the PCIe endpoint port (EP) 2146*a*) (operation one). In some implementations, operation one is accomplished by an address generator of the first reconfigurable processor (e.g., Address Generation and Coalescing Units) (AGCU)) writing the input data to physical memory addresses mapped to the sender buffers in the first set of sender buffers 2176*a* (e.g., via a hardware write (HWRITE) command). In one implementation, the first SmartNIC 132*a* is configured to write the input data, after encapsulation, into the sender buffers in the first set of sender buffers 2176*a*. In one implementation, the first SmartNIC 132*a* is configured to update tail pointers of the sender buffers in the first set of sender buffers 2176*a* in response to the writing of the input data. In one implementation, the first SmartNIC 132*a* is configured to process the input data as payload 2156*a*, apply encapsulation, store it in caches 2186*a*, and stream it to the second SmartNIC 132*n* over the network fabric 136 (e.g., via the MAC port 2196*a*).

One skilled in the art will appreciate that operations one and six comprise streaming network packets between the first reconfigurable processor and the first SmartNIC 132*a* over the local buses PCIe 2132*a* and 2136*a* using a protocol like Transaction Layer Packet (TLP) (e.g., 2120*a*, 2128*a*). One skilled in the art will also appreciate that operation two comprises streaming network packets from the first SmartNIC 132*a* to the second SmartNIC 132*n* over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198*a*, 2198*n*).

The receiver buffers in the second set of receiver buffers 2178*n* are configured to provide the input data to the second host processor 102*n* (operation three). In some implementations, operation three is accomplished by an address generator of the second host processor 102*n* (e.g., the second host processor reads DMAed data once the DMA operation is complete.) reading the input data from physical memory addresses mapped to the receiver buffers in the second set of receiver buffers 2178*n* (e.g., via a hardware read (HWREAD) command) In one implementation, the first SmartNIC 132*a* is configured to send the input data to the second SmartNIC 132*n* in response to the updated tail pointers. In one implementation, the second SmartNIC 132*n* is configured to write the input data, after decapsulation, into the receiver buffers in the second set of receiver buffers 2178*n*. In one implementation, the second SmartNIC 132*n* is configured to update tail pointers of the receiver buffers in the second set of receiver buffers 2178*n* in response to the writing of the input data. The second host processor 102*n* is configured to pull the input data from the second SmartNIC 132*n* (e.g., via the PCIe Endpoint Port (EP) 2146*n*) by reading the input data from the receiver buffers in the second set of receiver buffers 2178*n* in response to the updated tail pointers. Generally SmartNIC would DMA the payload into host 102*n* memory 134*n*, then notify the host via a DMA completion mechanism.

In some implementations, the execution includes streaming output data for the applications 1802 from the second host processor 102*n* to the first reconfigurable processor. The output data is generated as a result of processing the input data (e.g., processing of the input data by the second host processor 102*n*). In some implementations, one or more of the sender buffers in the second set of sender buffers 2176*n* are configured to receive the output data from the second host processor 102*n* (operation four) and provide the output data to one or more receiver buffers in the first set of receiver buffers 2178*a* (operation five).

The second host processor 102*n* is configured to push the output data to the second SmartNIC 132*n* (e.g., via the PCIe Endpoint Port (EP) 2146*n*) (operation four). In some implementations, operation four is accomplished by a DMA operation. In one implementation, the second SmartNIC 132*n* is configured to write the output data, after encapsulation, into the sender buffers in the second set of sender buffers 2176*n*. In one implementation, the second SmartNIC 132*n* is configured to update tail pointers of the sender buffers in the second set of sender buffers 2176*n* in response to the writing of the output data. In one implementation, the second SmartNIC 132*n* is configured to process the output data as payload 2156*n*, apply encapsulation, store it in caches 2186*n*, and stream it to the first SmartNIC 132*a* over the network fabric 136 (e.g., via the MAC port 2196*n*).

One skilled in the art will appreciate that operations three and four comprise streaming network packets between the second host processor 102*n* to the second SmartNIC 132*n* over the local buses PCIe 2132*n* and 2136*n* using a protocol like Transaction Layer Packet (TLP) (e.g., 2120*n*, 2128*n*). One skilled in the art will also appreciate that operation five comprises streaming network packets from the second SmartNIC 132*n* to the first SmartNIC 132*a* over the network fabric 136 (e.g., Ethernet, InfiniBand (IB)) using protocols like RDMA over Converged Ethernet (RoCE), TCP, User Datagram Protocol (UDP), and Quick UDP Internet Connections (QUIC) (e.g., 2198*a*, 2198*n*).

The receiver buffers in the first set of receiver buffers 2178*a* are configured to provide the output data to the first reconfigurable processor (operation six). In some implementations, operation six is accomplished by an address generator of the first reconfigurable processor (e.g., Address Generation and Coalescing Units) (AGCU)) reading the output data from physical memory addresses mapped to the receiver buffers in the first set of receiver buffers 2178*a* (e.g., via a hardware read (HWREAD) command). In one implementation, the second SmartNIC 132*n* is configured to send the output data to the first SmartNIC 132*a* in response to the updated tail pointers. In one implementation, the first SmartNIC 132*a* is configured to write the output data, after decapsulation, into the receiver buffers in the first set of receiver buffers 2178*a*. In one implementation, the first SmartNIC 132*a* is configured to update tail pointers of the receiver buffers in the first set of receiver buffers 2178*a* in response to the writing of the output data. The first reconfigurable processor is configured to pull the output data from the first SmartNIC 132*a* (e.g., via the PCIe Endpoint Port (EP) 2146*a*) by reading the output data from the receiver buffers in the first set of receiver buffers 2178*a* in response to the updated tail pointers.

In some implementations, the first reconfigurable processor notifies the second host processor 102*n* of remote invocations using one or more remote procedure calls. In one implementation, the first reconfigurable processor uses the sender buffers in the first set of sender buffers 2176*a* and the receiver buffers in the second set of receiver buffers 2178*n* to send, over the network fabric 136, one or more argument values to the second host processor 102*n* for execution of the remote procedure calls (similar to operation 2 in FIG. 22).

In some implementations, the second host processor 102*n* notifies the first reconfigurable processor of remote invocations using one or more remote procedure calls. In one implementation, the second host processor 102*n* uses the sender buffers in the second set of sender buffers 2176*n* and the receiver buffers in the first set of receiver buffers 2178*a* to send, over the network fabric 136, one or more argument values to the first reconfigurable processor for execution of the remote procedure calls (similar to operation 5 in FIG. 22).

In the synchronous mode of a remote procedure call using a first set of buffers, the technology disclosed allows a remote entity which executed the remote procedure call to produce one or more result values and send them back to the remote caller using a distinct set of buffers. In one implementation, the two communicating entities may designate two buffer queues, one in each direction. The caller will send the data by copying it into a first buffer queue. The receiver will pull the data out of the first buffer queue, compute an operation, and then place the result in a second buffer queue. The original caller will simply wait until the second buffer queue has data available and will be able to use the result computed remotely as soon as it arrives over the second buffer queue.

In other implementations of the technology disclosed, SmartNICs can be replaced by NICs, which can be controlled by NIC DMAs or via the host processors to implement the flows illustrated in FIGS. 21 and 22 (e.g., updating the head and tail pointers of the buffers). For example, in the NIC implementations, operations two and five of FIGS. 21 and 22 are executed by the first and second host processors 102*a* and 102*n* by initiating Remote DMA (RDMA) of the networking packets between the first NIC 132*a* and the second NIC 132*n*, and updating the corresponding tail pointers of the buffers upon arrival of the network packets.

In some implementations, the SmartNICs and the NICs are embedded on-chip on the reconfigurable processors.

Model Parallelism

Figure 23:
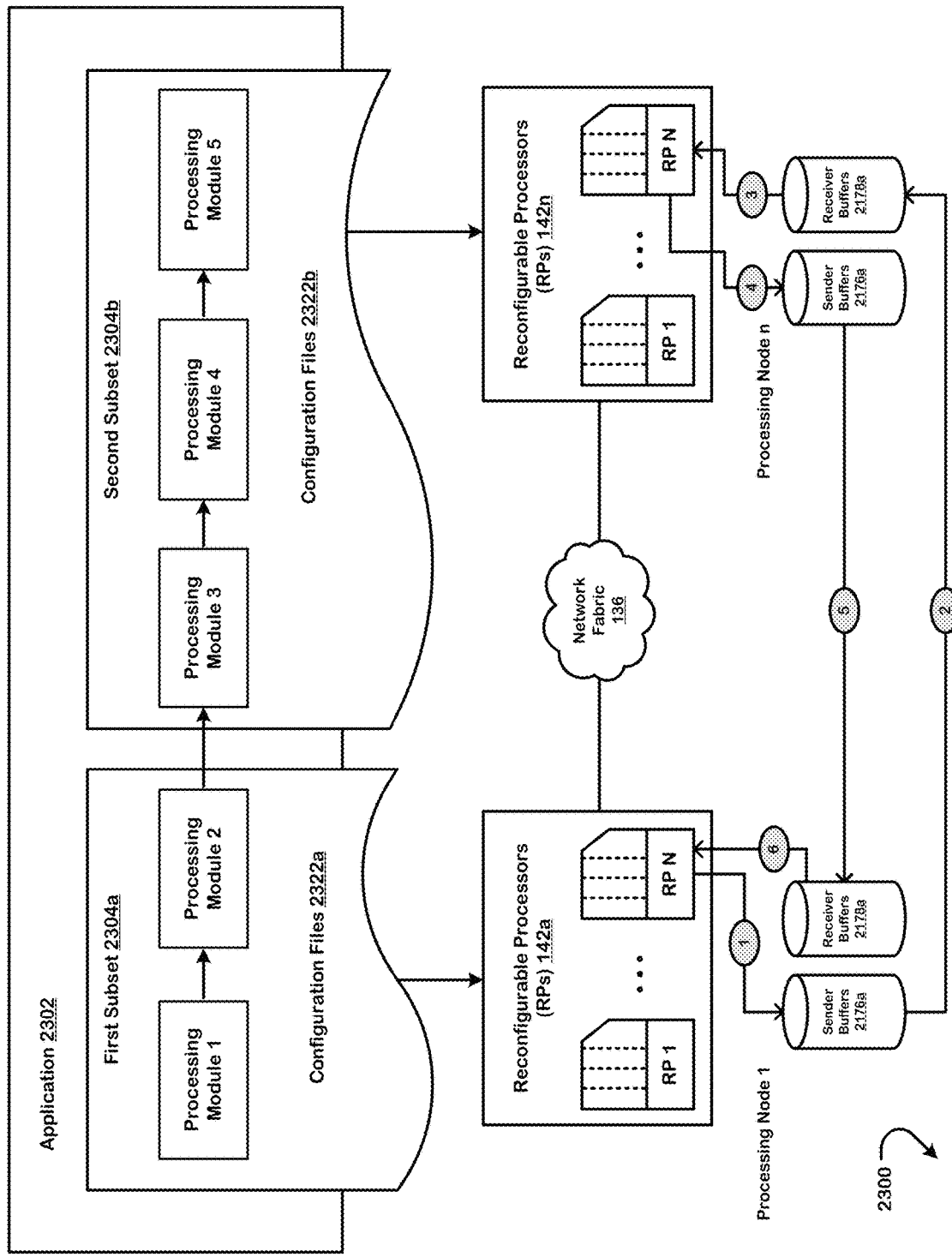
FIG. 23 illustrates one implementation of executing a model/application in parallel using the disclosed buffer-based inter-node streaming of configuration data over the network fabric 136. This is referred to herein as "model parallelism."

FIG. 23 illustrates one implementation of executing 2300 a model/application in parallel using the disclosed buffer-based inter-node streaming of configuration data (e.g., bit stream) over the network fabric 136. This is referred to herein as "model parallelism."

Application 2302 is a dataflow graph with a set of processing modules (e.g., processing modules 1 to 5). Examples of the processing modules include neurons or layers of deep neural networks. The runtime processor 1832 is configured to partition the set of processing modules into a first subset of processing modules 2304*a* and a second subset of processing modules 2304*b*. The runtime processor 1832 is configured to execute configuration files 2322*a* for the first subset of processing modules 2304*a* on the first reconfigurable processor (e.g., RP N from the RPs 142*a* on the processing node 1). The runtime processor 1832 is configured to execute configuration files 2322*b* for the second subset of processing modules 2304*b* on the second reconfigurable processor (e.g., RP N from the RPs 142*n* on the processing node n).

Deep neural network training, implemented, for example, by Stochastic Gradient Descent (SGD) comprises a forward pass and a backward pass. The backward pass comprises a delta pass and a chain pass. The forward pass propagates activations in a forward direction. The delta pass propagates deltas in a backward direction. The chain pass calculates gradients based on the deltas as the deltas are generated in the delta pass.

The runtime processor 1832 is configured to use the first plurality of buffers 2176*a*, 2178*a* and the second plurality of buffers 2176*n*, 2178*n* to stream data between the first subset of processing modules 2304*a* and the second subset of processing modules 2304*b*. The data includes feature maps and/or activations generated during a forward pass, and parameter gradients generated during a backward pass.

The operations one to six depicted in FIG. 23 are similar to corresponding operations in FIG. 21.

Data Parallelism

Figure 24:
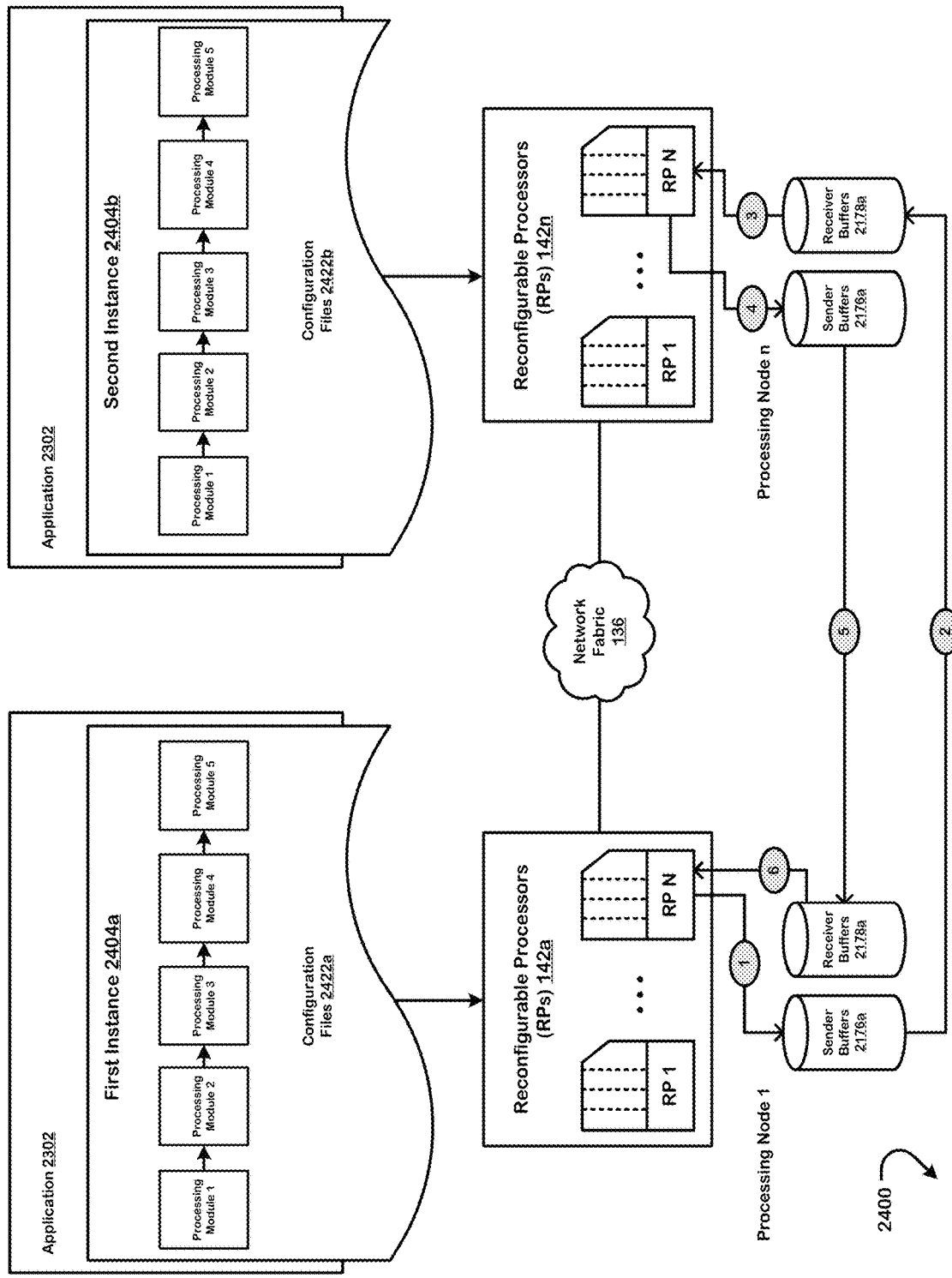
FIG. 24 illustrates one implementation of executing multiple instances of a model/application in parallel using the disclosed buffer-based inter-node streaming of configuration data over the network fabric 136. This is referred to herein as "data parallelism."

FIG. 24 illustrates one implementation of executing 2400 multiple instances of a model/application in parallel using the disclosed buffer-based inter-node streaming of configuration data (e.g., bit stream) over the network fabric 136. This is referred to herein as "data parallelism." The runtime processor 1832 is configured to initialize a first instance of the dataflow graph 2404*a* and a second instance of the dataflow graph 2404*b*.

The runtime processor 1832 is configured to execute configuration files 2422*a* for the first instance 2404*a* of the dataflow graph on the first reconfigurable processor (e.g., RP N from the RPs 142a on the processing node 1). The runtime processor 1832 is configured to execute configuration files 2422b for the second instance 2404b of the dataflow graph on the second reconfigurable processor (e.g., RP N from the RPs 142n on the processing node n).

The runtime processor 1832 is configured to use the first plurality of buffers 2176a, 2178a and the second plurality of buffers 2176n, 2178n to stream data between the first instance of the dataflow graph and the second instance of the dataflow graph. The data includes gradients generated during the backward pass.

The operations one to six depicted in FIG. 24 are similar to corresponding operations in FIG. 21.

Heterogeneous Reconfigurable Processors

Figure 25:
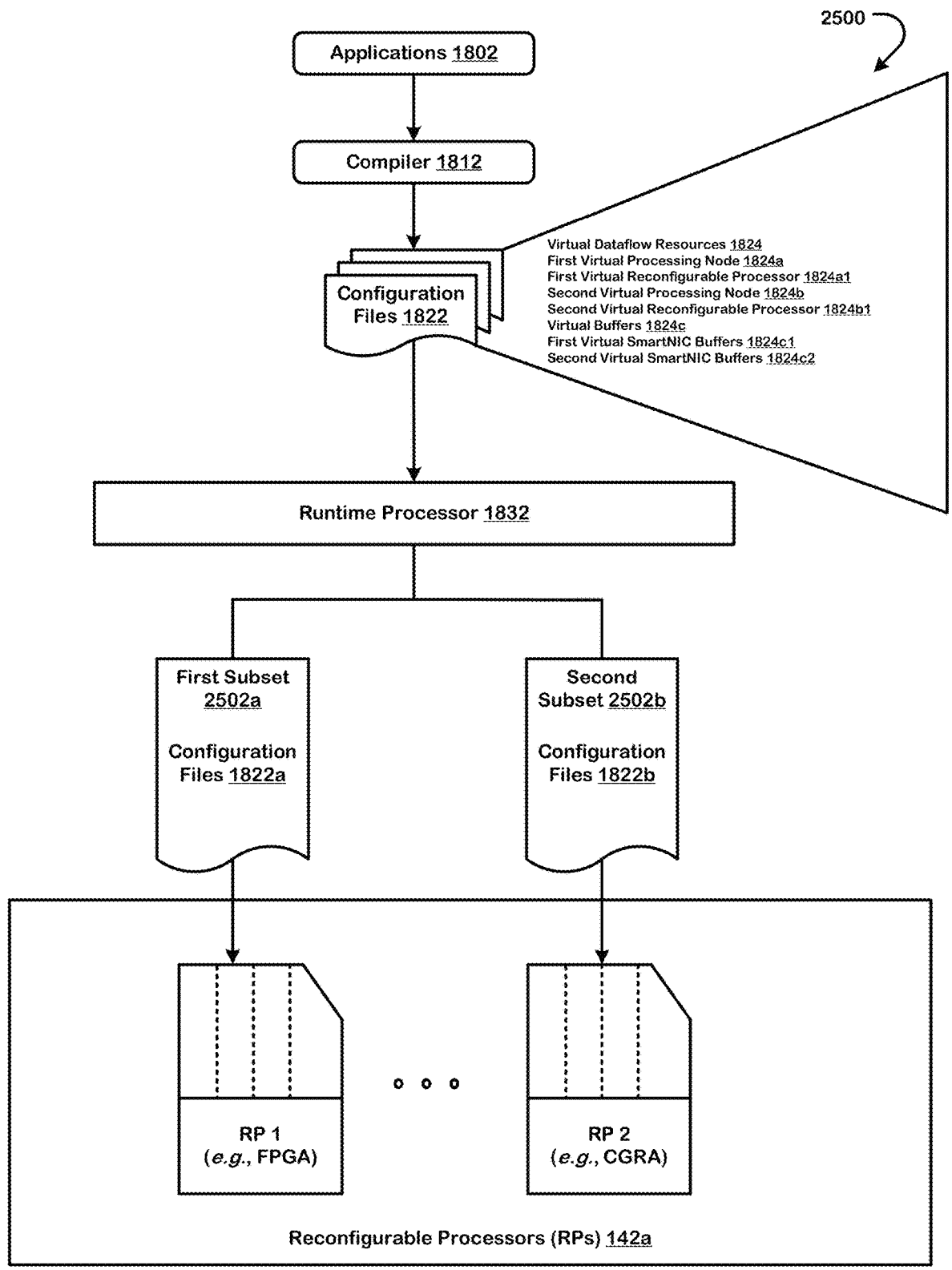
FIG. 25 illustrates one implementation of executing configuration files on heterogeneous reconfigurable processors.

FIG. 25 illustrates one implementation of executing 2500 configuration files on heterogeneous reconfigurable processors (e.g., RP 1 and RP 2 in FIG. 25). Examples of the heterogeneous reconfigurable processors include Central Processing Units (CPUs), Graphics Processing Units (GPUs), Field Programmable Gate Arrays (FPGAs), Coarse-Grained Reconfigurable Architectures (CGRAs), Application-Specific Integrated Circuits (ASICs), Application Specific Instruction-set Processor (ASIP), and Digital Signal Processors (DSPs).

The heterogeneous reconfigurable processors have different levels of configurable granularity. The runtime processor 1832 is configured to receive a set of configuration files (e.g., 1822) for an application (e.g., 1802). The runtime processor 1832 is configured to load and execute a first subset of configuration files 2502a in the set of configuration files on a first reconfigurable processor (RP 1) in the heterogeneous reconfigurable processors. The first reconfigurable processor has a first configuration and/or a first level of configurable granularity. The runtime processor 1832 is configured to load and execute a second subset of configuration files 2502b in the set of configuration files on a second reconfigurable processor (RP 2) in the heterogeneous reconfigurable processors. The second reconfigurable processor has a second configuration and/or a second level of configurable granularity that is different from the first configuration and/or the first level of configurable granularity.

The first configuration is a bit-level configurable granularity, and the first reconfigurable processor is a Field-Programmable Gate Array (FPGA). The second configuration is a word-level configurable granularity, and the second reconfigurable processor is a Coarse-Grained Reconfigurable Architecture (CGRA). The first configuration is a gate-level reconfigurability, and the first reconfigurable processor is the FPGA. The second configuration is a register transfer-level reconfigurability, and the second reconfigurable processor has the CGRA. The first configuration uses bit-wise Look-Up Tables (LUTs) and switches, and the first reconfigurable processor is the FPGA. The second configuration uses word-wide Issue Slots (ISs)/Arithmetic Logic Units (ALUs)/Functional Units (FUs)/Processing Elements (PEs), Register Files (RFs), and interconnections, and the second reconfigurable processor has the CGRA. A number of the ISs used by the second reconfigurable processor is fewer than a number of the LUTs used by the first reconfigurable processor. A number of bits required to configure the second reconfigurable processor is orders of magnitude smaller than a number of bits required to configure the first reconfigurable processor.

On-Chip NIC/SmartNIC

Figure 26:
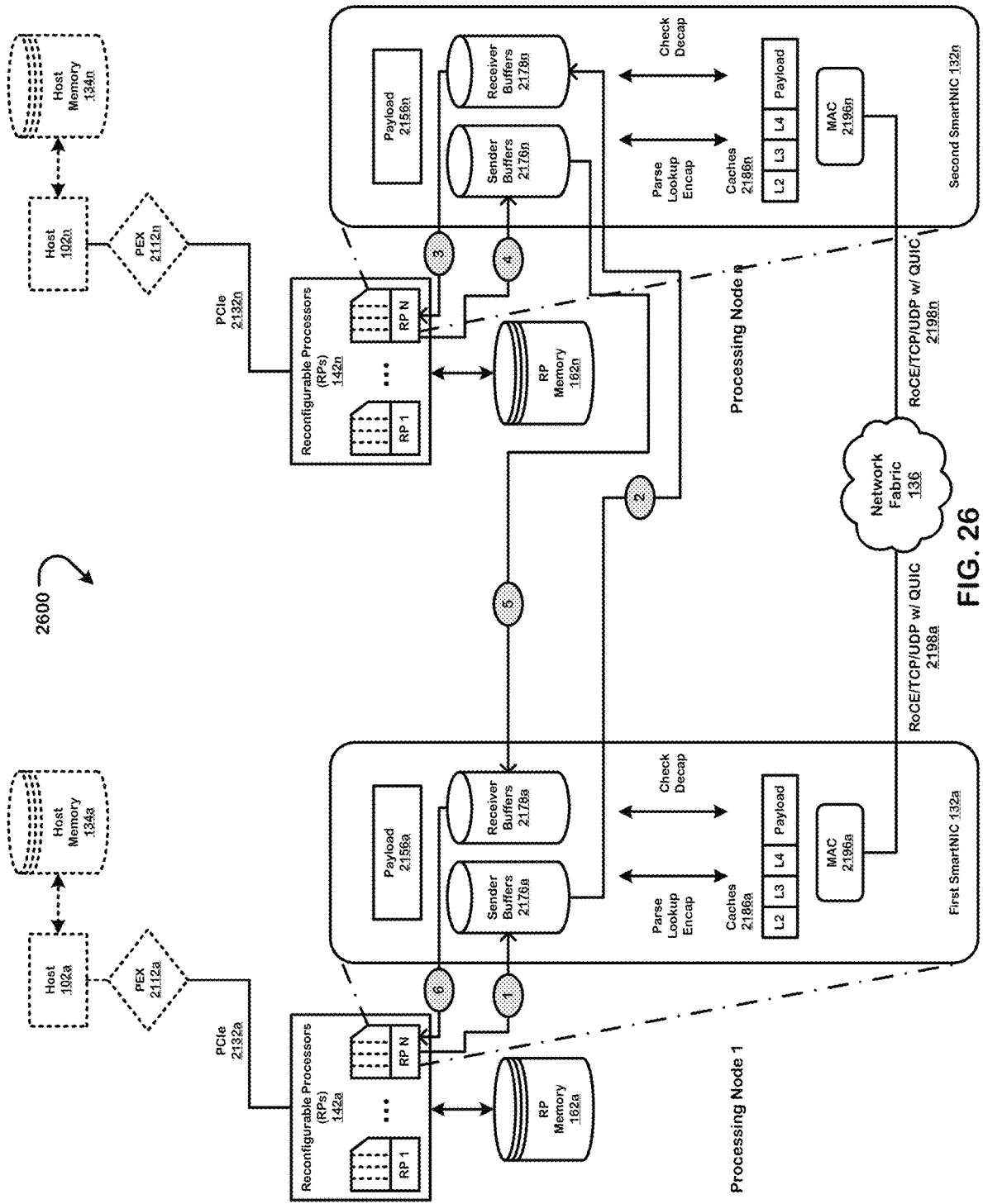
FIG. 26 illustrates one implementation of executing configuration files using NIC or SmartNIC devices that are embedded on the reconfigurable processors.

FIG. 26 illustrates one implementation of executing 2600 configuration files using NIC or SmartNIC devices that are embedded on the reconfigurable processors.

A first reconfigurable processor (e.g., RP N from the RPs 142a on the processing node 1) has a first Network Interface Controller (NIC), and the first NIC has a first plurality of buffers 2176a, 2178a. A second reconfigurable processor (e.g., RP N from the RPs 142n on the processing node n) has a second NIC, and the second NIC has a second plurality of buffers 2176n, 2178n. The runtime processor 1832 is configured to execute the configuration files 1812 for the applications 1802 using the first reconfigurable processor and the second reconfigurable processor. The execution includes streaming data (e.g., configuration data (e.g., bit stream) and application data (weights, coefficients, vectors, tensors, control data (e.g., control tokens), etc.) for the configuration files 1822 that define the applications 1802 between the first reconfigurable processor and the second reconfigurable processor using the first plurality of buffers of the first NIC and the second plurality of buffers of the second NIC.

The operations one to six depicted in FIG. 26 are similar to corresponding operations in FIG. 21.

Example Reconfigurable Processor

Figure 27:
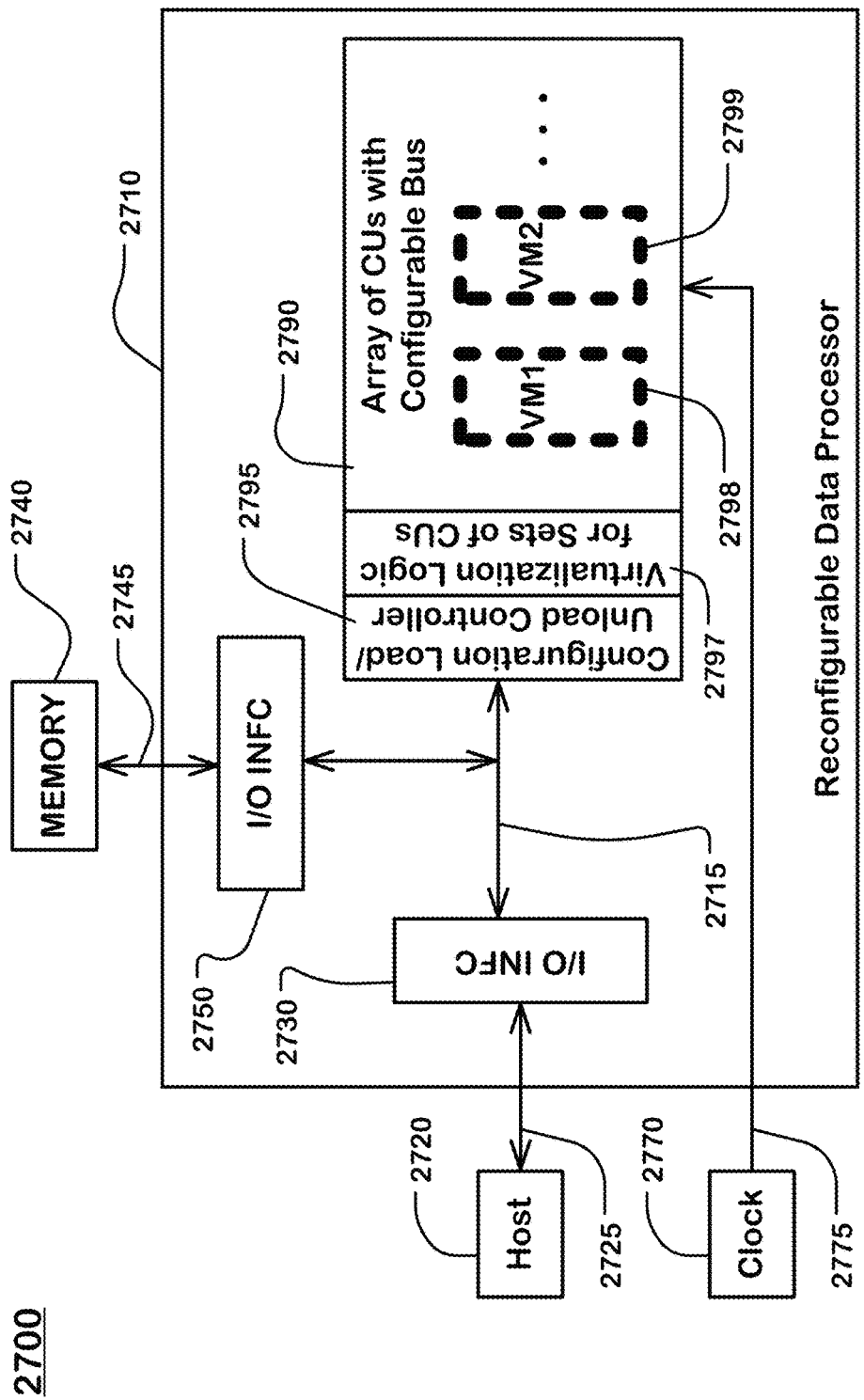
FIG. 27 is a system diagram illustrating a system including a host, a memory, and an example reconfigurable data processor on which the technology disclosed can be applied.

FIG. 27 is a diagram illustrating a system 2700 including a host 2720, a memory 2740, and an example reconfigurable data processor 2710 in which a computation unit as described herein is deployed by hardware or by configuration of reconfigurable components and configured with the virtualization logic 2797. As shown in the example of FIG. 27, the reconfigurable data processor 2710 includes an array 2790 of configurable units and a configuration load/unload controller 2795.

The virtualization logic 2797 can include resources that support or enable simultaneous execution of multiple, unrelated application graphs (or related ones) in an array of configurable units on one die or one multichip module. In the illustration, a first application graph is implemented in virtual machine VM1 in a particular set 2798 of configurable units, and a second application graph is implemented in virtual machine VM2 in another set 2799 of configurable units.

Figure 30:
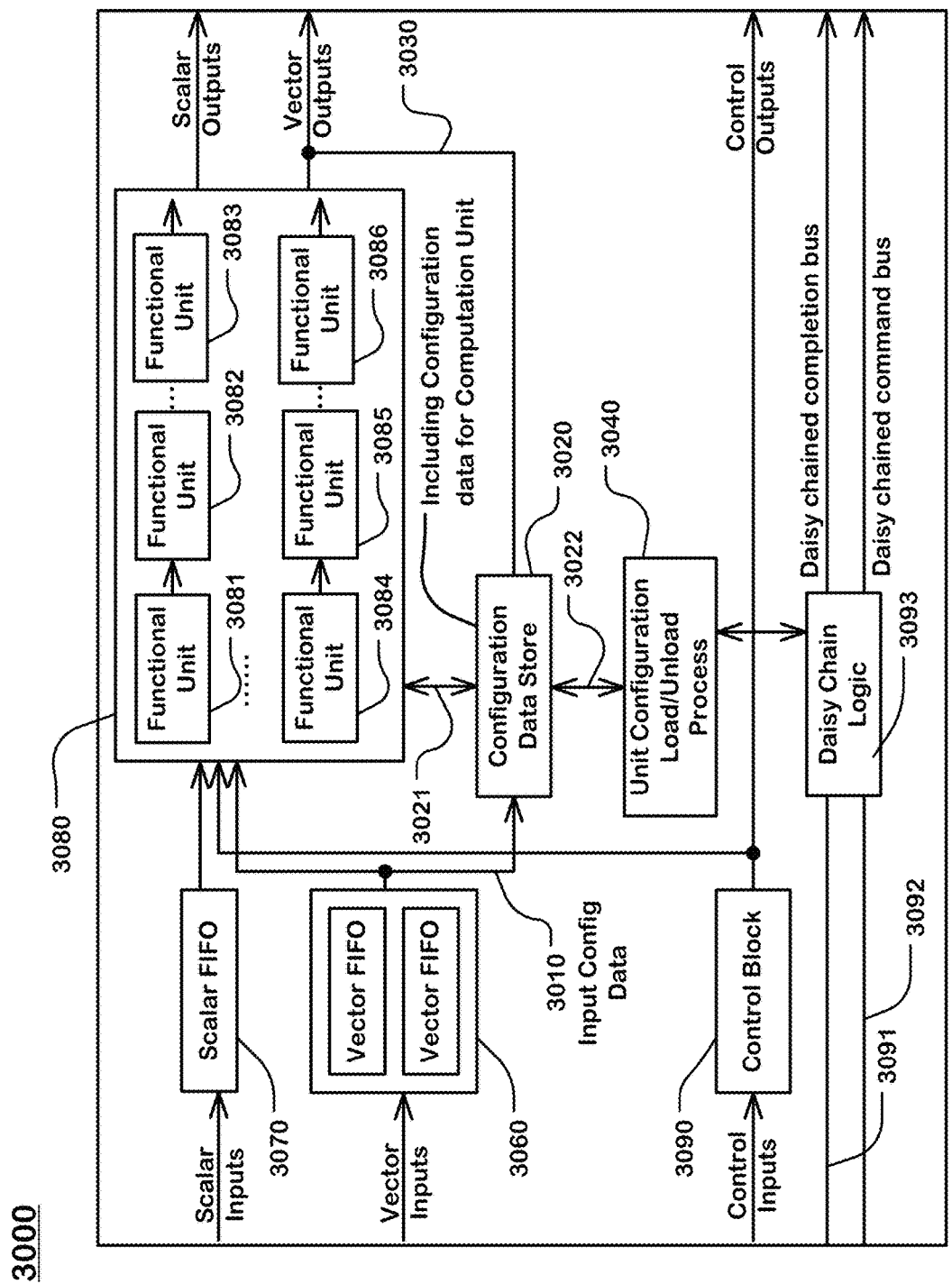
FIG. 30 is a block diagram illustrating an example configurable unit, such as a Pattern Compute Unit (PCU).
Figure 31:
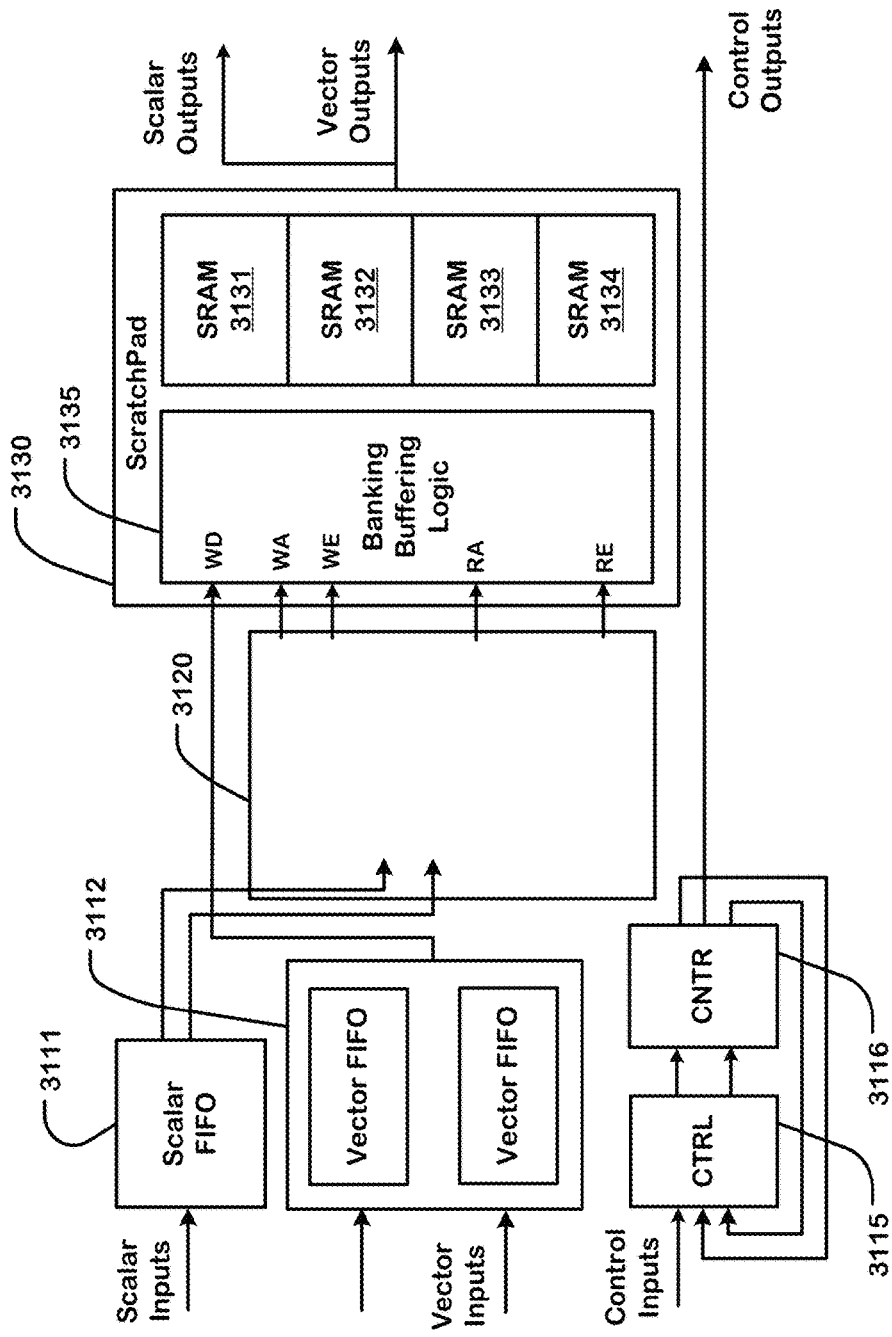
FIG. 31 is a block diagram illustrating an example configurable unit, such as a Pattern Memory Unit (PMU).

Configurable units in an array 2790 of configurable units are further described in reference to FIGS. 30 and 31 and configured with the virtualization logic 2797. Configurable units can include, or can have units configured to implement, a computation unit or computation units, as described herein.

The reconfigurable data processor 2710 includes an external I/O interface 2730 connected to the host 2720 by line 2725, and an external I/O interface 2750 connected to the memory 2740 by line 2745. The I/O interfaces 2730, 2750 connect via a bus system 2715 to the array 2790 of configurable units and to the configuration load/unload controller 2795. The bus system 2715 may have a bus width of carrying one chunk of data, which can be for this example one hundred and twenty-eight bits (references to one hundred and twenty-eight bits throughout can be considered as an example chunk size more generally).

To configure configurable units in the array 2790 of configurable units with a configuration file, the host 2720 can send the configuration file to the memory 2740 via the I/O interface 2730, the bus system 2715, and the I/O interface 2750 in the reconfigurable data processor 2710. The configuration file can be loaded in many ways, as suits a particular architecture, including in data paths outside the configurable processor 2710. The configuration file can be retrieved from the memory 2740 via the memory I/O interface 2750. Chunks of the configuration file can then be sent in a distribution sequence to configurable units in the array 2790 of configurable units in the reconfigurable data processor 2710.

An external clock generator 2770 or other clock line sources can provide a clock line 2775 or clock lines to elements in the reconfigurable data processor 2710, including the array 2790 of configurable units, and the bus system 2715, and the external data I/O interfaces. The bus system 2715 can communicate data at a processor clock rate via a clock line 2775 or clock lines.

Figure 28:
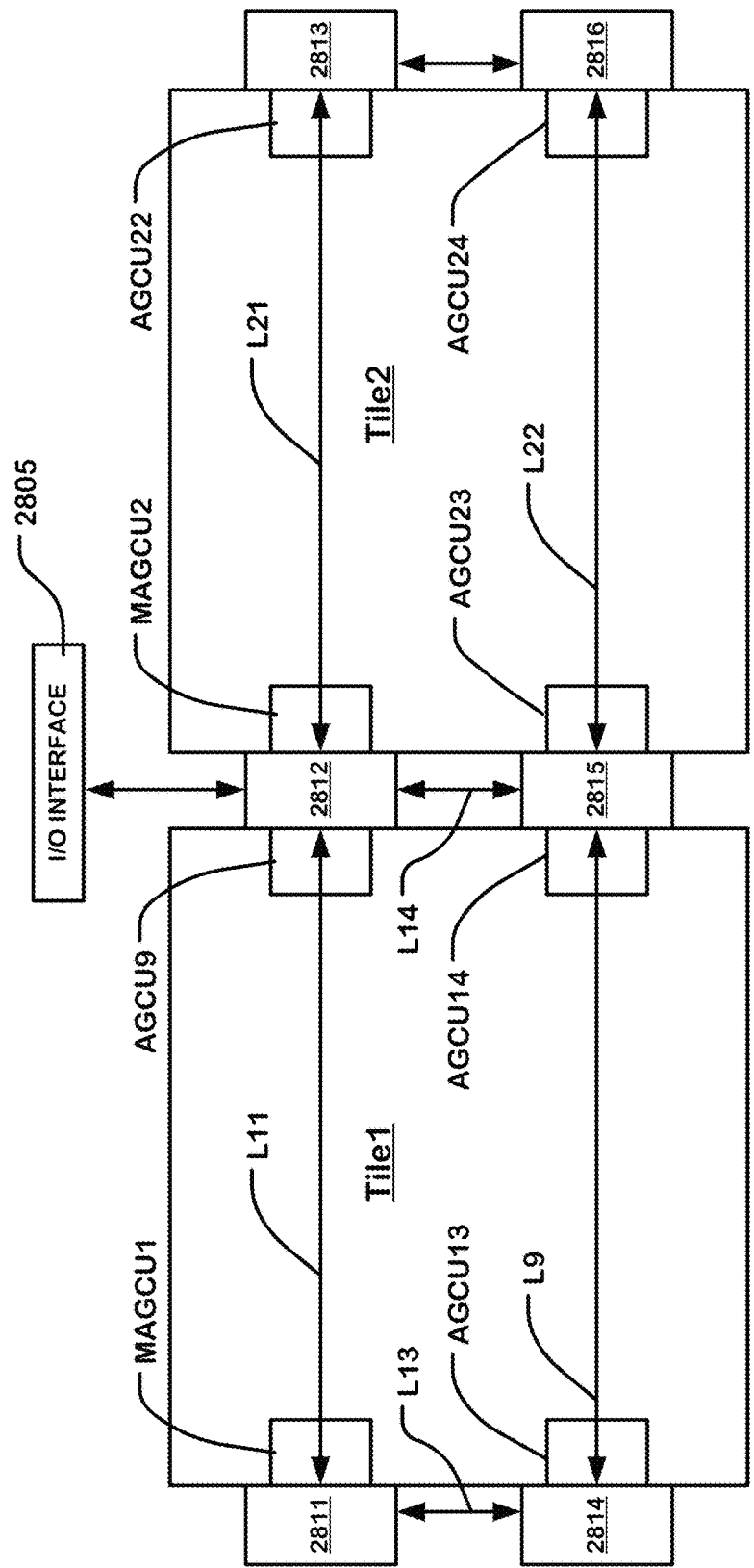
FIG. 28 is a simplified block diagram of a top-level network and components of a CGRA (Coarse-Grained Reconfigurable Architecture).

FIG. 28 is a simplified block diagram 2800 of components of a CGRA (Coarse-Grained Reconfigurable Architecture) processor. In this example, the CGRA processor has two tiles (Tile 1, Tile2). The tile comprises an array of configurable units connected to a bus system, including array level networks in this example. An array of configurable units (e.g., 2790, FIG. 27) in the tile includes computation units in hardware or by configuration of reconfigurable components, which are configured with the virtualization logic 2797. The bus system includes a top-level network connecting the tiles to external I/O interface 2805 (or any number of interfaces). In other embodiments, different bus system configurations may be utilized. The configurable units in each tile are nodes on the array level network in this embodiment.

Each of the tiles has four AGCUs (Address Generation and Coalescing Units) (e.g., MAGCU1, AGCU9, AGCU13, AGCU14). The AGCUs are nodes on the top-level network and nodes on the array level networks and include resources for routing data among nodes on the top-level network and nodes on the array level network in each tile.

Nodes on the top-level network in this example include one or more external I/Os, including interface 2805. The interfaces to external devices include resources for routing data among nodes on the top-level network and external devices, such as high-capacity memory, host processors, other CGRA processors, FPGA devices and so on, that are connected to the interfaces.

One of the AGCUs in a tile is configured in this example to be a master AGCU, which includes an array configuration load/unload controller for the tile. In other embodiments, more than one array configuration load/unload controller can be implemented, and one array configuration load/unload controller may be implemented by logic distributed among more than one AGCU.

The MAGCU1 includes a configuration load/unload controller for Tile1, and MAGCU2 includes a configuration load/unload controller for Tile2. In other embodiments, a configuration load/unload controller can be designed for loading and unloading configuration of more than one tile. In other embodiments, more than one configuration controller can be designed for configuration of a single tile. Also, the configuration load/unload controller can be implemented in other portions of the system, including as a stand-alone node on the top-level network and the array level network or networks.

The top-level network is constructed using top-level switches (2811, 2813, 2814, and 2816) connecting to each other as well as to other nodes on the top-level network, including the AGCUs, and I/O interface 2805. The top-level network includes links (e.g., L11, L9, L21, L22) connecting the top-level switches. Data travels in packets between the top-level switches on the links, and from the switches to the nodes on the network connected to the switches. For example, top-level switches 2811 and 2812 are connected by a link L14, top-level switches 2814 and 2815 are connected by a link L9, top-level switches 2811 and 2814 are connected by a link L13, and top-level switches 2812 and 2813 are connected by a link L21. The links can include one or more buses and supporting control lines, including for example a chunk-wide bus (vector bus). For example, the top-level network can include data, request and response channels operable in coordination for transfer of data in a manner analogous to an AXI compatible protocol. See, AMBA® AXI and ACE Protocol Specification, ARM.

Top-level switches can be connected to AGCUs. For example, top-level switches 2811, 2812, 2814, and 2815 are connected to MAGCU1, AGCU9, AGCU13 and AGCU14 in the tile Tile1, respectively. Top-level switches 2812, 2813, 2815, and 2816 are connected to MAGCU2, AGCU22, AGCU23 and AGCU24 in the tile Tile2, respectively.

Top-level switches can be connected to one or more external I/O interfaces (e.g., interface 2805).

Figure 29B:
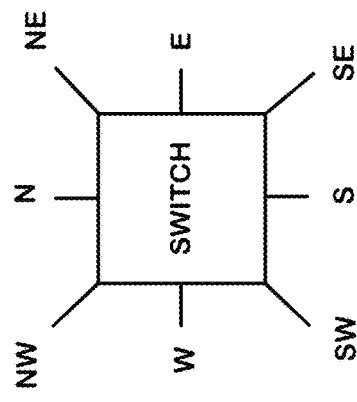
FIG. 29B illustrates an example switch unit connecting elements in an array level network.
Figure 29:
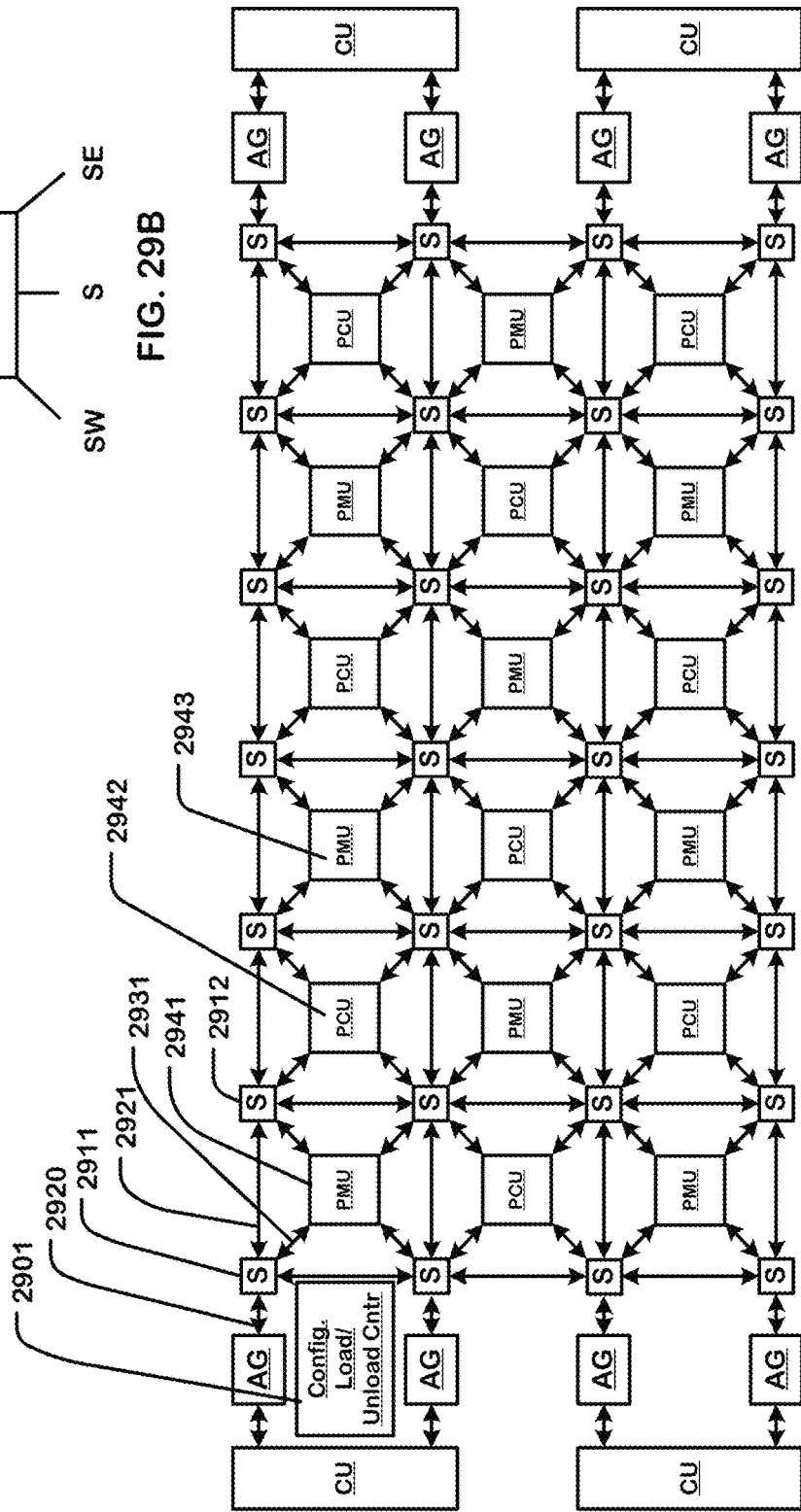
FIG. 29 is a simplified diagram of a tile and an array level network usable in the configuration of FIG. 27, where the configurable units are nodes on the array level network and are configurable to implement a Look-Up Table with input offsetting.

FIG. 29 is a simplified diagram of a tile and an array level network usable in the configuration of FIG. 28, where the configurable units in the array are nodes on the array level network and are configurable to implement the virtualization logic 2797.

In this example, the array of configurable units 2900 includes a plurality of types of configurable units, which are configured with the virtualization logic 2797. The types of configurable units in this example, include Pattern Compute Units (PCUs), Pattern Memory Units (PMUs), Switch units (S), and Address Generation and Coalescing Units (each including two address generators AG and a shared CU). For an example of the functions of these types of configurable units, see, Prabhakar et al., "Plasticine: A Reconfigurable Architecture For Parallel Patterns," ISCA '17, Jun. 24-28, 2017, Toronto, ON, Canada, which is incorporated by reference as if fully set forth herein. In this example, the PCUs (e.g., 2942) and PMUs (e.g., 2943) in the array of configurable units 2900 can include resources configurable for embodiment of a computation unit, an example configuration of which is described herein. Each of these configurable units contains a configuration store comprising a set of registers or flip-flops that represent either the setup or the sequence to run a program, and can include the number of nested loops, the limits of each loop iterator, the routes and/or instructions to be executed for each stage including stages, the source of the operands, and the network parameters for the input and output interfaces. The configuration file can include entries of Look-Up Tables as described herein.

Additionally, each of these configurable units contains a configuration store comprising a set of registers or flip-flops that store status usable to track progress in nested loops or otherwise. A configuration file in the configuration store contains a bit-stream representing the initial configuration, or starting state, of each of the components that execute the program. This bit-stream is referred to as a bit file. Program load is the process of setting up the configuration stores in the array of configurable units based on the contents of the bit file to allow the components to execute a program (i.e., a machine), including programs that utilize the virtualization logic 2797. Program Load may also require the load of all PMU memories.

The array level network includes links interconnecting configurable units in the array. The links in the array level network include one or more and, in this case, three kinds of physical buses: a chunk-level vector bus (e.g., one hundred and twenty-eight bits of data), a word-level scalar bus (e.g., thirty-two bits of data), and a multiple bit-level control bus. For instance, interconnect 2921 between switch units 2911 and 2912 includes a vector bus interconnect with a vector bus width of one hundred and twenty-eight bits, a scalar bus interconnect with a scalar bus width of thirty-two bits, and a control bus interconnect.

The three kinds of physical buses differ in the granularity of data being transferred. In one embodiment, the vector bus can carry a chunk that includes sixteen-bytes (=one hundred and twenty-eight bits) of data as its payload. The scalar bus can have a thirty-two-bit payload and carry scalar operands or control information. In some machines implemented using this system, data can be represented using floating point data formats, including standard or non-standard formats. Example formats include FP32 and BF16, among others. It can be understood that the number of data values carried on the scalar and vector buses is a function of the encoding format of the data values, with FP32 utilizing thirty-two bits per value and BF16 using sixteen bits per value.

The control bus can carry control handshakes such as tokens and other lines. The vector and scalar buses can be packet switched, including headers that indicate a destination of each packet and other information such as sequence numbers that can be used to reassemble a file when the packets are received out of order. Each packet header can contain a destination identifier that identifies the geographical coordinates of the destination switch unit (e.g., the row and column in the array), and an interface identifier that identifies the interface on the destination switch (e.g., North, South, East, West, etc.) used to reach the destination unit. The control network can be circuit switched based on timing circuits in the device, for example. The configuration load/unload controller can generate a header for each chunk of configuration data (e.g., bit stream) of one hundred and twenty-eight bits. The header is transmitted on a header bus to each configurable unit in the array of configurable unit.

In one example, a chunk of data of one hundred and twenty-eight bits is transmitted on the vector bus that provides the chunk as vector inputs to a configurable unit. The vector bus can include one hundred and twenty-eight payload lines, and a set of header lines. The header can include a sequence ID for each chunk, which can include:
  A bit to indicate if the chunk is scratchpad memory or configuration store data.
  Bits that form a chunk number.
  Bits that indicate a column identifier.
  Bits that indicate a row identifier.
  Bits that indicate a component identifier.

For a load operation, the configuration load controller can send the number N of chunks to a configurable unit in order from N−1 to 0. If, for example, N=6, the chunks are sent out in most-significant-bit-first order of Chunk 5→Chunk 4→Chunk 3→Chunk 2→Chunk 1→Chunk 0. (Note that this most-significant-bit-first order results in Chunk 5 being distributed in round 0 of the distribution sequence from the array configuration load controller.) For an unload operation, the configuration unload controller can write the unload data out of order to the memory. For both load and unload operations, the shifting in the configuration serial chains in a configuration data (e.g., bit stream) store in a configurable unit is from LSB (Least-Significant-Bit) to MSB (Most-Significant-Bit), or MSB out first.

FIG. 29B illustrates an example switch unit connecting elements in an array level network. As shown in the example of FIG. 29B, a switch unit can have eight interfaces. The North, South, East and West interfaces of a switch unit are used for connections between switch units. The Northeast, Southeast, Northwest and Southwest interfaces of a switch unit are each used to make connections to PCU or PMU instances. A set of two switch units in each tile quadrant have connections to an Address Generation and Coalescing Unit (AGCU) that include multiple Address Generation (AG) units and a Coalescing Unit (CU) connected to the multiple address generation units. The Coalescing Unit (CU) arbitrates between the AGs and processes memory requests. Each of the eight interfaces of a switch unit can include a vector interface, a scalar interface, and a control interface to communicate with the vector network, the scalar network, and the control network.

During execution of a machine after configuration, data can be sent via one or more unit switches and one or more links between the unit switches to the configurable units using the vector bus and vector interface(s) of the one or more switch units on the array level network.

In embodiments described herein, a configuration file or bit file, before configuration of the tile, can be sent from the configuration load controller using the same vector bus, via one or more unit switches and one or more links between the unit switches to the configurable unit using the vector bus and vector interface(s) of the one or more switch units on the array level network. For instance, a chunk of configuration data (e.g., bit stream) in a unit file particular to a configurable unit PMU 2941 can be sent from the configuration load/unload controller 2901 to the PMU 2941, via a link 2920 between the configuration load/unload controller 2901 and the West (W) vector interface of the switch unit 2911, the switch unit 2911, and a link 2931 between the Southeast (SE) vector interface of the switch unit 2911 and the PMU 2941.

In this example, one of the AGCUs is configured to be a master AGCU, which includes a configuration load/unload controller (e.g., 2901). The master AGCU implements a register through which the host (2720, FIG. 27) can send commands via the bus system to the master AGCU. The master AGCU controls operations on an array of configurable units in a tile and implements a program control state machine to track the state of the tile based on the commands it receives from the host through writes to the register. For every state transition, the master AGCU issues commands to all components on the tile over a daisy-chained command bus (FIG. 30). The commands include a program reset command to reset configurable units in an array of configurable units in a tile, and a program load command to load a configuration file to the configurable units.

The configuration load controller in the master AGCU is responsible for reading the configuration file from the memory and sending the configuration data (e.g., bit stream) to every configurable unit of the tile. The master AGCU can read the configuration file from the memory at preferably the maximum throughput of the top-level network. The data read from memory are transmitted by the master AGCU over the vector interface on the array level network to the corresponding configurable unit according to a distribution sequence described herein.

In one embodiment, in a way that can reduce the wiring requirements within a configurable unit, configuration and status registers holding unit files to be loaded in a configuration load process, or unloaded in a configuration unload process, in a component are connected in a serial chain and can be loaded through a process of shifting bits through the serial chain. In some embodiments, there may be more than one serial chain arranged in parallel or in series. When a configurable unit receives, for example, one hundred and twenty-eight bits of configuration data (e.g., bit stream) from the master AGCU in one bus cycle, the configurable unit shifts this data through its serial chain at the rate of one bit per cycle, where shifter cycles can run at the same rate as the bus cycle. It will take one hundred and twenty-eight shifter cycles for a configurable unit to load one hundred and twenty-eight configuration bits with the one hundred and twenty-eight bits of data received over the vector interface. The one hundred and twenty-eight bits of configuration data (e.g., bit stream) are referred to as a chunk. A configurable unit can require multiple chunks of data to load all its configuration bits.

The configurable units interface with the memory through multiple memory interfaces (2750, FIG. 27). Each of the memory interfaces can be accessed using several AGCUs. Each AGCU contains a reconfigurable scalar data path to generate requests for the off-chip memory. Each AGCU contains FIFOs (First-In, First-Out buffers for organizing data) to buffer outgoing commands, data, and incoming responses from the off-chip memory.

FIG. 30 is a block diagram illustrating an example configurable unit 3000, such as a Pattern Compute Unit (PCU), which is configured with the virtualization logic 2797. A configurable unit can interface with the scalar, vector, and control buses, in this example using three corresponding sets of inputs and outputs (JO): scalar inputs/outputs, vector inputs/outputs, and control inputs/outputs. Scalar IOs can be used to communicate single words of data (e.g., thirty-two bits). Vector IOs can be used to communicate chunks of data (e.g., one hundred and twenty-eight bits), in cases such as receiving configuration data (e.g., bit stream) in a unit configuration load process and transmitting and receiving data during operation after configuration across a long pipeline between multiple PCUs. Control IOs can be used to communicate signals on control lines such as the start or end of execution of a configurable unit. Control inputs are received by control block 3090, and control outputs are provided by the control block 3090.

Each vector input is buffered in this example using a vector FIFO in a vector FIFO block 3060 which can include one or more vector FIFOs. Likewise, in this example, each scalar input is buffered using a scalar FIFO 3070. Using input FIFOs decouples timing between data producers and consumers and simplifies inter-configurable-unit control logic by making it robust to input delay mismatches.

A configurable unit includes multiple reconfigurable data paths in block 3080. A data path in a configurable unit can be organized as a multi-stage (Stage 1 . . . Stage N), reconfigurable SIMD (Single Instruction, Multiple Data) pipeline. The chunks of data pushed into the configuration serial chain in a configurable unit include configuration data (e.g., bit stream) for each stage of each data path in the configurable unit. The configuration serial chain in the configuration data (e.g., bit stream) store 3020 is connected to the multiple data paths in block 3080 via lines 3021.

A configurable data path organized as a multi-stage pipeline can include multiple functional units (e.g., 3081, 3082, 3083, 3084, 3085, 3086) at respective stages. A computation unit or parts of a computation unit can be implemented in multiple functional units at respective stages in a multi-stage pipeline or in multiple multi-stage pipelines. A circuit including the virtualization logic 2797 can be implemented in multiple functional units and multiple memory units. Input registers in functional units can register inputs from scalar FIFOs 3070 or Vector FIFOs 3060 or from previous stages in a multi-stage pipeline. A functional unit at a stage in a multi-stage pipeline can execute a function, e.g., logical shift, an arithmetic function, comparison, a logical operation, etc., and generate an output.

Configurable units in the array of configurable units include configuration data (e.g., bit stream) stores 3020 (e.g., serial chains) to store unit files comprising a plurality of chunks (or sub-files of other sizes) of configuration data (e.g., bit stream) particular to the corresponding configurable units. Configurable units in the array of configurable units each include unit configuration load logic 3040 connected to the configuration data (e.g., bit stream) store 3020 via line 3022, to execute a unit configuration load process. The unit configuration load process includes receiving, via the bus system (e.g., the vector inputs), chunks of a unit file particular to the configurable unit and loading the received chunks into the configuration data (e.g., bit stream) store 3020 of the configurable unit. The unit file loaded into the configuration data (e.g., bit stream) store 3020 can include configuration data (e.g., bit stream), including opcodes and routing configuration, for circuits (e.g., module) implementing the virtualization logic 2797 in multiple functional units and multiple memory units, as described herein.

The configuration data (e.g., bit stream) stores in configurable units in the plurality of configurable units in this example comprise serial chains of latches, where the latches store bits that control configuration of the resources in the configurable unit. A serial chain in a configuration data (e.g., bit stream) store can include a shift register chain for configuration data (e.g., bit stream) and a second shift register chain for state information and counter values connected in series.

Input configuration data (e.g., bit stream) 3010 can be provided to a vector FIFO as vector inputs, and then be transferred to the configuration data (e.g., bit stream) store 3020. Output configuration data (e.g., bit stream) 3030 can be unloaded from the configuration data (e.g., bit stream) store 3020 using the vector outputs.

The CGRA uses a daisy-chained completion bus to indicate when a load/unload command has been completed. The master AGCU transmits the program load and unload commands to configurable units in the array of configurable units over a daisy-chained command bus. As shown in the example of FIG. 30, a control block 3090, a daisy-chained completion bus 3091 and a daisy-chained command bus 3092 are connected to daisy-chain logic 3093, which communicates with the unit configuration load logic 3040. The daisy-chain logic 3093 can include load complete status logic, as described below. The daisy-chained completion bus is further described below. Other topologies for the command and completion buses are clearly possible but not described here.

FIG. 31 is a block diagram illustrating an example configurable unit 3100, such as a Pattern Memory Unit (PMU), which is configured with the virtualization logic 2797 (i.e., ready-to-read credit counters, write credit counters, and flow control logic for operating them). A PMU can contain scratchpad memory 3130 coupled with a reconfigurable scalar data path 3120 intended for address calculation (RA, WA) and control (WE, RE) of the scratchpad memory 3130, along with the bus interfaces used in the PCU.

The bus interfaces can include scalar inputs, vector inputs, scalar outputs and vector outputs, usable to provide write data WD. The data path can be organized as a multi-stage reconfigurable pipeline, including stages of functional units FUs and associated pipeline registers PRs that register inputs and outputs of the functional units. PMUs can be used to store distributed on-chip memory throughout the array of reconfigurable units.

A scratchpad is built with multiple SRAM banks (e.g., 3131, 3132, 3133, 3134) Banking and buffering logic 3135 for the SRAM banks in the scratchpad can be configured to operate in several banking modes to support various access patterns. A computation unit as described herein can include a Look-Up Table stored in the scratchpad memory 3130, from a configuration file or from other sources. In a computation unit as described herein, the scalar data path 3120 can translate a section of a raw input value I for addressing Look-Up Tables implementing a function f(I), into the addressing format utilized by the SRAM scratchpad memory 3130, adding appropriate offsets and so on, to read the entries of the Look-Up Table stored in the scratchpad memory 3130 using the sections of the input value I. Each PMU can include write address calculation logic and read address calculation logic that provide write address WA, write enable WE, read address RA and read enable RE to the banking buffering logic 3135. Based on the state of the local FIFOs 3111 and 3112 and external control inputs, the control block 3115 can be configured to trigger the write address computation, read address computation, or both, by enabling the appropriate counters 3116. A programmable counter chain 3116 (Control Inputs, Control Outputs) and control block 3115 can trigger PMU execution.

This is one simplified example of a configuration of a configurable processor for implementing a computation unit as described herein. The configurable processor can be configured in other ways to implement a computation unit. Other types of configurable processors can implement the computation unit in other ways. Also, the computation unit can be implemented using dedicated logic in some examples, or a combination of dedicated logic and instruction-controlled processors.

Other Implementations

In various implementations of the technology disclosed, when two or more reconfigurable processors collaboratively execute an application, the two or more reconfigurable processors are independently and separately configured (e.g., by the runtime processor) with a same set of configuration files. In one implementation, when a first reconfigurable processor, configured with a given set of configuration files, begins executing configuration files in the given set of configuration files and/or functions therefor and/or data therefor, and requires a second reconfigurable processor, also configured with the given set of configuration files, to execute certain configuration files in the given set of configuration files and/or functions therefor and/or data therefor, then the second reconfigurable processor waits for a signal from the first reconfigurable processor. Examples of the signal include a control signal that indicates a breakpoint/checkpoint after a quiesce condition, such as the one described in U.S. Non-provisional patent application Ser. No. 16/504,627, filed Jul. 8, 2019, entitled, "QUIESCE RECONFIGURABLE DATA PROCESSOR,".

Then, after receiving the signal and corresponding application data and tensor state from the first reconfigurable processor, the second reconfigurable processor begins execution of the certain configuration files and/or functions therefor and/or data therefor using its own copy of the given set of configuration files with which it is independently and separately configured. In some implementations, a checkpoint is generated at the first reconfigurable processor, the checkpoint is transferred to the second reconfigurable processor, and the second reconfigurable processor loads the checkpoint and begins execution of the certain configuration files and/or functions therefor and/or data therefor.

A first example of accelerated deep learning is using a deep learning accelerator to train a neural network. A second example of accelerated deep learning is using a deep learning accelerator to operate a trained neural network to perform inferences. A third example of accelerated deep learning is using a deep learning accelerator to train a neural network and subsequently perform inference with any one or more of the trained neural network, information from same, and a variant of same.

Examples of neural networks include Fully Connected Neural Networks (FCNNs), Recurrent Neural Networks (RNNs), Convolutional Neural Networks (CNNs), Long Short-Term Memory (LSTM) networks, autoencoders, deep belief networks, and Generative Adversarial Networks (GANs).

An example of training a neural network is determining one or more weights associated with the neural network, such as by hardware acceleration via a deep learning accelerator. An example of making an inference is using a trained neural network to compute results by processing input data based on weights associated with the trained neural network. As used herein, the term 'weight' is an example of a 'parameter' as used in various forms of neural network processing. For example, some neural network learning is directed to determining parameters that are then usable for performing neural network inferences using the parameters.

A neural network processes data according to a dataflow graph comprising layers of neurons. Stimuli (e.g., input data) are received by an input layer of neurons and the computed results of the dataflow graph (e.g., output data) are provided by an output layer of neurons. Example layers of neurons include input layers, output layers, rectified linear unit layers, fully connected layers, recurrent layers, long short-term memory layers, convolutional layers, kernel layers, dropout layers, and pooling layers. A neural network is conditionally and/or selectively trained, subject to hardware acceleration. After being trained, a neural network is conditionally and/or selectively used for inference, subject to hardware acceleration.

An example of a deep learning accelerator is one or more relatively specialized hardware elements operating in conjunction with one or more software elements to train a neural network and/or perform inference with a neural network relatively more efficiently than using relatively less specialized hardware elements. Some implementations of the relatively specialized hardware elements include one or more hardware logic circuitry elements such as transistors, resistors, inductors, capacitors, wire interconnects, combinatorial logic (e.g., NAND, NOR) gates, latches, register files, memory arrays, tags for memory arrays, content-addressable memories, flash, ROM, DRAM, SRAM, Serializer/Deserializer (SerDes), I/O drivers, and the like, such as implemented via custom logic, synthesized logic, ASICs, and/or FPGAs. Some of the relatively less specialized hardware elements include conventional CPUs and conventional GPUs.

An example of storage is one or more elements enabled to retain state information, e.g., any one or more of: a flip-flop, a latch or an array of latches, a register or an array of registers, a register file, a memory, a memory array, a magnetic storage device, an optical storage device, SRAM, DRAM, flash, and ROM. In various embodiments storage is volatile (e.g., SRAM or DRAM) and/or non-volatile (e.g., flash or ROM).

An example of an Integrated Circuit (IC) is a collection of circuitry implemented on one or more portions of semiconductor material, such as a single die or a plurality of dice. An example of 3D-stacking of dice is providing mechanical connectivity and/or electrical connectivity between the dice, e.g., in a dimension orthogonal to a major surface of the dice, to form a unit. The mechanical connectivity and/or the electrical connectivity are variously implemented, e.g., via one or more of solder balls, microbumps, and through-silicon vias. An example of 2.5D stacking of dice is providing mechanical connectivity and/or electrical connectivity between the dice via a common element (e.g., a silicon interposer) to form a unit, wherein the mechanical connectivity and/or electrical connectivity between each die and the common substrate is in a dimension orthogonal to a major surface of the die. The mechanical connectivity and/or the electrical connectivity are variously implemented, e.g., via one or more of solder balls, microbumps, and through-silicon vias. An example of an Application-Specific Integrated Circuit (ASIC) is an IC designed for a particular use.

An example of a package is an element enabled to mechanically retain and/or contain one or more electronic circuits and/or to electrically interconnect one or more electronic circuits. Example electronic circuits are any one or more of one or more portions of semiconductor material, one or more dice, one or more interposers, and one or more substrates. Particular examples of packages include a BGA package and variants thereof. Some ICs comprise a package. An example of a substrate is an element to mechanically retain and/or electrically interconnect one or more dice and/or one or more packages. A particular example of a substrate is a PCB to, e.g., retain and interconnect packages. Another particular example of a substrate is a silicon interposer to, e.g., couple one or more 3D-stacked or 2.5-stacked dice. Another particular example of a substrate is a package, e.g., retaining a plurality of dice.

As used herein, a SmartNIC is a network interface component, or network adapter that operates directly on data packets independent of host kernel resources and running an operating system networking stack resulting in less contention for the host processing resources, less network latency, and increases in network data packet throughput. The SmartNIC accomplishes this by offloading certain IP network protocol stack processing tasks from the system host CPU, acting as a coprocessor of sorts. In some embodiments a SmartNIC is housed on a printed circuit card plugged into a backplane, whereas in other embodiments it is integrated onto a motherboard which also supports a host CPU or one or more RPs. In yet another embodiment the SmartNIC can be integrated onto a single chip with an RP or other component.

In some embodiments herein, a SmartNIC is equipped with a fully programmable hardware implementation, supporting an operating system configured for network processing tasks. The hardware implementation may comprise System-on-Chip (SoC), FPGAs, ASICs, CGRAs, or other programmable processor circuits such as the ARM family. A SmartNIC may support sets of specialized hardware functionalities accelerates a specific class of functions (e.g., Open vSwitch data-plane) or to perform generic packet and flow-filtering, packet inspection, flow table processing, encryption, RDMA, VXLAN overlays and NVMe-oF functionality.

A SmartNIC may include host kernel-bypass logic for sending and receiving packets to/from nodes and additional hosts. The SmartNIC may accomplish this by providing a set of physical addresses comprising a shared memory for inputs and outputs. In one aspect, the reprogrammable processor may directly access sets of SmartNIC FIFO buffers using a combination of head and tail pointers as described supra to push and pull data, thus bypassing the host kernel and reducing at least one hop. A host may also interface directly to the SmartNIC by writing to a physical address without requiring drivers to control the network flow, further increasing theoretical throughput.

In one aspect, the SmartNIC may provide a configuration interface to specify the physical addresses of a plurality of I/O shared memory buffers comprising FIFO queues and mapping tables for memory regions containing packet buffers. In an additional aspect, the SmartNIC may couple nodes, reprogrammable processors (RPs) and hosts to retrieve packet buffers from shared memory buffers and to transmit packet buffers from host, node, or RP DRAM to the SmartNIC shared memory buffers over a network.

The network fabric is an interface to a plurality of nodes and hosts. The SmartNIC provides connectivity between either a host and the network or between a node and the network. A node comprises a plurality of reprogrammable processors (RPs) and bypasses the host when interfacing to the SmartNIC. A SmartNIC may connect to a first physical/link connection over the network, coupling the SmartNIC with a host, node, or RP. The SmartNIC connects to a second physical/link connection, coupling the SmartNIC to the network. The physical/link connections to the network fabric interface may each be of any type, for instance, Ethernet, Fibre Channel, InfiniBand, PCIe, etc. A physical/link connection may also be a wireless medium. A SmartNIC includes Media Access Controllers (MACs) to interface with the physical/link connections to route data packets to the RPs and hosts.

An example SmartNIC may use an FPGA to implement the communications protocols, e.g., Transport Control Protocol ("TCP"), used to perform internet routing and may comprise PCIe high-speed network interfaces, shared physical memory and an FPGA. The FPGA may implement the SmartNIC controller as the bridge between a host, node, RP, and the network at the "physical layer" to integrate directly into the data path. The SmartNIC may further implement the Open System Interconnection ("OSI") model, which is a conceptual model that characterizes and standardizes the internal functions of a communication system by partitioning it into abstraction layers. A physical abstraction layer defines electrical and physical specifications between a device and a transmission medium, such as a copper or fiber optical cable. This includes the layout of pins, voltages, line impedance, cable specifications, signal timing, hubs, repeaters, network adapters, host bus adapters and more. The major functions and services performed by the physical layer include: (1) establishment and termination of a connection to a communications medium; (2) contention resolution; (3) flow control; and (4) modulation to convert digital data in user equipment to the corresponding signals transmitted over a communications channel. These are the signals operating over the physical cabling (such as copper and optical fiber) or over a radio link.

The network flows can be Transmission Control Protocol/Internet Protocol (TCP/IP) flows, for example. The SmartNICs may exchange network packets with the nodes or hosts via a network/fabric comprising media/physical links and can exchange network packets with their respective nodes or hosts via host-facing media/physical links to the host NICs. Network flows used by applications to exchange data may pass through the SmartNIC as follows. A host-based application may have application-layer data to convey, for instance, a remote call invocation. The host remote call invocation may comprise a command or data for passing through an operating system Application Programming Interface (API) (e.g., a stream or socket) as a write to a physical address on the SmartNIC where it enters the network stack, The API writes the command or data into the physical address of the shared memory FIFO and placed in one or more transport packets (e.g., TCP/IP packets). Next, encapsulation of transport packets to network packets (e.g., TCP/IP packets with the hosts Internet Protocol (IP) address as the sender). and then loaded into one or more payloads of physical layer frames (e.g., Ethernet frames). The frames then pass through to the first physical/link connection of the network fabric. On a second SmartNIC, the above process is reversed where the network packets require decapsulation and data eventually arrives at a physical address for the host, node, or RP.

The applications execute on the reconfigurable processors in a distributed fashion by programming the individual compute and memory components and may asynchronously receive, process, and send data and control information. In the reconfigurable processors, computation may execute as deep, nested dataflow pipelines that exploit nested parallelism and data locality efficiently. These dataflow pipelines contain several stages of computation, where each stage reads data from one or more input buffers with an irregular memory access pattern, performs computations on the data while using one or more internal buffers to store and retrieve intermediate results, and produces outputs that are written to one or more output buffers. The structure of these pipelines depends on the control and dataflow graph representing the application. Pipelines may arbitrarily nest and loop within each other.

The applications/graphs/application graphs/user applications/dataflow graphs/control flow graphs/data and control flow graphs/models/deep learning applications/deep neural networks/programs/program images/jobs/tasks comprise high-level programs. A high-level program is source code written in programming languages like C, C++, Java, JavaScript, Python, and Spatial, for example, using deep learning frameworks like PyTorch, TensorFlow, ONNX, Caffe, and Keras. The high-level program can implement computing structures and algorithms of machine learning models like AlexNet, VGGNet, GoogLeNet, ResNet, ResNeXt, RCNN, YOLO, SqueezeNet, SegNet, GAN, BERT, ELMo, USE, Transformer, and Transformer-XL. In one example, the high-level program can implement a convolutional neural network with several processing layers, such that each processing layer can include one or more nested loops. The high-level program can execute irregular memory operations that involve accessing inputs and weights and performing matrix multiplications between the inputs and the weights. The high-level program can include nested loops with high iteration count and loop bodies that load and multiply input values from a preceding processing layer with weights of a succeeding processing layer to produce an output for the succeeding processing layer. The high-level program can have loop-level parallelism of the outermost loop body, which can be exploited using coarse-grained pipelining. The high-level program can have instruction-level parallelism of the innermost loop body, which can be exploited using loop unrolling, SIMD vectorization, and pipelining.

Regarding loops in the high-level programs of the applications, loops directly nested in a loop body are termed the child loops of the outer parent loop. A loop is called an innermost loop if it does not have any children, i.e., there are no nested loops within its body. A loop is an outermost loop if it does not have a parent, i.e., it is not nested within another loop's body. An imperfectly nested loop has a body with a mix of non-looping statements (e.g., primitive arithmetic, logical, and relational operations) and one or more child loops. Parallelism in the imperfectly nested loops can be exploited at any or all loop levels, and in the operations that comprise loop bodies. Parallelism can occur in multiple forms such as fine-grained and coarse-grained pipeline parallelism, data parallelism, and task parallelism.

In some implementations, a Software Development Kit (SDK) (or dataflow graph generator) generates dataflow graphs of the high-level programs of the applications. The SDK transforms the input behavioral description of the high-level programs into an intermediate representation such as the dataflow graphs. This may include code optimization steps like false data dependency elimination, dead-code elimination, and constant folding. The dataflow graphs encode the data and control dependencies of the high-level programs.

The dataflow graphs comprise nodes and edges. (In order to avoid confusion with the use of the term 'node' to refer herein to processing nodes, a graph node is sometimes referred to herein as a 'vertex') Graph nodes or vertices can represent compute operations and memory allocations. The edges can represent dataflow and control flow. In some implementations, each loop in the high-level programs can be represented as a controller in the dataflow graphs. The dataflow graphs support branches, loops, function calls, and other variations of control dependencies. In some implementations, after the dataflow graphs are generated, additional analyses or optimizations focused on loop transformations can be performed, such as loop unrolling, loop pipelining, loop fission/fusion, and loop tiling.

The SDK also supports programming the reconfigurable processors in the pool of reconfigurable dataflow resources at multiple levels, for example, from the high-level deep learning frameworks to C++ and assembly language. In some implementations, the SDK allows programmers to develop code that runs directly on the reconfigurable processors. In other implementations, the SDK provides libraries that contain pre-defined functions like linear algebra operations, element-wise tensor operations, non-linearities, and reductions required for creating, executing, and profiling the dataflow graphs on the reconfigurable processors. The SDK communicates with the deep learning frameworks via Application Programming Interfaces (APIs).

The vertices in a dataflow graph represent operation units and may configure to be producers to produce tensors for execution of an application, and to be consumers to consume the tensors for execution of the application. The producers and consumers asynchronously transmit data along data connections. A tensor includes one or more vectors.

A "compiler" transforms the dataflow graphs into a hardware-specific configuration, and specifies in an execution file generated by the compiler 114. In one implementation, the compiler partitions the dataflow graphs into memory allocations and execution fragments, where these partitions are specified in the execution file. Execution fragments represent operations on data. An execution fragment can comprise portions of a program representing an amount of work. An execution fragment can comprise computations encompassed by a set of loops, a set of graph nodes, or some other unit of work that requires synchronization. An execution fragment can comprise a fixed or variable amount of work, as needed by the program. Different ones of the execution fragments can contain different amounts of computation. Execution fragments can represent parallel patterns or portions of parallel patterns and are executable asynchronously.

In some implementations, the partitioning of the dataflow graphs into the execution fragments includes treating calculations within at least one innermost loop of a nested loop of the dataflow graphs as a separate execution fragment. In other implementations, the partitioning of the dataflow graphs into the execution fragments includes treating calculations of an outer loop around the innermost loop of the dataflow graphs as a separate execution fragment. In the case of imperfectly nested loops, operations within a loop body up to the beginning of a nested loop within that loop body are grouped together as a separate execution fragment.

Memory allocations represent the creation of logical memory spaces in on-chip and/or off-chip memories for data required to implement the dataflow graphs, and these memory allocations are specified in the execution file. Memory allocations define the type and the number of hardware resources (functional units, storage, or connectivity components). Main memory (e.g., DRAM) is off-chip memory for providing memory allocations. Scratchpad memory (e.g., SRAM) is on-chip memory for providing memory allocations. Other memory types for which the memory allocations can be made for various access patterns and layouts include read-only Look-Up Tables (LUTs), fixed size queues (e.g., FIFOs), and register files.

The compiler binds memory allocations to virtual memory units and binds execution fragments to virtual compute units, and these bindings are specified in the execution file. In some implementations, the compiler partitions execution fragments into memory fragments and compute fragments, and these partitions are specified in the execution file. A memory fragment comprises address calculations leading up to a memory access. A compute fragment comprises all other operations in the parent execution fragment. In one implementation, each execution fragment is broken up into a plurality of memory fragments and exactly one compute fragment. In one implementation, the compiler performs the partitioning using reverse dataflow analysis such that inputs to an address used in a memory access recursively flag until the compiler reaches either constant values or (bound) loop/pattern iterators. A single execution fragment can produce one or more memory fragments, depending on how many memory accesses exist in the original loop body. In cases where the same memory addressing logic is shared across multiple memory accesses, address calculation may be duplicated to create multiple memory fragments from the same execution fragment.

The memory fragments of the execution fragments are configured to index into data structures. At least one of the memory fragments indexes into a data structure in the logical memory spaces of one of the memory allocations. Each compute and memory fragment preserves information about all loops whose loop bodies directly contain the operations in the corresponding execution fragment. In one implementation, this corresponds to replicating the calculation of the loop iterators of each loop into each compute and memory fragment. This replication allows each fragment to preserve the same iterative behavior as the original program, while also allowing distributed calculation of loop iterators.

The compiler translates the applications developed with commonly used open-source packages such as Keras and PyTorch into reconfigurable processor specifications. The compiler generates the configuration files with configuration data (e.g., bit stream) for the placed positions and the routed data and control networks. In one implementation, this includes assigning coordinates and communication resources of the physical memory and compute units by placing and routing units onto the array of the processor while maximizing bandwidth and minimizing latency.

Processing Node

Figure 32:
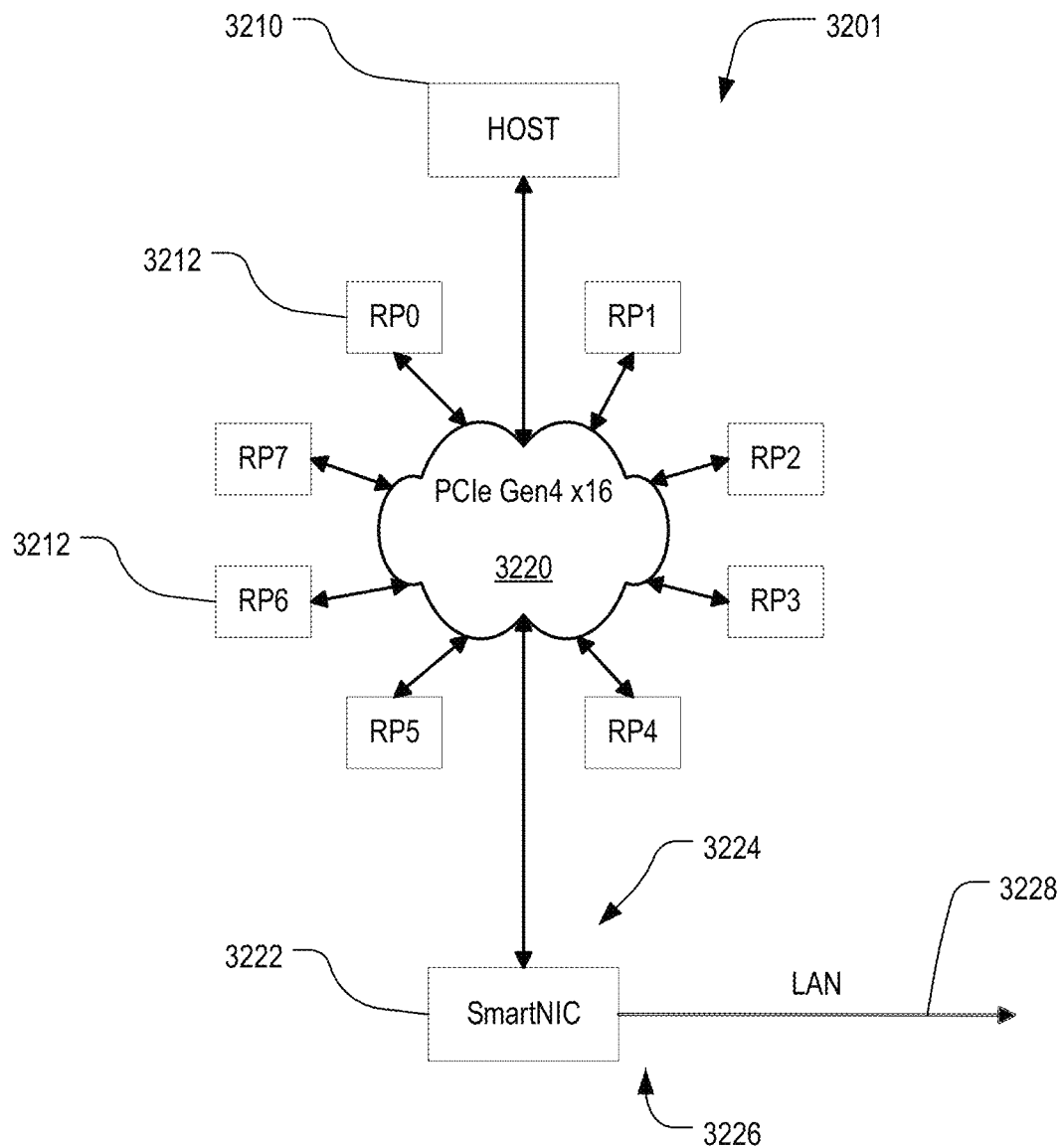
FIG. 32 illustrates an example processing node which includes a host, eight reconfigurable processors, and a SmartNIC.

FIG. 32 illustrates an example processing node 3201 which includes a host 3210 and eight RPs 3212 numbered RP0 through RP7, all interconnected by way of a PCIe bus 3220. Other implementations can include other quantities of RPs 3212, such as four or 16. In some implementations, the configuration bit file may designate one of the RPs as a "master" RP, and allocate to it certain high level responsibilities. In other implementations, the bit file may configure all of the RPs to be identical instances of a dataflow graph or graph fragment. In still other implementations, the configuration bit file may configure some or all of the RPs with dissimilar dataflow graphs or graph fragments. The processing node 3201 also includes a SmartNIC 3222, which has one port 3224 connected to the PCIe bus 3220, and a second port 3226 connected to a LAN 3228. The LAN 3228 in the present embodiment is Ethernet, but in other embodiments it could be other types of LANs such as WiFi or InfiniBand. In other embodiments the processing node includes more than one SmartNIC connected to the PCIe bus. For example another embodiment may have one SmartNIC for each RP in the node, in which case each SmartNIC may be situated physically adjacent to (or on the same motherboard or the same chip as) its corresponding RP. See FIG. 48 for example, discussed below. Additionally in various embodiments each SmartNIC can have multiple PCIe ports and/or multiple LAN (or other) ports.

Figure 33:
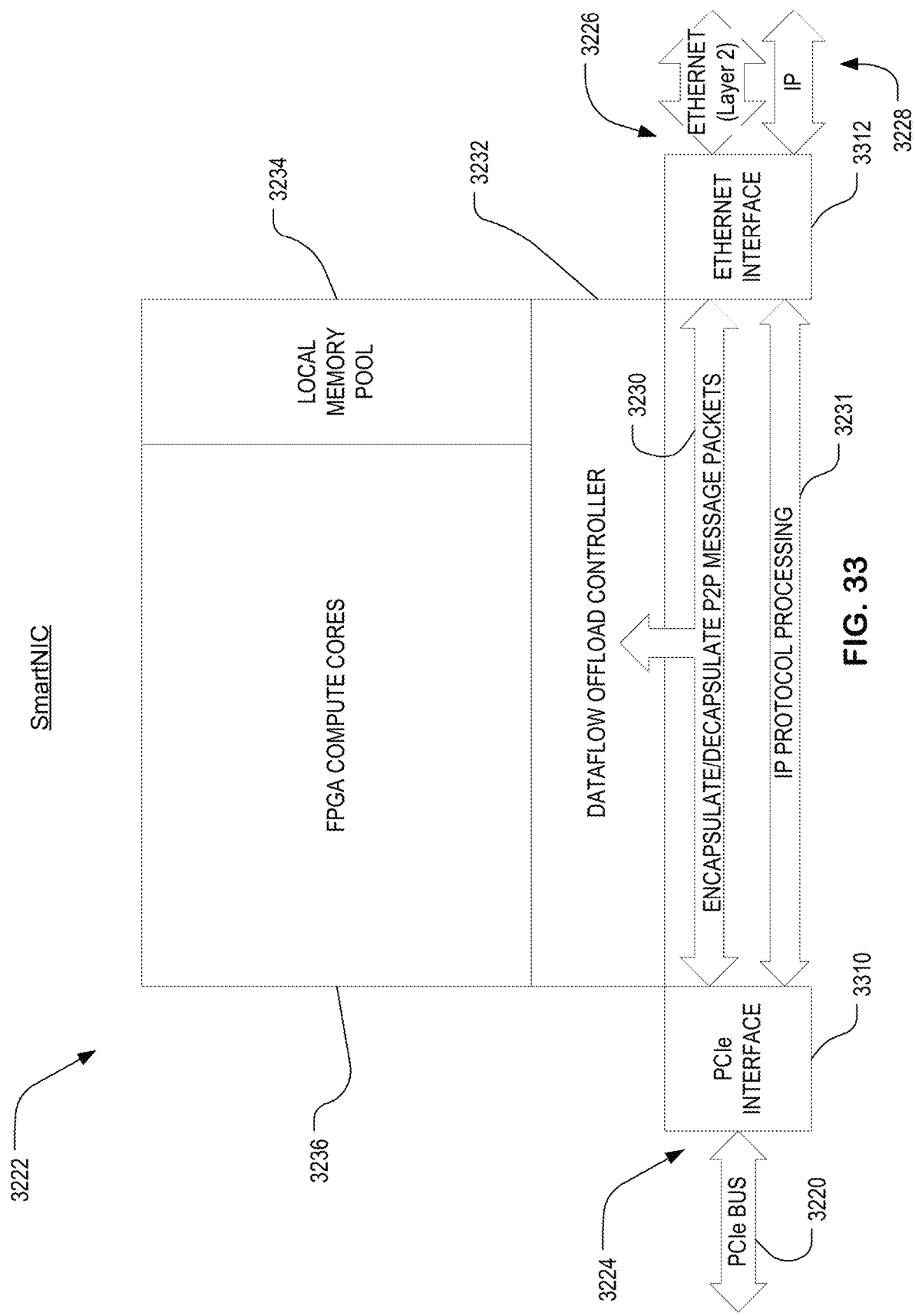
FIG. 33 is a block diagram of a SmartNIC that can be used in the processing nodes of FIG. 32 or FIG. 48.

FIG. 33 is a block diagram of SmartNIC 3222 in FIG. 32. (SmartNICs 4822 may be the same, in appropriate embodiments). It includes a PCIe interface 3310 for communicating with the PCIe bus 120 and a LAN interface 3312 (shown in FIG. 33 as more specifically an Ethernet interface) for communicating with LAN 3228. The PCIe bus 3220 generally carries data and other signals according to a PCIe protocol, and the SmartNIC 3222 includes an IP protocol processing facility 3231 to encapsulate such data according to IP standards and forward them through the LAN interface 3222 onto the LAN 3228. The IP protocol processing facility 3231 also extracts such data from IP packets incoming through the LAN interface 3222, and forwards the extracted data onto the PCIe bus 3220 through the PCIe interface 3310.

The PCIe bus 3220 also carries messages according to a peer-to-peer (P2P) messaging protocol. A P2P messaging protocol, as the term is used herein, is a protocol layer which facilitates message passing among peers, without requiring the use of central server computer or server software. Peers communicating with the P2P protocol are roughly equal participants in an application. A peer is both a supplier and a consumer of resources, in contrast with traditional client-server models in which the consumption and supply of resources is divided.

One purpose of SmartNIC 3222 is to transparently extend the network of P2P peers over the LAN 3228 to another processing node. SmartNIC 3222 therefore also includes an encapsulate/decapsulate facility 3230. Encapsulate/decapsulate facility 3230 receives P2P messages from PCIe bus 3220, decapsulates them to extract the message, and re-encapsulates them in datagrams for transmission over the LAN 3228. It similarly receives P2P messages from the LAN 3228, decapsulates them to extract the P2P message, and re-encapsulates them in PCIe bus packets for the PCIe bus 3220. Each data packet includes a destination address (which may be split into two or more components) which uniquely identifies any RP in the system, so encapsulate/decapsulate facility 3230 is able to determine from a packet incoming on the PCIe bus 3220, what Ethernet MAC address to apply to the repackaged datagram(s) it sends out on the LAN 3228 (and vice-versa). Encapsulate/decapsulate facility 3230 performs this address translation by referring to an address translation table that was previously programmed into the SmartNIC 3222 by the configuration bit file. In order to simplify and expedite LAN communication among processing nodes, the system may use Level 2 protocols of the OSI protocol stack, rather than Level 3/4 protocols such as IP or TCP.

SmartNIC 3222 also includes a dataflow offload controller 3232, a local memory pool 3234, and one or more FPGA cores 3236. Dataflow offload controller 3232 contains buffers as set forth above with respect to the RPs, and includes logic to interact with other RPs via the P2P protocol in the same way as set forth above with respect to an RP. As such, it participates in the same P2P messaging conversations just as do all the RPs. Thus in addition to serving as a message translator to forward P2P messages from the local PCIe bus onto the LAN 3228 for delivery to a different processing node, the SmartNIC 3222 (and any endpoints configured into the FPGA compute cores 3236, if any) also can be a destination for P2P messages from a local RP (via PCIe bus 3220) and from an external RP (via LAN 3228). It can also generate its own P2P messages destined for a local RP (via PCIe bus 3220) and from an external RP (via LAN 3228). It can also generate its own P2P messages destined for another SmartNIC reachable via LAN 3228, and can also be a destination for P2P messages generated by another SmartNIC and arriving via LAN 3228. Like the RPs, the SmartNIC 3222 (as well as any endpoints configured into the FPGA compute cores 3236, if any) are assigned addresses in the P2P protocol address space, and the uniqueness of RP addresses within that address space carries through to any endpoints in the SmartNIC as well. The locations in the local memory pool 3234 are also assigned addresses which are unique within the P2P protocol address space. In embodiments herein there is a 1:1 relationship between addresses on the PCIe bus and addresses in the P2P protocol address space (though the specific address values may differ).

In one embodiment, one or more of the encapsulate/decapsulate facility 3230, the IP protocol processing facility 3231, the and the dataflow offload controller 3232, can be implemented in hardware logic, including as part of the FPGA 3236. In an alternative embodiment, one or more of them can be implemented by way of a software or firmware instruction-controlled processor. Also, as used herein, the PCIe protocol, the Ethernet protocol, the P2P messaging protocol, P2P-over-PCIe, and P2P-over-Ethernet, are all considered to be different protocols. Protocols are considered herein to be "different" if they differ in at least one layer of their respective protocol stacks.

The FPGA compute cores 3236 may be integrated onto the same chip as one or more of the other components shown in FIG. 33, or it may be a separate integrated circuit device such as one or more of Intel Agilex F-Series and I-series FPGAs, and Xilinx Virtex Ultrascale+ FPGAs, as examples. The local memory pool 3234 may for example include off-the-shelf DRAM arrays. The SmartNIC 3222 itself has a unique address in the P2P protocol, so that P2P messages may be directed to the SmartNIC itself rather than another RP. Dataflow Offload Controller 3234 determines from the destination address in incoming P2P packets (incoming from PCIe bus 3220 or from LAN 3228) whether the destination is the SmartNIC 3222 or the opposite interface. If it is destined for the SmartNIC 3222, Dataflow Offload Controller 3234 forwards the extracted message to the FPGA compute cores 3236. The SmartNIC 3222, and more particularly the FPGA cores 3236, are realized as vertices or graph fragments in the same Dataflow graph that is used to configure the overall system for dataflow processing of an algorithm.

Because the basic building blocks in an FPGA that are configured during programming to perform a desired function, are smaller and more versatile than those of the CGRA, certain functions can be executed more efficiently in an FPGA. In particular, the coarse grained reconfigurable units in one embodiment are of two specific types: Pattern Compute Units (PCUs) and Pattern Memory Units (PMUs), arranged in a two dimensional array. Each PCU has a reconfigurable pipeline with multiple stages of SIMD functional units, with support for cross-SIMD lane shifting and reduction. Each PMU has a banked scratchpad memory and dedicated addressing logic and address decoders. These units communicate with each other through a pipelined static hybrid interconnect with separate bus-level and word-level data, and bit-level control networks. For example, a compiler is able to map inner loop computation to one PCU such that most operands are transferred directly between functional units without scratchpad accesses or inter-PCU communication. The on-chip, banked scratchpads are configurable to support streaming and double buffered accesses. The off-chip memory controllers support both streaming (burst) patterns and scatter/gather accesses. And the on-chip control logic is configurable to support nested patterns.

Figure 34:
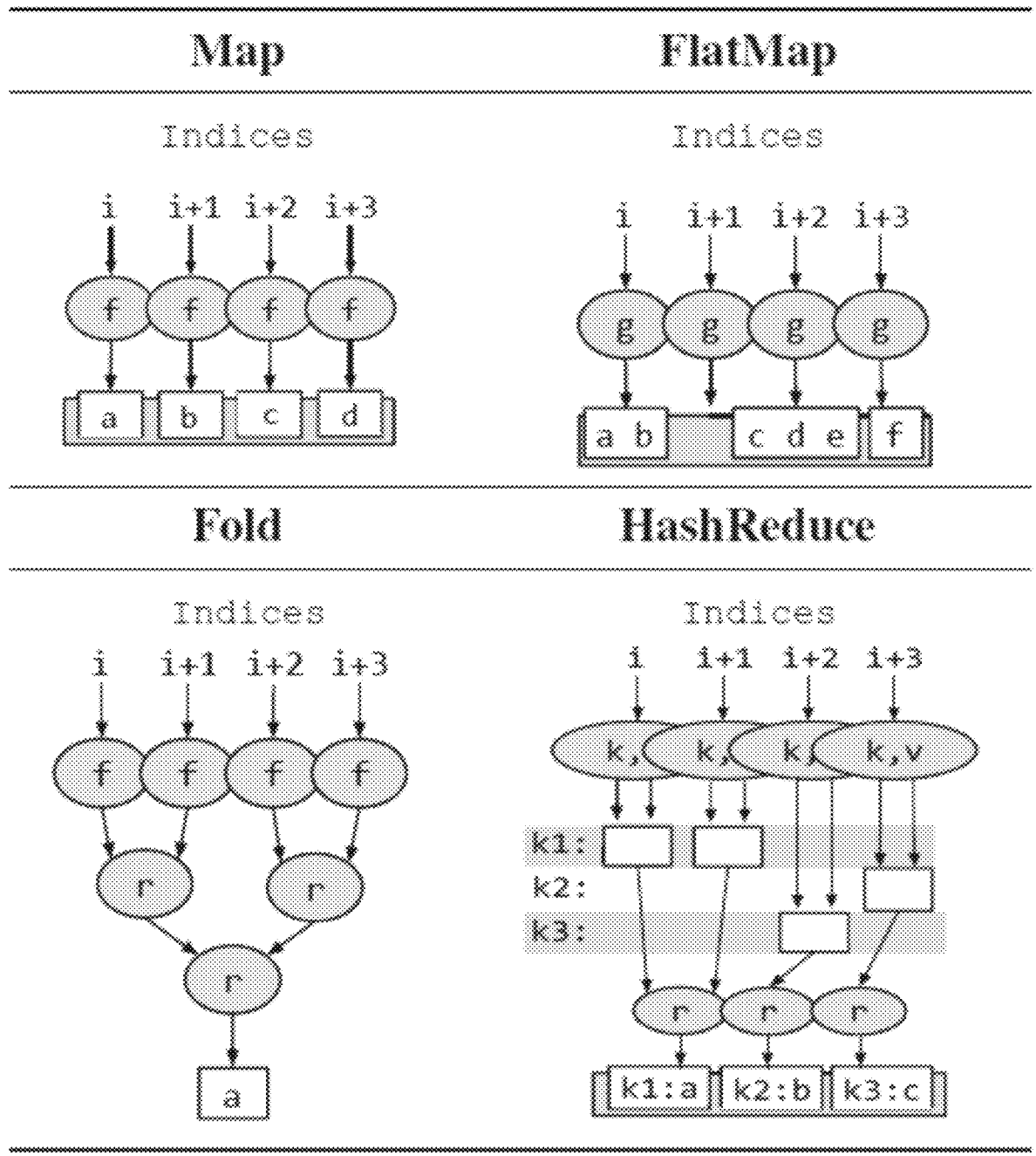
FIG. 34 depicts conceptual examples of specific common parallel patterns of Map, FlatMap, Fold and HashReduce.

The hierarchy in the architecture is designed to simplify compiler mapping and improve execution efficiency of the specific common parallel patterns of Map, FlatMap, Fold, and HashReduce, though the device can also be configured to implement other patterns as well. FIG. 34 depicts conceptual examples of each of these patterns, where computation is shown operating on four indices simultaneously. Each of these patterns takes as input one or more functions and an index domain describing the range of values that the pattern operates over. Each of these patterns builds an output and reads from an arbitrary number of input collections.

Map creates a single output element per index using the function $f$, where each execution of $f$ is guaranteed to be independent. The number of output elements from Map is the same as the size of the input iteration domain. Based on the number of collections read in $f$ and the access patterns of each read, Map can be configured by software to capture the behavior of a gather, a standard element-wise map, a zip, a windowed filter, or any combination thereof.

FlatMap produces an arbitrary number of elements per index using function g, where again function execution is independent. The produced elements are concatenated into a flat output. The functional components that implement FlatMap also can be configured to implement conditional data selection (e.g. WHERE in SQL, filter in Haskell or Scala) as well, since these functions are a special case of FlatMap where g produces zero or one elements.

Fold first acts as a Map, producing a single element per index using the function $f$ then reduces these elements using an associative combine function r.

HashReduce generates a hash key and a value for every index using functions k and v, respectively. Values with the same corresponding key are reduced on the fly into a single accumulator using an associative combine function r. HashReduce may either be dense, where the space of keys is known ahead of time and all accumulators can be statically allocated, or sparse, where the pattern may generate an arbitrary number of keys at runtime. Histogram creation is a common, simple example of HashReduce where the key function gives the histogram bin, the value function is defined to always be "1", and the combine function is integer addition.

In order to support the above parallel patterns, each PCU is designed to execute a single, innermost parallel pattern in an application. The PCU data path is organized as a multi-stage, reconfigurable SIMD pipeline. Each stage of each SIMD lane includes a functional unit (FU) and associated pipeline registers (PR). FUs perform 32-bit word level arithmetic and binary operations, including support for floating point and integer operations. As the FUs in a single pipeline stage operate in SIMD, each stage requires only a single configuration register. Results from each FU are written to its associated register. Pipeline registers in each lane are chained together across pipeline stages to allow live values to propagate between stages within the same lane. Cross-lane communication between FUs is captured using two types of intra-PCU networks: a reduction tree network that allows reducing values from multiple lanes into a single scalar, and a shift network which allows using PRs as sliding windows across stages to exploit reuse in stencil applications. Both networks use dedicated registers within PRs to minimize hardware overhead.

PCUs interface with the global interconnect using three kinds of inputs and outputs (IO); scalar, vector, and control. Scalar IO is used to communicate single words of data, such as the results of Folds. Each vector IO allows communicating one word per lane in the PCU, and is used in cases such as reading and writing to scratchpads in PMUs and transmitting intermediate data across a long pipeline between multiple PCUs. Each vector and scalar input is buffered using a small FIFO. Control IO is used to communicate control signals such as the start or end of execution of a PCU, or to indicate backpressure.

A reconfigurable chain of counters generates pattern iteration indices and control signals to coordinate execution. PCU execution begins when the control block enables one of the counters. Based on the application's control and data dependencies, the program can configure the control block to combine multiple control signals from both local FIFOs and global control inputs to trigger PCU execution. The control block is implemented using reconfigurable combinational logic and programmable up-down counters for state machines.

The PMUs are similarly configurable with coarse grained components. Each PMU contains a programmer-managed scratchpad memory coupled with a reconfigurable scalar data path that can be used for address calculation. PMUs are used to distribute on-chip memory throughout the device. The scratchpads are built with multiple SRAM banks matching the number of PCU lanes. Address decoding logic around the scratchpad can be configured by the program to operate in a striped banking mode, to support linear access patterns often found on dense data structures, or FIFO mode support, to support access patterns resembling a sliding window. The address decoding logic can also be configured for a duplication mode, where the contents are duplicated across all memory banks. Duplication mode provides multiple read address channels to support parallelized on-chip gather operations.

To support coarse-grained pipelines, each PMU scratchpad can be configured to operate as an N-buffer with any of the above banking modes. N-buffers are implemented by partitioning the address space in each SRAM bank into N disjoint regions. Using write and read state information, an appropriate offset is added to each bank's local address to access the correct data.

A programmable counter chain and control block triggers PMU execution similar to the PCU. Each PMU typically contains write address calculation logic from the producer pattern, and read address calculation logic from the consumer pattern. Based on the state of the local FIFOs and external control inputs, the control block can be configured to trigger the write address computation, read address computation, or both, by enabling the appropriate counters.

The interconnects among the FUs are also configurable by the program. More information on the structure and configurability of functional units in the CGRA embodiment can be found elsewhere herein, and in the above-incorporated publication by Prabhakar et al., entitled "Plasticine: A Reconfigurable Architecture for Parallel Patterns," ISCA '17, June 24-28, 2017, Toronto, ON, Canada.

Traditional FPGAs can also be configured to implement the above patterns, but typically with much poorer energy efficiency. On the other hand, FPGAs have much smaller and more generalized building blocks, and are therefore much more flexible in implementing functions that do not fit well into the programming paradigm for parallel computing as described above. FPGAs therefore are better at implementing such functions as simple arithmetic operations like addition, subtraction, multiplication and division, arbitrary state machines, moving of data to and from arbitrary locations in local memory, and/or other functions like bespoke encryption, compression, hash, transformation, or reduction functions that are not easily or efficiently implemented in a SIMD fashion in a CGRA.

Thus the inclusion of FPGA compute cores and local memory on the SmartNIC 3222 enables a configuration program to assign execution of limited compute kernels to the SmartNIC, thereby offloading dataflow graph fragment from the RPs, or supplementing their execution on an RP. The SmartNIC 3222 is capable of generating/responding to P2P traffic, offload kernels, fabric optimized engines, support Dataflow control/data requests, data flow offload, and orchestrate P2P control/data requests between FPGA compute cores and RPs. The local memory pool 3234 is available as scratchpad for the compute cores 3236. It is also accessible by any device in system, including any RP and any other SmartNIC. In this manner, the CGRA and the FPGA can collaborate symbiotically to further optimize the execution of dataflow graphs.

Processing Graph Example

Figure 35:
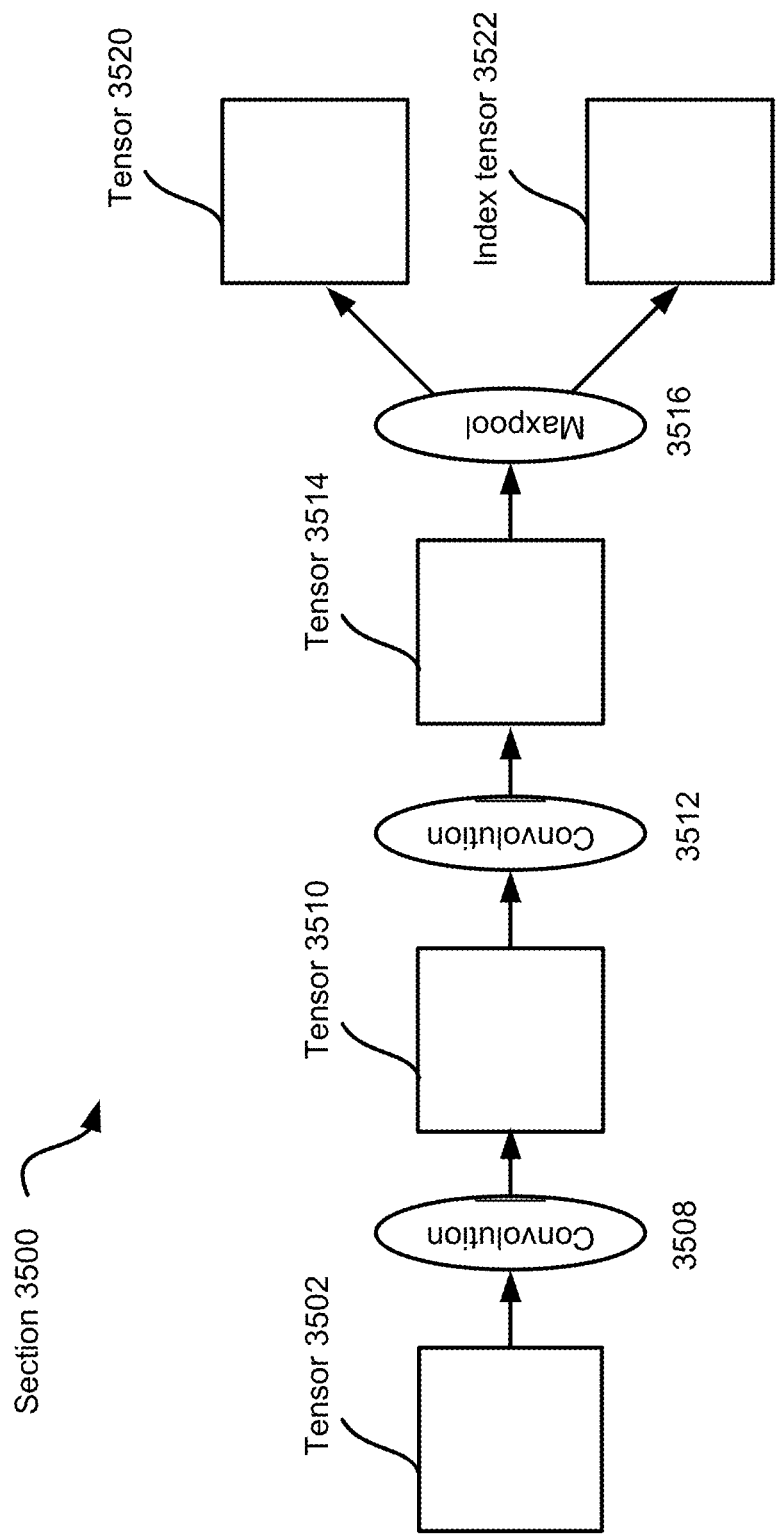
FIG. 35 illustrates a section from an example processing graph.

FIG. 35 illustrates a section from an example processing graph. The processing graph is used to implement a neural network, such as a CNN, a FCNN, an RNN, a LSTM network, an autoencoder, a deep belief network, a GAN, and/or the like. FIG. 35 illustrates one example section 3500 of a processing graph comprising processing nodes 3508, 3512 implementing convolution operations, and processing node 3516 implementing max-pooling operation. The section 3500 of the processing graph comprises a sequence of processing nodes or layers. Individual processing nodes or layers perform a corresponding operation. For example, the layers in the sequence of layers include one or more of convolution layers, max pooling layers, min pooling layers, average pooling layers, non-linearity layers, normalization layers, dropout layers, concatenation layers, transpose convolution layers, fully connected layers, SoftMax layers, and/or loss layers. The example section 3500 of FIG. 35 includes two example types of layers, such as convolution layers and a max-pool layer. The terms "layer" implementing an operation and "processing node" implementing an operation are used interchangeably.

For example, the sequence of processing nodes includes an input processing node 3508 configured to receive an input tensor 3502. The input processing node 3508 of the section 3500 convolves the input tensor 3502 with a kernel (not illustrated), to generate an intermediate tensor 3510. An intermediate processing node 3512 of the section 3500 convolves the intermediate tensor 3510 with another kernel (not illustrated), to generate another intermediate tensor 3514. An output processing node 3516 of the section 3500 performs a pooling operation (such as a max-pooling operation) on the intermediate tensor 3514, to generate an output tensor 3520 and an index tensor 3522. It may be noted that the example section 3500 of the processing graph illustrated in FIG. 35 is merely an example, and is not intended to limit the scope of this disclosure. For example, although the section 3500 is illustrated to include three processing nodes, in another example, the section 3500 can include a greater (or smaller) number of processing nodes. For example, the section 3500 can include a higher number of convolution layers. Furthermore, although only convolution and max-pooling layers are illustrated in the section 3500 of the processing graph, other types of layers may also be included, such as layers implementing ReLU, average pooling, fully connected layers, and/or the like. Also, the processing graph may include simpler functions, such as simple arithmetic operations, reading and writing to memory, and so on. Additionally, though FIG. 35 illustrates a single section of a processing graph of an application, a processing graph of an application can include multiple such sections, pipelined serially or in parallel, or both in combination.

As mentioned, a software compiler is used to generate dataflow graphs of the high-level programs of the applications. The compiler transforms the input behavioral description of the high-level programs into an intermediate representation such as the dataflow graphs. This may include code optimization steps like false data dependency elimination, dead-code elimination, and constant folding. The dataflow graphs encode the data and control dependencies of the high-level programs.

Figure 36:
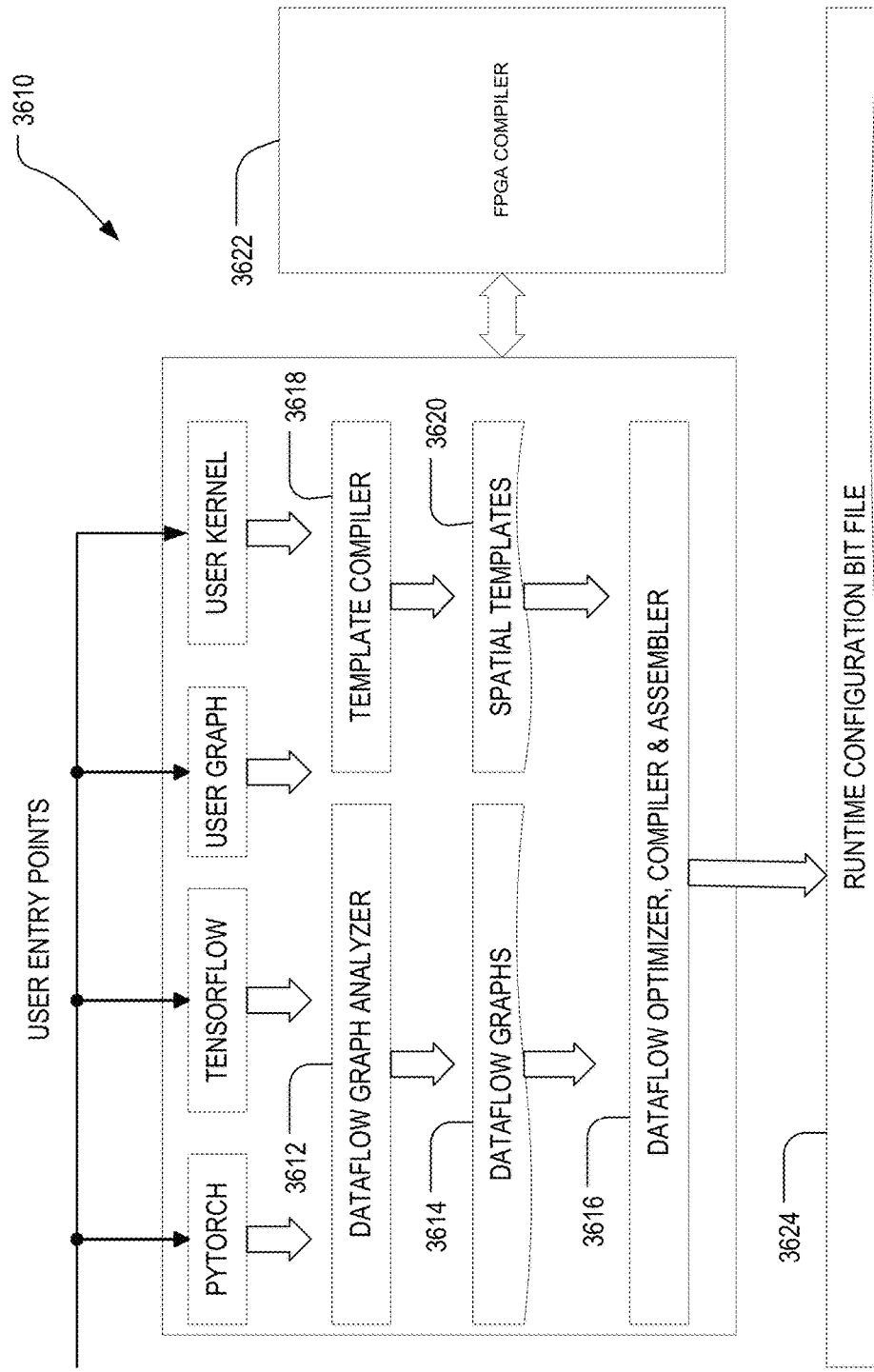
FIG. 36 illustrates an overall structure of an example compiler that can be used to generate dataflow graphs from high-level programs of applications.

FIG. 36 illustrates an overall structure that may be used for the compiler. As can be seen, the compiler 3610 includes user entry points for common open-source, machine-learning frameworks, such as PyTorch and TensorFlow. Serialized graphs from other frameworks and tools also can be imported. These inputs are provided to a Dataflow Graph Analyzer 3612, which accepts models from the frameworks then analyzes the model to extract the dataflow graph. For each operator, the computation and communication requirements are determined, so the appropriate RP resources can be allocated later. The analyzer determines the most efficient mappings of the operators and communication patterns to the RP utilizing the spatial programming model. With knowledge of both the model architecture and the RP architecture, the analyzer can also perform high-level, domain-specific optimizations like node fusion. The analyzer also determines which fragments of the application should be allocated to an FPGA, if one will exist in the system. The output of the Dataflow Graph Analyzer 3612 is an annotated Dataflow Graph 3614 that serves as the first intermediate representation (IR) passed to a Dataflow Compiler 3616.

For cases where operators are required but not available in the existing frameworks, new operators can be described via a high-level, tensor index notation API. A Template Compiler 3618 analyzes the operator and generates an optimized dataflow implementation for the RP, called a Spatial Template 3620. The generated template includes bindings that enable the new operator to be used directly from application code in the same way as built-in framework operators. If the analyzer 3612 determined that the operator is to be executed on the FPGA rather than on an RP, the compilation for the operator is performed by an FPGA compiler 3622.

The Dataflow Optimizer, Compiler and Assembler 3616 receives annotated Dataflow Graphs and performs high-level transformations like meta-pipelining, multi-section support and parallelization. It also understands the RP hardware attributes and performs low-level transforms, primarily placing and routing by mapping the graph onto the physical RP and FPGA hardware and then outputting an executable runtime configuration bit file 3624. In one embodiment, the bit file may contain code for the RP as well as a pointer to the bit file for the FPGA hardware, since the FPGA hardware compilation process (P&R, fine-grain programming) may differ from the RP compilation process. As before, a spatial programming approach is used to determine the most efficient location of RP resources.

Configuration Load Once a configuration bit file is ready, it can be loaded into the system to configure all of the RPs and FPGAs to execute the application during runtime. In particular, the configuration file is stored in memory, and transferred to the reconfigurable processors via a combination of parallel and serial techniques. The configurable units include configuration data stores, implemented using for example serial chains of latches, to store unit files of configuration data. The unit file particular to a configurable unit can comprise a plurality of sub-files of configuration data. In examples described herein, the sub-files consist of a "chunk" of data having a size suited to efficient distribution using the bus system.

Each of the configurable units, including the FPGA cores 3236, can each include logic to execute a unit configuration load process, including receiving via the bus system, sub-files of a unit file particular to the configurable unit, and loading the received sub-files into the configuration store of the configurable unit. In some embodiments, configurable units in the plurality of configurable units use routes in the bus system during execution after configuration that are also used in the configuration load process.

The unit files can be organized to comprise a plurality of ordered sub-files. The unit files particular to different configurable units may have different numbers of ordered sub-files in some embodiments. The configuration file for an array of configurable units is arranged so that sub-files of the unit files are interleaved with other sub-files of the same order for other unit files, and arranged so that location of a sub-file in the configuration file implies the configurable unit in the array of the sub-file and its order in the unit file particular to the configurable unit.

An example of an array configuration load process executes by sending sub-files to a plurality of configurable units, in a distribution sequence of N rounds (round R(i) for i=0 to N−1). In each round R(i), the process transfers one sub-file of order (i) via the bus system to the configurable units having unit files including up to (i+1) sub-files.

The configuration data stores in configurable units can comprise serial chains, and the unit configuration load process can execute by receiving, in one bus cycle, all or part of a first sub-file of the unit file particular to the configurable unit from the bus system in one round of the distribution sequence, and beginning to push the received first sub-file into the serial chain during subsequent bus cycles before receiving a second sub-file in a next round of the distribution sequence, and receiving the second sub-file in the next round of the distribution sequence from the bus system in a later bus cycle, beginning to push the received second sub-file into the serial chain during bus cycles after pushing earlier received sub-files into the serial chain. In some rounds of the distribution sequence, the first sub-file is consumed by the unit configuration load process in the configurable unit before the second sub-file in the plurality of ordered sub-files is received by the configurable unit.

The system can include more than one type of configurable unit, and the unit files for different types of configurable units can include different numbers of sub-files of configuration data. For example, the unit files for a first type of configurable unit include Z1 chunks, and the unit files for a second type of configurable unit include Z2 chunks, where Z1 is less than Z2. The configuration load process can include retrieving segments of the configuration file including sub-file (i) of the unit files for all of the configurable units of a first type and the second type to be distributed in round R(i), for (i) going from 0 to Z1−1, and then retrieving segments of the configuration file including sub-file (i) of the unit files for all of the configurable units of the second type to be distributed in round R(i), for (i) going from Z1 to Z2−1. This protocol can be extended to any number of types of configurable units having different numbers of sub-files in their unit files.

In one technique to initiate the array configuration load process, a configuration load command identifying a location in memory of the configuration file can be received from a host process, and in response to the command, the process generates one or more memory access requests. As the requested portions of the configuration file are returned, the distribution sequence can be executed.

The sub-files of the plurality of unit files can be arranged in the configuration file in an interleaved fashion that matches the distribution sequence. This arrangement of the configuration files enables the configuration load process to imply the configurable unit, and the position in the plurality of ordered sub-files of each sub-file by the location of the sub-file in the configuration file. The array configuration load process can include routing the sub-files to configurable units based on locations of the sub-files in the configuration file.

Configurable units in the array of configurable units in an example described herein include respective load complete status logic connected in a daisy chain starting and ending at the array configuration load logic. In a procedure to confirm successful loading of a configuration file using the daisy chain, the array configuration load logic forwards a configuration load complete signal on the daisy chain after the configuration file is distributed, and in each configurable unit in the array, the configuration load complete status logic forwards the configuration load complete signal on the daisy chain when the configuration load complete signal from a previous member of the chain is received and loading of its own unit file is completed. The host is notified when the file has been completely loaded, and in response to such notification the host can send a start command to one or more of the configurable units to initiate the function to be executed by the machine. The start command can be sent using the P2P protocol, and can be sent via the PCIe bus.

The bus system for carrying the configuration file segments can be the same as or substantially overlap the communication networks described elsewhere herein for carrying P2P messages.

FIG. 37 illustrates one example organization of a configuration file. Other organizations can be used as well arranged as suits a particular protocol for loading and unloading configuration files. In the example described with reference to FIG. 37, configurable units in an array of configurable units include the Switch, PCU, PMU, AGCU and FPGA. Each of these configurable units contains a set of registers that represent either the setup or the sequence to run a program. These registers include data to define the operation of the configurable unit containing it, such as the number of nested loops, the limits of each loop iterator, the instructions to be executed for each stage, the source of the operands, the network parameters for the input and output interfaces. Additionally, each of the configuration files can include data to set context in a set of counters that track its progress in each nested loop.

In another example, FPGA units may not consist of sub-files, and their configuration load process may differ from the preceding.

A program executable contains a bit-stream representing the initial configuration, or starting state, of each of the configurable units that execute the program. This bit-stream is referred to herein as a bit file, or as a configuration file. Program load is the process of setting up the configuration stores in the configurable units based on the contents of the configuration file to allow all the configurable units to execute a program. Program unload is the process of unloading the configuration stores from the configurable units, and assembling a bit-stream, called herein an unload configuration file. The unload configuration file has, in examples described herein, the same arrangement chunks or sub-files and the configuration file used for program load.

The configuration file includes a plurality of chunks of configuration data for each configurable unit in an array of configurable units, the chunks being arranged in the configuration file in a fashion that matches the sequence in which they are to be distributed. This organization of the configuration file enables the array configuration load process to route the chunks to configurable units based on locations of the chunks in the configuration file.

As illustrated in FIG. 37, the configuration file includes a plurality of chunks of unit files for each configurable unit in a plurality of configurable units, the unit files having up to M (Z5=7 in this example) sub-files having an order (i) in the unit file. In FIG. 37, M is seven, and the chunks are ordered from first to seventh (i.e. the first through the seventh chunks correspond with chunks (0) to (6) in this indexing). The chunks are arranged so that all sub-files of order (i) for (i) going from 0 to M−1, for all the unit files in the load or unload configuration file are stored in a corresponding block (i) of address space in the memory, for (i) going from 0 to M−1. The chunks of order (0) are stored in block (0) including addresses A0 to A1-1. The chunks of order (0) for switch units in this example are in a group of contiguous addresses within block (0). The chunks of order (0) for PCUs are in a group of contiguous addresses within block (0). The chunks of order (0) for PMUs are in a group of contiguous addresses within block (0). The chunks of order (0) for AGCUs are in a group of contiguous addresses. The chunks of order (0) for FPGAs are in a group of contiguous addresses. The chunks of order (1) are stored in block (1) including addresses A1 to A2-1. The chunks of order (1) for switch units in this example are stored in a group of contiguous addresses within block (1). The chunks of order (1) for PCUs are in group of contiguous addresses within block (1). The chunks of order (1) for PMUs are in group of contiguous addresses within block (1). The chunks of order (1) for AGCUs are in group of contiguous addresses within block (1). The chunks of order (1) for FPGAs are in group of contiguous addresses within block (1). The chunks of orders 3 to 6 are arranged as seen in FIG. 37, following the pattern in blocks (2) to (6).

The array can include more than one type of configurable unit, and the unit files for different types of configurable units can include different numbers of chunks of configuration data. For instance, as shown in FIG. 3, types of configurable units in the array can include Switch Units, PCU (Pattern Compute Units), PMU (Pattern Memory Units), AGCU (Address Generation and Coalescing Units) and FPGA (Field Programmable Gate Array) units.

The unit files can be organized to comprise a plurality of ordered chunks (or other sized sub-files). The unit files particular to different configurable units may have different numbers of ordered chunks in some embodiments. The configuration file for an array of configurable units is arranged so that chunks of the unit files are grouped with chunks of the same order for other unit files. Also, the configuration file is arranged so that location of a chunk in the configuration file implies the configurable unit in the array of the chunk and its order in the unit file particular to the configurable unit.

The array configuration load process can retrieve segments of the configuration file including chunk (i) of the unit files for all of the configurable units of the first type (Switch type), the second type (PCU type), the third type (PMU type), the fourth type (AGCU type), and the fifth type (FPGA type), for (i) going from 0 to Z1−1(=1). The chunks (0) of the unit files for all of the configurable units of the five types are retrieved in a first round, and the chunks (1) of the unit files for all of the configurable units of the five types are retrieved in a second round. After the first and second rounds, all (2) chunks of the unit files for all of the configurable units of the first type (Switch type) have been retrieved. The unit files for all of the configurable units of the first, second, third, fourth and fifth types have 0, 1, 3, 4 and 5 chunks remaining to be retrieved, respectively.

The array configuration load process can then retrieve segments of the configuration file including chunk (i) of the unit files for all of the configurable units of the second, third, fourth and fifth types in a third round. After the third round, all (3) chunks of the unit files for all of the configurable units of the second type (PCU type) have been retrieved. The unit files for all of the configurable units of the first, second, third and fourth and fifth types have 0, 0, 2, 3 and 4 chunks remaining to be retrieved, respectively.

The array configuration load process can then retrieve segments of the configuration file including chunk (i) of the unit files for all of the configurable units of the third, fourth and fifth types in a fourth round. After the fourth round, all (4) chunks of the unit files for all of the configurable units of the third type (PMU type) have been retrieved. The unit files for all of the configurable units of the first, second, third, fourth and fifth types have 0, 0, 1, 2 and 3 chunks remaining to be retrieved, respectively.

The array configuration load process can then retrieve segments of the configuration file including chunk (i) of the unit files for all of the configurable units of the third fourth and fifth types, in fifth, sixth and seventh rounds. After the sixth round, all (6) chunks of the unit files for all of the configurable units of the fourth type (AGCU type) have been retrieved. The unit files for all of the configurable units of the first, second, third, fourth and fifth types have 0, 0, 0, 0 and 0 chunks remaining to be retrieved, respectively.

In the manner described above, the array configuration load process can continue until the unit files for all of the configurable units of the first, second, third, fourth and fifth types have no chunks remaining to be retrieved.

The array configuration load process routes chunks of the configuration data to configurable units via the array level network using addresses implied by location of the chunks in the configuration file. In some embodiments, the chunks of the configuration file may be returned out of order to the configuration load controller from memory. The location of the chunks in the configuration file can be used to route the chunk to the correct configurable unit. Because of the organization of the rounds in the distribution sequence, the configurable units are guaranteed to receive the chunks of their unit files in order.

Further information about the configuration load process can be found in the above-incorporated U.S. patent application Ser. No. 16/197,826, filed Nov. 21, 2018, entitled, "CONFIGURATION LOAD OF A RECONFIGURABLE DATA PROCESSOR." Note that in an embodiment in which the FPGA is an off-the-shelf component rather than one designed for a system such as those described herein, the configuration load process may utilize the FPGA manufacturer's software and procedures rather than the mechanisms described herein for configuring the RPs.

Example Uses of FPGA Offload

A number of different kinds of applications can make use of the availability of an FPGA as set forth herein, to offload portions of a dataflow graph for increased efficiency or throughput. For example, if a deep learning application includes large numbers of parameters to be learned, and/or large numbers of data samples to use in training, it might be desirable to store these data in a storage cluster or an SQL database system. Accessing such data might require inordinate wait times if it were to be handled by an RP. With an FPGA, especially one built onto a SmartNIC, such I/O intensive tasks can be offloaded to the FPGA, leaving the powerful compute resources of the RP available for more appropriate tasks. As another example, if an application requires communication of sensitive data over an insecure link, for example to report valuable but intermediate results, or to receive such results, encryption and decryption tasks can be offloaded to the FPGA. If such tasks are peripheral to the primary purpose of the application, then offloading the encryption/decryption tasks to the FPGA would leave the RP's resources available for tasks more central to the application. Again, it is especially useful for the FPGA to be co-located with a SmartNIC which has interfaces to both the intra-node PCIe bus as well as an external LAN. As another example, if an application involves processing income stream data, such as audio, video or real time data acquisition data, it might be desirable to perform certain preprocessing tasks on the FPGA as the data stream arrives, rather than using RP resources which could be better used for other aspects of the application. Again, co-location of the FPGA with the SmartNIC is advantageous because of its interfaces to both the PCIe bus and an external LAN. In all of these examples, the functions to be performed by the FPGA can be realized as part of the dataflow graph, assigned to the FPGA at compile time, and configured into the FPGA at the time of configuration load.

Figure 38:
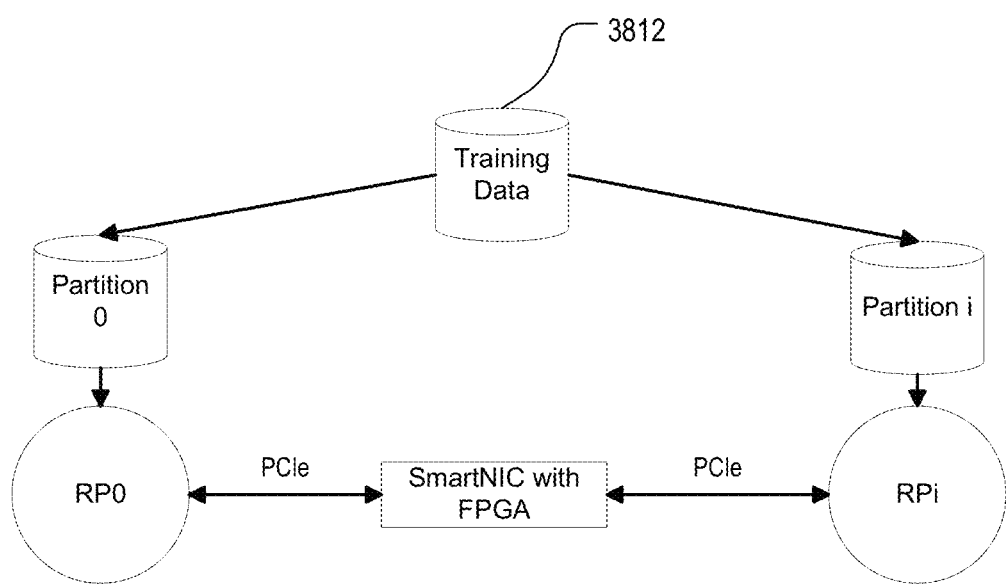
FIG. 38 illustrates a simple deep learning application implemented with data parallelism across multiple reconfigurable processors in a compute node.

Not all applications require runtime access to a LAN in order to benefit from offloading of graph nodes to an FPGA. FIG. 38 illustrates a simple deep learning application that is implemented with data parallelism across multiple RPs in a single compute node as previously set forth with respect to FIG. 32. In particular, the drawing illustrates two of the RP's designated RP0 and RPi, where the lower case subscript 'i' indicates that the component labeled RPi represents any number of RPs. All the RPs are configured with the same processing graph fragment, to learn the weights in a multi-layer neural network based on training data 3812. The training data 3812 has been partitioned into multiple training data sets, each to be processed by a respective one of the RP's in parallel. For example, Partition 0 is to be processed by RP0 and each of the Partitions 'i' are to be processed by the respective RPi. Each of the training data partitions are further subdivided into mini-batches of data samples as will become apparent below. In this discussion, whenever a component is given a subscript i, it will be understood to be representative of all of such components participating in the application execution.

As shown in FIG. 32, each of the RP's is further in communication with the SmartNIC 3222, via a P2P messaging protocol carried over a PCIe bus 3220. The FPGA in the SmartNIC 3222 has been configured by the configuration bit file in the manner described herein, to perform the functions described below. All of the RPs are configured with identical dataflow graph fragments, except that one of them, the one designated RP0 in FIG. 38, may be considered a master. The master is configured by the configuration bit file to perform certain high level dataflow functions for which performance by all the RPs would not be useful.

The application configured into the system of FIG. 38 is a neural network stochastic gradient decent (SGD) training application which has been further divided, longitudinally along a forward path of the network, into three graph "Sections" (or neural network layer sections) numbered 0, 1 and 2. A "Section" of a dataflow graph, as the term is used herein, refers to a portion of the graph that is allocated a time slice on the RP. In general, a "Section" can include multiple sequential layers of a neural network, and/or different branches of the neural network. Sectioning is performed by the compiler, with knowledge of the resources available to the RPs. In the application of FIG. 38, each of the sections may include internal branching, but they are divided such that each section requires the results of its upstream section for its own forward calculations (prediction calculation). Similarly, during back-propagation, each section requires gradients calculated by its own downstream section (upstream when viewed according to the backward propagation direction) for each of the data samples in the mini-batch that the particular RP is processing, in order to perform its own backward calculations. Back-propagation does not need to know the partial results of other instances of the dataflow, until a synchronization step at which the parameters of the model are updated based on the gradients calculated by all the graph instances operating in parallel on different mini-batches. At that point an average gradient is calculated with respect to each of the parameters, averaged across all of the mini-batches processed by all of the graph instances.

Note that the SGD process is said above to calculate updated "parameters". In many networks the parameters to be learned are the neural network "weights", by which each neuron in an upstream layer influences each neuron in the next layer downstream. But many networks also include other parameters which can be made learnable, such as biases. The term "parameters" is intended herein to be a generalization of the term "weights". Nevertheless, the two terms are used interchangeably herein for clarity of the discussion.

FIG. 39 illustrates the temporal progress resulting from a conventional implementation of data parallelism, in which the Data Parallel operations of FIG. 38 are performed by GPUs orchestrated by a host. It can be seen that as time progresses, GPU0 performs forward processing on Section S0 (abbreviated FWD0), then FWD1, then FWD2. At this point GPU0 calculates the loss (step not shown) for each of the data samples in the mini-batch, and begins the first back-propagation step BWD2. In parallel with these steps, each of the other GPU's participating in the data parallel operation also perform the same sequence of steps on their own mini-batches of training data.

However, each of the GPU's may execute at a different speed, and thus may complete step BWD2 at different times. At time step 5, each of the GPUs notify the host that they have completed their respective steps BWD2, and the host causes each of them to transmit their calculated gradients with respect to each of the parameters in Section S2, to all the other GPU's (SYNC2). For example, the host may write this command into a GPU control register or a storage location that the GPU is monitoring. While the cross-transmission is in progress, each of the GPUs performs its respective backward pass for Section S1 (BWD1) and notifies the host when done. In time step 6, the host causes each of the GPUs to transmit their calculated gradients with respect to each of the parameters in Section S1, to all the other GPU's (SYNC1). While the cross-transmission is in progress, each of the GPUs performs its respective backward pass for Section S0 (BWD0) and notifies the host when done. In time step 7, the host causes each of the GPUs to transmit its calculated gradients with respect to each of the parameters in Section 0, to all the other GPU's (SYNC0).

The GPUs cannot continue with the All-Reduce (AR) steps because typically they must wait for all the cross-transmissions to complete first. Thus one time step is lost in each GPU while it idles awaiting notification from the host that all the SYNC steps have been completed. Then each GPU can proceed with its All-Reduce operation to calculate the average gradient with respect to each of the parameters in Section S2 (step AR2 in time step 8). Similarly each GPU then performs its All-Reduce operation to calculate the average gradient with respect to each of the parameters in Section 1 (step AR1 in time step 9), and then each GPU performs its All-Reduce operation to calculate the average gradient with respect to each of the parameters in Section 0 (step AR0 in time step 10). If three optimization steps (OPT2, OPT1, OPT0) are performed thereafter, a total of 13 time steps are used in the conventional implementation to complete one update of the parameters. Just as significantly, significant control and networking overhead is incurred in the conventional method as the host orchestrates all of the synchronization steps. Techniques are available to speed up the process, but many of them require even more involvement by the host and thus make the control and networking overhead even worse.

FIG. 40 illustrates the temporal progress resulting from an improved implementation using an FPGA 3236 on the SmartNIC 3224 to both orchestrate the SYNC steps and to perform the All-Reduce steps, thereby offloading time consuming processing steps from the RPs.

In FIG. 40, the steps FWD0, FWD1, FWD2 and BWD2 occur as in FIG. 39. Preferably FWD0 processes an entire mini-batch before FWD1 begins, and so on for FWD2. However, unlike the GPU embodiment of FIG. 39, no host is involved at runtime to set up and trigger each of these steps.

Additionally, no host is required to orchestrate the SYNC steps as in FIG. 39. Instead, the dataflow graph has been pre-configured into each of the RP's to notify the FPGA via P2P messages directly to the SmartNIC on the PCIe bus 3220. Then, while the RPs are calculating BWD1, the FPGA is reading the gradients calculated by each of the RP's directly from the RP's memory, to the local memory pool 3234. This too has been pre-configured into the FPGA by the dataflow graph and is triggered by the arrival of the data, not by any signal from a host CPU. Thus both the SYNC2 and AR2 steps are performed by the FPGA in parallel with the BWD1 step in the RP's, and both the SYNC1 and AR1 steps are performed by the FPGA in parallel with the BWD0 step in the RP's. Thus the three time steps that are required in FIG. 39 for the GPUs to perform AR steps, are eliminated in FIG. 40. The FPGA can even be configured to add up, with respect to each parameter in Section S2, the gradients received from the RP's on the fly, as they are received, thereby performing All-Reduce on the fly. No additional control and networking overhead is incurred by such an operation because it has already been pre-configured into the FPGA.

FIG. 41 illustrates the temporal progress resulting from a further improved implementation, which can be advantageous if the FPGA is sufficiently faster than the RPs. FIG. 41 is similar to FIG. 40 in that the dataflow pipelines configured into each of the RP's and to each of the FPGAs are able to perform SYNC2 and AR2 in the FPGA in parallel with the RPs performing BWD1. FIG. 41 is different, though, in that the FPGAs also perform an optimization step OPT2 while the RPs are performing BWD1. Optimizations are post-processing steps to adjust the learning rate, or to otherwise help the algorithm overcome saddle points, for example. Numerous kinds of optimization steps are available, such as those described in Sebastian Ruder, An Overview Of Gradient Descent Optimization Algorithms, arXiv: 1609.04747v2 [cs.LG] (2016), incorporated by reference herein. Some of these require retention of momentum, velocity, or other values depending on the optimizer, from one training epoch to the next. These can be maintained in the SmartNIC FPGA or local memory pool.

Again, unlike the GPU embodiment of FIG. 39, no host is involved at runtime to set up and trigger each of the steps in FIG. 41. Nor is any host required to orchestrate the SYNC, AR or OPT steps as in FIG. 39. Instead, the dataflow graph has been pre-configured into each of the RP's to notify the FPGA via P2P messages directly to the SmartNIC on the PCIe bus 3220. Then, while the RPs are calculating BWD1, the FPGA is reading the gradients calculated by each of the RP's directly from the RP's memory, to the local memory pool 3234. This too has been pre-configured into the FPGA by the dataflow graph and is triggered by the arrival of the data, not by any signal from a host CPU. Thus the SYNC2, AR2 and OPT2 steps are performed by the FPGA in parallel with the BWD1 step in the RP's, and the SYNC1, AR1 and OPT1 steps are performed by the FPGA in parallel with the BWD0 step in the RP's. Thus three more time steps are eliminated compared to the sequence of FIG. 40, and six time steps are eliminated as compared to the sequence of FIG. 39.

Note that certain SYNC and AR steps are said above to be performed by the FPGA "in parallel" with certain BWD steps in FIGS. 40 and 41. As used herein, two steps or pipeline stages, or dataflow segments, are considered to be performed in "parallel" with each other if the first step, stage or segment overlaps in time with the second step, stage or segment. That is, the second step, stage or segment begins before the first step, stage or segment completes.

Note also that while a host 3210 is shown in FIG. 32, no host is shown in FIG. 38. This is because while host 3210 may be connected to the PCIe bus 3220, it does not control any of the operations of the RPs or the FPGA once they have begun. Nor do any of the messages or data passing among the RPs and/or SmartNICs pass through the host. All of the steps shown in 40 FIGS. 40 and 41 were pre-configured into the RPs and the FPGA, and are triggered by the receipt of sufficient data to begin the step, or an explicit completion token from the sender, but not by a command by any host. Host 3210 may be involved before and after the steps of 40 FIGS. 40 and 41, such as to record some of the parameter updates for later analysis, and in some embodiments to direct each RP to the next mini-batch to process. Host 3210 also may be the configuration load controller that initiates the configuration load process. But once the process of 40 FIG. 40 or 41 begins for a particular mini-batch, it runs to completion without further host intervention.

Example Use of FPGA Offload—Multi-Node System

Figure 42:
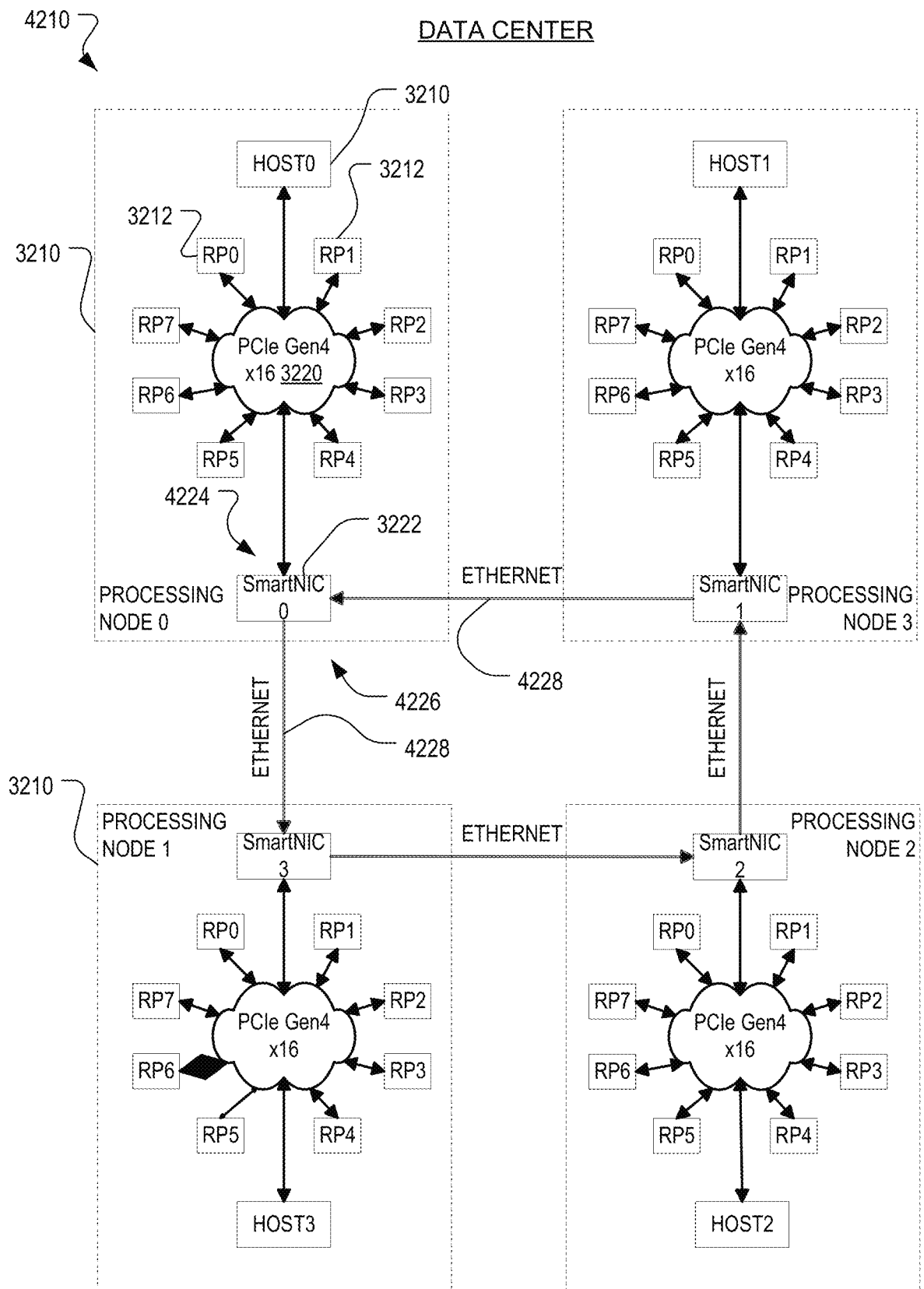
FIG. 42 illustrates an example data center incorporating multiple processing nodes.

FIG. 42 illustrates an example data center 4210 incorporating multiple processing nodes 3201 each as described above with respect to FIG. 32. Four processing nodes are shown, numbered 0-3. As set forth above with respect to FIG. 32, each processing node 3201 includes a respective host 3210 and eight (for example) RPs 3212 numbered RP0 through RP7, all interconnected by way of a respective PCIe bus 3220. RPs and other units within a single processing node are sometimes referred to herein as "local" to each other, whereas units that are in different processing nodes are sometimes referred to herein as "foreign" to each other.

The hosts are given subscripts in FIG. 42 corresponding to the node number to which they belong (e.g. Host0, Host1, Host2 and Host3). Each processing node 3201 also includes a respective SmartNIC 4222, which has one port 4224 connected to the local PCIe bus 3220 in the respective processing node, and a second port 4226 connected to a LAN 3228. Like the hosts, the SmartNICs also are given subscripts in FIG. 42 corresponding to the node number to which they belong (e.g. SmartNIC0, SmartNIC1, SmartNIC2 and SmartNIC3). The LAN 3218 in FIG. 42 is an Ethernet, but in other embodiments it could be other types of LANs such as WiFi or InfiniBand. Also, the LAN could be constructed with various topologies in different embodiments, including all interconnected by a single layer 2 switch. In the embodiment of FIG. 3201, however, the LAN is constructed of four separate segments, connected in a ring topology from one SmartNIC to the next. Each of the Ethernet ports 4226 in FIG. 42 is considered to have two sub-ports in order to support this topology. (Other implementations can have more or fewer sub-ports, as needed given the parameter size relative to minibatch execution time and throughput). Specifically, SmartNIC0 has one Ethernet sub-port connected to SmartNIC3 and another connected to SmartNIC1; SmartNIC1 has one Ethernet sub-port connected to SmartNIC0 and another connected to SmartNIC2; SmartNIC2 has one Ethernet sub-port connected to SmartNIC1 and another connected to SmartNIC3; and SmartNIC3 has one Ethernet sub-port connected to SmartNIC2 and another connected to SmartNIC0. In order to simplify the discussion, all of the Ethernet segments in FIG. 4210 are sometimes referred to herein collectively as a single LAN or Ethernet 4228.

The reconfigurable components in all of the processing nodes in the system 4210 are configured by a configuration load process as described above with respect to FIG. 32. In one embodiment, one of the hosts 3210 acts as the configuration load controller for all processing nodes 3201, whereas in another embodiment each of the hosts 3210 acts as the configuration load controller for only those reconfigurable components that reside in its own processing node 3201. In yet another embodiment, a separate member, not shown in FIG. 42, acts as the configuration load controller for all of the processing nodes 3201. Other variations will be apparent to the reader.

In some implementations, the configuration bit file may designate one of the hosts 3210 as a master host, and/or may designate one of the RPs in each processing node 3201 as a master RP for that node. The configuration bit file may allocate certain high level responsibilities to such a master RP or master host. In other implementations, the bit file may configure all of the RPs in one or more of the processing nodes to be identical instances of a dataflow graph or graph fragment. In still other implementations, the configuration bit file may configure some or all of the RPs hosts with dissimilar dataflow graphs or graph fragments. The hosts, too, may be programmed similarly or differently than the other hosts.

Figure 43:
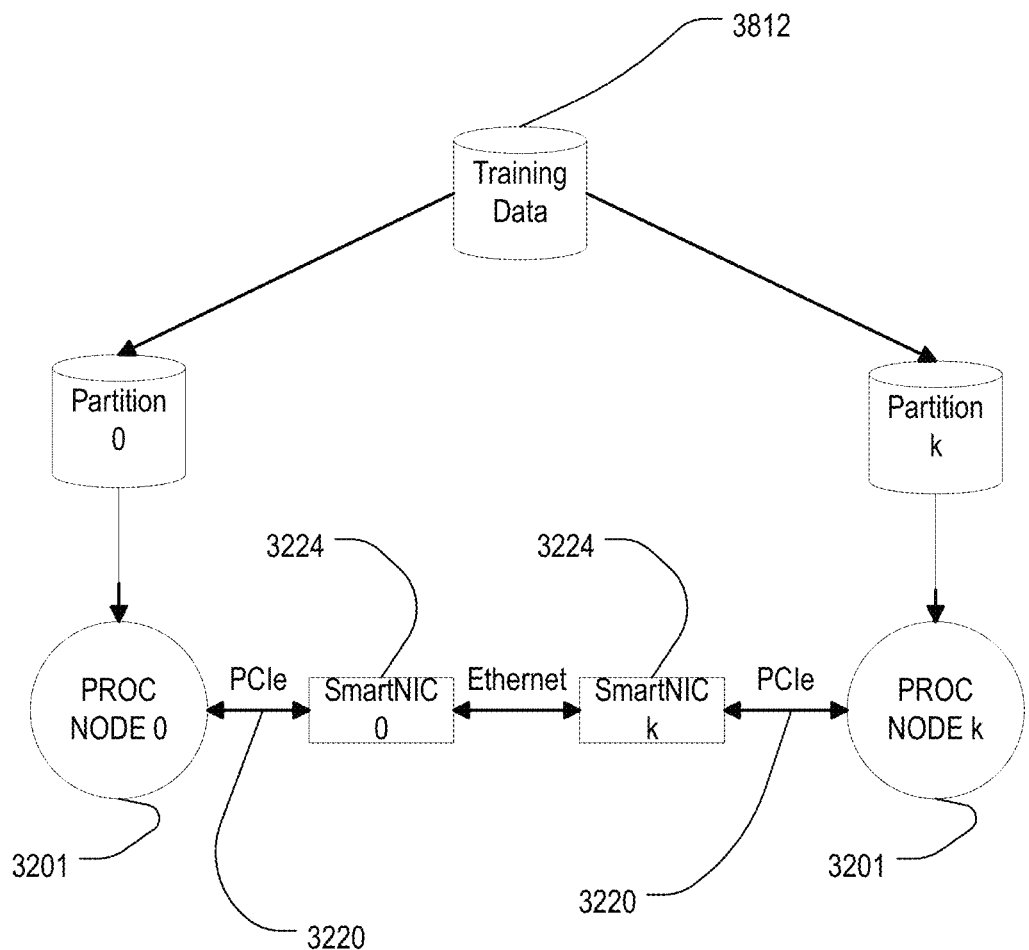
FIG. 43 illustrates a stochastic gradient descent deep learning application implemented with data parallelism across multiple processing nodes.

FIG. 43 illustrates a SGD deep learning application similar to that of FIG. 38, that is implemented with data parallelism across multiple RPs in the multiple processing nodes of FIG. 42. In particular, the drawing illustrates two of the processing nodes designated processing node 0 and processing node k, where the lower case subscript 'k' indicates that the component labeled processing node k represents any of the processing nodes. All the RPs in all of the processing nodes 3201 are configured with the same processing graph fragment, to learn the weights in a multi-layer neural network based on training data 3812. The training data 3812 has been partitioned into multiple training data sets, each to be processed by a respective one of the processing nodes in parallel. Each partition is further divided within a processing node for processing by respective RPs in that processing node.

The deep learning application of FIG. 43 has the same time-saving benefits of SYNC/AR offload as explained above with respect to FIG. 40, the difference being that each of the SYNC/AR steps includes contributions from all the RPs in all the processing nodes 3201. As described further below, the application of FIG. 43 operates roughly by the local SmartNICs each accumulating all gradients from all local RPs to the local SmartNIC's memory, and all the SmartNICs then participating in a Ring All-Reduce process. Updated weights (or other parameters) are then calculated independently by each of the FPGAs from the resulting average gradients, and broadcast to each SmartNIC's local RPs for use in the next training epoch. The process that takes place is illustrated in more detail in FIGS. 44-47, which can collectively be taken as an illustration of a dataflow graph configured into the various units in FIG. 42.

Figure 44:
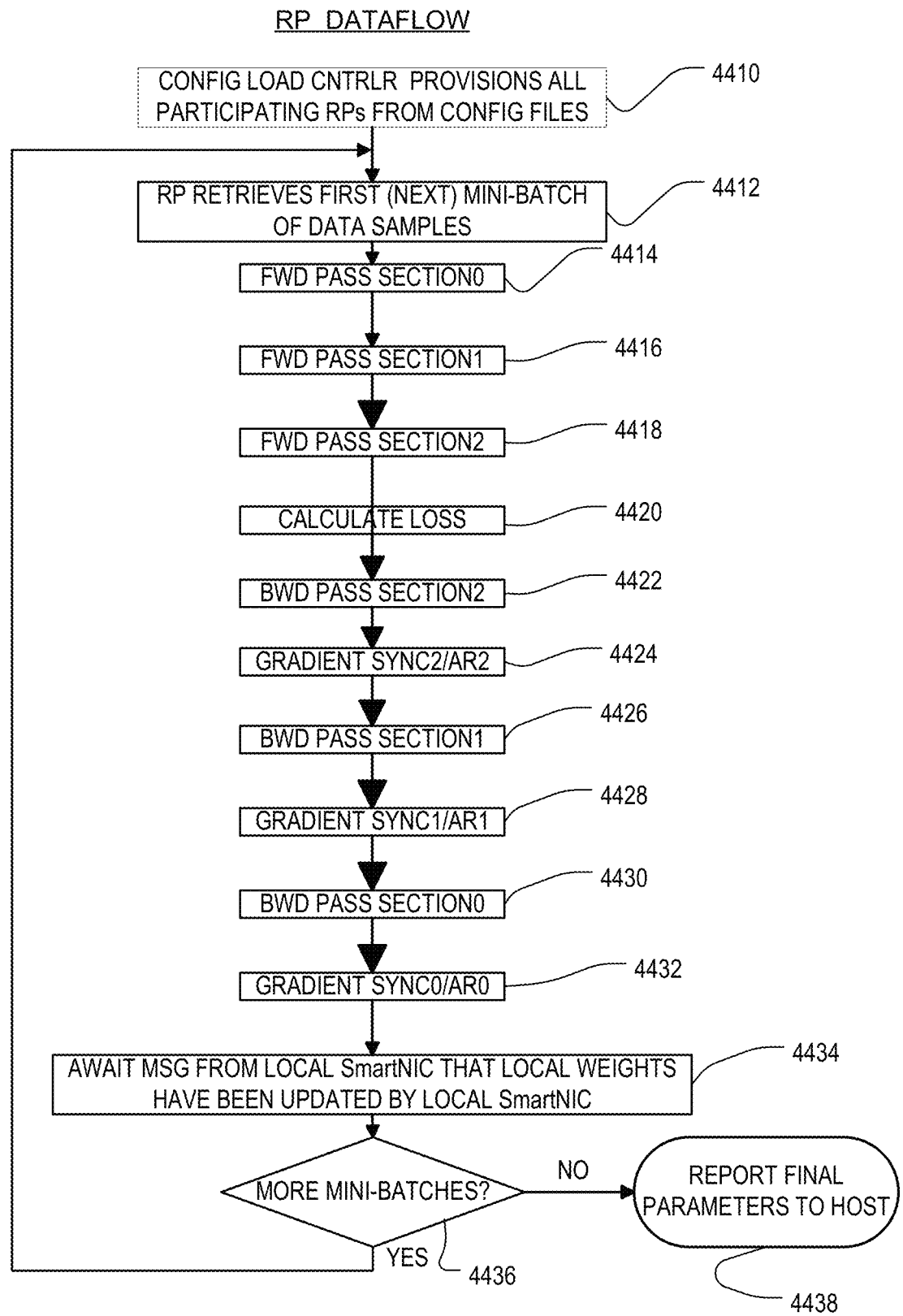
FIG. 44 illustrates a dataflow graph fragment that is configured into each of the reconfigurable processors in FIG. 42.

FIG. 44 illustrates a dataflow graph fragment that is configured into each of the RPs. (Alternatively, it can be considered to illustrate a dataflow graph fragment configured into virtual machines in the RPs.) Though graph fragments may be illustrated herein in the form of steps in a flow chart, and may be referred to as steps in the discussion below, it will be understood that they actually represent stages in a dataflow pipeline. They are therefore sometimes referred to herein interchangeably as steps or stages. Additionally, as used herein, as used herein a pipeline can include one or more "sub-pipelines", which are themselves considered to be pipelines in their own right. Also, a sub-stage of a pipeline stage is also considered itself to constitute a stage of the pipeline.

Initially, in step 4410, the configuration load controller configures each of the RPs with the pipeline shown in the drawing. The loaded configuration can, in some embodiments, also load an initial set of network parameters into each of the RPs, or configure an address from which they can be drawn. The loaded configuration also can, in some embodiments, load into each RP's local memory all the data samples that the RP will train from, or configure an address from which they can be drawn.

In step 4412, the RP retrieves the first mini-batch of data samples for use in local training.

In step 4414, the RP processes all the data samples in the mini-batch through the first configured forward Section of the network, Section S0, to yield outputs from Section S0. The outputs are then passed to step 4416, which processes all the data samples in the mini-batch through the second configured forward Section of the network, Section S1, to yield outputs from Section S1. The outputs are then passed to step 4418, which processes all the data samples in the mini-batch through the third configured forward Section of the network, Section S2, to yield outputs from Section S2. These are the predictions, one tensor for each data sample in the mini-batch.

In step 4420, the dataflow calls for the RP to calculate the loss (error) for each of the data samples. As an example, the dataflow graph can be configured to calculate the loss for a particular data sample as the sum of the squares of the differences between each predicted output and its respective target value as specified in the data sample.

Step 4420 also passes the output node deltas to backward pass Section S2, step 4422. Step 4422 calculates the loss gradient with respect to each of the learnable parameters in Section S2 of the network, for each of the data samples in the mini-batch. Step 4422 also calculates the gradient of the loss with respect to each of the Section S1 outputs, for each of the data samples (the Section S1 output node deltas). The RP then follows the configured data flow and passes the Section S2 parameter gradients to Gradient SYNC2/AR2 step 4424. As mentioned above with respect to FIG. 40, the sync orchestration and reduction of the Section S2 gradients are actually performed by the local SmartNIC 4224 rather than the current RPi. So far as the dataflow portion configured onto the RP is concerned, this step primarily involves sending the parameter gradients calculated in step 4422 to the local SmartNIC 4226 via P2P messages over the local PCIe bus 3220. Alternatively it can simply involve sending a P2P message via the local PCIe bus to the SmartNIC indicating that the parameter gradients are available, so the SmartNIC can fetch them from the RP.

In one embodiment, the pipeline of FIG. 44 could stall here and await the averaged Section S2 gradient values or updated Section S2 weights from the SmartNIC 4224, but that is not necessary since neither is required for the subsequent backward pass stages. Instead, therefore, Step 4422 proceeds to pass the calculated the Section S1 output node deltas on to BWD Pass Section S1 step 4426 of the pipeline, in parallel with the data collection and reduction taking place on the SmartNIC 4224.

Step 4426 uses the Section S1 output node deltas to calculate the parameter gradient with respect to each of the learnable parameters in Section S1 of the network, for each of the data samples in the mini-batch. The RP then passes the Section S1 parameter gradients to Gradient SYNC1/AR1 step 44284232 as described above with respect to Gradient SYNC2/AR2 step 4424. BWD Pass Section S1 step 4426 also calculates the gradient of the loss with respect to each of the Section S0 outputs, for each of the data samples (the Section S0 output node deltas) and proceeds to pass them on to BWD Pass Section S0 step 4430 of the pipeline, in parallel with the data collection and reduction taking place on the SmartNIC 4224. BWD Pass Section S0 step 4430 uses the Section S0 output node deltas to calculate the parameter gradients with respect to each of the learnable parameters in Section S0 of the network, for each of the data samples in the minibatch. The RP then passes the Section S0 parameter gradients to Gradient SYNC0/AR0 step 12324232 as described above with respect to Gradient SYNC2/AR2 step 4424.

Step 4434 then awaits a message from the local SmartNIC 4226 via P2P messages over the local PCIe bus 3220 to indicate that updated weights calculated on the local Smart-NIC have been broadcast to local scratchpad memory on the RP or off-chip memory attached to the RP. In step 4436 the RP determines whether more mini-batches have been assigned to it to process, and if so, the pipeline repeats with step 4412.

Note that since the RPs operate on a dataflow model, there may not be any separate steps 4434 or 4436. Instead, since actions in the pipeline are triggered by receipt of data, an implementation may simply end the pipeline after step 4432, and step 4412 at the beginning of the pipeline is triggered to re-start, upon local receipt of updated parameters, if the RP has been assigned more mini-batches to process. Similarly, if the RP does not have any more mini-batches to process, then receipt of the updated parameters triggers step 4438 to report the final parameters to the local host, or to report completion of all assigned minibatches and epochs to the host.

Note that only one RP in the system needs to report the final parameter values to a host. In an embodiment, one of the processing nodes (e.g. processing node 0 in FIG. 42) is designated as the master node, and one of the RPs (e.g. RP0 in FIG. 42) is designated as the master RP in processing node 0. Then only that RP is configured with step 4438. In all other RPs, if there are no further mini-batches for the RP to process, the pipeline of FIG. 44 simply ends.

Figure 45:
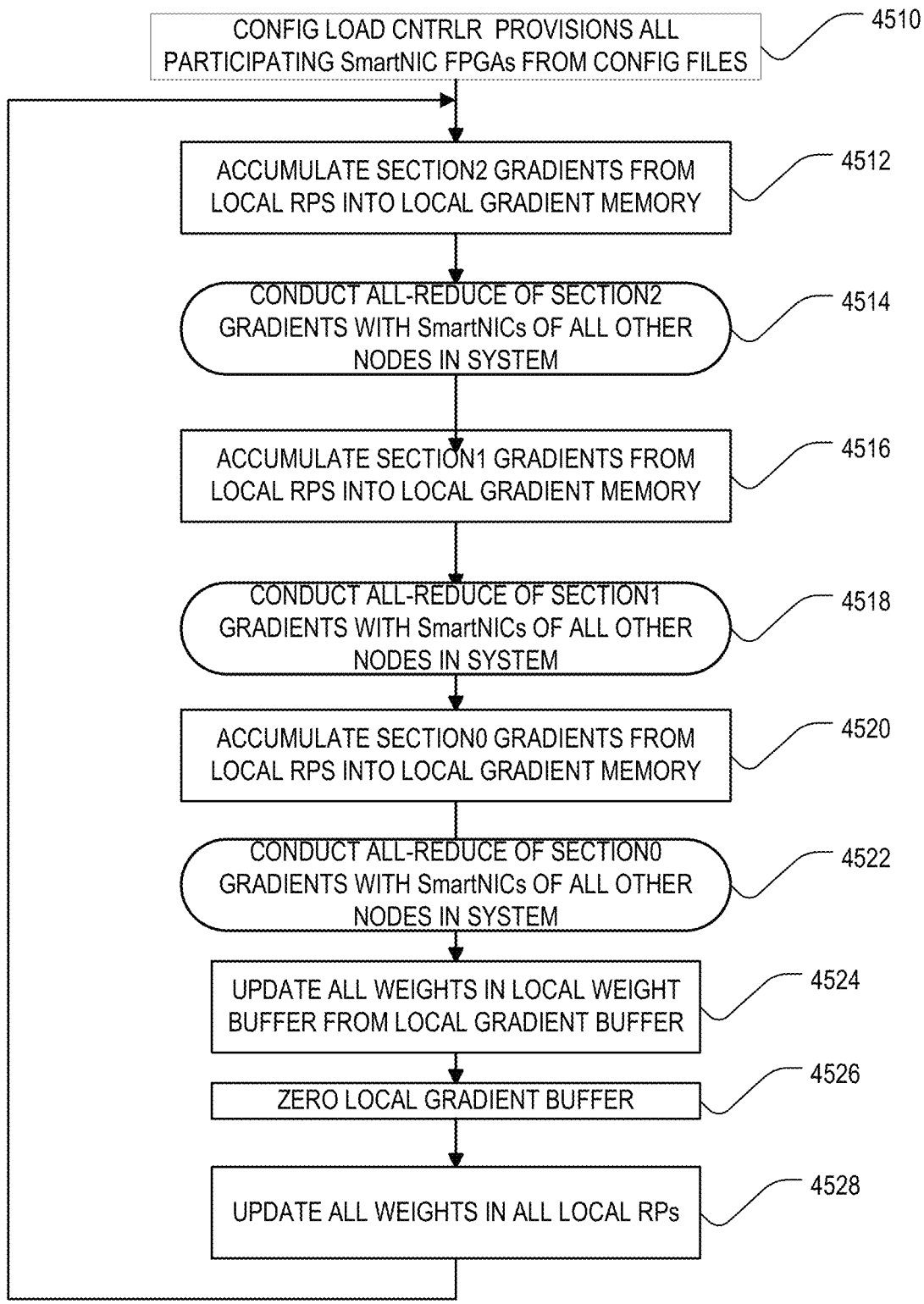
FIG. 45 illustrates a dataflow graph fragment that is configured into the SmartNICs of each of the processing nodes in the system of FIG. 42.

FIG. 45 illustrates a dataflow graph fragment that is configured into the SmartNICs 4224 of each of the processing nodes 3201 in the system of FIG. 42 by the configuration load controller. As an overview, in the embodiment of FIG. 45, the SmartNIC accumulates the gradients from all its local RPs, and then the SmartNIC cooperates with the SmartNICs of the other processing nodes in the system, to perform a Ring All-Reduce of the various local sums which results in each SmartNIC having a local copy of a final sum. The final sum represents a total or average gradient for each of the learnable parameters in the network being trained. Each of the SmartNICs then locally updates all the parameters from the average gradients, and broadcasts the updated weights to all its local RPs via its own local PCIe bus.

The graph fragment is expressed in the configuration bit file in the form of configuration bits to be written into the FPGA on the SmartNIC, which together cause the building blocks of the FPGA to form a state machine and associated structures to perform the steps shown in the drawing. Though the graph fragment is illustrated in the drawing in the flow chart form, it will be understood that it is implemented in FPGA hardware rather than in instruction code to be executed by a software-based instruction processor. As such, for appropriate operations, it typically can be made to execute much faster. The graph fragment is configured into each of the SmartNICs by the configuration load controller, which also configures into the FPGAs a parameters buffer for all the learnable parameters, and initializes it to the same initial values for such parameters as are configured into the RPs in step 4410 (FIG. 44). The bit file also configures into each of the FPGAs a gradient buffer for all the learnable parameters and initializes the gradient values to zero.

Step 4512 is triggered when the Section S2 parameter gradients become available to the SmartNIC in step 4424 (FIG. 44). In step 4512, the Section S2 gradients are accumulated into the SmartNIC's local memory pool 3234 from each of the local RPs, having been sent during the Gradient SYNC2/AR2 step 4424 of the RP's pipeline.

In step 4514, the FPGA cooperates with the FPGA in each of the other SmartNTCs to perform a collective which results in a local copy of a final sum of all the Section S2 gradients in the local memory pool 3234 of each of the SmartNICs. This step is described in more detail below.

In step 4516, after all-reduce is complete with respect to the Section S2 gradients, the Section S1 gradients are accumulated into the SmartNIC's local memory pool 3234 from each of the local RPs, having been sent during the Gradient SYNC1/AR1 step 4428 of the RP's pipeline.

In step 4518, the FPGA cooperates with the FPGA in each of the other SmartNTCs to perform a collective which results in a local copy of a final sum of all the Section S1 gradients in the local memory pool 3234 of each of the SmartNICs. Again, this step is described in more detail below.

In step 4520, after all-reduce is complete with respect to the Section S1 gradients, the Section S0 gradients are accumulated into the SmartNIC's local memory pool 3234 from each of the local RPs, having been sent during the Gradient SYNC0/AR0 step 4432 of the RP's pipeline.

In step 4522, the FPGA cooperates with the FPGA in each of the other SmartNICs to perform a collective which results in a local copy of a final sum of all the Section S0 gradients in the local memory pool 3234 of each of the SmartNICs. Again, this step is described in more detail below.

Once all the average gradients have been calculated across all the processing nodes 3201, in step 4524 the FPGA of the local SmartNIC updates all the parameter values in its local parameter buffer from the gradient buffer. This typically involves a simple multiplication of each of the average gradients by a predetermined learning rate factor. At this point each of the SmartNICs has a complete set of updated parameter values for use in the next epoch of training In step 4526 the SmartNIC re-initializes its local gradient buffer to zero, and in step 4528 it sends the updated parameter values to all of its local RPs. The FPGA then idles until Section S2 gradients for the next training epoch become available to the SmartNIC in step 4424, 32 and the dataflow graph fragment repeats from step 4512.

Uni-Directional Inter-Node Ring all-Reduce

Steps 4514, 4518 and 4522 in FIG. 45 each call for an all-reduce of the gradients from the respective network segment. Any type of collective can be configured into the SmartNICs in various embodiments to accomplish this, but a Ring All-Reduce with a Uni-Directional Ring collective is used in the embodiment described herein. Many other collective methodologies are known and could be used instead. Non-limiting examples include Broadcast, All-Gather, Reduce, All-Reduce, Reduce-Scatter, Scatter, Gather, All-To-All, tree-based, and Neighborhood. See NCCL-Woolley.pdf, retrieved from https://images.nvidia.com/events/sc15/pdfs/NCCL-Woolley.pdf, visited Apr. 21, 2021, incorporated by reference herein. Herein, whichever collective is chosen is implemented using a message passing protocol, orchestrated by a control algorithm configured into an FPGA in one or more of the participating SmartNICs.

Figure 46A:
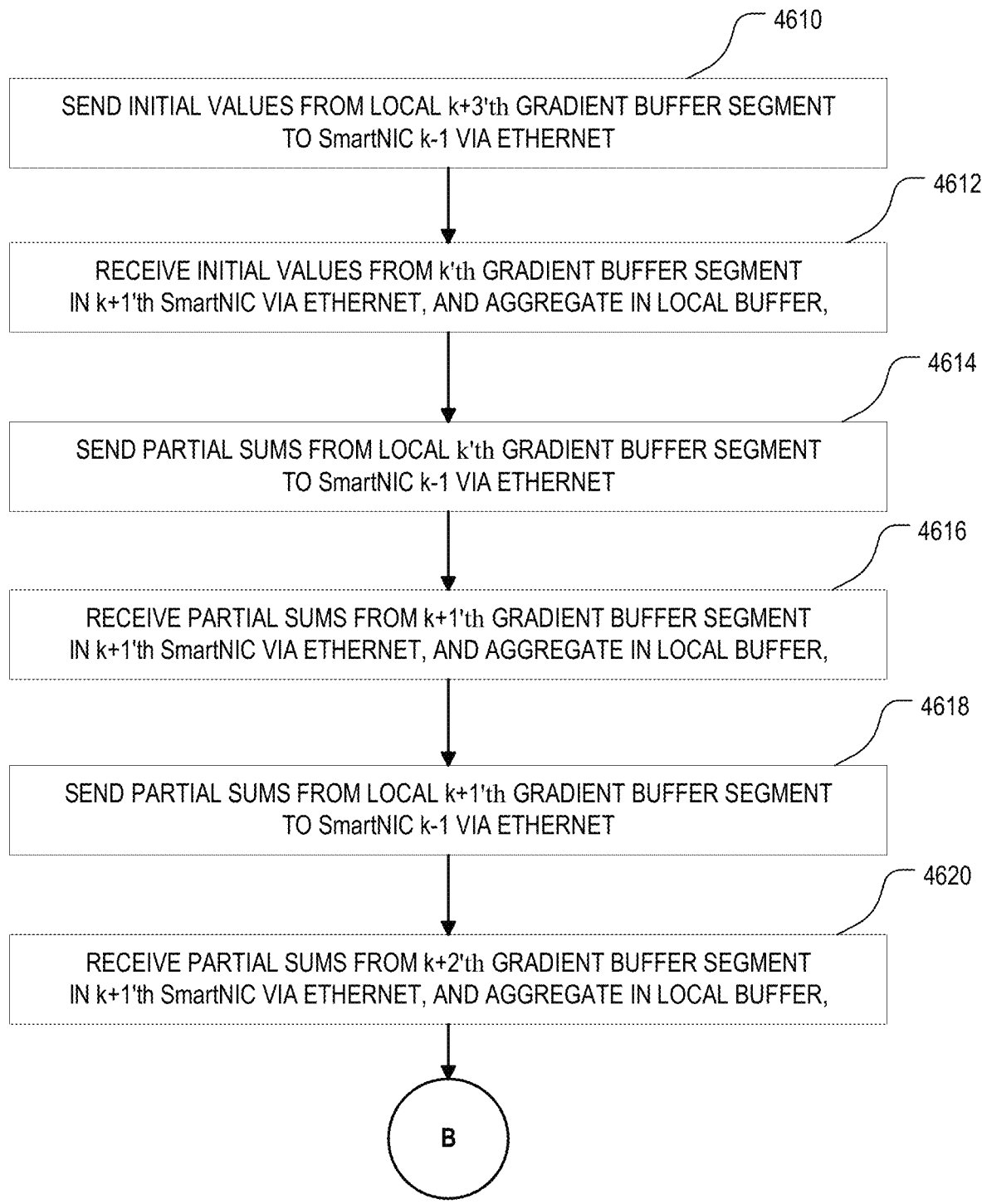
FIGS. 46A and 46B (collectively FIG. 46) is a detail of a uni-directional ring all-reduce collective for each of the steps 4514, 4518 and 4522 in FIG. 45.
Figure 46B:
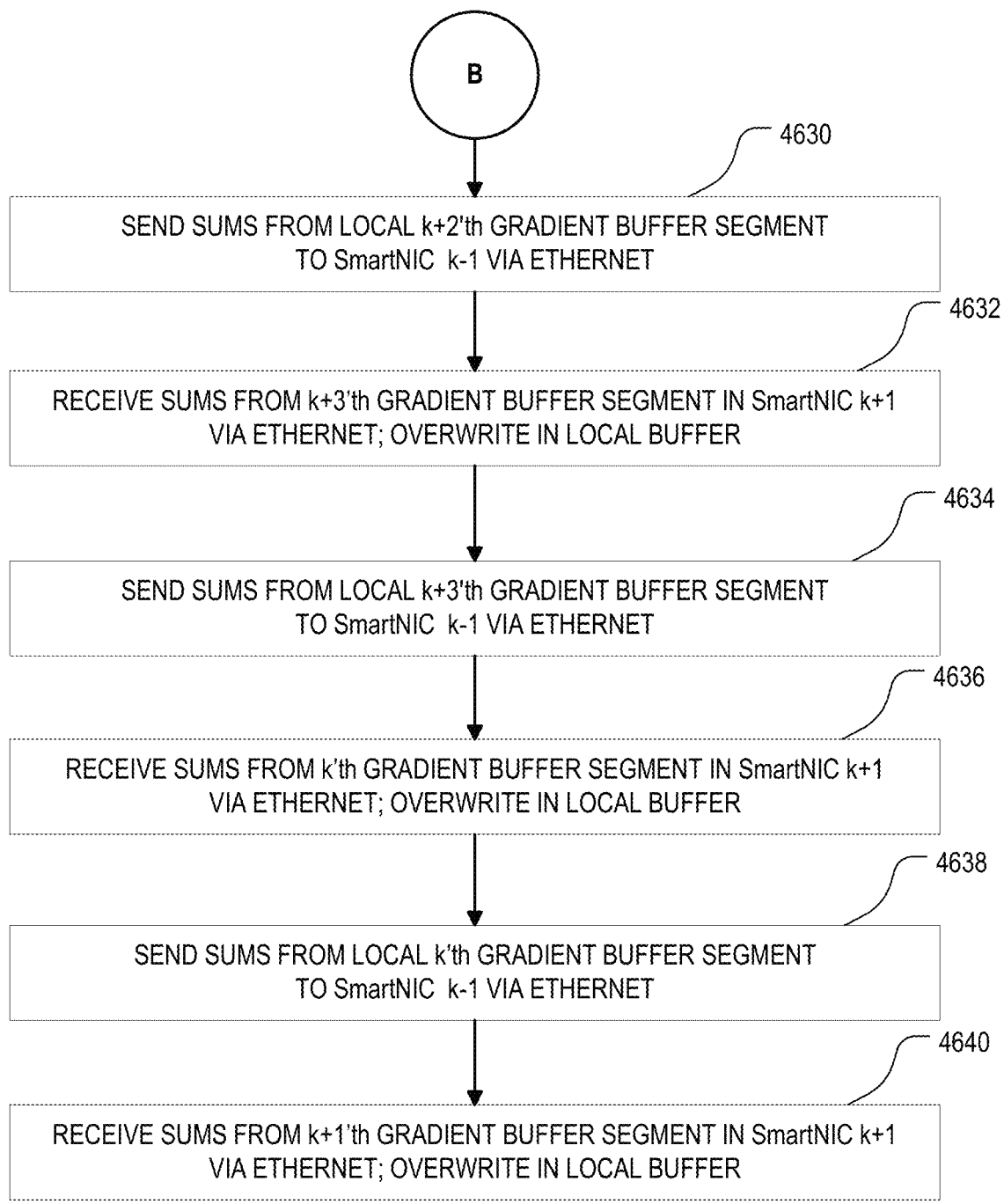

FIGS. 46A and 46B (collectively FIG. 46) is a detail of the uni-directional ring all-reduce collective for a Section Sj in FIG. 45, j=2, 1, 0. That is, it represents a detail of each of the steps 4514, 4518 and 4522 in FIG. 45, depending on j. The dataflow is described in FIG. 46 with reference to an index k (e.g. SmartNIC k, gradient buffer segment k), but the index k is used in the drawing only as a convenience to facilitate compactness of the description. The SmartNICs do not need to know their ID number k or perform any calculations based on k in the present embodiment since the compiler performs such calculations in advance when preparing the configuration bit files. The bit files configured into the FPGA in each SmartNIC have hardcoded pointers to each particular gradient buffer segment to be read or written or accumulated by that particular SmartNIC in each stage of the pipeline. Additionally, since the compiler was also aware at compile time of which of the other SmartNICs is reachable via each of the two LAN sub-ports of a SmartNIC, both the source and destination SmartNICs for each gradient transmission also has already been pre-configured into the FPGA of each SmartNIC by hardcoded identification of which LAN sub-port to use. In an embodiment, these variations arising from the differing SmartNIC ID numbers k are the only differences between the ring all-reduce dataflows as configured into the SmartNICs. However, in a different embodiment, the configuration bit file could configure into the FPGAs the number of processing nodes 3201, the ID number k for each of the participating SmartNICs, and/or an indication of which LAN sub-port is connected to which other one of the SmartNICs.

The uni-directional ring all-reduce algorithm will be described using illustrations in FIGS. 47A, 47B, 47C, 47D, 47E, 47F, 47G, and 47H (collectively FIG. 47).

Initially, at compile time, the dataflow compiler has divided the gradient buffers in each of the SmartNICs into N buffer segments, where N is the number of participating SmartNICs. N=4 in the embodiment of FIG. 42. Each gradient buffer segment includes only 1/N of the gradients in the current Section Sj of the network. In another embodiment the FPGAs could be configured to perform a single ring all-reduce process to include all gradients for all the parameters in the network, after all the local sums from all Sections j have been accumulated in all of the local SmartNICs.

In the following description, all the NIC ID numbers and gradient buffer segments are modulo N (i.e. modulo 4 in this example). As examples, when considering this description for NIC k, NIC k+1 would be read as NIC 0 if k=3, and NIC k−1 would be read as NIC 3 if k=0. The four SmartNICs are referred to herein as NICs 0, 1, 2 and 3, and the gradient buffer segments are referred to as segments 0, 1, 2 and 3. It will be understood that the very same process as described herein using the above numbering system, could alternatively be described by assigning different numbers to the NICs and/or to the gradient buffer segments. The numbering of an alternate description might appear different from that set forth herein, but the actual process being performed would remain the same or be equivalent, as would be discernable by reverting to the numbering system used herein.

The dataflow of FIG. 46 proceeds with a first phase (sometimes referred to herein as an accumulation phase), followed by a second step (sometimes referred to herein as a distribution phase). Generally the stages of the accumulation phase are shown in FIG. 46A, whereas the stages of the distribution phase are shown in FIG. 46B.

Figure 47A:
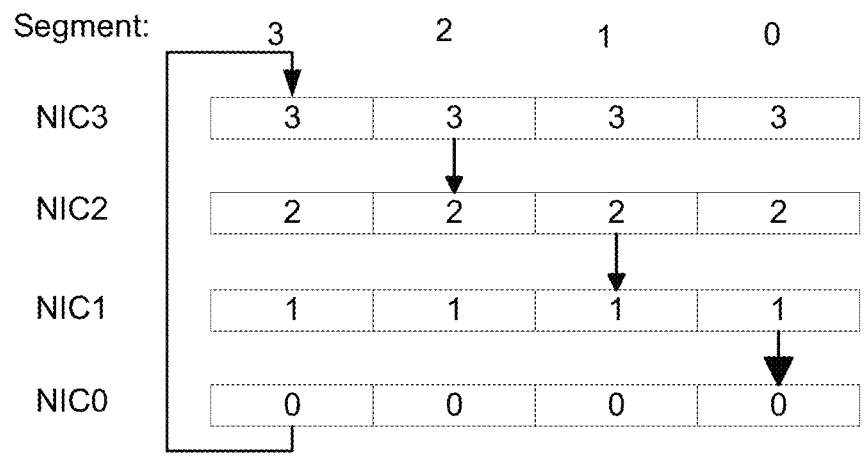
FIGS. 47A, 47B, 47C, 47D, 47E, 47F, 47G, and 47H (collectively FIG. 47) illustrate the uni-directional ring all-reduce algorithm of FIG. 46.
Figure 47B:
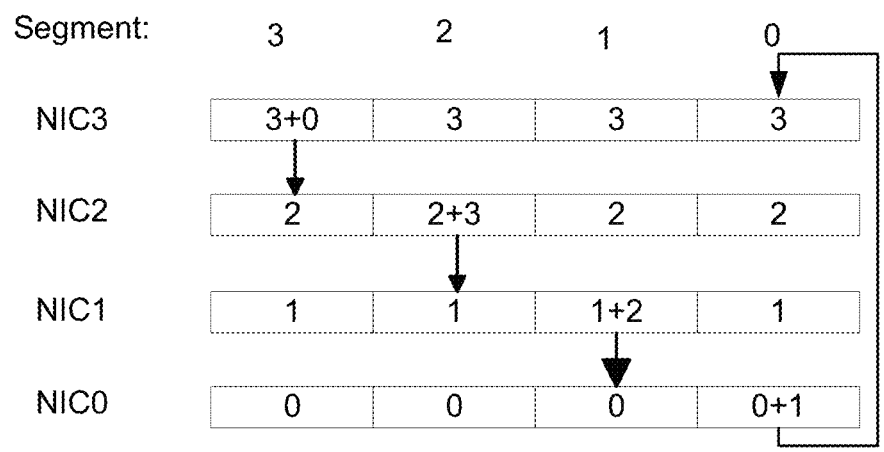

Referring to pipeline stage 4610, in the first phase of the algorithm, and as indicated by the arrows in FIG. 47A, the NIC k sends the initial values in its k+3'th gradient buffer segment to NIC k−1. (More explicitly, NIC0 sends the values from its gradient buffer segment 3 to NIC3, NIC1 sends the values from its gradient buffer segment 0 to NIC0, NIC2 sends the values from its gradient buffer segment 1 to NIC1, and NIC3 sends the values from its gradient buffer segment 2 to NIC2.) This means that NIC k also receives the initial values from the k'th gradient buffer segment in NIC k+1 (stage 4612). (More explicitly, NIC0 receives the values from NIC1's gradient buffer segment 0, NIC1 receives the values from NIC2's gradient buffer segment 1, NIC2 receives the values from NIC3's gradient buffer segment 2, and NIC3 receives the values from NIC0's gradient buffer segment 0.) Upon receipt, NIC k adds the received values to its local gradient buffer for the k'th gradient segment. Thus as shown in FIG. 47B, after stage 4612, NIC k's gradient buffer for segment k now includes the sum of the corresponding gradients from NIC k and from NIC k+1. NIC gradient buffers for all other segments, still contain only the gradients from its own local RPs.

Next, in pipeline stage 4614, and as indicated by the arrows in FIG. 47B, the MC k sends the partial sums now in its k'th gradient buffer segment to NIC k−1. This means that NIC k also receives the partial sums from the k+1'th gradient buffer segment in NIC k+1 (stage 4616). Upon receipt, NIC k adds these values to its local gradient buffer for the k+1'th gradient segment. Thus as shown in FIG. 47C, after stage 4616, NIC k's gradient buffer for segment k+1 now includes the sum of the corresponding gradients from NIC k, NIC k+1, and NIC k+2.

Figure 47C:
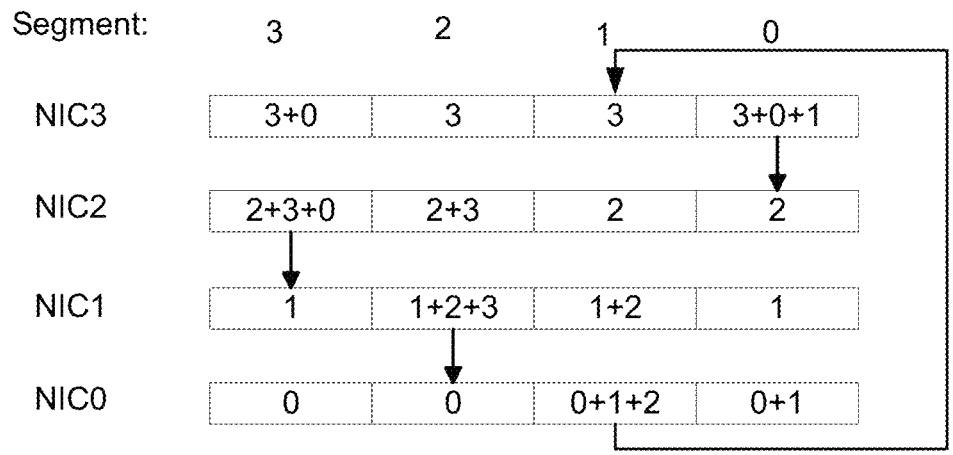
Figure 47D:
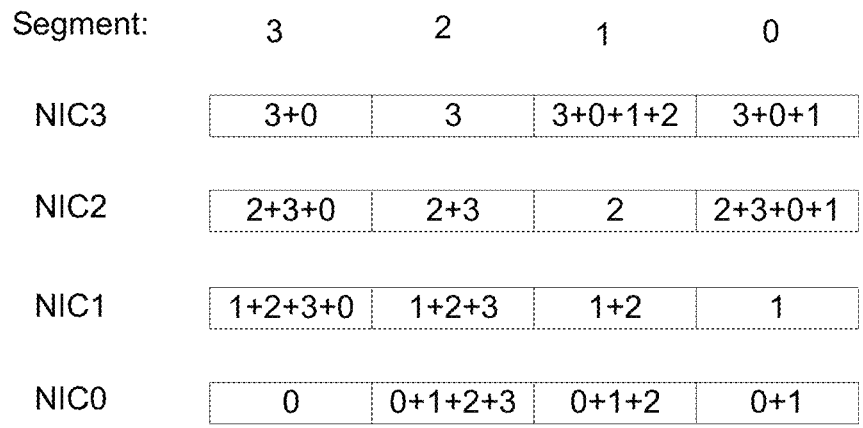

Next, in pipeline stage 4618, and as indicated by the arrows in FIG. 47C, the MC k sends the partial sums now in its k+1'th gradient buffer segment to NIC k−1. This means that NIC k also receives the partial sums from the k+2'th gradient buffer segment in NIC k+1 (stage 4620). Upon receipt, NIC k adds these values to its local gradient buffer for the k+2'th gradient segment. Thus as shown in FIG. 47D, after stage 4620, NIC k's gradient buffer for segment k+2 now includes the sum of the corresponding gradients from all four SmartNICs.

Figure 47E:
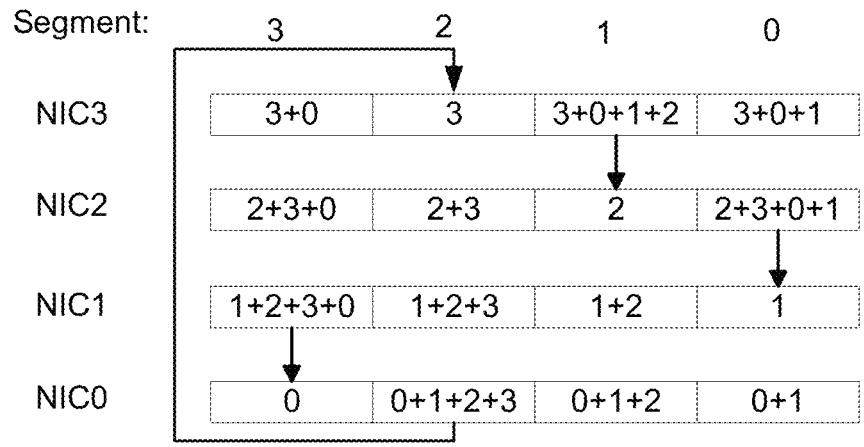

Then in the second phase of the algorithm, referring to stage 4630 and as shown by the arrows in FIG. 47E, each NIC k sends the values in its local gradient segment buffer k+2, which is the complete sum of the gradients of that segment, to NIC k−1. This means that NIC k also receives the complete sum of the gradients of segment k+3 from NIC k+1 (stage 4632). NIC k writes this into its local gradient buffer for that segment, over-writing the values previously there. The resulting state is shown in FIG. 47F.

Figure 47F:
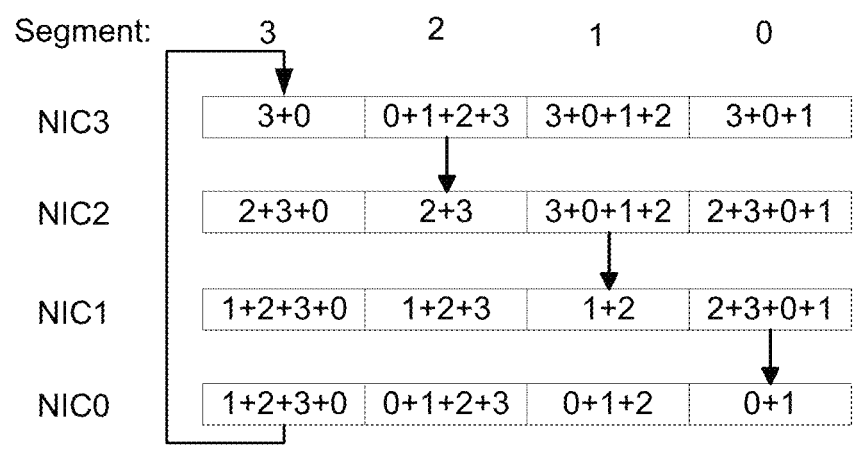

Next, referring to stage 4634 and as shown by the arrows in FIG. 47F, each NIC k sends the values in its local gradient segment buffer k+3, which is the complete sum of the gradients of that segment, to NIC k−1. This means that NIC k also receives the complete sum of the gradients of segment k from NIC k+1 (stage 4636). NIC k writes this into its local gradient buffer for that segment, over-writing the values previously there. The resulting state is shown in FIG. 47G.

Figure 47G:
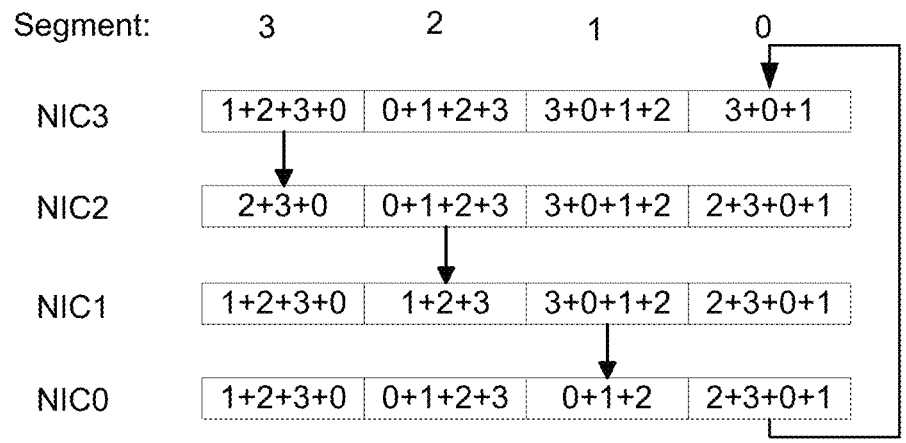
Figure 47H:
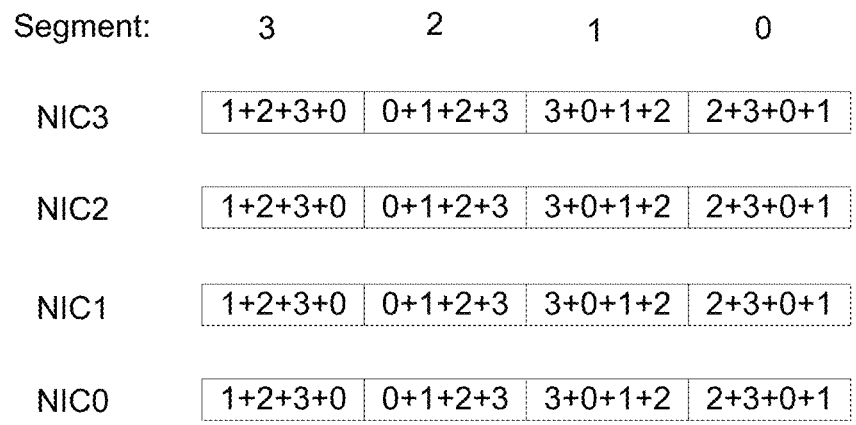

Finally, referring to stage 4638 and as shown by the arrows in FIG. 47G, each NIC k sends the values in its local gradient segment buffer k, which is the complete sum of the gradients of that segment, to NIC k−1. This means that NIC k also receives the complete sum of the gradients of segment k+1 from NIC k+1 (stage 4640). NIC k writes this into its local gradient buffer for that segment, over-writing the values previously there. The resulting state is shown in FIG. 47H. Each NIC now has complete sums of all the Section Sj gradients in its own gradient buffers. Each NIC can now update all the parameters in its local parameters buffer, and send the updated parameters to all of its local RPs (stages 4524 and 4528 in FIG. 45).

Note that in an embodiment, the FPGA for NIC k could be configured to perform both steps 4610 and 4612 at the same time, since the gradient buffer segments involved are different, and the LAN sub-ports over which data is sent/received are also different. The same is true for all the other corresponding pairs of stages in FIGS. 46A and 46B.

The dataflow of FIG. 46 can be re-written for a generalized value of N, as follows, with all index arithmetic taken Modulo N:

In the accumulation phase, for each value of an iterator p, p iterating by integers from 0 up to N−2, each k'th SmartNIC sends its initial or aggregated values from its local k+p−1'th gradient buffer segment, to the k−1'th SmartNIC via the Ethernet. The k'th SmartNIC also receives via the Ethernet from the k+1'th SmartNIC, and aggregates in its local gradient buffer segment, values from the k+p'th gradient buffer segment.

After the above stage completes for p=N−2, the distribution phase begins. In the distribution phase, for each value of the iterator q, q iterating by integers from 0 up to N−2, each k'th SmartNIC sends its aggregated values from its local k+q−2'th gradient buffer segment to the k−1'th SmartNIC via Ethernet. The k'th SmartNIC also receives via Ethernet, values from the k+q−1'th gradient buffer segment from the k+1'th SmartNIC, and writes it to its local gradient buffer segment.

Again, the numbering system used in the above description is selected for purposes of this description, and serves only to identify in a compact way, what operations occur and in what sequence; the numbering system itself does not necessarily exist in the configured FPGA. The FPGA is merely configured by the configuration bit file to include functional elements that will, when executed, perform the operations described herein in the sequence described herein. Another description of the algorithm may well use a different numbering system, but still produce an FPGA configured to perform the operations described herein in the sequence described herein.

In addition, it will be understood that different hardware functional elements can be instantiated into the FPGA to perform the operations described herein in the sequence described herein. In one embodiment, for example, all of the individual operations can be implemented as a linear sequence of stages, with no iterations occurring. For example, if N=4, then the configuration bit file might configure a string of 3 sequential pipeline stages for performing the 3 operations described above for the accumulation phase, followed by 3 more pipeline stages for performing the 3 operations described above for the distribution phase; and if N=5, then the configuration bit file might configure a string of 4 sequential pipeline stages for performing the 4 operations of the accumulation phase, followed by 4 more pipeline stages for performing the 4 operations of the distribution phase; and so on. In this implementation example, applications having different values of N will be implemented in the FPGA with shorter or longer pipelines of stages, depending on N.

In another embodiment, as another example, the configuration bit file may configure just a single stage for performing the operations described above for any provided value of p in the accumulation phase, and a 'p-counter' which iterates p and provides it to the stage to perform the arithmetic in order to iterate the correct sequence in which the operations are performed. And the configuration bit file may also configure another single stage for performing the operations described above for any provided value of q in the distribution phase, and a q-counter' which iterates q and provides it to the stage to perform the arithmetic in order to iterate the correct sequence in which the operations are performed in the distribution phase. In this implementation example, the pipeline lengths may not change with different values of N; the only difference among implementations for different values of N may be a single register in the FPGA pre-programmed with the value of N, used to initialize the two p- and q-counters. Many other implementation variations will be apparent to the reader.

Note that the All-Reduce stage in a data-parallel back-propagation neural network learning algorithm should generate the average gradient calculated by all participating RPs for each learnable parameter. The algorithm described herein, on the other hand, generates the sum of such gradients rather than the average. Assuming the mini-batch size processed by all RPs are equal, this is not a problem because learning rate factor that the SmartNICs apply to each gradient value for updating the parameters in stage 4514 can simply be specified in the configuration bit file to be correspondingly smaller (e.g. divided by the total number of participating RPs). In an embodiment in which the gradient values calculated by different RPs might derive from different numbers of mini-batches, or different numbers of samples, the averaging performed by the SmartNIC in the present method should be a weighted average in which each RP's calculated gradient value is weighted in proportion to the number of samples that the RP's gradient values represent. This can be accomplished for example by configuring each RP to pre-divide its own calculated gradient values by the number of mini-batches, or the number of data samples that the values represent, before forwarding them to its respective SmartNIC. These adaptations can be included in the configuration bit file, and do not require any coordination by any host at runtime.

Intra-Node Gradient Collective

As mentioned above, step 4512 (FIG. 45) involves accumulating the Section S2 gradients from the local RPs into gradient memory of the local SmartNIC. Steps 4516 and 4520 are similar, for the Section S1 and Section S0 gradients, respectively. As with the inter-node collective, any type of collective can be configured into the RPs and their local SmartNIC in various embodiments to accomplish this. The choice of collective may depend on the size of the parameters, and can be chosen to optimize parallelization of the reduce operation so it does not become the throughput bottleneck.

Most preferably, though, the collective is triggered by the RP when data is available, and then orchestrated by the SmartNIC.

In one embodiment, each RP streams its gradients for the parameters in the current Section to the local SmartNICs local memory pool 3234 via streaming P2P transactions. Alternatively, the RP may issue a remote write via the P2P protocol, to a memory mapped SmartNIC buffer should a store and forward be required. In yet another alternative, the RP can issue a P2P control to the SmartNIC which triggers the SmartNIC to issue a P2P remote read transaction to a buffer in RP device memory. Regardless of the mechanism by which the Section S2 gradients reach the local SmartNIC, they may be received asynchronously, but each one (or chunk) of them is received in association with an identification of the originating RP and the particular parameters included in the chunk. As the gradients are received, the FPGA adds them up in its local gradient buffer. The FPGA keeps track of which gradients have been received and from which RPs, and moves on to the next step upon receipt of all of the Section S2 gradients from all of the local RPs.

A direct streaming collective to a single local SmartNIC, however, could cause a bottleneck as the number of RPs in the node increases, thereby stifling local scaling. Thus in another embodiment, the accumulation of the Section S2 gradients into the local SmartNIC (and the Section S1 gradients and the Section S0 gradients as well), can be accomplished using a Ring All-Reduce algorithm just as described above with respect to the inter-node collective, and a separate dedicated SmartNIC for each of the RPs. That is, a first round of Ring All-Reduce takes place locally within each processing node, leaving a "local master" SmartNIC with the sum of the gradients for the current section from all the local RPs. N=8 in the 8-RP nodes of FIG. 42. Then a second round of Ring All-Reduce takes place as described above. Each of the dedicated SmartNICs has its own FPGA. Only one of such SmartNICs is treated by the configuration bit file as the local master, and that is the one that is configured by the configuration bit file to communicate with the corresponding master SmartNICs in the other nodes in the second round of Ring All-Reduce.

The local Ring All-Reduce can take place over the local PCIe bus 3220, in which case none of the dedicated SmartNICs (other than the local master SmartNIC) need include the Ethernet interface 3312. Alternatively, if they do include the Ethernet interface 3312, then the configuration bit file can configure the FPGAs in the dedicated SmartNICs to perform the local Ring All-Reduce using the P2P protocol over a local LAN arranged in a ring topology. See FIG. 48, which illustrates an RP processing node 4801 like that of FIG. 42, but with local LAN segments 4830 added for the local ring.

Figure 48:
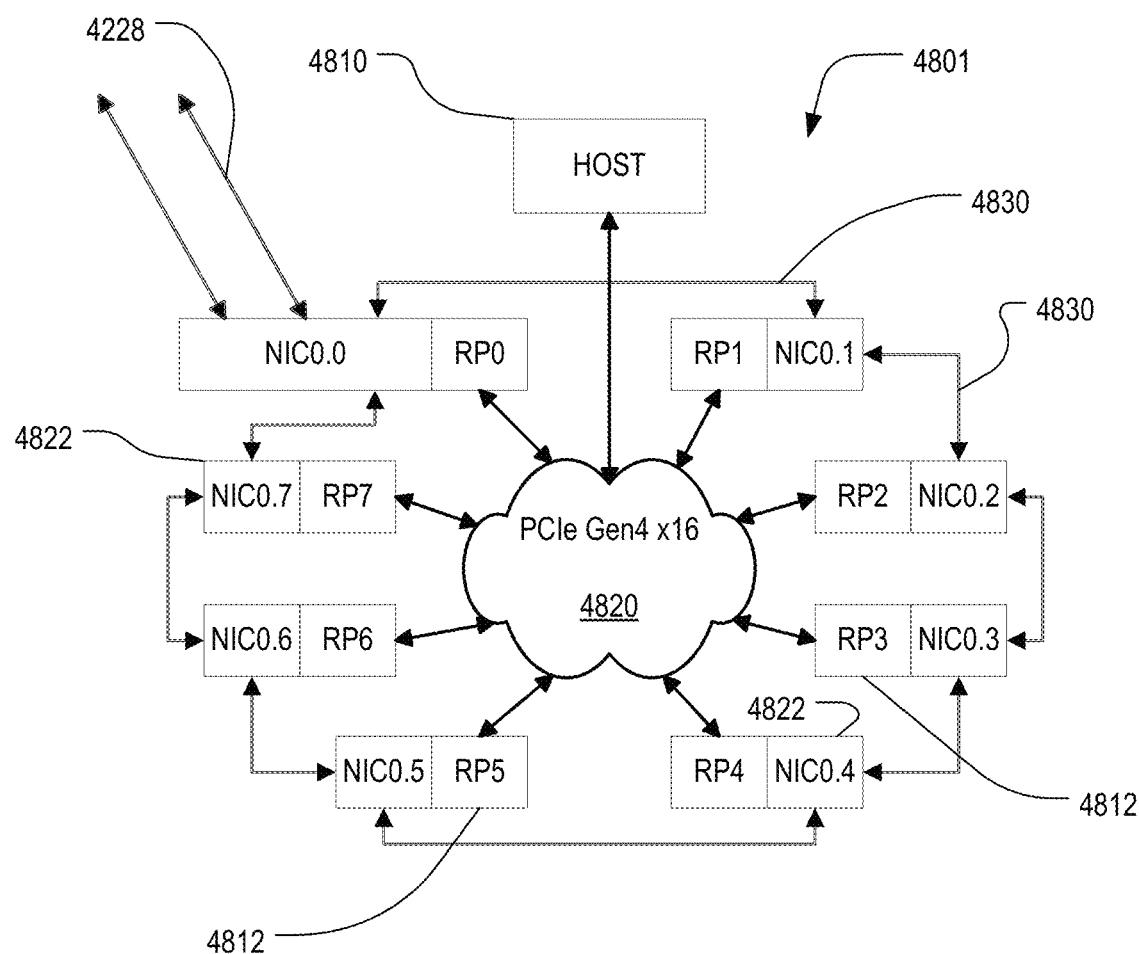
FIG. 48 illustrates another example processing node which includes a host, eight reconfigurable processors, and a SmartNIC for each of the reconfigurable processors.

In particular, FIG. 48 illustrates an example processing node 4801 which includes a host 4810 and the eight RPs 4812 like RPs 3212 shown in FIG. 32, all interconnected by way of a PCIe bus 4820. The SmartNICs in FIG. 48 are numbered as "$NIC_{k,i}$", where k is the node number ranging from 0 to N−1, N being the number of participating processing nodes, and where i is the SmartNIC number within the node k. The index i ranges from 0 to $M_{k-1}$, where $M_k$ is the number of SmartNICs in node k. Only one processing node, node 0, is shown in FIG. 48, and it will be understood that all of the other participating nodes k, k=1 . . . N−1, can be the same or different.

As with the system of FIG. 32, other implementations can include other quantities of RPs 4812. The processing node 4801 differs from that of FIG. 32 in that each RP 4812 is paired with its own SmartNICs 4822. Each RP 4812 communicates with its respective SmartNIC via the PCIe bus 4820, though in another embodiment, each RP 4812 has a separate, dedicated PCIe bus (or other peripheral bus), separate from PCIe bus 4820, for communicating with its respective SmartNIC 4822. Each SmartNIC 4822 has one port connected to the PCIe bus (or other bus) via which it communicates with its corresponding RP 4812, and a second port connected to a local LAN 4828. The LAN 4828 in the present embodiment is Ethernet, but in other embodiments it could be other types of LANs such as WiFi or InfiniBand. The SmartNIC labeled NIC0.0 in FIG. 48 may be the one configured by the configuration bit file as the local master SmartNIC. It includes the two additional Ethernet sub-ports 4228 for communicating with the local master SmartNICs in the other processing nodes as set forth above with respect to FIG. 42. Alternatively, the LAN 4828 (or one segment of the LAN 4828) may include an Ethernet switch (not shown) which includes one or more additional ports for extending the LAN 4828 to other RP processing nodes like 4801. The arrangement of FIG. 48 can be configured to communicate among the RPs 4812 via the two disparate communication link types (PCIe and Ethernet) as needed in order to optimize processing.

Messaging Protocol

As set forth in detail above primarily with respect to FIGS. 14A-26, data communication over the PCIe buses 3220 include buffers on both the sending and receiving ends of a data transmission. The PCIe buses 3220 in the systems of FIGS. 32 and 42 carry control and data packets according to a peer-to-peer (P2P) messaging protocol. As set forth above, the SmartNICs 3222, too, include logic to participate fully in such conversations. The P2P protocol includes at least two types of transactions: one that transfers the data, and another deals with notifying the sender that the receiver has processed the data (e.g. by returning a credit). Using such a protocol, there are a number of ways in different embodiments that the recipient of data can learn that sufficient data has been received in order to trigger the next step in the recipients dataflow. Similarly there are a number of ways that the sender of data can learn that all of it has been received by the consumer so the sender can trigger a subsequent pipeline stage which requires the memory that previously contained the data. Such self-determination is a feature that enables the system to minimize runtime control of the dataflow by a host, and thus minimize the extensive control and networking overhead that can be incurred in conventional systems in which an outside entity such as a runtime host has to orchestrate all of the synchronization steps. Such outside control overhead can stifle scaling of an architecture beyond just a few compute nodes.

For example in the embodiment of FIG. 42, the reporting of gradients by each RP to the local SmartNIC, in pipeline stages 4424, 4428 and 4432 (FIG. 44) can use a "push" operation defined in the P2P protocol, originated by the producer RP. The protocol sequence informs the local SmartNIC when data transmission for the current network Section Sj is complete. In response to having received such notifications from all local RPs, the SmartNIC automatically proceeds with a subsequent pipeline stage to perform a collective across the LAN with the other SmartNICs in the data center (stages 4514, 4518 or 4522 in FIG. 45). No control by any third party entity is required. Additionally, the P2P protocol sequence also notifies the producer RP when the consumer SmartNIC has received all the data that the RP transmitted to the SmartNIC for the current network Section Sj. The producer RP's dataflow uses such notification as part of its logic to trigger a subsequent pipeline stage that will re-use its local gradient memory. For example the RP may be configured to re-use local gradient memory in the BWD pass for the next network Section Sj. And as among the SmartNICs, the P2P protocol sequence notifies each SmartNIC k when the values from its local gradient buffer segment have been received by SmartNIC k−1 (stages 4610, 4614, 4618, 4630, 4636 and 4640 in FIG. 46), and when all the values from SmartNIC k+1 have arrived (stages 4612, 4616, 4620, 4632, 4636 and 4640 in FIG. 46), both of which the dataflow configured into the FPGA may need to occur in order to trigger a subsequent stage of the dataflow pipeline in the FPGA. Still further, each of the SmartNICs can use the same P2P protocol sequence, or a similar broadcast-type P2P protocol sequence, to transmit the updated parameters to all the local RPs over the local PCIe bus in stage 4528 (FIG. 45). The RPs may be configured to trigger the next training epoch only upon notification, in accordance with the P2P protocol, that the RP has received all the updated parameters (stage 4434 in FIG. 44). And the SmartNICs may be configured to include in its logic for triggering the next iteration of its pipeline stage 4512 (FIG. 45), the notification according to the P2P protocol that its transmission of the last set of updated parameters has completed to all of the local RPs.

In one embodiment of a P2P protocol that provides such completion notifications, control packets are exchanged between a producer (sender or source) of data packets and a consumer (receiver or destination) of the data to inform the consumer that all data for a particular transmission has been sent. A simplified set of semantics that can be used to accomplish this might include the following:

A producer can transmit data to a consumer either by a "push" operation controlled by the producer or by a "pull" operation controlled by the consumer. For a push operation, the sequence of packets according to the P2P might be as follows:

In response to a request from the producer's internal dataflow operations, the producer's AGCU sends the consumer a Write Request token, specifying a destination FIFO address at the consumer. The destination address can be within a DRAM at the consumer, which for a SmartNIC, can be in the Local Memory Pool 3234.

When any required prior processing by the consumer is finished, the consumer's AGCU returns a Clear-to-Send (CTS) token.

The producer's AGCU then sends the data packets as a series of one or more fixed size chunks, the last of which contains a token indicating "Last".

The consumer's AGCU then notifies the consumer's destination dataflow pipeline that the data have been received.

The producer's AGCU then notifies the internal dataflow operations that made the request, that the sending process is complete.

The producer's AGCU, once triggered, operates independently of the producer's dataflow pipelines. Thus the data transfer can take place mostly in parallel with continued dataflow operations at the producer, until the dataflow reaches a stage which requires access to the memory which was storing the send data. The producer's dataflow pipeline can be configured such that one of the requirements for triggering that stage to proceed is receipt of the completion notification from the producer's AGCU. Similarly, the consumer dataflow can continue operating in parallel with the receiving of the data, until a pipeline stage is reached which requires the data being received. The consumer's dataflow pipeline can be configured such that one of the requirements for triggering that stage to proceed is receipt of the notification from the consumer's AGCU that the data has arrived.

For a pull operation, the sequence of packets according to the P2P might be as follows:

In response to a request from the producer's internal dataflow operations, the producer's AGCU sends a P2P token to the consumer notifying of the availability of data for reading, the address where the data is stored, and the number of chunks to be read.

When any required prior processing by the consumer is finished, the consumer's AGCU returns a P2P acknowledgement token and begins reading the data chunks, which arrive in P2P data packets. Alternatively, the consumer's AGCU can issue a remote read command from a memory mapped buffer either in SmartNIC local memory or in remote RP device memory.

When the consumer has received all the data, the consumer's AGCU notifies the consumer's destination dataflow pipeline that the data have been received.

The consumer's AGCU also returns a Clear-to-Send (CTS) token back to the producer's AGCU.

The producer's AGCU interprets the CTS token as a completion message, and notifies the internal dataflow operations that made the request, that the reading process is complete.

As for the sending operation, the data transfer can take place mostly in parallel with continued dataflow operations at the producer and consumer. The producer's dataflow pipeline can be configured such that one of the requirements for triggering a subsequent dataflow pipeline stage is receipt of the completion notification from the producer's AGCU. Similarly, the consumer's dataflow pipeline can be configured such that one of the requirements for triggering a subsequent dataflow pipeline is receipt of the notification from the consumer's AGCU that the data has arrived.

Transmission of data from a producer to consumer also can be requested by the consumer. In such a case a P2P protocol sequence similar to the ones above can be used to transfer the data, either by push or pull, and the dataflow pipelines in either or both the producer and consumer can be configured to include a transmit completion signal in the conditions for triggering a subsequent dataflow pipeline stage. It will be understood that other embodiments can provide other mechanisms in the message passing protocol by which producers and consumers can learn that a data transmission operation has completed and sufficient data is available for proceeding with a subsequent dataflow pipeline stage.

It will be appreciated that other messaging protocols can also be used which provide data transfer completion notifications to the consumer, or the producer, or both. As another example, in a push sending protocol sequence, the originator can specify in the initial packet the length of the upcoming data transfer. Lengths may for example be specified in multiples of a fixed chunk size (such as 64 bytes), and the data packets themselves may be padded if necessary to fill out a full chunk. The consumer learns that it has received all data by monitoring writes to its local Memory Pool and detecting when all chunks have been written. As yet another example, a P2P protocol may be used which does not natively include completion notifications, but the compiler may configure into the dataflows equivalent notifications to be sent to the transmission partner after data transmission or reception has completed.

Additionally, the same P2P messaging protocol that is used within a processing node across the PCIe bus, is also used across the Ethernet links in the system of FIG. 42. The P2P messages are encapsulated in Ethernet Datagrams rather than PCIe data packets. As mentioned above, P2P packets sent over the PCIe bus but addressed to RPs in a different processing node 3201 are re-encapsulated by the SmartNIC 3222, sent over the Ethernet to the SmartNIC of the destination processing node, re-encapsulated there, and forwarded on to the destination RP over that SmartNIC's own local PCIe bus. The same P2P protocol is used for messaging through all processing nodes of the data center 4210, though encapsulated differently depending on the lower level protocol of the underlying transmission medium.

The technology disclosed can be practiced as a system, method, or article of manufacture. One or more features of an implementation can be combined with the base implementation. Implementations that are not mutually exclusive are hereby taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

One or more implementations and aspects of the technology disclosed or elements thereof can be implemented in the form of a computer product, including a non-transitory computer readable storage medium with computer usable program code for performing the method steps indicated. Furthermore, one or more implementations and aspects of the technology disclosed or elements thereof can be implemented in the form of an apparatus including a memory and at least one processor that is coupled to the memory and operative to perform exemplary method steps. Yet further, in another aspect, one or more implementations and aspects of the technology disclosed or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media). For example, aspects of FIG. 36 can be implemented in these ways, as can operations that are handled by a host or CPU.

As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

While the present invention is disclosed by reference to the preferred implementations and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following clauses and claims.

CLAUSES

Some features of the invention include those set out in the following clauses.

Clause 1. A method for training parameters of a neural network using training data samples partitioned across a plurality of participating reconfigurable processors, each of the data samples including a plurality of input values and a set of at least one target output value, comprising:

providing a system including a plurality of functional units including a plurality of participating reconfigurable processors RPi (collectively the participating RPs), each of the participating RPs configurable at a first level of configurable granularity to implement a dataflow architecture, and a peer-to-peer (P2P) message-passing protocol layer by which messages can be transmitted from a producing one of the functional units to a consuming one of the functional units over an underlying interconnect fabric, the system further including a second reconfigurable unit $RU_0$ being configurable at a second level of configurable granularity to implement a dataflow architecture, the first level of configurable granularity being more coarse than the second level of configurable granularity;

a host system writing an application into the functional units, including configuring each of the participating RPs with one or more dataflow pipelines implementing a respective instance of a first dataflow segment, the first dataflow segment including, for a respective current training data sample and a current set of the neural network parameters, pipeline stages that: evaluate the neural network using the current set of values for the parameters and the input values of the respective current training data sample, to calculate a set of at least one predicted output value, calculate a loss in dependence upon the target output values and the predicted output values;

calculate a first intermediate result in dependence upon a parameter gradient with respect to each of the parameters, and forward the first intermediate result to the second reconfigurable unit $RU_0$ without passing through the host system; the host system writing an application into the functional units further including configuring the second reconfigurable unit $RU_0$ with one or more dataflow pipelines implementing an instance of a second dataflow segment, the second dataflow segment including pipeline stages that:

participate in an aggregation of first intermediate results from the participating RPs to calculate a second intermediate result in dependence upon the first intermediate results, and forward the second intermediate result to a continuing one of the functional units;

executing the first dataflow segment on each of the RPs to produce a respective first intermediate result and forward the respective first intermediate result to the second reconfigurable unit $RU_0$ without passing through the host system; and executing the second dataflow segment on the second reconfigurable unit $RU_0$ to produce the second intermediate result and forward the second intermediate result to the continuing reconfigurable unit without passing through the host system.

Clause 2. The method of clause 1, wherein the second reconfigurable unit includes an FPGA, and wherein configuring the second reconfigurable unit with an instance of a second dataflow segment comprises configuring the FPGA with the instance of a second dataflow segment.

Clause 3. The method of clause 2, wherein each of the participating RPs has a Coarse-Grained Reconfigurable Architecture (CGRA), and wherein configuring each of the participating RPs with an instance of a first dataflow segment comprises configuring each of the CGRAs with an instance of a first dataflow segment.

Clause 4. The method of clause 1, further comprising:

a host system writing an second application into the functional units, including reconfiguring a first one of the participating RPs with a third dataflow segment of the second application and reconfiguring the second reconfigurable unit with a fourth dataflow segment of the second application;

executing the third dataflow segment on the first RP to produce a third intermediate result;

the first RP, in a pipeline stage of the third dataflow segment, forwarding the third intermediate result to the second reconfigurable unit without passing through the host system;

executing the fourth dataflow segment on the second reconfigurable unit in dependence upon the third intermediate result, to produce a fourth intermediate result;

the second reconfigurable unit, in a pipeline stage of the fourth dataflow segment configured into the second reconfigurable unit, forwarding the fourth intermediate result to a second continuing one of the RPs without passing through the host system; and continuing execution of the second application on the second continuing RP in dependence upon the fourth intermediate result.

Clause 5. The method of clause 1, wherein the system includes a plurality of second reconfigurable units RUi including reconfigurable unit RU0, each of the second reconfigurable units RUi corresponding to a respective one of the reconfigurable processors RPi, wherein the first dataflow segment on each RPi forwards the respective first intermediate result to the corresponding second reconfigurable unit RUi, wherein the host system writing an application into the functional units includes configuring each of the second reconfigurable units RUi including $RU_0$ with the one or more dataflow pipelines implementing a respective instance of the second dataflow segment, and wherein participating in an aggregation of first intermediate results from the participating RPs to calculate a second intermediate result includes all instances of the second dataflow segment participating in a Ring All-Reduce of the first intermediate results to develop the second intermediate result in at least the reconfigurable unit $RU_0$.

Clause 6. The method of clause 5, wherein the system further comprises a local network which uses a networking protocol different from the interconnect fabric, and wherein each of the second reconfigurable units RUi has a SmartNIC which includes:

an FPGA, wherein configuring each of the second reconfigurable units RUi with one or more dataflow pipelines comprises configuring the respective FPGA with the one or more dataflow pipelines;

a first interface through which the respective SmartNIC receives the first intermediate results from the corresponding reconfigurable processor RPi; and a second interface through which the SmartNIC participates in the Ring All-Reduce with the SmartNICs of the other second reconfigurable units via the P2P protocol layer protocol on the local network under control of the dataflow pipelines configured into the respective FPGA.

Clause 7. The method of clause 6, wherein the first interface on each of the second reconfigurable units RUi receives the first intermediate results from the corresponding reconfigurable processor RPi on the interconnect fabric via the P2P protocol layer protocol.

Clause 8. The method of clause 6, wherein the second intermediate result includes values dependent upon a local aggregation of the first intermediate results received by the second reconfigurable unit from all of the participating RPs.

Clause 9. The method of clause 8, wherein the second intermediate result includes an intermediate result value for each of the neural network parameters, each of the intermediate result values being a predetermined function of an average of the parameter gradients for the respective parameter as indicated by the first intermediate results received from the participating RPs.

Clause 10. The method of clause 8, wherein the second intermediate result includes an intermediate result value for each of the neural network parameters, each of the intermediate result values indicating an update for the respective parameter calculated in dependence upon an average of the parameter gradients for the respective parameter as indicated by the first intermediate results received from the participating RPs.

Clause 11. The method of clause 5, wherein the second dataflow segment forwards the second intermediate result to all of the participating RPs, the continuing one of the functional units being one of the participating RPs.

Clause 12. The method of clause 1, wherein all of the participating RPs are reachable by the second reconfigurable unit RU0 via the interconnect fabric using the P2P protocol layer, and wherein participating in an aggregation of first intermediate results from the participating RPs comprises, in a SYNC/AR pipeline stage of the second dataflow segment:

receiving via the P2P protocol respective first intermediate results from all of the participating RPs; and summing, separately for each of the parameters, the first intermediate results from all of the participating RPs.

Clause 13. The method of clause 1, wherein the first dataflow segment on each of the RPs forwards the respective first intermediate result to the second reconfigurable unit RU0 via the P2P protocol layer, and wherein the second dataflow segment forwards the second intermediate result to all of the participating RPs via the P2P protocol layer.

Clause 14. The method of clause 1, wherein the second reconfigurable unit RU0 has a SmartNIC which includes: a first interface through which the SmartNIC communicates on the interconnect fabric according to an interconnect fabric protocol;

a second interface through which the SmartNIC communicates on a network connection using a networking protocol different from that used on the interconnect fabric;

a SmartNIC dataflow controller;

first translation logic which receives data packets arriving on the first interface and addressed to destinations reachable through the second interface, re-encapsulates them according to the networking protocol and forwards them through the second interface;

second translation logic which receives data packets arriving on the second interface and addressed to destinations reachable through the first interface, re-encapsulates them according to the interconnect fabric protocol and forwards them through the first interface;

first consumer logic which receives data packets arriving on the first interface and addressed to the SmartNIC, extracts first messages, and provides the first messages to the SmartNIC dataflow controller; and first producer logic which forwards onto the first interface messages originated by the SmartNIC dataflow controller and addressed to a reconfigurable unit reachable through the first interface and an FPGA in communication with the SmartNIC dataflow controller, wherein configuring the second reconfigurable unit $RU_0$ comprises configuring the FPGA.

Clause 15. The method of clause 14, wherein a local set of at least one of the participating RPs are reachable by the SmartNIC through the first interface, and a foreign set of at least one of the participating RPs are reachable through a set of at least one foreign SmartNIC which are reachable through the second interface, each of the foreign SmartNICs including:

a foreign first interface through which the foreign SmartNIC communicates on an interconnect fabric of the foreign SmartNIC;

a second foreign interface through which the foreign SmartNIC communicates on the network;

a foreign SmartNIC dataflow controller;

first foreign translation logic which receives data packets arriving on the first foreign interface and addressed to destinations reachable through the second foreign interface, re-encapsulates them according to a networking protocol and forwards them through the second interface;

second foreign translation logic which receives data packets arriving on the second foreign interface and addressed to destinations reachable through the first foreign interface, re-encapsulates them according to the interconnect fabric protocol of the foreign SmartNIC and forwards them through the first foreign interface;

first foreign consumer logic which receives data packets arriving on the first foreign interface and addressed to the foreign SmartNIC, extracts first foreign messages, and provides the first foreign messages to the foreign SmartNIC dataflow controller; first foreign producer logic which forwards onto the first foreign interface messages originated by the foreign SmartNIC dataflow controller and addressed to an RP reachable through the first foreign interface;

second foreign consumer logic which receives data packets arriving on the second foreign interface and addressed to the foreign SmartNIC, extracts second foreign messages, and provides the second foreign messages to the foreign SmartNIC dataflow controller;

second foreign producer logic which forwards onto the second foreign interface messages originated by the foreign SmartNIC dataflow controller and addressed to an RP reachable through the second foreign interface, wherein the second dataflow segment further includes cooperating with the foreign SmartNICs to further aggregate with the local aggregation, aggregations of corresponding intermediate results received through the second interface from the foreign SmartNICs, and wherein the second intermediate result includes values dependent upon the further aggregation.

Clause 16. The method of clause 15, wherein cooperating with the foreign SmartNICs comprises performing a Ring All-Reduction of the local aggregation with the aggregations of the corresponding intermediate results received through the second interface from the foreign SmartNICs.

Clause 17. The method of clause 15, wherein the second dataflow segment includes a particular pipeline stage to transmit through the second interface at least part of the local aggregation of first intermediate results from the participating RPs, and wherein the SmartNIC triggers the particular pipeline stage in response to receipt and local aggregation by the SmartNIC of the first intermediate results from all of the participating RPs, for all of the parameters.

Clause 18. The method of clause 15, wherein the second dataflow segment includes a particular pipeline stage to transmit through the second interface at least part of the local aggregation of first intermediate results from the participating RPs, and wherein the SmartNIC triggers the particular pipeline stage only after receipt by the SmartNIC of the first intermediate results from all of the participating RPs, for all of the parameters, and not in response to any control signal from the host system subsequent to the start command from the host system.

Clause 19. The method of clause 15, wherein the neural network includes a plurality of neural network sections, including an output neural network section having outputs for carrying the at least one predicted output value, and further including a hidden neural network section having inputs and further having outputs providing values to inputs of the output neural network section, and wherein the first intermediate result includes values dependent upon the parameter gradient with respect to only the neural network parameters in the output neural network section.

Clause 20. The method of clause 19, wherein the continuing one of the RPs is a first one of the participating RPs, wherein the first dataflow segment further includes further pipeline stages that:
calculate a further intermediate result in dependence upon a parameter gradient with respect to each of the parameters in the hidden neural network section; and
forward the further intermediate result to the SmartNIC via the P2P protocol layer without passing through the host system, wherein the second dataflow segment includes pipeline stages to coordinate a local further aggregation of further intermediate results from the participating RPs before forwarding the further intermediate result to the continuing one of the RPs,
and wherein the further pipeline stage to calculate a further intermediate result proceeds in parallel with the pipeline stages in the second dataflow segment to coordinate the local further aggregation.

What is claimed is:

1. A system for training parameters of a neural network using training data samples that include a plurality of input values and a target output value, comprising:
a plurality of processing nodes including a processing node and a second processing node, each processing node of the plurality of processing nodes includes:
a respective plurality of processors reconfigurable at a first level of configuration granularity;
a respective smart network interface controller comprising a respective controller configurable at a second level of configuration granularity; and
a respective interconnect fabric communicatively coupling processors of the respective plurality of processors to the respective smart network interface controller;
the processing node comprising a plurality of processors reconfigurable at the first level of configuration granularity, including a processor and a smart network interface controller comprising a controller reconfigurable at the second level of configuration granularity finer than the first level of configuration granularity, the controller communicatively coupled to the processor through an intra-node communication link, and to a network interface controller on the second processing node through a network;
the processor configured by a host system to execute a first dataflow segment of the neural network having one or more dataflow pipelines to generate a predicted output value using a first subset of the plurality of input values and a set of neural network parameters, calculate a first intermediate result for a parameter of the set of neural network parameters based on the predicted output value and the target output value, and provide the first intermediate result to the controller;
wherein the processor comprising a Coarse-Grained Reconfigurable Architecture (CGRA); and
the controller configured by the host system to receive a second intermediate result from the network interface controller though the network, execute a second dataflow segment, dependent upon the first intermediate result and the second intermediate result, to generate a third intermediate result indicative of an update of the parameter of the set of neural network parameters;
wherein the controller is configured to produce the third intermediate result using a collective methodology;
wherein the respective smart network interface controllers of the plurality of processing nodes are connected in a ring configuration and the collective methodology comprises a uni-directional ring all-reduce; and
wherein none of the first intermediate result, the second intermediate result, nor the third intermediate result, pass through the host system.

2. The system of claim 1, the processing node further comprising: an interconnect fabric, including the intra-node communication link, communicatively coupling processors of the plurality of processors to the controller.

3. The system of claim 2, the system further comprising the host system.

4. The system of claim 2, the controller further configured to receive respective second intermediate results, including the second intermediate result from the second processing node, from the respective smart network interface controllers of the plurality of processing nodes and to add the first intermediate result and the second intermediate results to produce the third intermediate result.

5. The system of claim 1, the controller further configured to use the third intermediate result to update the parameter of the set of neural network parameters to create an updated parameter and provide the updated parameter to the processor.

6. The system of claim 5, the processor further configured to generate an updated predicted output value using a second subset of the plurality of input values and an updated set of neural network parameters that includes the updated parameter.

7. The system of claim 1, the controller comprising a Field-Programmable Gate Array (FPGA).

8. A method for training parameters of a neural network using training data samples that include a plurality of input values and a target output value, the method utilizing a host system communicatively coupled to a processing node that includes a processor reconfigurable at a first level of configuration granularity and a controller reconfigurable at a second level of configuration granularity finer than the first level of configuration granularity, the controller communicatively coupled to the processor through an intra-node communication link, and to a network interface controller on a second processing node through a network, the method comprising:
configuring the processor at the first level of configuration granularity by the host system to execute a first dataflow segment of the neural network having one or more dataflow pipelines;
configuring the controller at the second level of configuration granularity by the host system to execute a second dataflow segment dependent upon a first intermediate result and a second intermediate result;
generating, using the one or more dataflow pipelines, a predicted output value using a first subset of the plurality of input values and a set of neural network parameters;
calculating, using the one or more dataflow pipelines, the first intermediate result for a parameter of the set of neural network parameters based on the predicted output value and the target output value;
providing, by the processor, the first intermediate result to the controller;
receiving respective second intermediate results, including the second intermediate result from the second processing node, from respective smart network interface controllers of a plurality of processing nodes; and generating, using a collective methodology at respective controllers, a third intermediate result by adding the first intermediate result and the second intermediate results, the third intermediate result indicative of an update of the parameter of the set of neural network parameters;

wherein the respective smart network interface controllers of the plurality of processing nodes are connected in a ring configuration and the collective methodology comprises a uni-directional ring all-reduce; and wherein none of the first intermediate result, the second intermediate result, nor the third intermediate result, pass through the host system.

9. The method of claim 8, further comprising:

updating a parameter of the set of neural network parameters using the third intermediate result to create an updated set of neural network parameters; and generating an updated predicted output value using a second subset of the plurality of input values and the updated set of neural network parameters.

10. One or more non-transitory computer-readable media having one or more configuration files stored thereon, that when used by a host system to configure a processing node that includes a processor reconfigurable at a first level of configuration granularity and a controller reconfigurable at a second level of configuration granularity finer than the first level of configuration granularity, the controller communicatively coupled to the processor through an intra-node communication link, and to a network interface controller on a second processing node through a network, cause a method for training parameters of a neural network using training data samples that include a plurality of input values and a target output value to be performed, the method comprising:

configuring the processor at the first level of configuration granularity by the host system to execute a first dataflow segment of the neural network having one or more dataflow pipelines;

configuring the controller at the second level of configuration granularity by the host system to execute a second dataflow segment dependent upon a first intermediate result and a second intermediate result;

generating, using the one or more dataflow pipelines, a predicted output value using a first subset of the plurality of input values and a set of neural network parameters;

calculating, using the one or more dataflow pipelines, the first intermediate result for a parameter of the set of neural network parameters based on the predicted output value and the target output value;

providing, by the processor, the first intermediate result to the controller;

receiving respective second intermediate results, including the second intermediate result from the second processing node, from respective smart network interface controllers of a plurality of processing nodes; and generating, using a collective methodology at respective controllers, a third intermediate result by adding the first intermediate result and the second intermediate results, the third intermediate result indicative of an update of the parameter of the set of neural network parameters;

wherein the respective smart network interface controllers of the plurality of processing nodes are connected in a ring configuration and the collective methodology comprises a uni-directional ring all-reduce; and wherein none of the first intermediate result, the second intermediate result, nor the third intermediate result, pass through the host system.

11. The one or more non-transitory computer-readable media of claim 10, the method further comprising:

updating a parameter of the set of neural network parameters using the third intermediate result to create an updated set of neural network parameters; and generating an updated predicted output value using a second subset of the plurality of input values and the updated set of neural network parameters.

\* \* \* \* \*